United States Patent
Sugimoto et al.

(10) Patent No.: US 11,561,388 B2
(45) Date of Patent: Jan. 24, 2023

(54) LIGHT MODULE

(71) Applicant: HAMAMATSU PHOTONICS K.K., Hamamatsu (JP)

(72) Inventors: Tatsuya Sugimoto, Hamamatsu (JP); Kyosuke Kotani, Hamamatsu (JP); Tomofumi Suzuki, Hamamatsu (JP); Katsumi Shibayama, Hamamatsu (JP); Noburo Hosokawa, Hamamatsu (JP); Nao Inoue, Hamamatsu (JP); Masashi Ito, Hamamatsu (JP); Yutaka Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 806 days.

(21) Appl. No.: 16/492,672

(22) PCT Filed: Mar. 14, 2018

(86) PCT No.: PCT/JP2018/009973
§ 371 (c)(1),
(2) Date: Sep. 10, 2019

(87) PCT Pub. No.: WO2018/168927
PCT Pub. Date: Sep. 20, 2018

(65) Prior Publication Data
US 2020/0049974 A1 Feb. 13, 2020

(30) Foreign Application Priority Data

Mar. 14, 2017 (JP) .............................. JP2017-048559
Mar. 14, 2017 (JP) .............................. JP2017-048561
(Continued)

(51) Int. Cl.
*G02B 6/06* (2006.01)
*B81B 3/00* (2006.01)
(Continued)

(52) U.S. Cl.
CPC ............ *G02B 26/06* (2013.01); *B81B 3/0062* (2013.01); *G01J 3/45* (2013.01); *G02B 6/357* (2013.01);
(Continued)

(58) Field of Classification Search
CPC .... G02B 26/0841; G02B 26/00; G02B 26/08; G02B 26/101; G02B 26/06;
(Continued)

(56) References Cited

U.S. PATENT DOCUMENTS 4,973,160 A 11/1990 Takiguchi et al.
11,067,380 B2 7/2021 Suzuki et al.
(Continued)

FOREIGN PATENT DOCUMENTS

CN 1908702 A 2/2007
CN 101786592 A 7/2010
(Continued)

OTHER PUBLICATIONS

Wu et al., A Study of Using Metamaterials as Antenna Substrate to Enhance Gain, 2005, Progress in Electromagnetics Research, Pier 51, pp. 295-328 (Year: 2005).*
(Continued)

*Primary Examiner* — Ryan A Lepisto
*Assistant Examiner* — Erin D Chiem
(74) *Attorney, Agent, or Firm* — Faegre Drinker Biddle & Reath LLP

(57) ABSTRACT

A light module includes an optical element and a base on which the optical element is mounted. The optical element has an optical portion which has an optical surface; an elastic portion which is provided around the optical portion such that an annular region is formed; and a pair of support portions which is provided such that the optical portion is sandwiched in a first direction along the optical surface and (Continued)

in which an elastic force is applied and a distance therebetween is able to be changed in accordance with elastic deformation of the elastic portion. The base has a main surface, and a mounting region in which an opening communicating with the main surface is provided. The support portions are inserted into the opening in a state where an elastic force of the elastic portion is applied.

4 Claims, 61 Drawing Sheets

(30) Foreign Application Priority Data

| | | |
|---|---|---|
| Mar. 16, 2017 | (JP) | JP2017-051484 |
| Apr. 4, 2017 | (JP) | JP2017-074494 |

(51) Int. Cl.

| | | |
|---|---|---|
| G01J 3/45 | (2006.01) | |
| G02B 6/35 | (2006.01) | |
| G02B 26/08 | (2006.01) | |
| B81C 3/00 | (2006.01) | |
| G02B 6/293 | (2006.01) | |
| G01J 3/02 | (2006.01) | |
| G01J 3/453 | (2006.01) | |
| G01J 5/02 | (2022.01) | |
| G01N 21/35 | (2014.01) | |
| G02B 26/06 | (2006.01) | |

(52) U.S. Cl.
CPC ......... *G02B 6/3518* (2013.01); *G02B 6/3584* (2013.01); *G02B 26/0833* (2013.01)

(58) Field of Classification Search
CPC .. G02B 26/0833; G02B 6/3518; G02B 6/357; G02B 6/3584; G02B 6/29349; G01J 3/021; G01J 3/0256; G01J 3/4535; G01J 5/0225; B81B 3/0043; B81B 3/0062; B81B 2201/042; B81C 3/008; G01N 2021/3595
See application file for complete search history.

(56) References Cited

U.S. PATENT DOCUMENTS

| | | |
|---|---|---|
| 2001/0048784 A1 | 12/2001 | Behin et al. |
| 2001/0053261 A1 | 12/2001 | Goldstein et al. |
| 2002/0186477 A1 | 12/2002 | Wang et al. |
| 2003/0049879 A1 | 3/2003 | Lin |
| 2003/0227681 A1 | 12/2003 | Currie |
| 2004/0028321 A1 | 2/2004 | Sunaga et al. |
| 2008/0100899 A1 | 5/2008 | Shimokawa et al. |
| 2010/0103492 A1 | 4/2010 | Maruyama et al. |
| 2010/0188728 A1 | 7/2010 | Warashina et al. |
| 2010/0208347 A1* | 8/2010 | Kouma .................. H02N 1/006 359/578 |
| 2010/0265512 A1 | 10/2010 | Medhat et al. |
| 2012/0099176 A1 | 4/2012 | Zhou |
| 2012/0327493 A1 | 12/2012 | Koide et al. |
| 2014/0019236 A1 | 1/2014 | Argue et al. |
| 2014/0104687 A1 | 4/2014 | Warashina et al. |
| 2014/0139924 A1 | 5/2014 | Warashina et al. |
| 2014/0168736 A1 | 6/2014 | Mizoguchi |
| 2014/0192365 A1 | 7/2014 | Mortada et al. |
| 2016/0299335 A1* | 10/2016 | Hofmann ............. G02B 26/101 |
| 2020/0124469 A1 | 4/2020 | Sugimoto et al. |
| 2021/0130159 A1 | 5/2021 | Sugimoto et al. |
| 2021/0148690 A1 | 5/2021 | Suzuki et al. |
| 2021/0155471 A1 | 5/2021 | Sugimoto et al. |
| 2021/0191106 A1 | 6/2021 | Sugimoto et al. |
| 2021/0278274 A1 | 9/2021 | Suzuki et al. |

FOREIGN PATENT DOCUMENTS

| | | | | |
|---|---|---|---|---|
| CN | 102466828 A | 5/2012 | | |
| CN | 103210445 A | 7/2013 | | |
| CN | 103547528 A | 1/2014 | | |
| CN | 103569936 A | * 2/2014 | ......... | B81B 3/0045 |
| CN | 103582830 A | 2/2014 | | |
| CN | 104216107 A | 12/2014 | | |
| CN | 104272070 A | 1/2015 | | |
| CN | 105164568 A | 12/2015 | | |
| CN | 105552125 A | 5/2016 | | |
| CN | 105849618 A | 8/2016 | | |
| CN | 105992964 A | 10/2016 | | |
| CN | 106444017 A | 2/2017 | | |
| CN | 106468828 A | 3/2017 | | |
| JP | 2003-159698 A | 6/2003 | | |
| JP | 2004-82288 A | 3/2004 | | |
| JP | 2004-102315 A | 4/2004 | | |
| JP | 2005-43870 A | 2/2005 | | |
| JP | 2005-308863 A | 11/2005 | | |
| JP | 2006-091666 A | 4/2006 | | |
| JP | 2006-102934 A | 4/2006 | | |
| JP | 2006102934 A | * 4/2006 | ......... | G02B 26/0841 |
| JP | 2007155965 A | * 6/2007 | | |
| JP | 2010-170029 A | 8/2010 | | |
| JP | 2010-184334 A | 8/2010 | | |
| JP | 2010-286609 A | 12/2010 | | |
| JP | 2011-2698 A | 1/2011 | | |
| JP | 2012-524295 A | 10/2012 | | |
| JP | 2012-215691 A | 11/2012 | | |
| JP | 2012-240129 A | 12/2012 | | |
| JP | 2012-242450 A | 12/2012 | | |
| JP | 2014-055871 A | 3/2014 | | |
| JP | 2014-192365 A | 10/2014 | | |
| JP | 2014534461 A | * 12/2014 | ......... | G02B 26/0841 |
| JP | 5846636 B2 | * 1/2016 | ......... | G02B 26/085 |
| WO | WO 2008/084520 A1 | 7/2008 | | |
| WO | WO-2010/121185 A1 | 10/2010 | | |
| WO | WO 2012/002101 A1 | 1/2012 | | |

OTHER PUBLICATIONS

Shujing Su et al., "The Design of Two-kind Wafer Micro-mirror Actuated by Heat," Journal of Test and Measurement Technology, North China Institute of Technology, 030051, vol. 16, Jun. 2002, Dec. 31, 2002.
International Preliminary Report on Patentability dated Sep. 26, 2019 for PCT/JP2018/010019.
International Preliminary Report on Patentability dated Sep. 26, 2019 for PCT/JP2018/009992.
International Preliminary Report on Patentability dated Sep. 26, 2019 for PCT/JP2018/009975.
International Preliminary Report on Patentability dated Sep. 26, 2019 for PCT/JP2018/009973.
Zongquan Deng, "Design of Space Deployable and Foldable Mechanisms", Harbin Institute of Technology Press. Jun. 2013 (including abstract).

* cited by examiner (a)

(b)

(a)

(b)

(a)

(b)

(a)

(b)

(a)

(b)

(a)

(b)

(a)

(b)

(a)

(b)

(c)

(a)

(b)

(b)

(c)

(a)

(b)

(b)

(c)

(a)

(b)

(c)

(a)

(b)

(c)

(a)

(b)

(a)

(b)

(a)

(b)

(a)

(b)

(a)

(b)

(a)

(b)

(a)

(b)

(a)

(b)

(a)

(b)

(a)

(b)

(c)

(a)

(b)

(c)

(a)

(b)

LIGHT MODULE

TECHNICAL FIELD

An aspect of the present disclosure relates to a light module.

BACKGROUND ART

Light modules in which an interference optical system is formed on a silicon-on-insulator (SOI) substrate by a micro electro mechanical systems (MEMS) technology are known (for example, refer to Patent Literature 1). Such light modules have attracted attention because they can supply a Fourier transform infrared spectroscopic analyzer (FTIR) in which highly accurate optical disposition is realized.

Patent Literature 2 discloses a process of manufacturing an optical system. In this process, first, a template substrate and an optical bench are prepared. An alignment slot is formed in the template substrate through etching. A bond pad is disposed on a main surface of the optical bench. Subsequently, the template substrate is attached to the main surface of the optical bench such that the alignment slot is disposed on the bond pad. Subsequently, an optical element is inserted into the alignment slot while being positionally aligned along a side wall of the alignment slot and is positioned on the bond pad. Then, the optical element is bonded to the optical bench due to a reflow of the bond pad.

CITATION LIST

Patent Literature

Patent Literature 1: Japanese Unexamined Patent Publication No. 2012-524295

Patent Literature 2: Specification of United States Patent Application, Publication No. 2002/0186477

SUMMARY OF INVENTION

Technical Problem

The foregoing light modules have the following problem in respect that the size of a movable mirror depends on a degree of completion of deep cutting with respect to an SOI substrate, for example. That is, since the degree of completion of deep cutting with respect to an SOI substrate is approximately 500 μm at the maximum, there is a limitation in improvement of sensitivity of an FTIR by increasing the size of a movable mirror. Here, a technology of mounting a separately formed movable mirror in a device layer (for example, a layer of an SOI substrate in which a driving region is formed) may be taken into consideration.

In contrast, in a case where the process disclosed in Patent Literature 2 is used when the MEMS device disclosed in Patent Literature 1 is prepared, an optical element such as a movable mirror is bonded by reflow of a bond pad and mounted in a movable mounting region which is connected to an actuator. In this case, there is concern that bonding of a bond pad may adversely affect driving of the mounting region. Therefore, there are cases where the process disclosed in Patent Literature 1 may not be able to be applied, depending on the characteristics of a mounting region of an optical element.

An object of an aspect of the present disclosure is to provide a light module in which an optical element can be reliably mounted regardless of characteristics of a mounting region.

Solution to Problem

According to an aspect of the present disclosure, there is provided a light module including an optical element, and a base on which the optical element is mounted. The optical element has an optical portion which has an optical surface, an elastic portion which is provided around the optical portion such that an annular region is formed, and a pair of support portions which is provided such that the optical portion is sandwiched in a first direction along the optical surface and in which an elastic force is applied and a distance therebetween is able to be changed in accordance with elastic deformation of the elastic portion. The base has a main surface, and a mounting region in which an opening communicating with the main surface is provided. The support portions are inserted into the opening in a state where an elastic force of the elastic portion is applied. The optical element is supported in the mounting region by a reaction force of the elastic force applied from an inner surface of the opening to the support portions in a state where the optical surface intersects the main surface.

In this light module, the optical element has the elastic portion, and the pair of support portions in which the distance therebetween is able to be changed in accordance with elastic deformation of the elastic portion. Meanwhile, the opening communicating with the main surface is formed in the mounting region of the base on which the optical element is mounted. Therefore, as an example, when the support portions are inserted into the opening in a state where the elastic portion is elastically deformed such that the distance between the support portions is decreased, and when elastic deformation of the elastic portion is partially released, the distance between the support portions increases inside the opening, and then the support portions can be brought into contact with the inner surface of the opening. Accordingly, the optical element is supported by a reaction force applied from the inner surface of the opening to the support portions. In this manner, in this light module, the optical element is mounted on the base using an elastic force. Therefore, it is possible to reliably mount the optical element without taking an adverse influence of a bonding agent or the like into consideration, that is, regardless of characteristics of the mounting region.

In this optical element, the elastic portion is provided such that the annular region is formed. Therefore, for example, compared to a case where the elastic portion is in a cantilever state (in this case, a closed region such as an annular shape is not formed by the elastic portion), the strength of the elastic portion is improved. Therefore, for example, damage to the elastic portion can be curbed when manufacturing or handling the optical element. That is, in regard to an optical element, another object of the aspect of the present disclosure is to provide an optical element in which damage to the elastic portion can be curbed.

In the light module according to the aspect of the present disclosure, the base may have a support layer and a device layer which is provided on the support layer and includes the main surface and the mounting region. The opening may penetrate the device layer in a direction intersecting the main surface. The support portion may include an interlock portion which is bent to come into contact with a pair of edge portions of the opening in a direction intersecting the main surface. In this case, the interlock portion is interlocked with the mounting region at a position where the interlock portion comes into contact with the pair of edge portions of the opening. Therefore, it is possible to reliably mount the optical element on the base and to positionally align the optical element in a direction intersecting the main surface of the base.

In the light module according to the aspect of the present disclosure, the inner surface of the opening may include a pair of inclined surfaces which is inclined such that a distance therebetween increases from one end toward the other end when viewed in a direction intersecting the main surface, and a reference surface which extends along a reference line connecting the other end of one inclined surface and the other end of the other inclined surface to each other. In this case, when the support portions are inserted into the opening and an elastic deformation of the elastic portion is partially released, the support portions can slide on the inclined surfaces and can abut the reference surface due to an elastic force. Therefore, it is possible to positionally align the optical element in a direction along the main surface.

In the light module according to the aspect of the present disclosure, the optical element may have a first connecting portion which connects the optical portion and the elastic portion to each other. In this manner, the optical portion may be connected to the elastic portion.

In the light module according to the aspect of the present disclosure, the elastic portion may form the annular region, which is formed in an annular shape such that the optical portion is surrounded when viewed in a second direction intersecting the optical surface. In this case, since the elastic portion has no end portion, it is possible to reliably improve the strength of the elastic portion.

In the light module according to the aspect of the present disclosure, the support portion may include a second connecting portion which is connected to the elastic portion, and a leg portion which extends over the optical surface from the second connecting portion along the optical surface and in a third direction intersecting the first direction and is inserted into the opening. In this case, it is possible to mount the optical element on the base in a state where the optical surface in its entirety protrudes on the main surface.

The light module according to the aspect of the present disclosure may further include a fixed mirror which is mounted in the support layer, the device layer, or an intermediate layer; and a beam splitter which is mounted in the support layer, the device layer, or the intermediate layer. The optical element may be a movable mirror which includes the optical surface serving as a mirror surface. The device layer may have a driving region which is connected to the mounting region. The movable mirror, the fixed mirror, and the beam splitter may be disposed such that an interference optical system is constituted. In this case, it is possible to obtain an FTIR having improved sensitivity. In addition, here, the mounting region, in which the movable mirror is mounted, is characterized by being connected to the driving region and being driven. Therefore, since the mounting region is likely to be adversely affected by a bonding agent or the like, the foregoing configuration becomes more effective.

In the light module according to the aspect of the present disclosure, the base may have the intermediate layer which is provided between the support layer and the device layer. The support layer may be a first silicon layer of an SOI substrate. The device layer may be a second silicon layer of the SOI substrate. The intermediate layer may be an insulating layer of the SOI substrate. In this case, it is possible to favorably realize a configuration for reliable mounting of the movable mirror with respect to the device layer using the SOI substrate.

The light module according to the aspect of the present disclosure may further include a light incident unit which is disposed such that measurement light is incident on the interference optical system from outside, and a light emission unit which is disposed such that the measurement light is emitted from the interference optical system to the outside. In this case, it is possible to obtain an FTIR including a light incident unit and a light emission unit.

Advantageous Effects of Invention

According to the aspect of the present disclosure, it is possible to provide a light module in which an optical element can be reliably mounted regardless of characteristics of a mounting region.

DESCRIPTION OF EMBODIMENTS

First Embodiment

Hereinafter, an embodiment of an aspect of the present disclosure will be described in detail with reference to the drawings. The same reference signs are applied to parts which are the same or corresponding in each of the drawings, and duplicated parts will be omitted.

[Configuration of Light Module]

Figure 1:
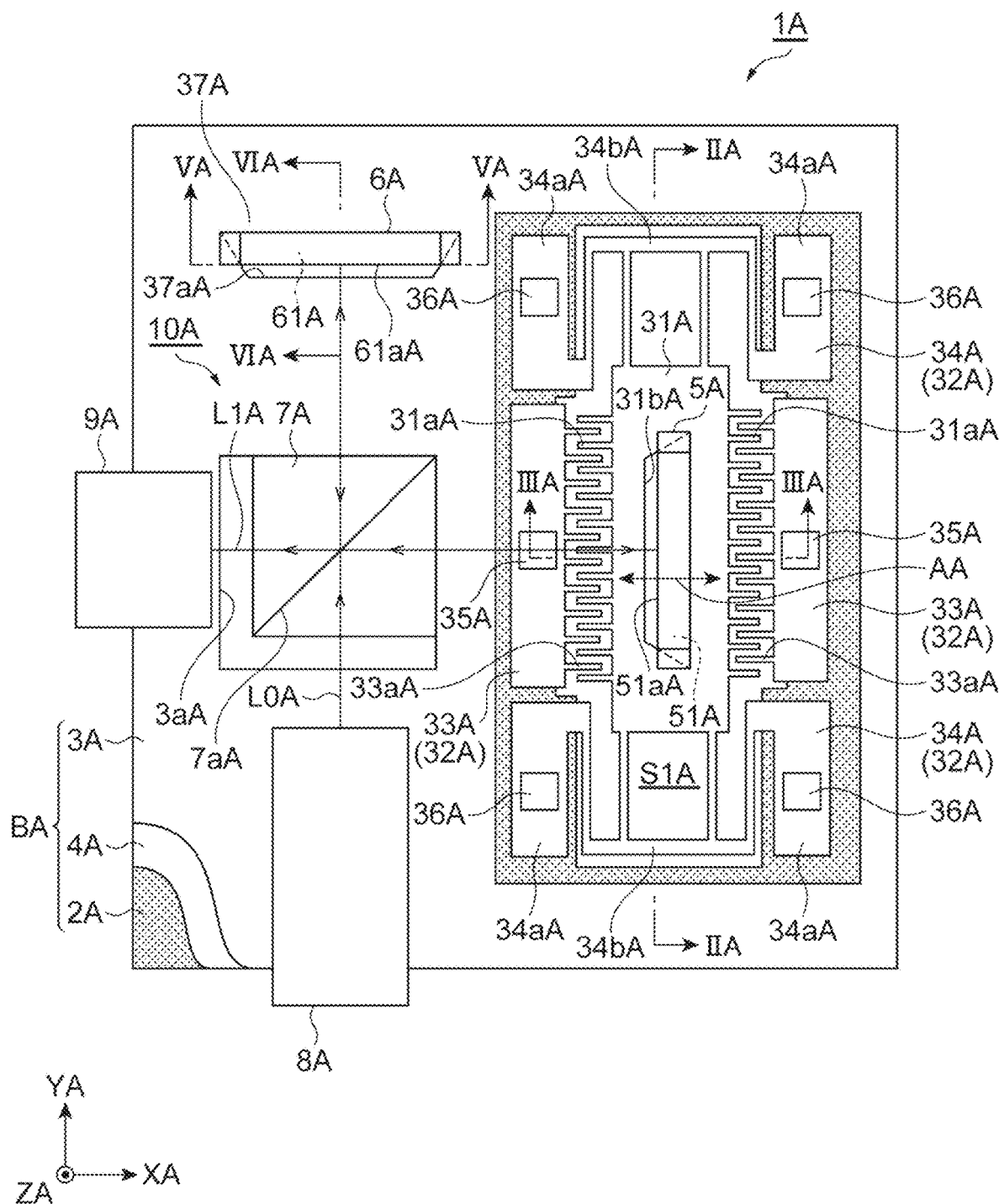
FIG. 1 is a plan view of a light module of an embodiment.

As illustrated in FIG. 1, a light module 1A includes a base BA. The base BA includes a main surface BsA. The base BA includes a support layer 2A, a device layer 3A which is provided on the support layer 2A, and an intermediate layer 4A which is provided between the support layer 2A and the device layer 3A. Here, the main surface BsA is a surface of the device layer 3A on a side opposite to the support layer 2A. The support layer 2A, the device layer 3A, and the intermediate layer 4A are constituted of an SOI substrate. Specifically, the support layer 2A is a first silicon layer of the SOI substrate. The device layer 3A is a second silicon layer of the SOI substrate. The intermediate layer 4A is an insulating layer of the SOI substrate. The support layer 2A, the device layer 3A, and the intermediate layer 4A have a rectangular shape of which one side is approximately 10 mm, for example, when viewed in a ZA-axis direction (direction parallel to a ZA-axis) that is a laminating direction thereof. The thickness of each of the support layer 2A and the device layer 3A is approximately several hundreds of μm, for example. The thickness of the intermediate layer 4A is approximately several μm, for example. FIG. 1 illustrates the device layer 3A and the intermediate layer 4A in a state where one corner portion of the device layer 3A and one corner portion of the intermediate layer 4A are cut out.

The device layer 3A has a mounting region 31A and a driving region 32A which is connected to the mounting region 31A. The driving region 32A includes a pair of actuator regions 33A and a pair of elastic support regions 34A. The mounting region 31A and the driving region 32A (that is, the mounting region 31A, the pair of actuator regions 33A, and the pair of elastic support regions 34A) are integrally formed in a portion of the device layer 3A by a MEMS technology (patterning and etching).

The actuator regions 33A of the pair are disposed on both sides of the mounting region 31A in an XA-axis direction (direction parallel to an XA-axis orthogonal to the ZA-axis). That is, the mounting region 31A is sandwiched between the actuator regions 33A of the pair in the XA-axis direction. Each of the actuator regions 33A is fixed to the support layer 2A with the intermediate layer 4A. A first comb-teeth portion 33aA is provided on a side surface of each of the actuator regions 33A on the mounting region 31A side. Each of the first comb-teeth portions 33aA is in a state of being floated with respect to the support layer 2A by removing the intermediate layer 4A immediately below thereof. The actuator regions 33A are provided with a first electrode 35A.

The elastic support regions 34A of the pair are disposed on both sides of the mounting region 31A in a YA-axis direction (direction parallel to a YA-axis orthogonal to the ZA-axis and the XA-axis). That is, the mounting region 31A is sandwiched between the elastic support regions 34A of the pair in the YA-axis direction. Both end portions 34aA of each of the elastic support regions 34A are fixed to the support layer 2A with the intermediate layer 4A. An elastic deformation portion 34bA (part between both the end portions 34aA) of each of the elastic support regions 34A has a structure in which a plurality of leaf springs are connected. The elastic deformation portion 34bA of each of the elastic support regions 34A is in a state of being floated with respect to the support layer 2A by removing the intermediate layer 4A immediately below thereof. Each of both the end portions 34aA is provided with a second electrode 36A in each of the elastic support regions 34A.

The elastic deformation portion 34bA of each of the elastic support regions 34A is connected to the mounting region 31A. The mounting region 31A is in a state of being floated with respect to the support layer 2A by removing the intermediate layer 4A immediately below thereof. That is, the mounting region 31A is supported by the pair of elastic support regions 34A. Second comb-teeth portions 31aA are provided on side surfaces of the mounting region 31A on the actuator region 33A side. Each of the second comb-teeth portions 31aA is in a state of being floated with respect to the support layer 2A by removing the intermediate layer 4A immediately below thereof. In the first comb-teeth portions 33aA and the second comb-teeth portions 31aA facing each other, each comb tooth of the first comb-teeth portions 33aA is positioned between comb teeth of the second comb-teeth portions 31aA.

The elastic support regions 34A of the pair sandwich the mounting region 31A from both sides with respect to a direction AA parallel to the XA-axis. When the mounting region 31A moves along the direction AA, the pair of elastic support regions 34A causes an elastic force to act on the mounting region 31A such that the mounting region 31A returns to the initial position. Therefore, when a voltage is applied to a part between the first electrode 35A and the second electrode 36A, and an electrostatic attraction acts between the first comb-teeth portions 33aA and the second comb-teeth portions 31aA facing each other, the mounting region 31A moves along the direction AA to a position where the electrostatic attraction and the elastic force of the pair of elastic support regions 34A is balanced. In this manner, the driving region 32A functions as an electrostatic actuator.

The light module 1A further includes a movable mirror 5A, a fixed mirror 6A, a beam splitter 7A, a light incident unit 8A, and a light emission unit 9A. The movable mirror 5A, the fixed mirror 6A, and the beam splitter 7A are disposed on the device layer 3A such that an interference optical system 10A (Michelson interference optical system) is constituted.

The movable mirror 5A is mounted in the mounting region 31A of the device layer 3A on one side of the beam splitter 7A in the XA-axis direction. A mirror surface 51aA of a mirror portion 51A included in the movable mirror 5A is positioned on a side opposite to the support layer 2A with respect to the device layer 3A. For example, the mirror surface 51aA is a surface perpendicular to the XA-axis direction (that is, a surface perpendicular to the direction AA) and is directed to the beam splitter 7A side.

The fixed mirror 6A is mounted in a mounting region 37A of the device layer 3A on one side of the beam splitter 7A in the YA-axis direction. A mirror surface 61aA of a mirror portion 61A included in the fixed mirror 6A is positioned on a side opposite to the support layer 2A with respect to the device layer 3A. For example, the mirror surface 61aA is a surface perpendicular to the YA-axis direction and is directed to the beam splitter 7A side.

The light incident unit 8A is mounted in the device layer 3A on the other side of the beam splitter 7A in the YA-axis direction. For example, the light incident unit 8A is constituted of optical fibers, a collimating lens, and the like. The light incident unit 8A is disposed such that measurement light is incident on the interference optical system 10A from outside.

The light emission unit 9A is mounted in the device layer 3A on the other side of the beam splitter 7A in the XA-axis direction. For example, the light emission unit 9A is constituted of optical fibers, a collimating lens, and the like. The light emission unit 9A is disposed such that measurement light (interference light) is emitted from the interference optical system 10A to the outside.

The beam splitter 7A is a cube-type beam splitter having an optical functional surface 7aA. The optical functional surface 7aA is positioned on a side opposite to the support layer 2A with respect to the device layer 3A. The beam splitter 7A is positionally aligned when one corner portion of the beam splitter 7A on a bottom surface side is brought into contact with one corner of a rectangular opening 3aA formed in the device layer 3A. The beam splitter 7A is mounted in the support layer 2A by being fixed to the support layer 2A through bonding or the like in a positionally aligned state.

In the light module 1A having a configuration described above, when measurement light L0A is incident on the interference optical system 10A from outside via the light incident unit 8A, a portion of the measurement light L0A is reflected by the optical functional surface 7aA of the beam splitter 7A and travels toward the movable mirror 5A, and the remaining portion of the measurement light L0A is transmitted through the optical functional surface 7aA of the beam splitter 7A and travels toward the fixed mirror 6A. A portion of the measurement light L0A is reflected by the mirror surface 51aA of the movable mirror 5A, travels toward the beam splitter 7A along the same optical path, and is transmitted through the optical functional surface 7aA of the beam splitter 7A. The remaining portion of the measurement light L0A is reflected by the mirror surface 61aA of the fixed mirror 6A, travels toward the beam splitter 7A along the same optical path, and is reflected by the optical functional surface 7aA of the beam splitter 7A. A portion of the measurement light L0A which has been transmitted through the optical functional surface 7aA of the beam splitter 7A, and the remaining portion of the measurement light L0A which has been reflected by the optical functional surface 7aA of the beam splitter 7A become measurement light L1A which is interference light. The measurement light L1A is emitted from the interference optical system 10A to the outside via the light emission unit 9A. According to the light module 1A, since the movable mirror 5A can reciprocate along the direction AA at a high speed, it is possible to provide a small-sized FTIR having high accuracy.

[Movable Mirror and Surrounding Structure Thereof]

Figure 2:
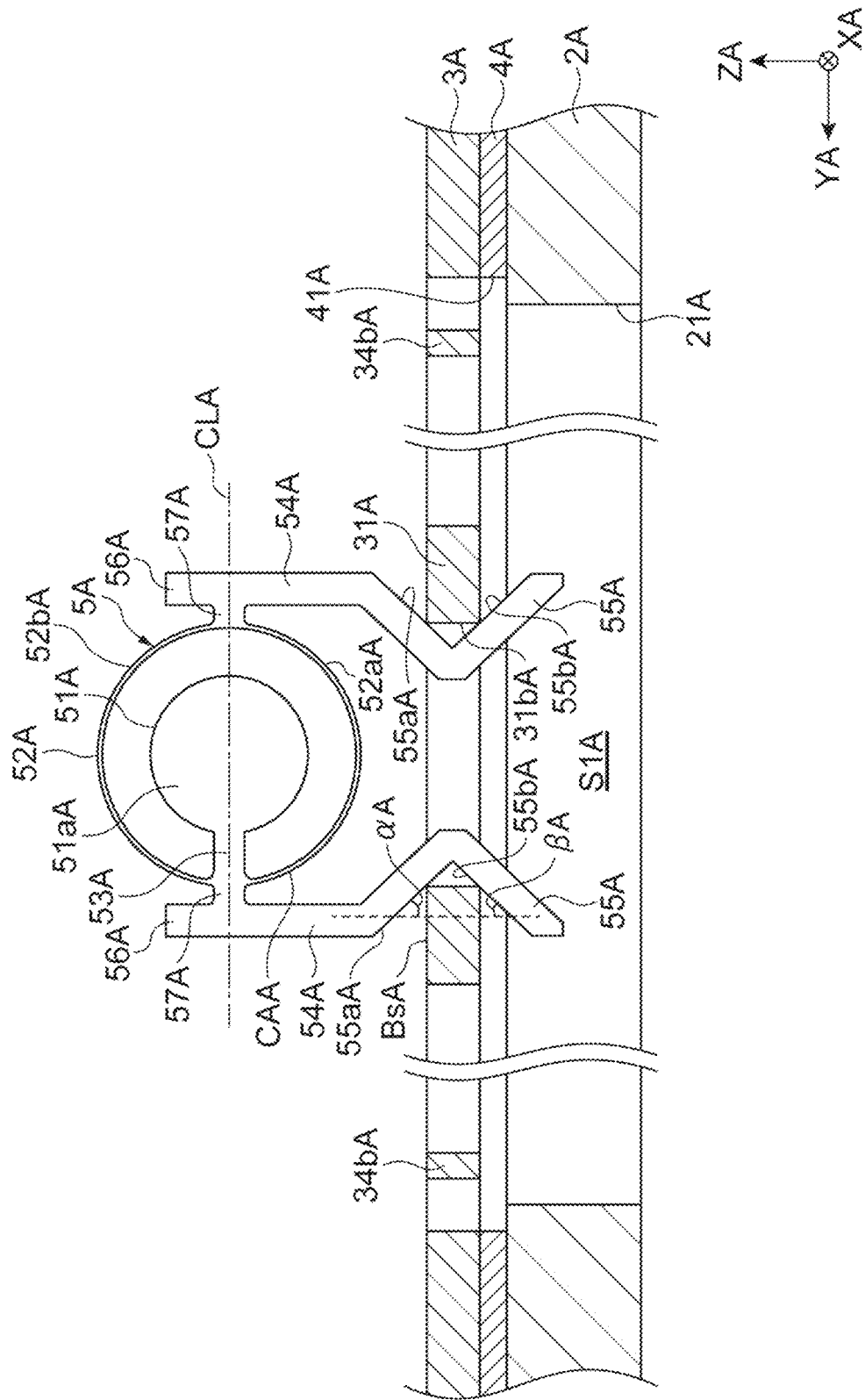
FIG. 2 is a cross-sectional view taken along line IIA-IIA illustrated in FIG. 1.
Figure 3:
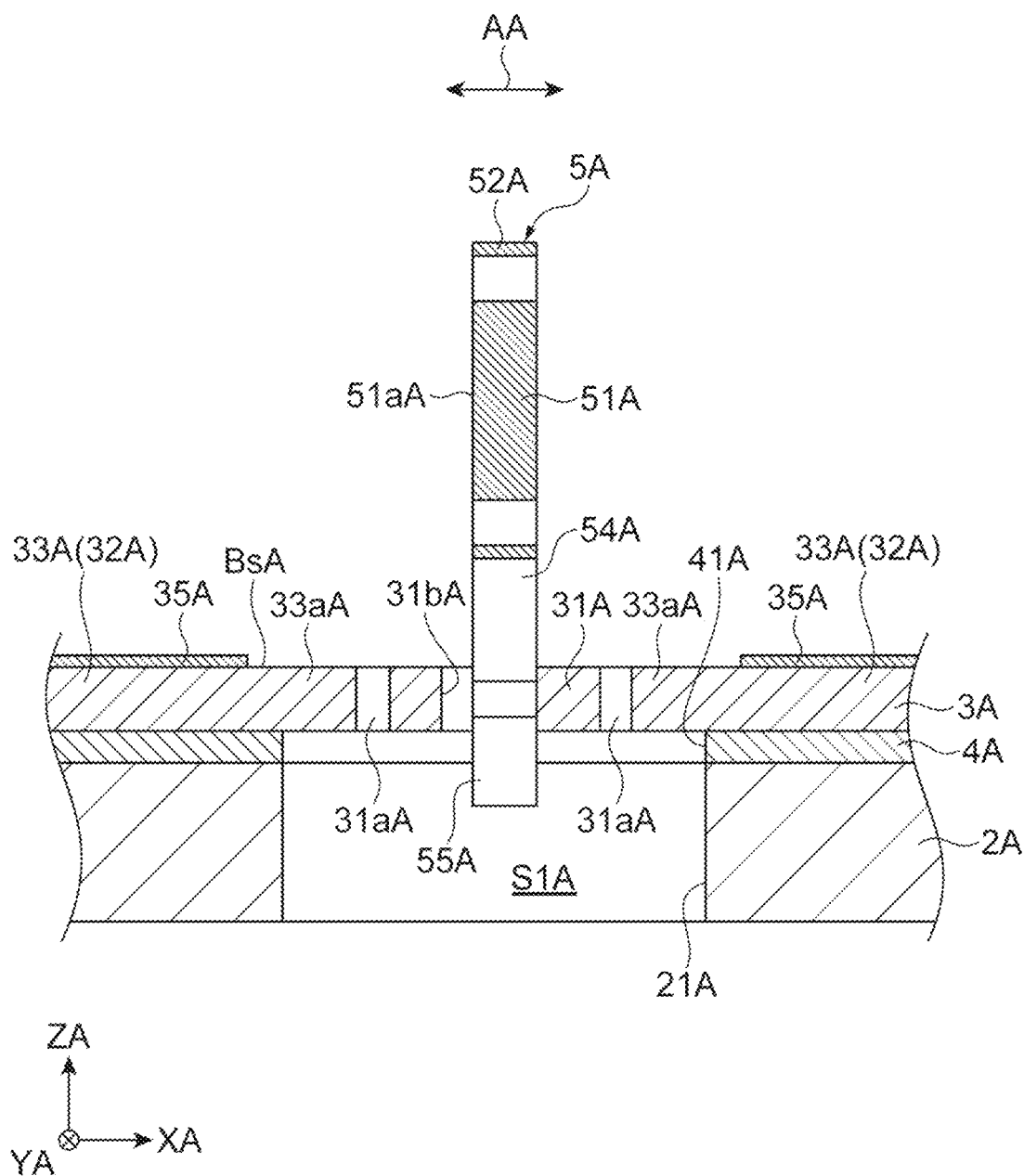
FIG. 3 is a cross-sectional view taken along line IIIA-IIIA illustrated in FIG. 1.
Figure 4:
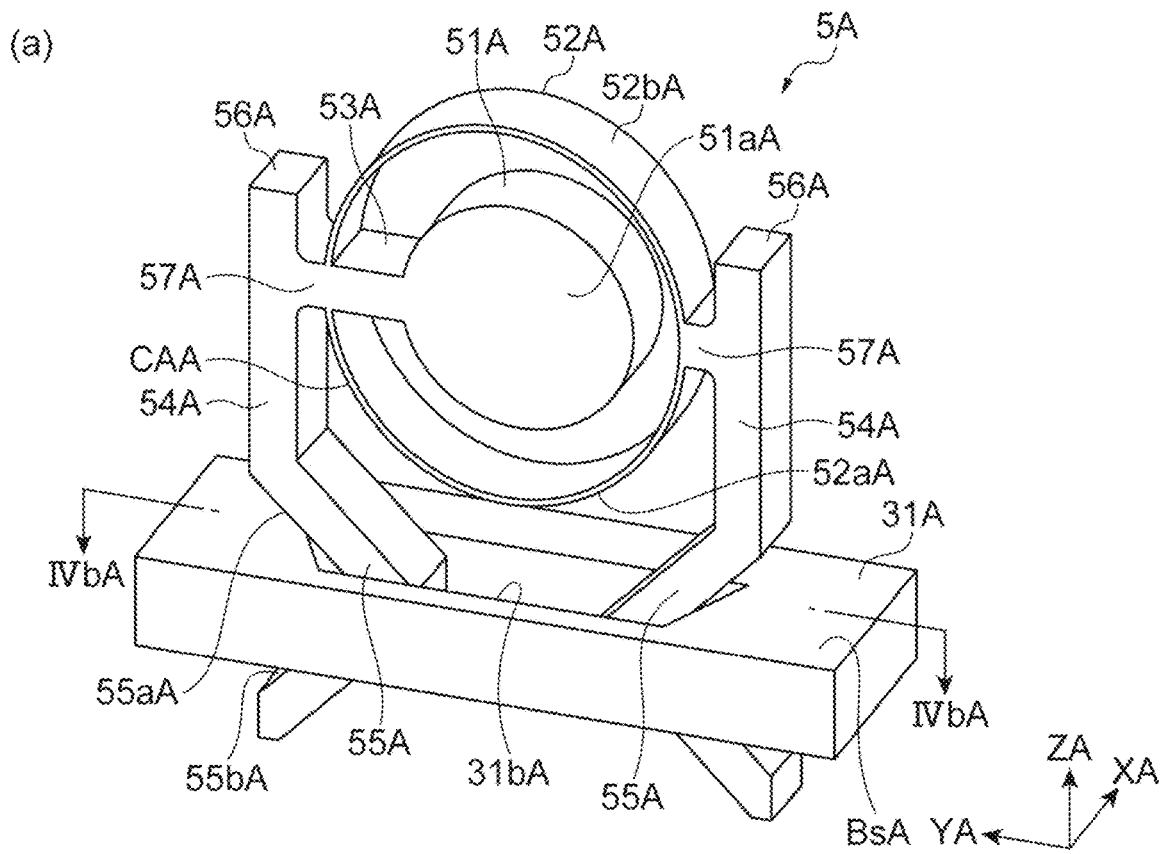
FIG. 4(*a*) is a perspective view of a surrounding structure of a movable mirror illustrated in FIG. 1, and FIG. 4(*b*) is a cross-sectional view taken along line IVbA-IVbA illustrated in FIG. 4(*a*).
Figure 4:
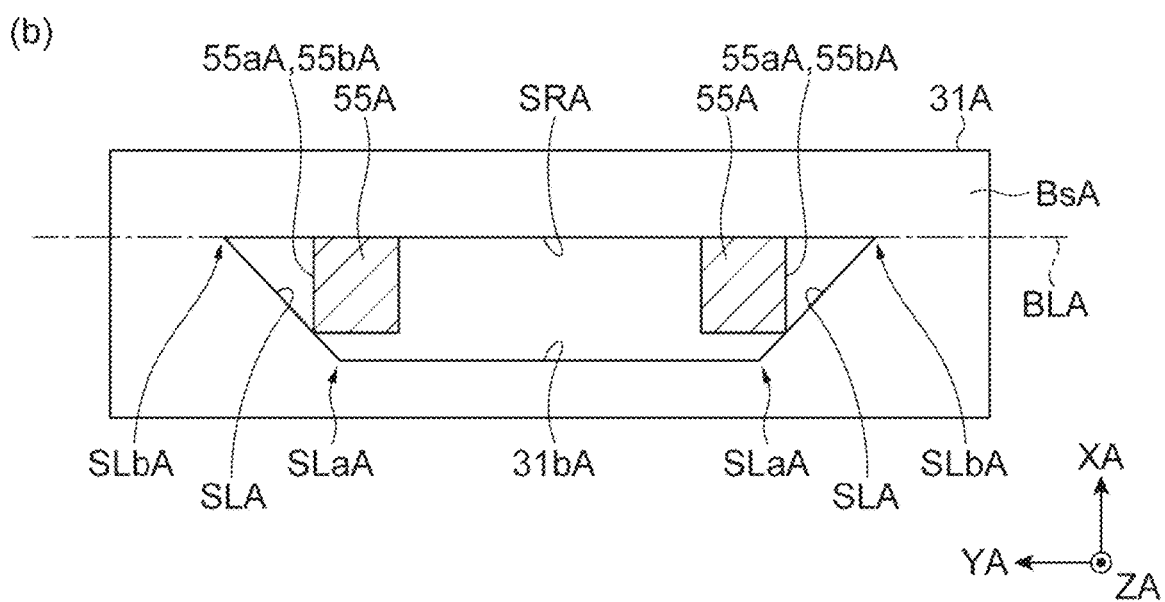

As illustrated in FIGS. 2, 3, and 4, the movable mirror (optical element) 5A has the mirror portion (optical portion) 51A which has the mirror surface (optical surface) 51aA, an annular elastic portion 52A, a connecting portion (first connecting portion) 53A which connects the mirror portion 51A and the elastic portion 52A to each other, a pair of support portions 56A, and a pair of connecting portions (second connecting portion) 57A which connects the support portions 56A and the elastic portion 52A each other. The mirror portion 51A is formed to have a disk shape. The mirror surface 51aA is a circular plate surface of the mirror portion 51A. The movable mirror 5A is mounted on the base BA in a state where the mirror surface 51aA intersects (for example, is orthogonal to) the main surface BsA.

The elastic portion 52A is formed to have a circular shape being separated from the mirror portion 51A and surrounding the mirror portion 51A when viewed in a direction (second direction, the XA-axis direction) intersecting the mirror surface 51aA. That is, the elastic portion 52A is provided around the mirror portion 51A and forms an annular region CAA having a circular shape. The connecting portion 53A connects the mirror portion 51A and the elastic portion 52A to each other at the center of the mirror portion 51A in a direction (third direction, the ZA-axis direction) intersecting the main surface BsA. Here, a single connecting portion 53A is provided.

The elastic portion 52A is formed to have a circular plate shape by a semicircular leaf spring 52aA and a semicircular leaf spring 52bA which continues to the leaf spring 52aA. The leaf spring 52aA is a part disposed on the main surface BsA side (leg portion 54A side, which will be described below) of a center line CLA passing through the center of the mirror portion 51A in the ZA-axis direction. The center line CLA is an imaginary straight line extending along a direction (first direction, the YA-axis direction) along the mirror surface 51aA and the main surface BsA. The leaf spring 52bA is a part disposed on a side opposite to the main surface BsA (on a side opposite to the leg portion 54A, which will be described below) of the center line CLA. The spring constant of the leaf spring 52aA and the spring constant of the leaf spring 52bA are equal to each other. That is, the elastic portion 52A has a symmetrical shape with respect to the center line CLA, and the elastic portion 52A has equal spring constants on both sides of the center line CLA.

The support portions 56A have a rod shape with a rectangular cross section and are provided such that the mirror portion 51A and the elastic portion 52A are sandwiched therebetween in the YA-axis direction. The support portion 56A is connected to the elastic portion 52A through the connecting portion 57A at a position corresponding to the connecting portion 53A in the YA-axis direction. Therefore, when a force is applied to the support portions 56A such that the support portions 56A are sandwiched from both sides in the YA-axis direction at positions corresponding to the connecting portions 57A, for example, the elastic portion 52A can be elastically deformed to be compressed in the YA-axis direction. That is, the distance between the support portions 56A along the YA-axis direction can be changed in accordance with elastic deformation of the elastic portion 52A. In addition, an elastic force of the elastic portion 52A can be applied to the support portions 56A. Here, the pair of connecting portions 57A and the connecting portion 53A are arranged in a row on the center line CLA.

The support portion 56A includes the leg portion 54A. The leg portion 54A in its entirety extends to one side (here, the main surface BsA side) of the mirror surface 51aA over the mirror surface 51aA from the connecting portion 57A along the ZA-axis direction. The leg portion 54A includes an interlock portion 55A. The interlock portion 55A is a part of the leg portion 54A on a distal end side. The interlock portion 55A in its entirety is bent in a V-shape. The interlock portion 55A includes an inclined surface 55aA and an inclined surface 55bA. The inclined surface 55aA and the inclined surface 55bA are surfaces (outer surfaces) of a pair of interlock portions 55A on sides opposite to surfaces facing each other.

The inclined surfaces 55aA are inclined toward each other in a direction (negative ZA-axis direction) away from the connecting portions 57A between the interlock portions 55A of the pair. The inclined surfaces 55bA are inclined away from each other in the negative ZA-axis direction. When viewed in the XA-axis direction, the absolute value for an inclination angle αA of the inclined surface 55aA with respect to the ZA-axis is smaller than 90°. Similarly, the absolute value for an inclination angle βA of the inclined surface 55bA is smaller than 90°. Here, as an example, the absolute value for the inclination angle αA and the absolute value for the inclination angle βA are equal to each other.

Here, an opening 31bA is formed in the mounting region 31A. Here, the opening 31bA extends in the ZA-axis direction and penetrates the device layer 3A. Therefore, the opening 31bA communicates with (reaches) the main surface BsA and a surface of the device layer 3A on a side opposite to the main surface BsA. The opening 31bA exhibits a pillar shape in which a shape when viewed in the ZA-axis direction is a trapezoidal shape (refer to FIG. 4). The opening 31bA will be described below in detail.

The support portions 56A are inserted into this opening 31bA in a state where an elastic force of the elastic portion 52A is applied. In other words, the support portions 56A (that is, the movable mirror 5A) penetrate the mounting region 31A via the opening 31bA. More specifically, a portion of the interlock portion 55A of the support portion 56A is positioned inside the opening 31bA. In this state, the interlock portions 55A come into contact with a pair of edge portions (an edge portion on the main surface BsA side and an edge portion on a side opposite to the main surface BsA) of the opening 31bA in the ZA-axis direction.

Here, the inclined surfaces 55aA come into contact with the edge portions of the opening 31bA on the main surface BsA side, and the inclined surfaces 55bA come into contact with the edge portions of the opening 31bA on a side opposite to the main surface BsA. Accordingly, the interlock portions 55A are interlocked with the mounting region 31A such that the mounting region 31A is sandwiched therebetween in the ZA-axis direction. As a result, detachment of the movable mirror 5A from the base BA in the ZA-axis direction is curbed.

Here, an opening 41A is formed in the intermediate layer 4A. The opening 41A is open on both sides of the intermediate layer 4A in the ZA-axis direction. An opening 21A is formed in the support layer 2A. The opening 21A is open on both sides of the support layer 2A in the ZA-axis direction. In the light module 1A, a continuous space S1A is constituted of a region inside the opening 41A of the intermediate layer 4A and a region inside the opening 21A of the support layer 2A. That is, the space S1A includes a region inside the opening 41A of the intermediate layer 4A and a region inside the opening 21A of the support layer 2A.

The space S1A is formed between the support layer 2A and the device layer 3A and corresponds to at least the mounting region 31A and the driving region 32A. Specifically, a region inside the opening 41A of the intermediate layer 4A and a region inside the opening 21A of the support layer 2A include a range in which the mounting region 31A moves when viewed in the ZA-axis direction. A region inside the opening 41A of the intermediate layer 4A forms a clearance for causing a part (that is, a part to be floated state with respect to the support layer 2A, for example, the mounting region 31A in its entirety, the elastic deformation portion 34bA of each of the elastic support regions 34A, the first comb-teeth portions 33aA, and the second comb-teeth portions 31aA) of the mounting region 31A and the driving region 32A, which needs to be separated from the support layer 2A, to be separated from the support layer 2A.

A portion of each of the interlock portions 55A included in the movable mirror 5A is positioned in the space S1A. Specifically, a portion of each of the interlock portions 55A is positioned in a region inside the opening 21A of the support layer 2A through a region inside the opening 41A of the intermediate layer 4A. A portion of each of the interlock portions 55A protrudes into the space S1A from a surface of the device layer 3A on the intermediate layer 4A side by approximately 100 µm, for example. As described above, since a region inside the opening 41A of the intermediate layer 4A and a region inside the opening 21A of the support layer 2A include the range in which the mounting region 31A moves when viewed in the ZA-axis direction, a portion of each of the interlock portions 55A of the movable mirror 5A positioned in the space S1A does not come into contact with the intermediate layer 4A and the support layer 2A when the mounting region 31A reciprocates along the direction AA.

Here, as illustrated in FIG. 4, an inner surface of the opening 31bA includes a pair of inclined surfaces SLA and a reference surface SRA. The inclined surface SLA includes one end SLaA and the other end SLbA. The one end SLaA and the other end SLbA are both end portions of the inclined surface SLA when viewed in the ZA-axis direction. The inclined surfaces SLA of the pair are inclined such that the distance therebetween increases from the one end SLaA toward the other end SLbA (for example, with respect to the XA-axis). When viewed in the ZA-axis direction, the reference surface SRA extends along a reference line BLA connecting the other end SLbA of one inclined surface SLA and the other end SLbA of the other inclined surface SLA to each other. Here, the reference surface SRA simply connects the other ends SLbA to each other. As described above, the shape of the opening 31bA when viewed in the ZA-axis direction is a trapezoidal shape. Therefore, here, the inclined surfaces SLA correspond to legs of the trapezoidal shape, and the reference surface SRA corresponds to a bottom base of the trapezoidal shape.

Here, the opening 31bA is a single space. The minimum value for the size (that is, the gap between the one ends SLaA of the inclined surfaces SLA) of the opening 31bA in the YA-axis direction is a value allowing the pair of interlock portions 55A to be collectively disposed inside the opening 31bA when the elastic portion 52A is elastically deformed to be compressed along the YA-axis direction. Meanwhile, the maximum value for the size (that is, the gap between the other ends SLbA of the inclined surfaces SLA) of the opening 31bA in the YA-axis direction is a value allowing only a portion of elastic deformation of the elastic portion 52A to be released (that is, the elastic portion 52A does not reach the natural length) when the pair of interlock portions 55A is disposed in the opening 31bA.

Therefore, when the pair of interlock portions 55A is disposed inside the opening 31bA, the interlock portions 55A press the inner surface of the opening 31bA due to an elastic force of the elastic portion 52A, and a reaction force from the inner surface of the opening 31bA is applied to the interlock portions 55A (support portions 56A). Accordingly, in a state where the mirror surface 51aA intersects (for example, is orthogonal to) the main surface BsA, the movable mirror 5A is supported in the mounting region 31A by a reaction force of an elastic force applied from the inner surface of the opening 31bA to the support portions 56A.

Particularly, the interlock portions 55A are brought into contact with the inclined surfaces SLA of the opening 31bA. Therefore, the interlock portions 55A slide on the inclined surfaces SLA toward the reference surface SRA due to a component of a reaction force from the inclined surfaces SLA in the XA-axis direction and abut the reference surface SRA while being in contact with the inclined surfaces SLA. Accordingly, the interlock portions 55A come into internal contact with the corner portions defined by the inclined surfaces SLA and the reference surface SRA and are positionally aligned (self-aligned due to an elastic force) in both the XA-axis direction and the YA-axis direction. Here, since the interlock portions 55A have a quadrangular cross-sectional shape, the inclined surfaces SLA come into point contact with the interlock portions 55A and the reference surface SRA comes into line contact with the interlock portions 55A when viewed in the ZA-axis direction. That is, here, the inner surface of the opening 31bA comes into contact with the pair of interlock portions 55A at two points and along two lines when viewed in the ZA-axis direction.

Meanwhile, as illustrated in FIG. 2, when viewed in the XA-axis direction, a reaction force of an elastic force is also applied to the interlock portions 55A from the inner surface of the opening 31bA at the edge portions of the opening 31bA. When the movable mirror 5A is mounted, there are cases where a reaction force is applied to either the inclined surfaces 55aA or the inclined surfaces 55bA of the interlock portions 55A. In these cases, either the inclined surfaces 55aA or the inclined surfaces 55bA slide on the edge portions due to a component of a reaction force along the inclined surfaces 55aA or the inclined surfaces 55bA and move along the ZA-axis direction to reach positions (that is, positions where the mounting region 31A is sandwiched therebetween in the ZA-axis direction) where both the inclined surfaces 55aA and the inclined surfaces 55bA come into contact with the edge portions. Accordingly, the interlock portions 55A are interlocked at the positions, and the movable mirror 5A is positionally aligned (self-aligned due to an elastic force) in the ZA-axis direction. That is, the movable mirror 5A is self-aligned in a three-dimensional manner utilizing an elastic force of the elastic portion 52A.

The movable mirror 5A described above is integrally formed by a MEMS technology (patterning and etching), for example. Therefore, the thickness (size in a direction intersecting the mirror surface 51aA) of the movable mirror 5A is uniform in each portion. For example, the thickness thereof is approximately 320 µm. In addition, the diameter of the mirror surface 51aA is approximately 1 mm, for example. Moreover, the gap between a surface (inner surface) of the elastic portion 52A on the mirror portion 51A side and a surface (outer surface) of the mirror portion 51A on the elastic portion 52A side is approximately 200 µm, for example. The thickness of the elastic portion 52A (thickness of the leaf spring) is within a range of approximately 10 µm to 20 µm, for example.

[Fixed Mirror and Surrounding Structure Thereof]

Figure 5:
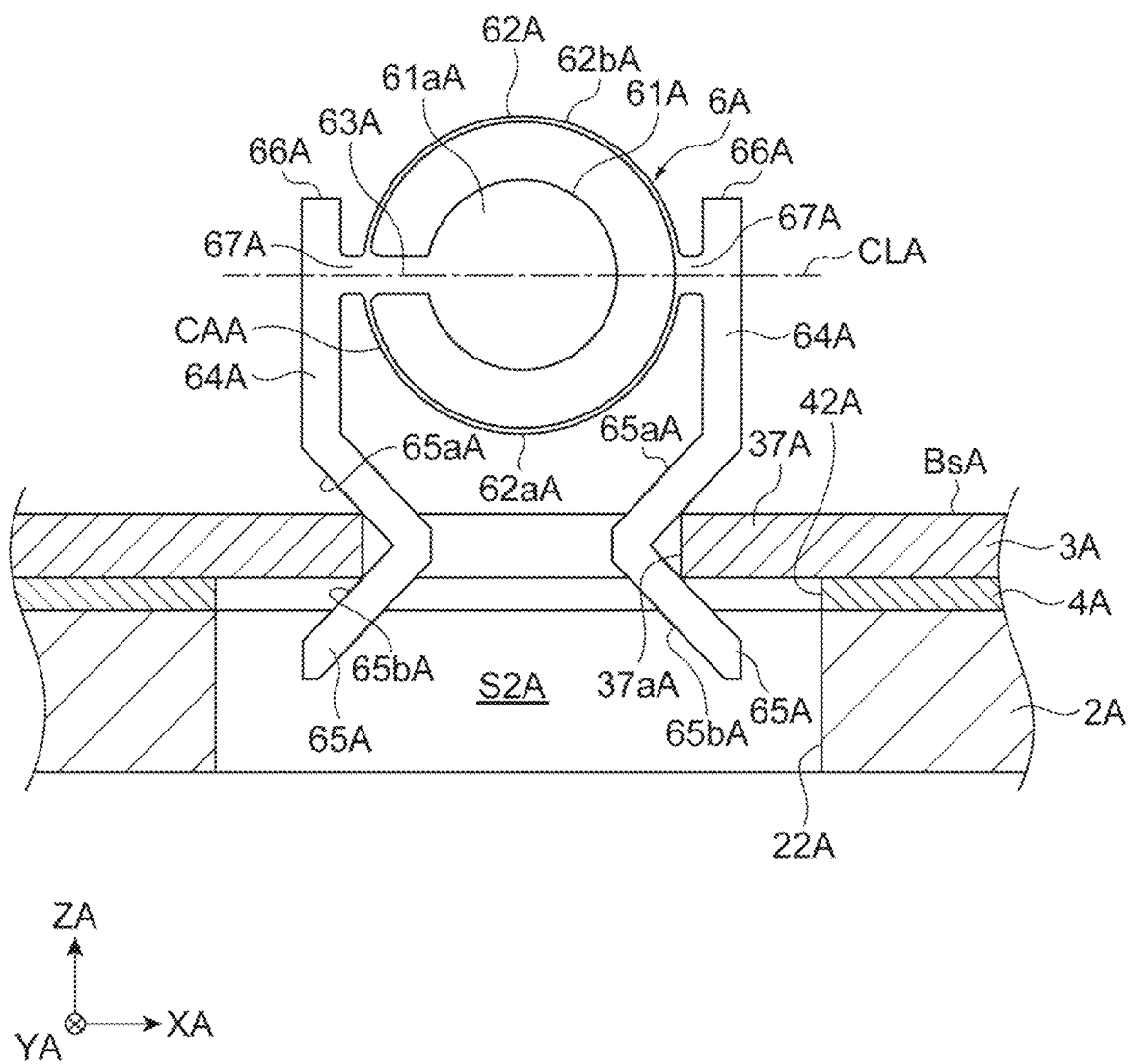
FIG. 5 is a cross-sectional view taken along line VA-VA illustrated in FIG. 1.
Figure 6:
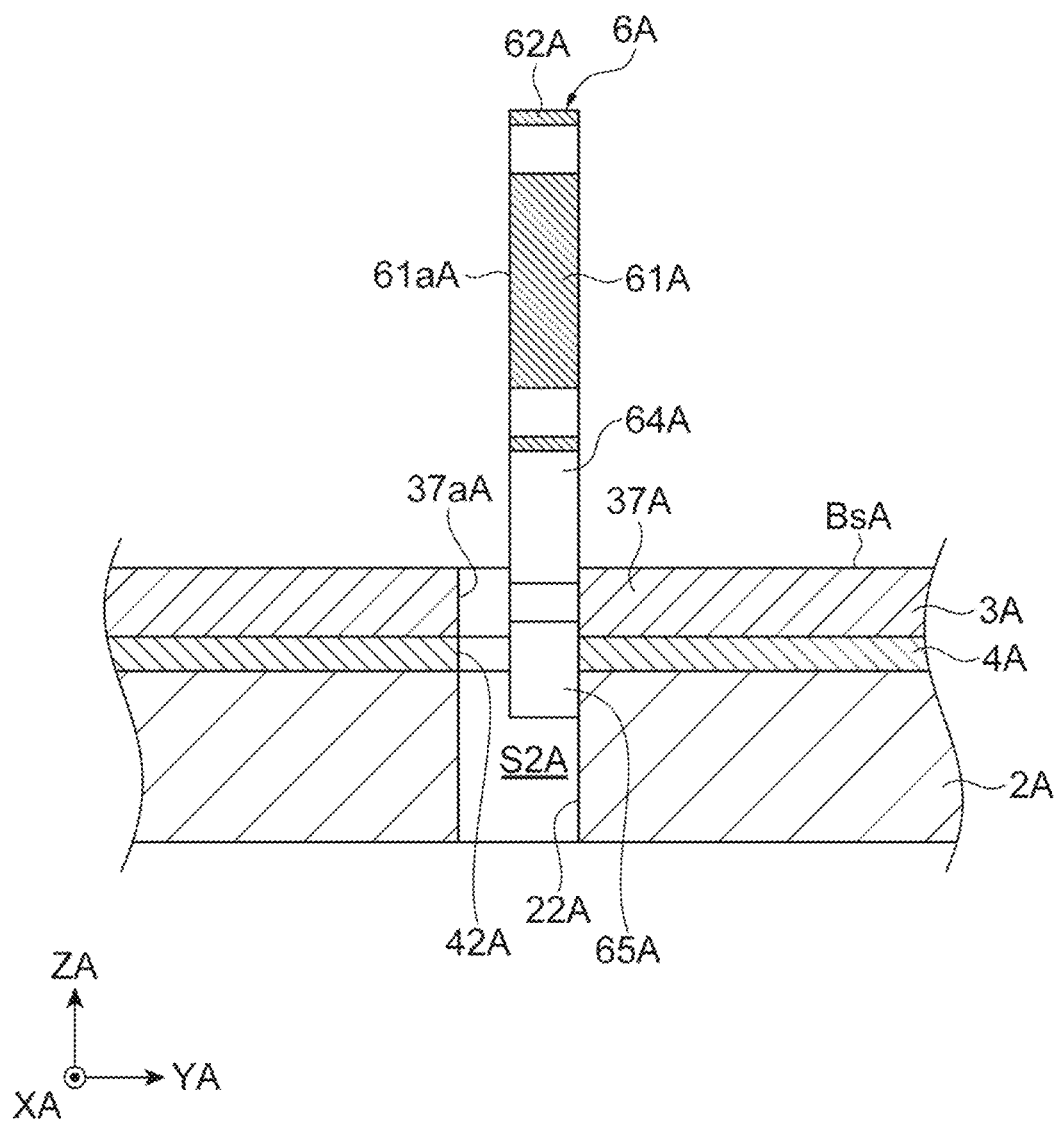
FIG. 6 is a cross-sectional view taken along line VIA-VIA illustrated in FIG. 1.

The fixed mirror 6A and the surrounding structure thereof are similar to the foregoing movable mirror 5A and the surrounding structure thereof, except that the mounting region is not movable. That is, as illustrated in FIGS. 5 and 6, the fixed mirror (optical element) 6A has the mirror portion (optical portion) 61A which has the mirror surface (optical surface) 61aA, an annular elastic portion 62A, a connecting portion (first connecting portion) 63A which connects the mirror portion 61A and the elastic portion 62A to each other, a pair of support portions 66A, and a pair of connecting portions (second connecting portion) 67A which connects the support portions 66A and the elastic portion 62A to each other. The mirror portion 61A is formed to have a disk shape. The mirror surface 61aA is a circular plate surface of the mirror portion 61A. The fixed mirror 6A is mounted on the base BA in a state where the mirror surface 61aA intersects (for example, is orthogonal to) the main surface BsA of the base BA.

The elastic portion 62A is formed to have a circular shape being separated from the mirror portion 61A and surrounding the mirror portion 61A when viewed in a direction (second direction, the YA-axis direction) intersecting the mirror surface 61aA. Therefore, the elastic portion 62A is provided around the mirror portion 61A and forms the annular region CAA having a circular shape. The connecting portion 63A connects the mirror portion 61A and the elastic portion 62A to each other at the center of the mirror portion 61A in a direction (third direction, the ZA-axis direction) intersecting the main surface BsA. Here, a single connecting portion 63A is provided.

The elastic portion 62A is formed to have a circular plate shape by a semicircular leaf spring 62aA and a semicircular leaf spring 62bA which continues to the leaf spring 62aA. The leaf spring 62aA is a part disposed on the main surface BsA side (leg portion 64A side, which will be described below) of the center line CLA passing through the center of the mirror portion 61A in the ZA-axis direction. The center line CLA is an imaginary straight line extending in a direction (first direction, the XA-axis direction) along the mirror surface 61aA and the main surface BsA. The leaf spring 62bA is a part disposed on a side opposite to the main surface BsA (on a side opposite to the leg portion 64A, which will be described below) of the center line CLA. The spring constant of the leaf spring 62aA and the spring constant of the leaf spring 62bA are equal to each other. That is, the elastic portion 62A has a symmetrical shape with respect to the center line CLA, and the elastic portion 62A has equal spring constants on both sides of the center line CLA.

The support portions 66A have a rod shape with a rectangular cross section and are provided such that the mirror portion 61A and the elastic portion 62A are sandwiched therebetween in the XA-axis direction. The support portion 66A is connected to the elastic portion 62A through the connecting portion 67A at a position corresponding to the connecting portion 63A along the YA-axis direction. Therefore, when a force is applied to the support portions 66A such that the support portions 66A are sandwiched from both sides in the XA-axis direction at positions corresponding to the connecting portions 67A, for example, the elastic portion 62A can be elastically deformed to be compressed in the XA-axis direction. That is, the distance between the support portions 66A along the XA-axis direction can be changed in accordance with elastic deformation of the elastic portion 62A. In addition, an elastic force of the elastic portion 62A can be applied to the support portions 66A. Here, the pair of connecting portions 67A and the connecting portion 63A are arranged in a row along the center line CLA.

The support portion 66A includes the leg portion 64A. The leg portion 64A in its entirety extends to one side (here, the main surface BsA side) of the mirror surface 61aA over the mirror surface 61aA from the connecting portion 67A in the ZA-axis direction. The leg portion 64A includes an interlock portion 65A. The interlock portion 65A is a part of the leg portion 64A on a distal end side. The interlock portion 65A in its entirety is bent. The interlock portion 65A includes an inclined surface 65aA and an inclined surface 65bA. The inclined surface 65aA and the inclined surface 65bA are surfaces (outer surfaces) of a pair of interlock portions 65A on sides opposite to surfaces facing each other.

The inclined surfaces 65aA are inclined toward each other in a direction (negative ZA-axis direction) away from the connecting portions 67A between the interlock portions 65A of the pair. The inclined surfaces 65bA are inclined away from each other in the negative ZA-axis direction. When viewed in the YA-axis direction, inclination angles of the inclined surfaces 65aA and 65bA with respect to the ZA-axis are similar to those of the inclined surfaces 55aA and 55bA in the movable mirror 5A.

Here, an opening 37aA is formed in the mounting region 37A. Here, the opening 37aA penetrates the device layer 3A in the ZA-axis direction. Therefore, the opening 37aA communicates with (reaches) the main surface BsA and a surface of the device layer 3A on a side opposite to the main surface BsA. Similar to the opening 31bA in the mounting region 31A, the opening 37aA exhibits a pillar shape in which a shape when viewed in the ZA-axis direction is a trapezoidal shape.

The support portions 66A are inserted into this opening 37aA in a state where an elastic force of the elastic portion 62A is applied. In other words, the support portions 66A (that is, the fixed mirror 6A) penetrate the mounting region 37A via the opening 37aA. More specifically, a portion of the interlock portion 65A of the support portion 66A is positioned inside the opening 37aA. In this state, the interlock portions 65A come into contact with a pair of edge portions (an edge portion on the main surface BsA side and an edge portion on a side opposite to the main surface BsA) of the opening 37aA in the ZA-axis direction. Here, the inclined surfaces 65aA come into contact with the edge portions of the opening 37aA on the main surface BsA side, and the inclined surfaces 65bA come into contact with the edge portions of the opening 37aA on a side opposite to the main surface BsA. Accordingly, the interlock portions 65A are interlocked with the mounting region 37A such that the mounting region 37A is sandwiched therebetween in the ZA-axis direction. As a result, detachment of the fixed mirror 6A from the base BA in the ZA-axis direction is curbed.

Here, an opening 42A is formed in the intermediate layer 4A. The opening 42A includes the opening 37aA of the mounting region 37A when viewed in the ZA-axis direction and is open on both sides of the intermediate layer 4A in the ZA-axis direction. An opening 22A is formed in the support layer 2A. The opening 22A includes the opening 37aA of the mounting region 37A when viewed in the ZA-axis direction and is open on both sides of the support layer 2A in the ZA-axis direction. In the light module 1A, a continuous space S2A is constituted of a region inside the opening 42A of the intermediate layer 4A and a region inside the opening 22A of the support layer 2A. That is, the space S2A includes a region inside the opening 42A of the intermediate layer 4A and a region inside the opening 22A of the support layer 2A.

A portion of each of the interlock portions 65A included in the fixed mirror 6A is positioned in the space S2A. Specifically, a portion of each of the interlock portions 65A is positioned in a region inside the opening 22A of the support layer 2A through a region inside the opening 42A of the intermediate layer 4A. A portion of each of the interlock portions 65A protrudes into the space S2A from a surface of the device layer 3A on the intermediate layer 4A side by approximately 100 µm, for example.

Here, an inner surface of the opening 37aA has a configuration similar to the inner surface of the opening 31bA in the mounting region 31A. Therefore, when the pair of interlock portions 65A is disposed inside the opening 37aA, the interlock portions 65A press the inner surface of the opening 37aA due to an elastic force of the elastic portion 62A, and a reaction force from the inner surface of the opening 37aA is applied to the interlock portions 65A (support portions 66A). Accordingly, in a state where the mirror surface 61aA intersects (for example, is orthogonal to) the main surface BsA, the fixed mirror 6A is supported in the base BA by a reaction force of an elastic force applied from the inner surface of the opening 37aA to the support portions 66A. Particularly, similar to the case of the movable mirror 5A, the fixed mirror 6A is also self-aligned in a three-dimensional manner utilizing the inner surface of the opening 37aA and an elastic force.

Similar to the movable mirror 5A, the fixed mirror 6A described above is also integrally formed by a MEMS technology (patterning and etching), for example. The size of each portion of the fixed mirror 6A is similar to the size of each portion of the movable mirror 5A described above, for example.

[Operations and Effects]

In the light module 1A, the movable mirror 5A has the elastic portion 52A, and the pair of support portions 56A in which the distance therebetween is able to be changed in accordance with elastic deformation of the elastic portion 52A. Meanwhile, the opening 31bA communicating with the main surface BsA is formed in the mounting region 31A of the base BA on which the movable mirror 5A is mounted. Therefore, as an example, when the support portions 56A are inserted into the opening 31bA in a state where the elastic portion 52A is elastically deformed such that the distance between the support portions 56A is decreased, and when an elastic deformation of the elastic portion 52A is partially released, the distance between the support portions 56A increases inside the opening 31bA, so that the support portions 56A can be brought into contact with the inner surface of the opening 31bA.

Accordingly, the movable mirror 5A is supported due to a reaction force applied from the inner surface of the opening 31bA to the support portions 56A. In this manner, in this light module 1A, the movable mirror 5A is mounted on the base BA utilizing an elastic force. Therefore, it is possible to reliably mount the optical element without taking an adverse influence of a bonding agent or the like into consideration, that is, regardless of characteristics of the mounting region 31A. Here, operations and effects are described with the movable mirror 5A as an example. However, the fixed mirror 6A also exhibits similar operations and effects.

In addition, in the movable mirror 5A, the elastic portion 52A is provided such that the annular region CAA is formed. Therefore, for example, compared to a case where the elastic portion 52A is in a cantilever state (in this case, a closed region such as an annular shape is not formed by the elastic portion 52A), the strength of the elastic portion 52A is improved. Therefore, for example, damage to the elastic portion 52A can be curbed when manufacturing or handling the movable mirror 5A.

In addition, in the light module 1A, the base BA has the support layer 2A and the device layer 3A which is provided on the support layer 2A and includes the main surface BsA and the mounting region 31A. In addition, the opening 31bA penetrates the device layer 3A in a direction (ZA-axis direction) intersecting the main surface BsA. Then, the support portions 56A include the interlock portions 55A which are bent to come into contact with the pair of edge portions of the opening 31bA in the ZA-axis direction. Therefore, the interlock portions 55A are interlocked with the mounting region 31A at positions where they come into contact with the pair of edge portions of the opening 31bA. Therefore, it is possible to reliably mount the movable mirror 5A on the base BA and to positionally align the movable mirror 5A in a direction intersecting the main surface BsA of the base BA.

In addition, in the light module 1A, when viewed in the ZA-axis direction, the inner surface of the opening 31bA includes the inclined surfaces SLA of the pair which are inclined such that the distance therebetween increases from the one end SLaA toward the other end SLbA, and the reference surface SRA which extends along the reference line BLA connecting the other end SLbA of one inclined surface SLA and the other end SLbA of the other inclined surface SLA to each other. Therefore, when the support portions 56A are inserted into the opening 31bA and an elastic deformation of the elastic portion 52A is partially released, the support portions 56A can slide on the inclined surfaces SLA due to an elastic force and can abut the reference surface SRA. Therefore, the movable mirror 5A can be positionally aligned in a direction along the main surface BsA.

In addition, in the light module 1A, the elastic portion 52A forms the annular region CAA, which is formed in an annular shape such that the mirror portion 51A is surrounded when viewed in the XA-axis direction. Therefore, since the elastic portion 52A has no end portion, the strength of the elastic portion 52A can be reliably improved.

In addition, in the light module 1A, the support portion 56A includes the connecting portion 57A which is connected to the elastic portion 52A, and the leg portion 54A which extends over the mirror surface 51aA from the connecting portion 57A in the ZA-axis direction and is inserted into the opening 31bA. Therefore, it is possible to mount the movable mirror 5A on the base BA in a state where the mirror surface 51aA in its entirety protrudes on the main surface BsA of the base BA.

Moreover, in the movable mirror 5A, the elastic portion 52A has a symmetrical shape with respect to the center line CLA of the mirror surface 51aA, and the elastic portion 52A has equal spring constants on both sides of the center line CLA. Therefore, for example, when the elastic portion 52A is elastically deformed in the YA-axis direction, the posture of the movable mirror 5A is unlikely to be unstable (for example, distortion is unlikely to occur). In addition, when an elastic deformation of the elastic portion 52A is partially released, uneven inputting of a reaction force from the inner surface of the opening 31bA to the pair of support portions 56A is curbed.

Here, in the light module 1A, the movable mirror 5A penetrates the mounting region 31A of the device layer 3A, and a portion of each of the interlock portions 55A of the movable mirror 5A is positioned in the space S1A formed between the support layer 2A and the device layer 3A. Accordingly, for example, since there is no limitation on the size and the like of each of the interlock portions 55A, the movable mirror 5A can be stably and firmly fixed to the mounting region 31A of the device layer 3A. Thus, according to the light module 1A, reliable mounting of the movable mirror 5A with respect to the device layer 3A is realized.

In addition, in the light module 1A, a portion of each of the interlock portions 55A of the movable mirror 5A is positioned in a region inside the opening 21A of the support layer 2A through a region inside the opening 41A of the intermediate layer 4A. Accordingly, it is possible to favorably realize a configuration for reliable mounting of the movable mirror 5A with respect to the device layer 3A.

In addition, in the light module 1A, the support layer 2A is the first silicon layer of the SOI substrate, the device layer 3A is the second silicon layer of the SOI substrate, and the intermediate layer 4A is the insulating layer of the SOI substrate. Accordingly, it is possible to favorably realize a configuration for reliable mounting of the movable mirror 5A with respect to the device layer 3A using the SOI substrate.

In addition, in the light module 1A, the mirror surface 51aA of the movable mirror 5A is positioned on a side opposite to the support layer 2A with respect to the device layer 3A. Accordingly, it is possible to simplify the configuration of the light module 1A.

In addition, in the light module 1A, the movable mirror 5A, the fixed mirror 6A, and the beam splitter 7A are disposed such that the interference optical system 10A is constituted. Accordingly, it is possible to obtain an FTIR having improved sensitivity.

In addition, in the light module 1A, the light incident unit 8A is disposed such that measurement light is incident on the interference optical system 10A from outside, and the light emission unit 9A is disposed such that the measurement light is emitted from the interference optical system 10A to the outside. Accordingly, it is possible to obtain an FTIR including the light incident unit 8A and the light emission unit 9A.

Modification Examples

Hereinabove, an embodiment of the aspect of the present disclosure has been described. However, the aspect of the present disclosure is not limited to the foregoing embodiment. For example, the material and the shape of each configuration are not limited to the materials and the shapes described above, and various materials and shapes can be employed.

Figure 7:
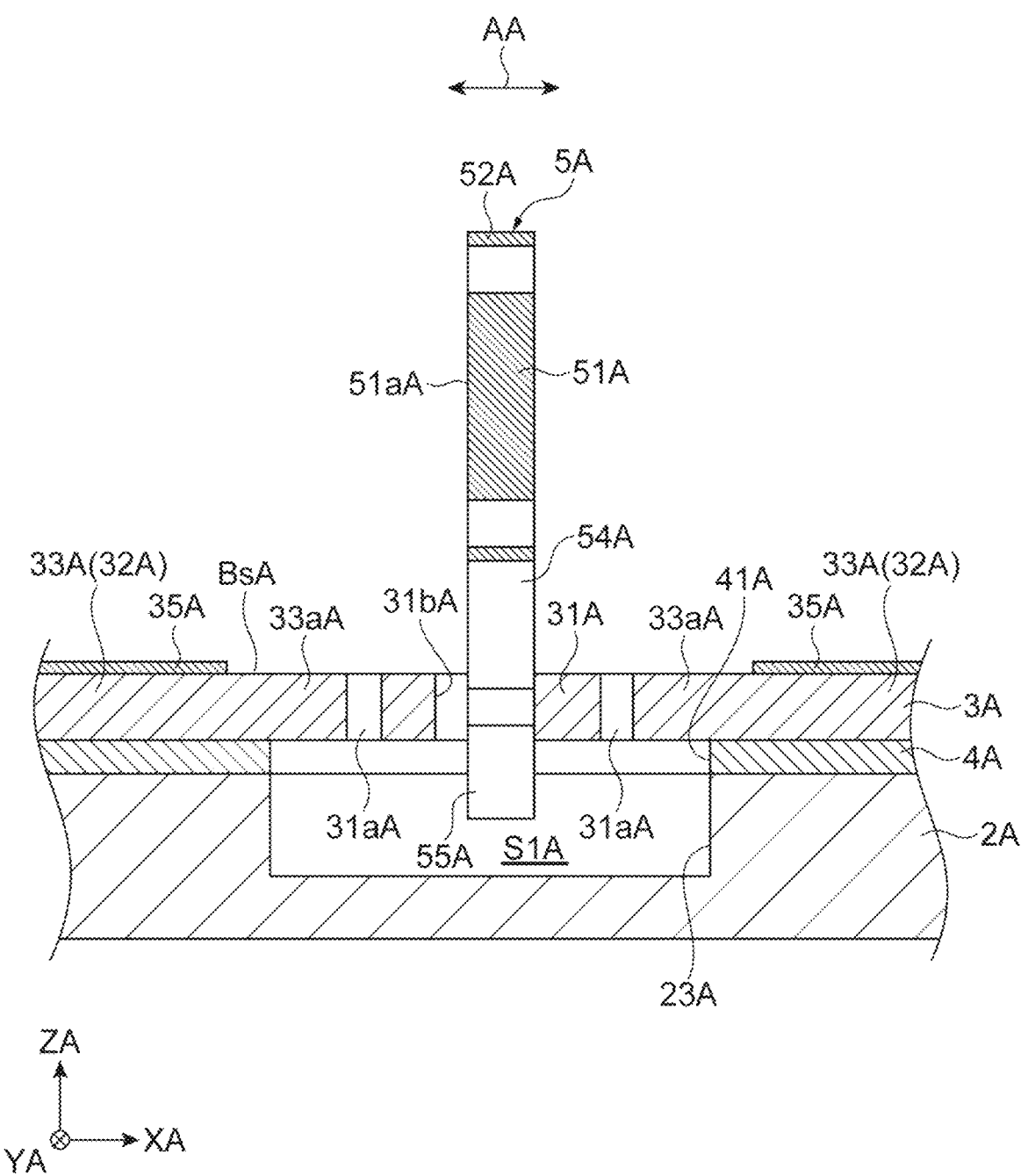
FIG. 7 is a cross-sectional view of a modification example of the surrounding structure of the movable mirror.
Figure 8:
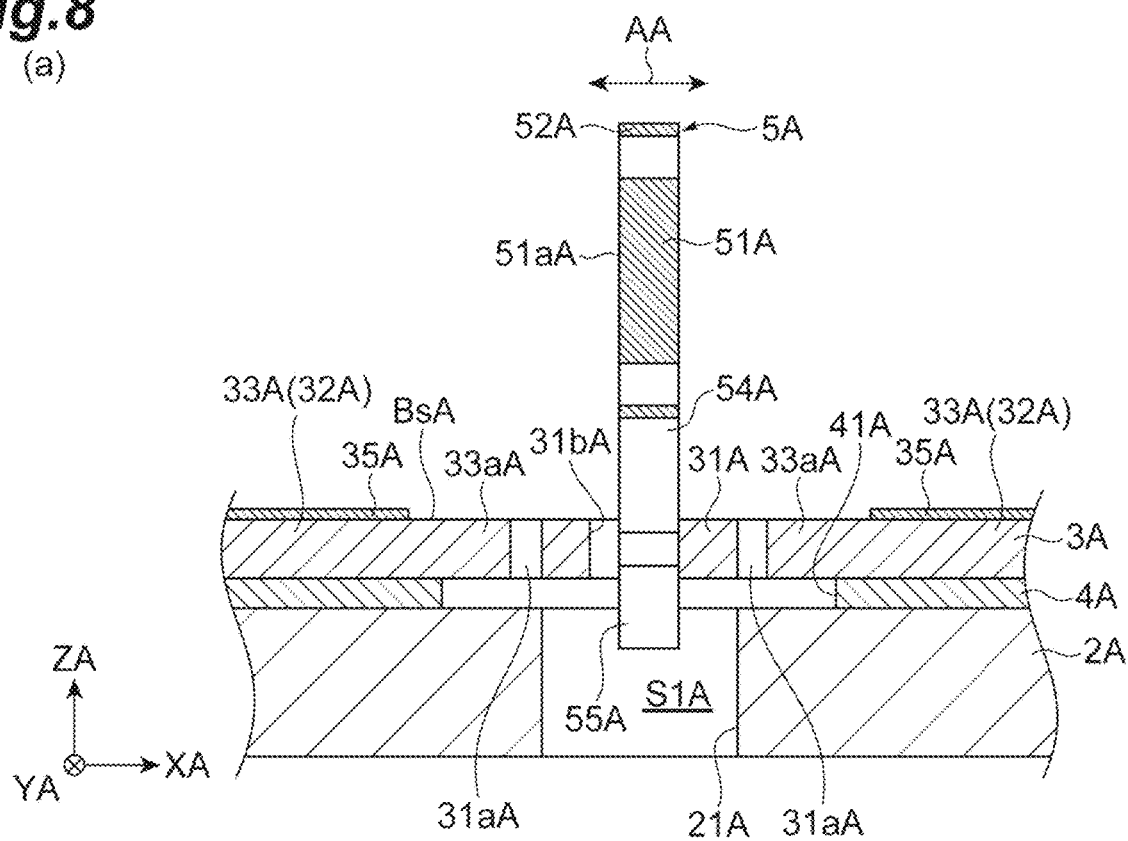
FIG. 8 is a cross-sectional view of another modification example of the surrounding structure of the movable mirror.
Figure 8:
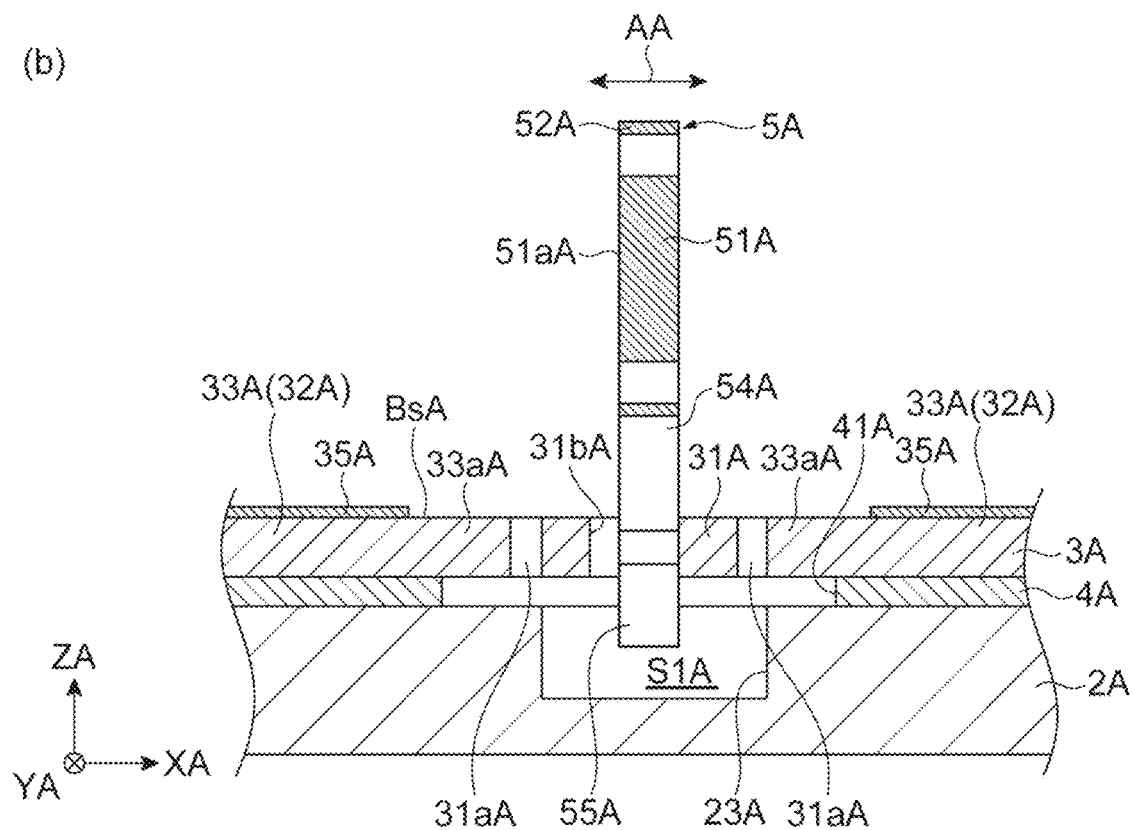
Figure 9:
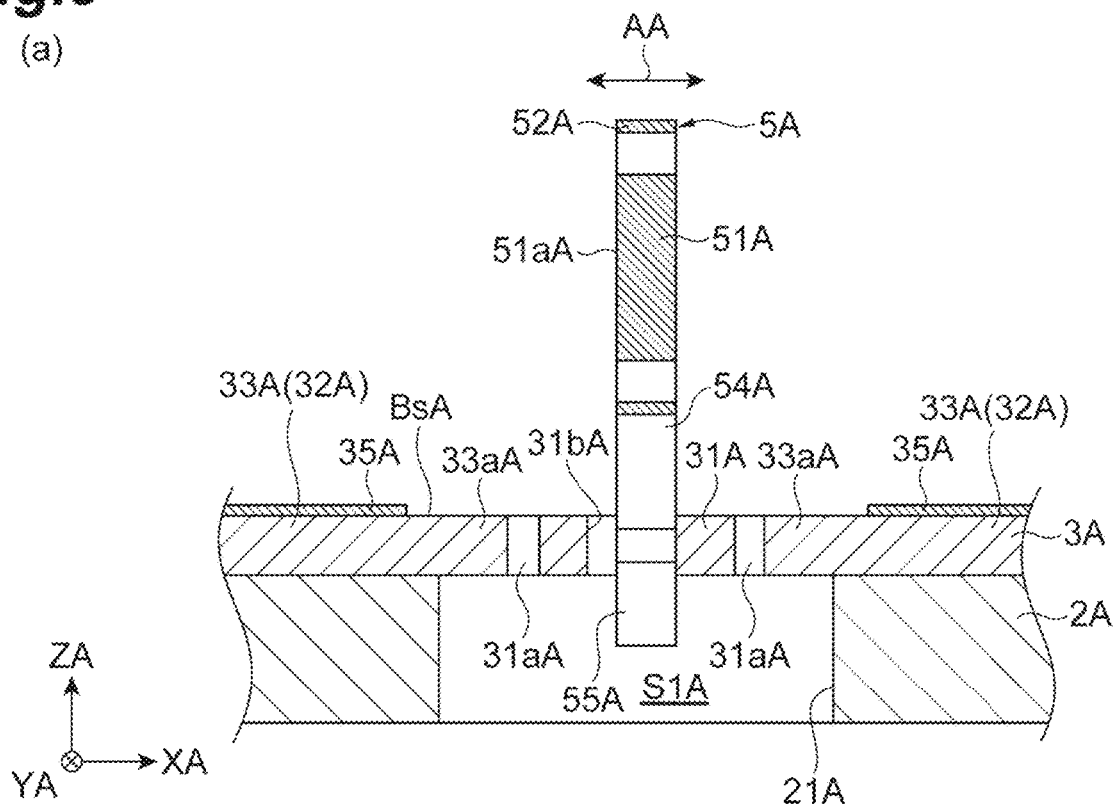
FIG. 9 is a cross-sectional view of another modification example of the surrounding structure of the movable mirror.
Figure 9:
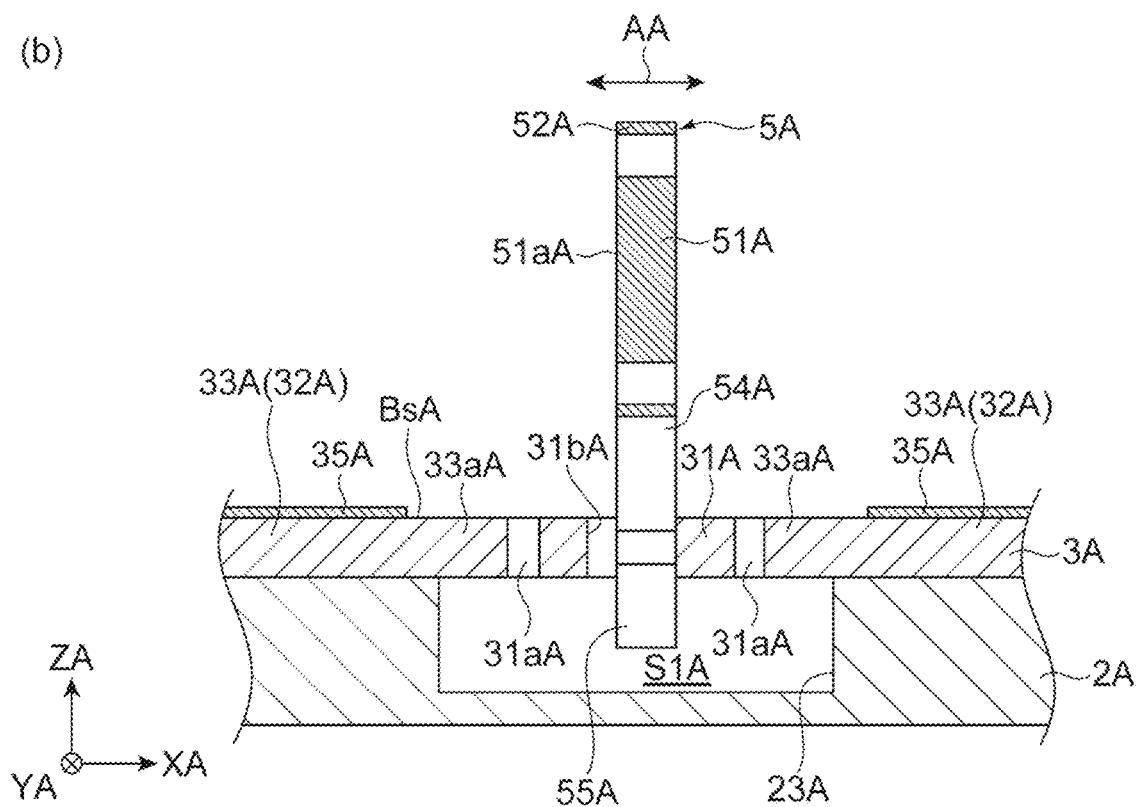
Figure 10:
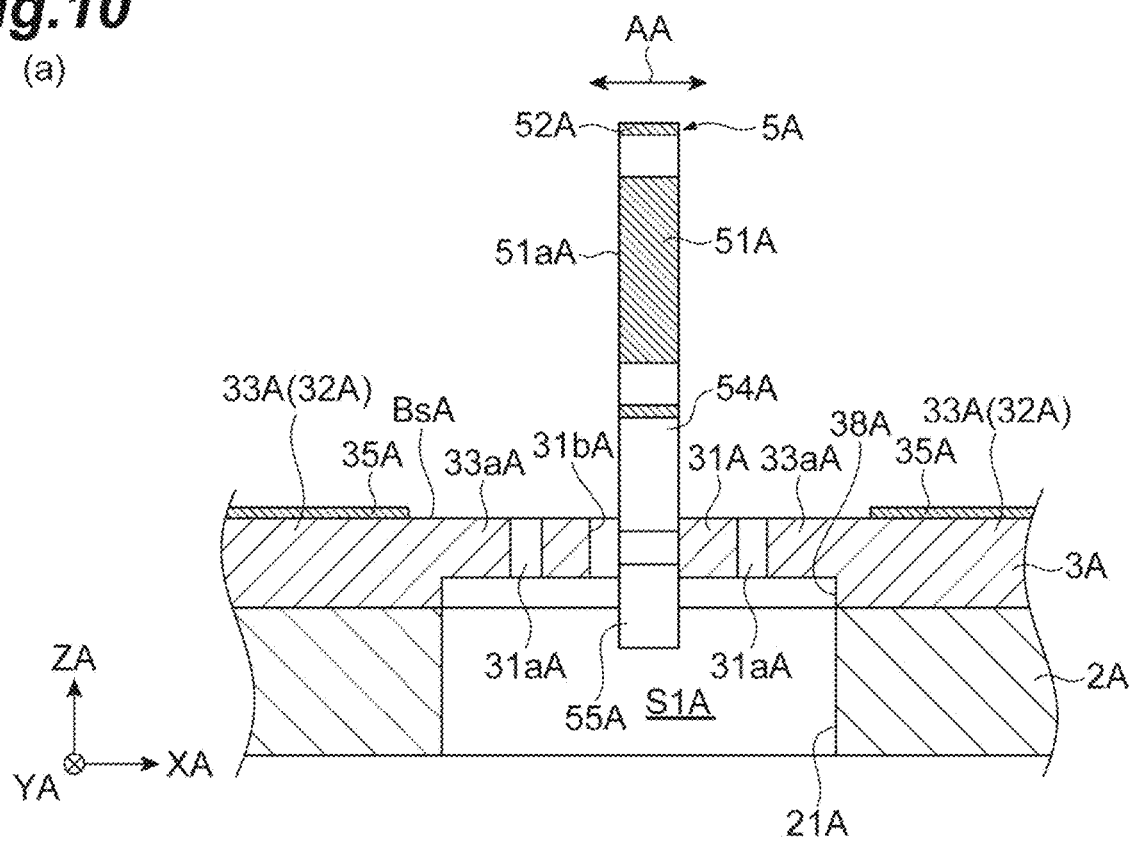
FIG. 10 is a cross-sectional view of another modification example of the surrounding structure of the movable mirror.
Figure 10:
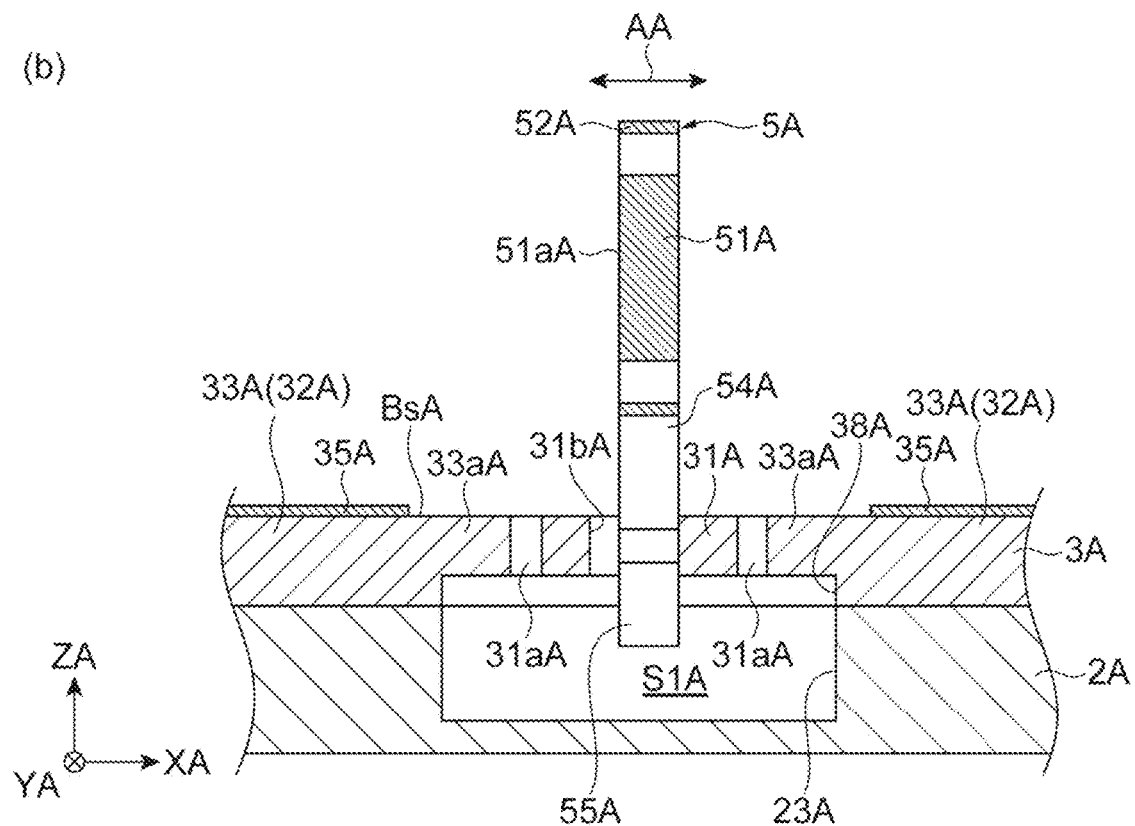
Figure 11:
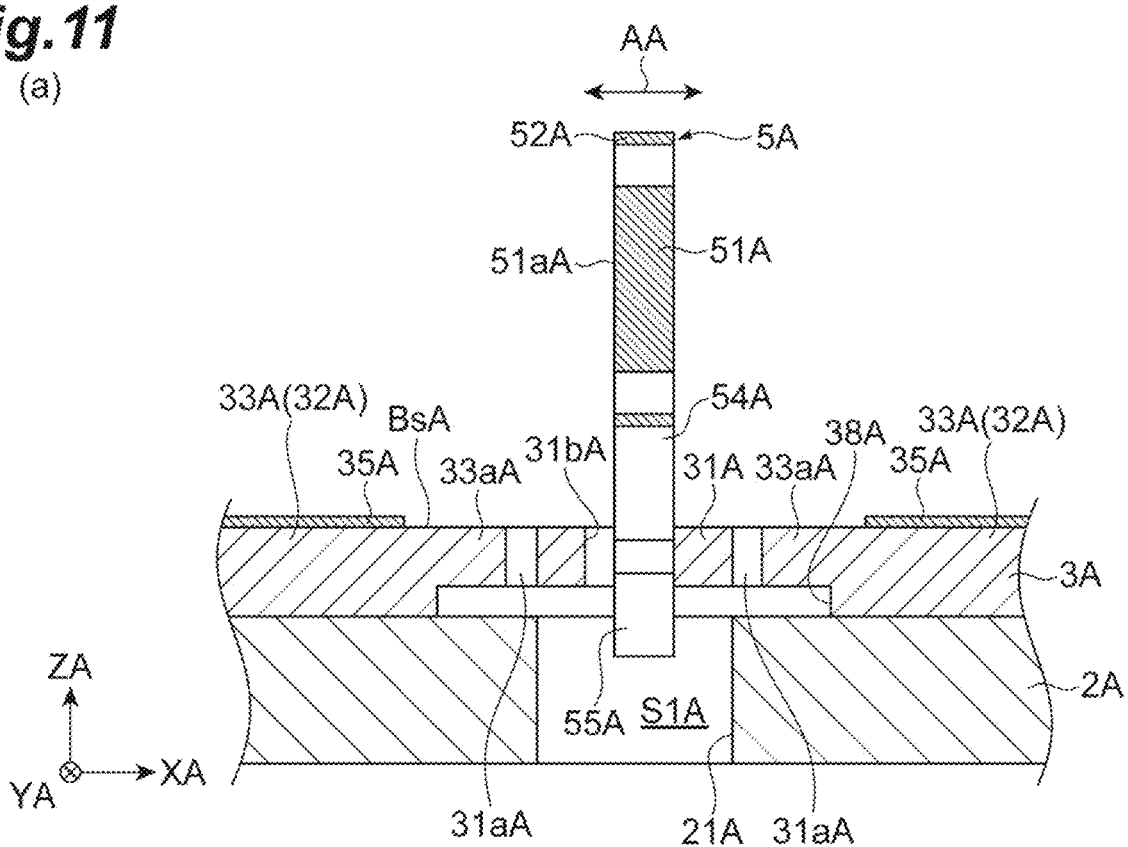
FIG. 11 is a cross-sectional view of another modification example of the surrounding structure of the movable mirror.
Figure 11:
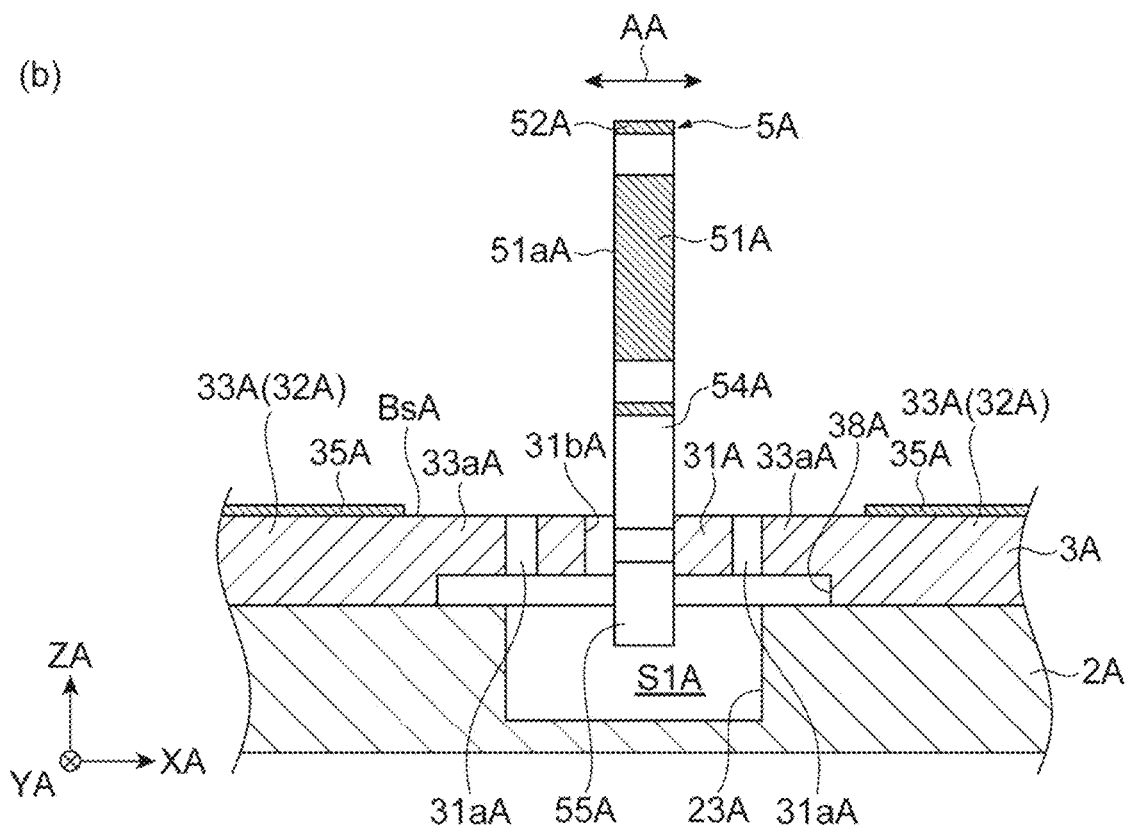

In addition, as long as the space S1A is formed between the support layer 2A and the device layer 3A and corresponds to at least the mounting region 31A and the driving region 32A, various forms can be employed as illustrated in FIGS. 7 and 8.

In the configuration illustrated in FIG. 7, in place of the opening 21A, a recess portion 23A open on the device layer 3A side is formed in the support layer 2A, and the space S1A is constituted of a region inside the opening 41A of the intermediate layer 4A and a region inside the recess portion 23A of the support layer 2A. In this case, a region inside the recess portion 23A of the support layer 2A includes the range in which the mounting region 31A moves when viewed in the ZA-axis direction. A portion of each of the interlock portions 55A of the movable mirror 5A is positioned in a region inside the recess portion 23A through a region inside the opening 41A of the intermediate layer 4A. With this configuration as well, it is possible to favorably realize a configuration for reliable mounting of the movable mirror 5A with respect to the device layer 3A.

In the configuration illustrated in FIG. 8(a), a region inside the opening 21A of the support layer 2A includes a range in which each of the interlock portions 55A of the movable mirror 5A moves when viewed in the ZA-axis direction. In the configuration illustrated in FIG. 8(b), a region inside the recess portion 23A of the support layer 2A includes the range in which each of the interlock portions 55A of the movable mirror 5A moves when viewed in the ZA-axis direction. In these cases, a region inside the opening 41A of the intermediate layer 4A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. In any configuration, a portion of each of the interlock portions 55A of the movable mirror 5A positioned in the space S1A does not come into contact with the intermediate layer 4A and the support layer 2A when the mounting region 31A reciprocates along the direction AA.

In addition, the support layer 2A and the device layer 3A may be joined to each other without having the intermediate layer 4A interposed therebetween. In this case, the support layer 2A is formed of silicon, borosilicate glass, quartz glass, or ceramic, for example, and the device layer 3A is formed of silicon, for example. The support layer 2A and the device layer 3A are joined to each other through room-temperature joining utilizing surface activation, low-temperature plasma joining, direct joining in which high-temperature processing is performed, insulating resin bonding, metal joining, or joining using glass frit, for example. In this case as well, as long as the space S1A is formed between the support layer 2A and the device layer 3A and corresponds to at least the mounting region 31A and the driving region 32A, various forms can be employed as illustrated in FIGS. 9, 10, 11, and 12. In any configuration, it is possible to favorably realize a configuration for reliable mounting of the movable mirror 5A with respect to the device layer 3A.

In the configuration illustrated in FIG. 9(a), the space S1A is constituted of a region inside the opening 21A of the support layer 2A. In this case, a region inside the opening 21A of the support layer 2A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the opening 21A of the support layer 2A.

In the configuration illustrated in FIG. 9(b), the space S1A is constituted of a region inside the recess portion 23A of the support layer 2A. In this case, a region inside the recess portion 23A of the support layer 2A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the recess portion 23A of the support layer 2A.

In the configuration illustrated in FIG. 10(a), a recess portion (first recess portion) 38A open on the support layer 2A side is formed in the device layer 3A, and the space S1A is constituted of a region inside the recess portion 38A of the device layer 3A and a region inside the opening 21A of the support layer 2A. In this case, a region inside the recess portion 38A of the device layer 3A and a region inside the opening 21A of the support layer 2A include the range in which the mounting region 31A moves when viewed in the ZA-axis direction. A region inside the recess portion 38A of the device layer 3A forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the opening 21A of the support layer 2A through a region inside the recess portion 38A of the device layer 3A.

In the configuration illustrated in FIG. 10(b), the recess portion 38A is formed in the device layer 3A, and the space S1A is constituted of a region inside the recess portion 38A of the device layer 3A and a region inside the recess portion (second recess portion) 23A of the support layer 2A. In this case, a region inside the recess portion 38A of the device layer 3A and a region inside the recess portion 23A of the support layer 2A include the range in which the mounting region 31A moves when viewed in the ZA-axis direction. A region inside the recess portion 38A of the device layer 3A forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the recess portion 23A of the support layer 2A through a region inside the recess portion 38A of the device layer 3A.

In the configuration illustrated in FIG. 11(a), the recess portion 38A is formed in the device layer 3A, and the space S1A is constituted of a region inside the recess portion 38A of the device layer 3A and a region inside the opening 21A of the support layer 2A. In this case, a region inside the recess portion 38A of the device layer 3A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A region inside the opening 21A of the support layer 2A includes a range in which each of the interlock portions 55A of the movable mirror 5A moves when viewed in the ZA-axis direction. A portion of each of the interlock portions 55A of the movable mirror 5A is positioned in a region inside the opening 21A of the support layer 2A through a region inside the recess portion 38A of the device layer 3A.

In the configuration illustrated in FIG. 11(b), the recess portion 38A is formed in the device layer 3A, and the space S1A is constituted of a region inside the recess portion 38A of the device layer 3A and a region inside the recess portion (second recess portion) 23A of the support layer 2A. In this case, a region inside the recess portion 38A of the device layer 3A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A region inside the recess portion 23A of the support layer 2A includes the range in which each of the interlock portions 55A of the movable mirror 5A moves when viewed in the ZA-axis direction. A portion of each of the interlock portions 55A of the movable mirror 5A is positioned in a region inside the recess portion 23A of the support layer 2A through a region inside the recess portion 38A of the device layer 3A.

Figure 12:
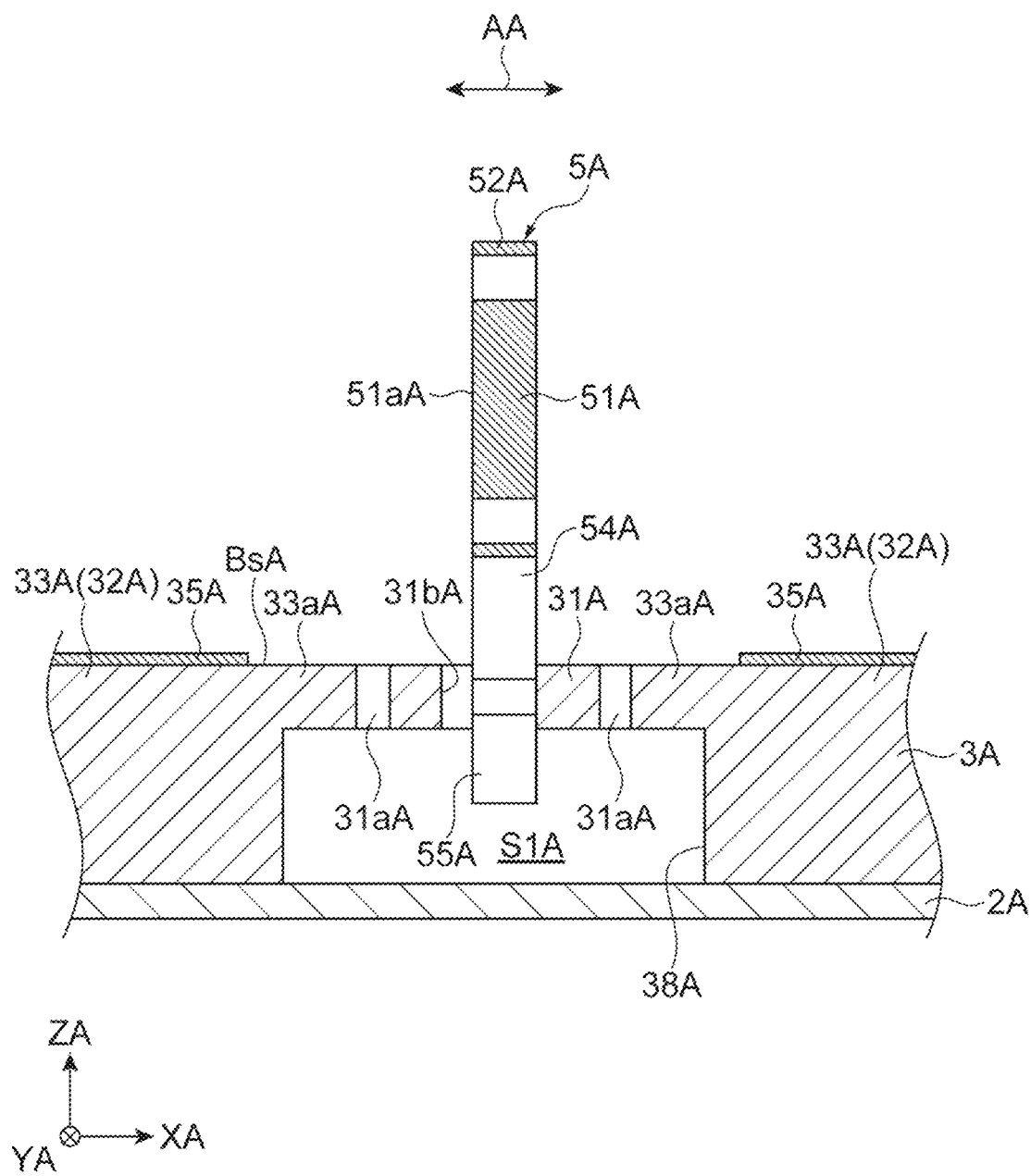
FIG. 12 is a cross-sectional view of another modification example of the surrounding structure of the movable mirror.

In the configuration illustrated in FIG. 12, the recess portion 38A is formed in the device layer 3A, and the space S1A is constituted of a region inside the recess portion 38A of the device layer 3A. In this case, a region inside the recess portion 38A of the device layer 3A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the recess portion 38A of the device layer 3A.

Figure 13:
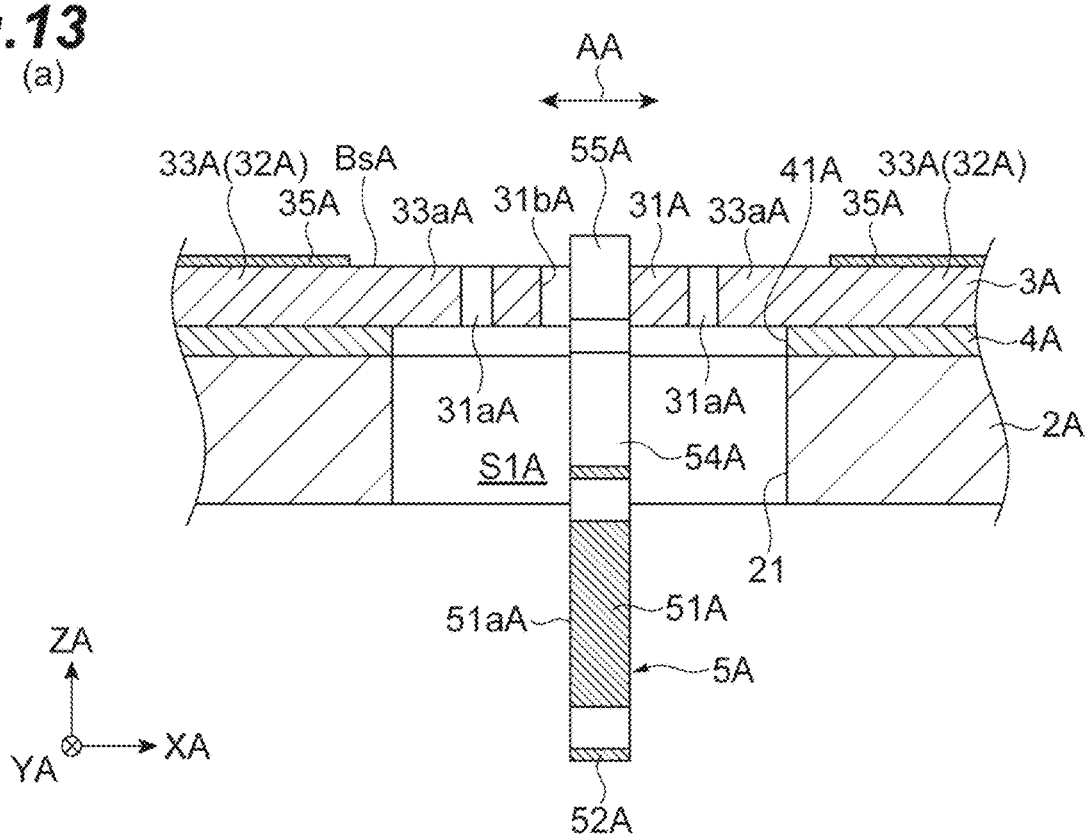
FIG. 13 is a cross-sectional view of another modification example of the surrounding structure of the movable mirror.
Figure 13:
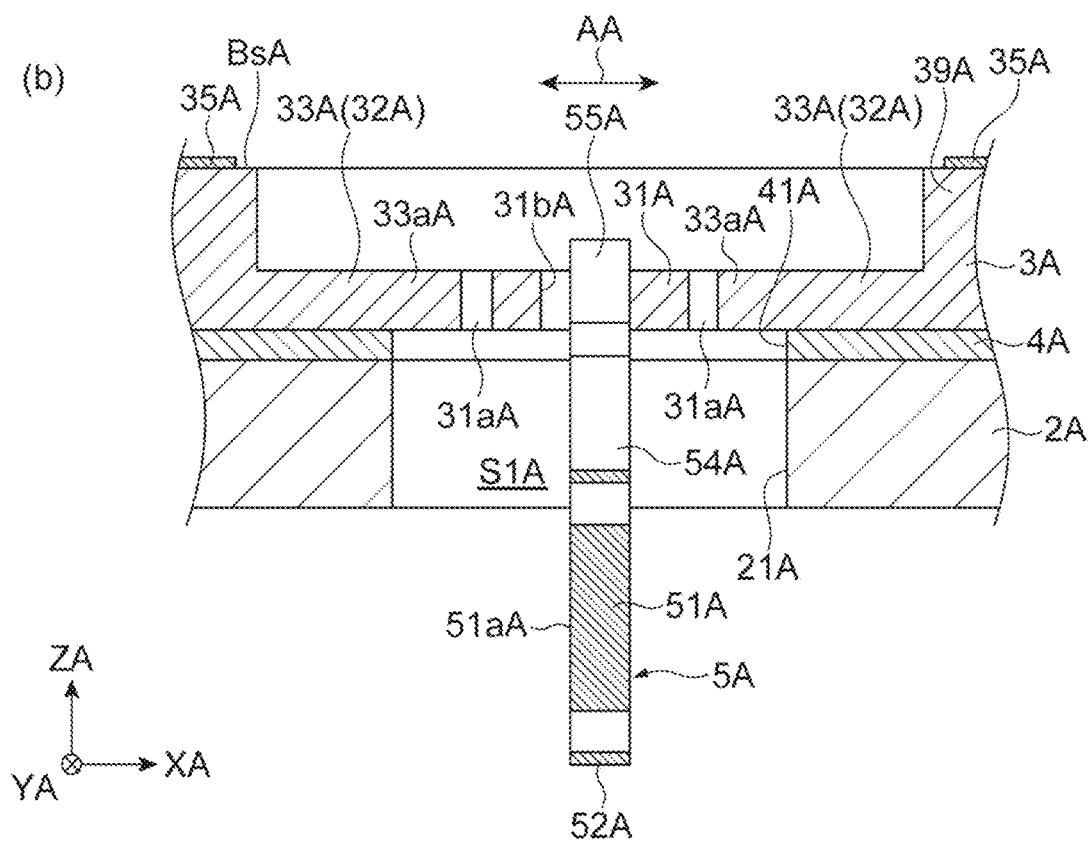

In addition, as illustrated in FIGS. 13(a) and 13(b), a portion of each of the leg portions 54A and a portion of each of the interlock portions 55A of the movable mirror 5A may be positioned in the space S1A, and the mirror surface 51aA of the movable mirror 5A may be positioned on a side opposite to the device layer 3A with respect to the support layer 2A. In this case, the mirror surface 61aA of the fixed mirror 6A and the optical functional surface 7aA of the beam splitter 7A are also positioned on a side opposite to the device layer 3A with respect to the support layer 2A. In the configuration illustrated in FIG. 13(b), a spacer 39A protruding to a side opposite to the support layer 2A is integrally provided in the device layer 3A. The spacer 39A protrudes beyond a part of each of the interlock portions 55A of the movable mirror 5A protruding from the device layer 3A to a side opposite to the support layer 2A, thereby protecting the part. In addition, here, the opening 31bA communicates with the main surface BsA via a space defined by the spacer 39A. Alternatively, here, the opening 31bA communicates with another main surface which is a surface on a side opposite to the main surface BsA, via the space S1A.

Here, in the foregoing embodiment, the movable mirror 5A has been described in respect to a case where the mirror surface 51aA in its entirety protrudes to the main surface BsA or a surface of the base BA on a side opposite to the main surface BsA. However, the form of the movable mirror 5A is not limited to this case. For example, a portion of the mirror surface 51aA of the movable mirror 5A may be disposed inside the base BA. Hereinafter, this example will be described.

Figure 14:
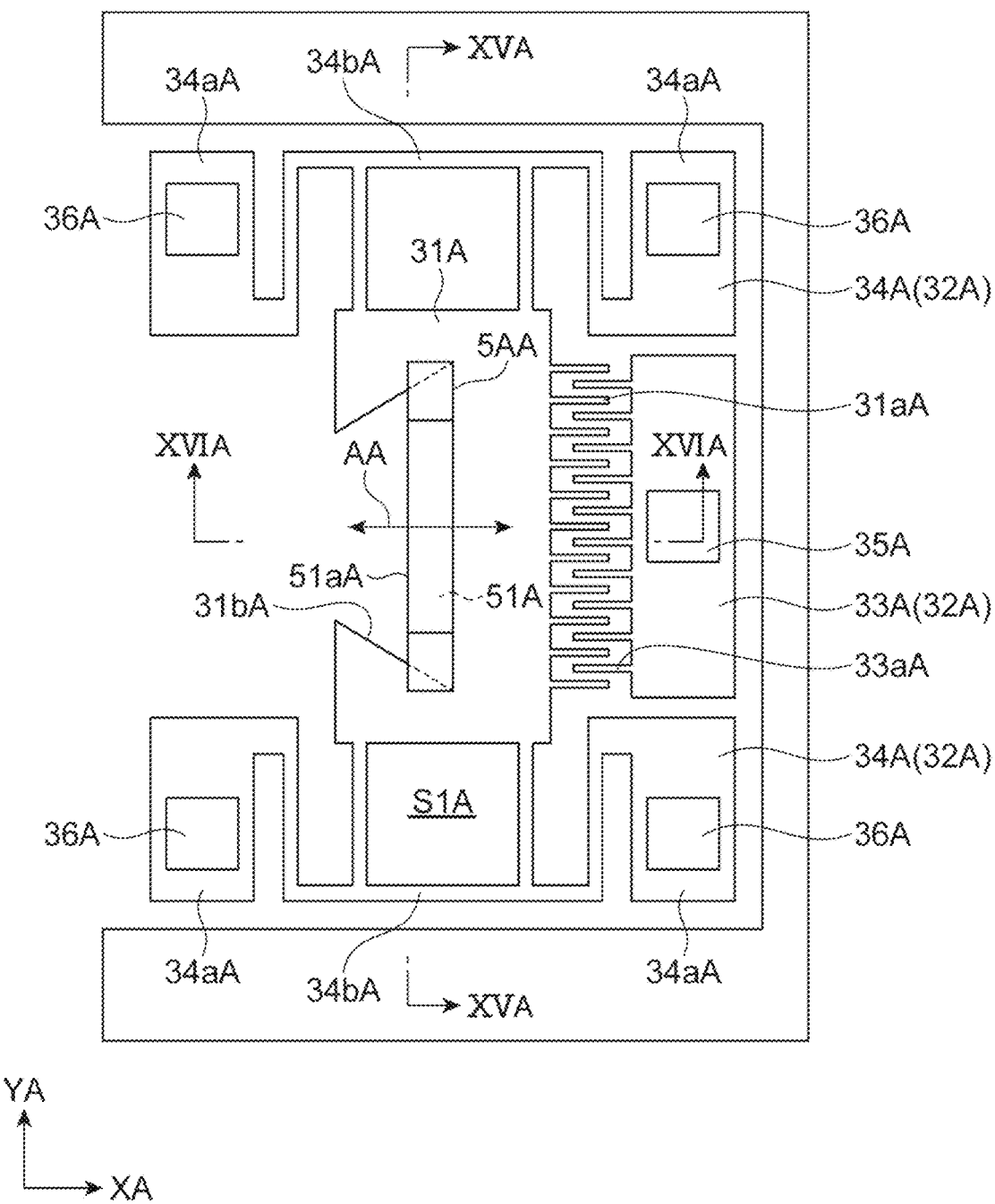
FIG. 14 is a partially schematic plan view of a light module according to a modification example.
Figure 15:
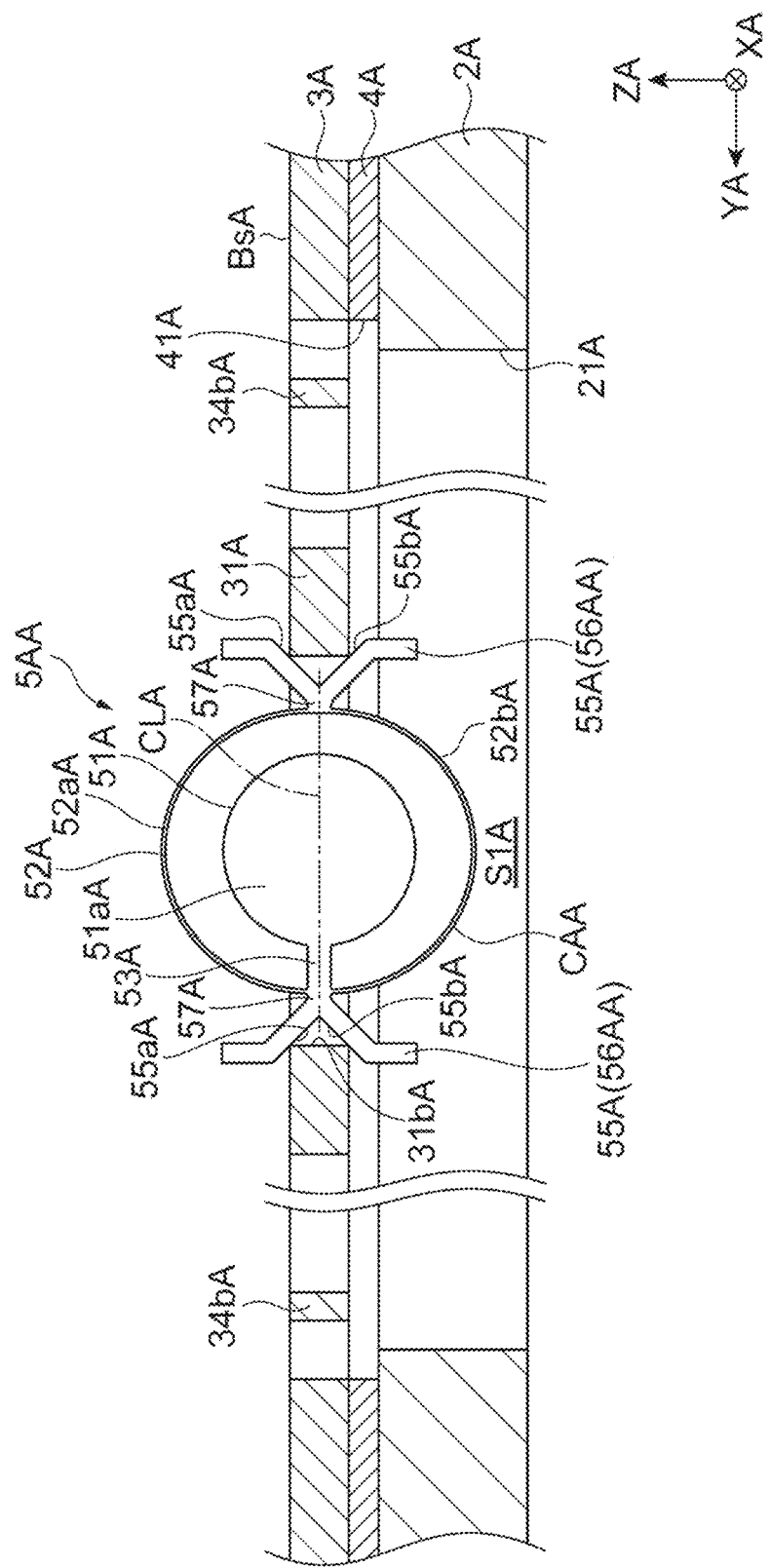
FIG. 15 is a cross-sectional view taken along line XVA-XVA illustrated in FIG. 14.
Figure 16:
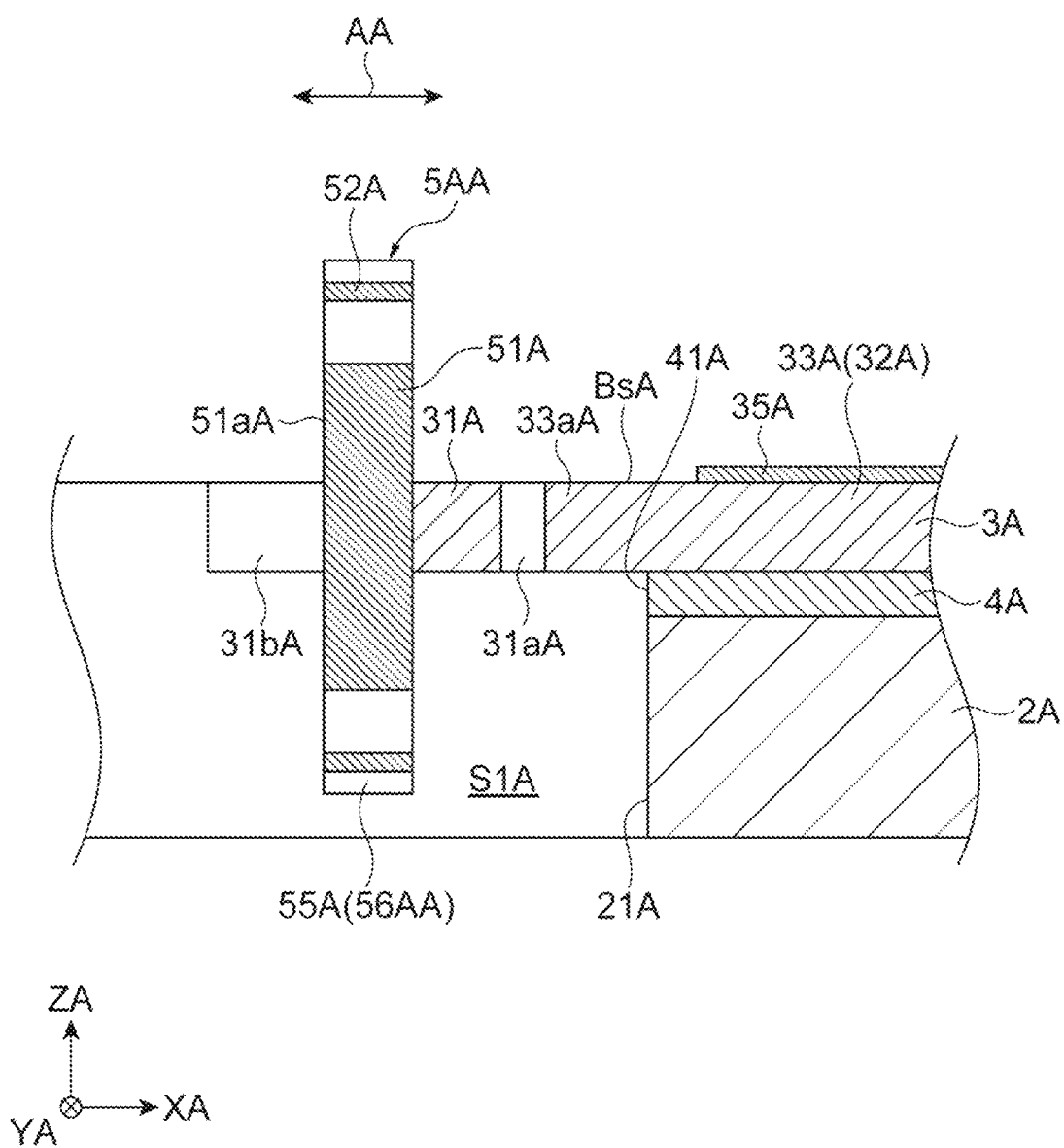
FIG. 16 is a cross-sectional view taken along line XVIA-XVIA illustrated in FIG. 14.

As illustrated in FIGS. 14, 15, and 16, here, compared to the movable mirror 5A illustrated in FIG. 2, a movable mirror 5AA differs from the movable mirror 5A in having support portions 56AA, in place of the support portions 56A. The relationship between the support portions 56AA and the elastic portion 52A is similar to that between the support portions 56A and the elastic portion 52A. In contrast, the support portions 56AA differ from the support portions 56A in having no leg portion 54A.

That is, here, the support portions 56AA in their entirety serve as the interlock portions 55A. Accordingly, the support portions 56AA have a symmetrical shape with respect to the center line CLA of the mirror surface 51aA in the ZA-axis direction and do not have a part extending to one side of the center line CLA in a relatively long manner. Therefore, here, the support portions 56AA support the movable mirror 5AA in a state where the movable mirror 5AA in its entirety penetrates the mounting region 31A via the opening 31bA. The mirror surface 51aA intersects the mounting region 31A.

Here, a part (central part) of the interlock portion 55A (support portion 56AA) overlaps the mirror portion 51A along the YA-axis direction. Then, the movable mirror 5AA is interlocked with the device layer 3A in the interlock portions 55A thereof and is supported in the mounting region 31A. Therefore, compared to a case where the movable mirror 5A is supported by the support portions 56A (leg portions 54A) extending to one side of the center line CLA in a relatively long manner, discrepancy between support points and the centroid is small, and stable mounting can be realized.

Specifically, as an example, the support portions 56AA support the movable mirror 5AA such that the center line CLA of the mirror surface 51aA in the ZA-axis direction is aligned with the center of the device layer 3A in the thickness direction. Therefore, a portion (here, half or more) of the mirror surface 51aA is positioned on the support layer 2A side of the main surface BsA. In contrast, here, the opening 31bA extends to reach the end portion of the mounting region 31A on a side facing the mirror surface 51aA and is open therein. Therefore, even in this case as well, interference of the measurement light L0A with the mounting region 31A is avoided by controlling the optical path of the measurement light L0A toward the mirror surface 51aA, and the mirror surface 51aA in its entirety can be effectively utilized.

As above, in the movable mirror 5AA, the support portions 56AA (here, the movable mirror 5AA in its entirety) are symmetrically formed with respect to the center line CLA of the mirror surface 51aA in the ZA-axis direction. Then, the movable mirror 5AA is supported by the support portions 56AA at positions thereof corresponding to the center line CLA. Therefore, it is possible to cause the support points and the centroid to be substantially aligned with each other in the ZA-axis direction and to realize more stable mounting.

In addition, in the foregoing embodiment, the fixed mirror 6A is mounted in the device layer 3A. However, the fixed mirror 6A may be mounted in the support layer 2A or the intermediate layer 4A. In addition, in the foregoing embodiment, the beam splitter 7A is mounted in the support layer 2A. However, the beam splitter 7A may be mounted in the device layer 3A or the intermediate layer 4A. In addition, the beam splitter 7A is not limited to a cube-type beam splitter and may be a plate-type beam splitter.

In addition, the light module 1A may include a light emitting element for generating measurement light to be incident on the light incident unit 8A, in addition to the light incident unit 8A. Alternatively, the light module 1A may include a light emitting element for generating measurement light to be incident on the interference optical system 10A, in place of the light incident unit 8A. In addition, the light module 1A may include a light receiving element for detecting measurement light (interference light) emitted from the light emission unit 9A, in addition to the light emission unit 9A. Alternatively, the light module 1A may include a light receiving element for detecting measurement light (interference light) emitted from the interference optical system 10A, in place of the light emission unit 9A.

In addition, a first penetration electrode which is electrically connected to each of the actuator regions 33A and a second penetration electrode which is electrically connected to each of both the end portions 34aA of each of the elastic support regions 34A may be provided in the support layer 2A and the intermediate layer 4A (in only the support layer 2A when the intermediate layer 4A is not present), and a voltage may be applied to a part between the first penetration electrode and the second penetration electrode. In addition, the actuator for moving the mounting region 31A is not limited to an electrostatic actuator, and a piezoelectric actuator or an electromagnetic actuator may be adopted, for example. In addition, the light module 1A is not limited to a module for constituting an FTIR and may be a module for constituting other optical systems.

Figure 17:
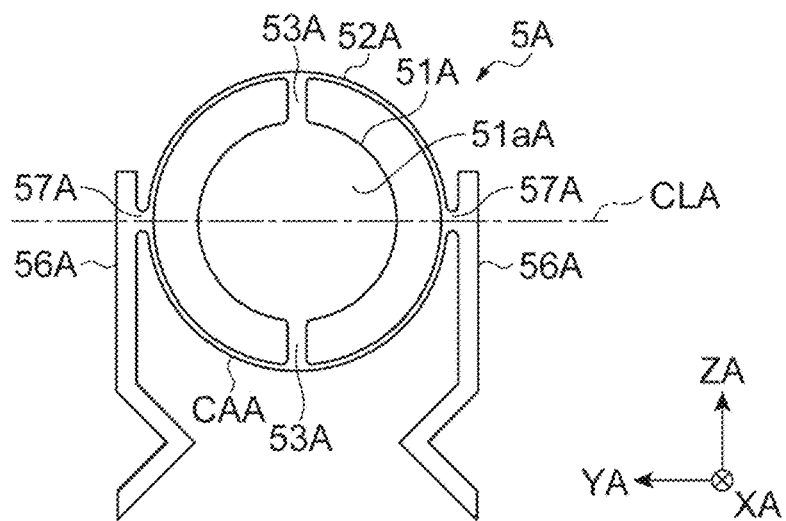
FIG. 17 is a front view illustrating a modification example of the movable mirror.
Figure 17:
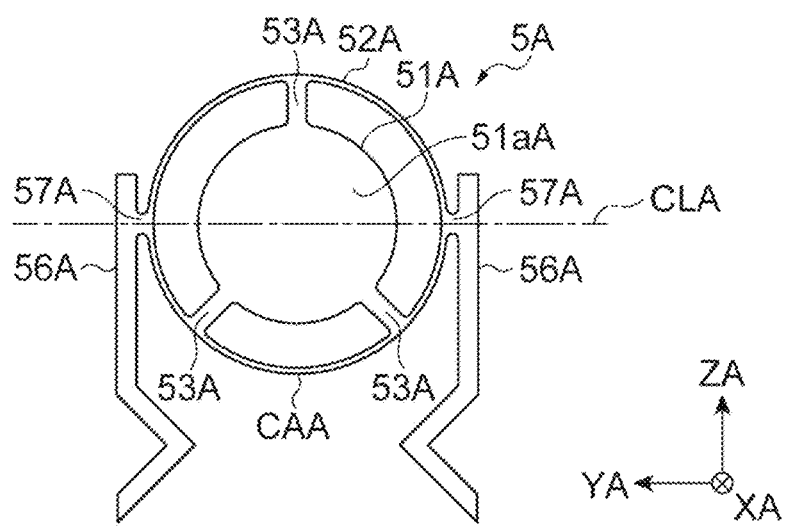
Figure 17:
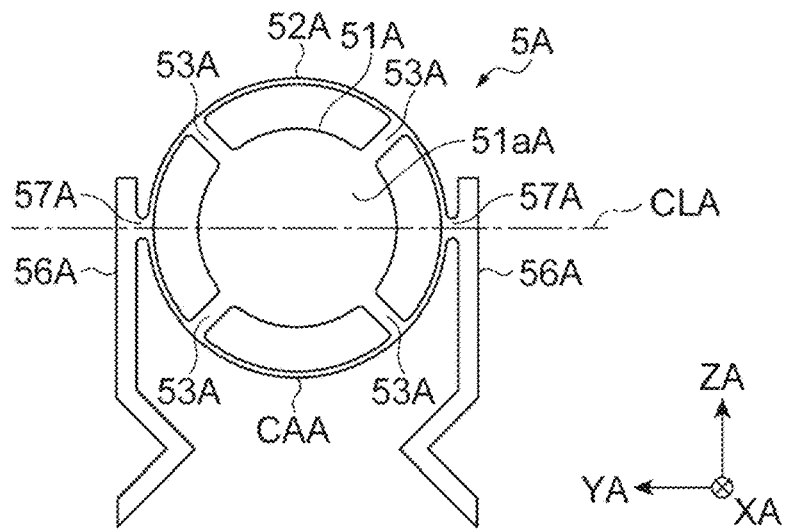

Subsequently, description of modification examples will be continued. Hereinafter, modification examples will be described using the movable mirrors 5A and 5AA and the opening 31bA. However, the fixed mirror 6A and the opening 37aA can also be modified in a similar manner. As illustrated in FIG. 17, the movable mirror 5A may include a plurality of connecting portions (first connecting portions) 53A which connects the mirror portion 51A and the elastic portion 52A to each other.

In the example illustrated in FIG. 17(a), the movable mirror 5A has a pair of connecting portions 53A. Here, the pair of connecting portions 53A is disposed at positions different from those of the pair of connecting portions 57A. The connecting portions 53A of the pair are distributed and disposed on both sides of the center line CLA. Particularly, here, the connecting portions 53A of the pair are disposed at symmetrical positions with respect to the center line CLA. Therefore, here, the elastic portion 52A and the movable mirror 5A in their entirety are symmetrically constituted with respect to a straight line connecting the pair of connecting portions 53A to each other.

In addition, in the example illustrated in FIG. 17(b), the movable mirror 5A has three connecting portions 53A. The three connecting portions 53A are disposed at positions different from those of the pair of connecting portions 57A. Here, one connecting portion 53A and two connecting portions 53A of the three connecting portions 53A are distributed and disposed on both sides of the center line CLA. Similarly, in the example illustrated in FIG. 17(c), the movable mirror 5A has four connecting portions 53A. The four connecting portions are disposed at positions different from those of the pair of connecting portions 57A. Here, the four connecting portions 53A are distributed such that two are disposed on each side of the center line CLA.

Figure 18:
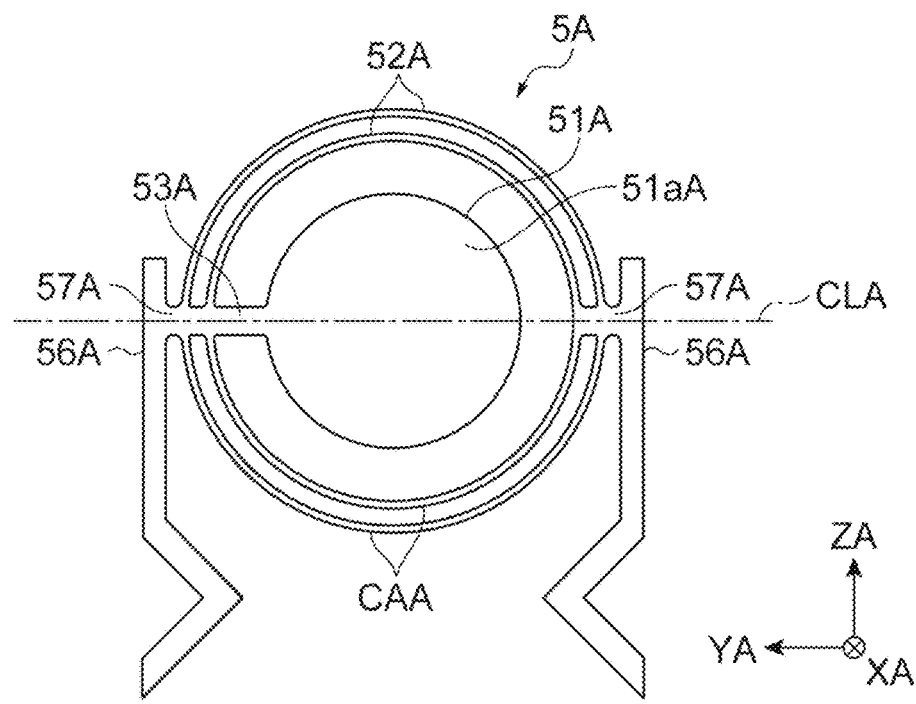
FIG. 18 is a front view illustrating another modification example of the movable mirror.
Figure 18:
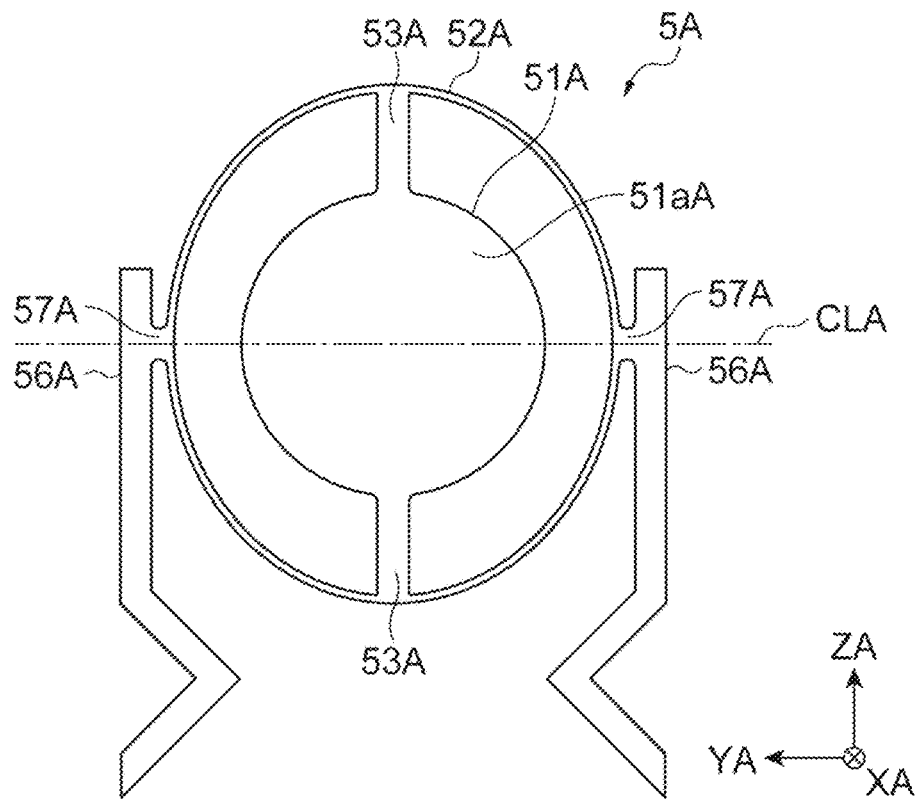

Meanwhile, as illustrated in FIG. 18(a), the movable mirror 5A can have a plurality of elastic portions 52A. Here, the movable mirror 5A has a pair of elastic portions 52A. The pair of elastic portions 52A is individually formed to have a circular plate shape and is concentrically disposed with respect to each other. In other words, here, one elastic portion 52A is provided such that the mirror portion 51A is surrounded, and the other elastic portion 52A is provided such that the one elastic portion 52A and the mirror portion 51A are surrounded. Each of the elastic portions 52A forms the annular region CAA.

On the other hand, the elastic portion 52A is not limited to a circular plate shape and may have an elliptical plate shape as illustrated in FIG. 18(b). That is, when viewed in a direction (XA-axis direction) intersecting the mirror surface 51aA, the elastic portion 52A may have an elliptical shape. Here, a pair of connecting portions 53A is disposed at positions corresponding to the long axis of the ellipse of the elastic portion 52A. In addition, a pair of connecting portions 57A is disposed at positions corresponding to the short axis of the ellipse of the elastic portion 52A.

Description of modification examples of the elastic portion 52A will be continued. In the example illustrated in FIG. 19(a), the movable mirror 5A has a pair of elastic portions 52A which has a rectangular plate shape, and a pair of plate-like connection portions 58A which connects the elastic portions 52A to each other. The elastic portions 52A are disposed on both sides of the mirror portion 51A such that the mirror portion 51A is sandwiched therebetween in the YA-axis direction. The elastic portions 52A extend in the ZA-axis direction in a manner substantially parallel to the support portions 56A. The connection portions 58A are provided on both end portions of the elastic portions 52A in the longitudinal direction and connect the elastic portions 52A to each other. Accordingly, here, the annular region CAA having a rectangularly annular shape is formed by the elastic portions 52A and the connection portions 58A. Here, a single connecting portion 53A connects the elastic portions 52A and the mirror portion 51A to each other via the connection portions 58A.

Figure 19:
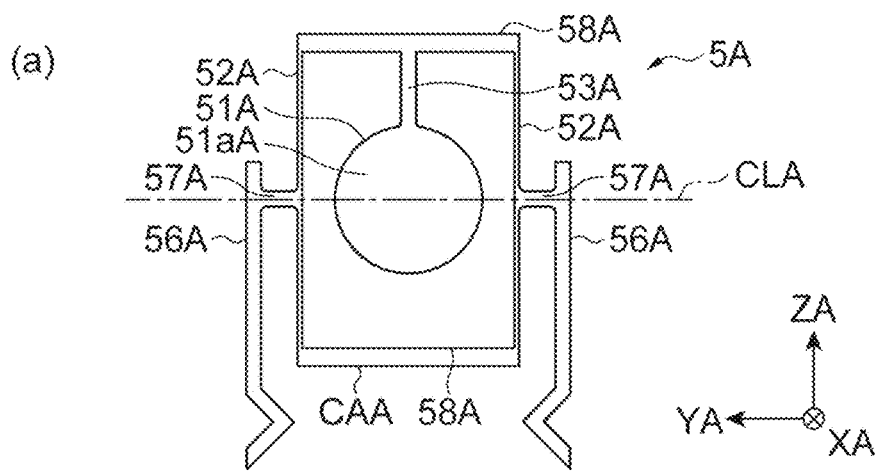
FIG. 19 is a front view illustrating another modification example of the movable mirror.
Figure 19:
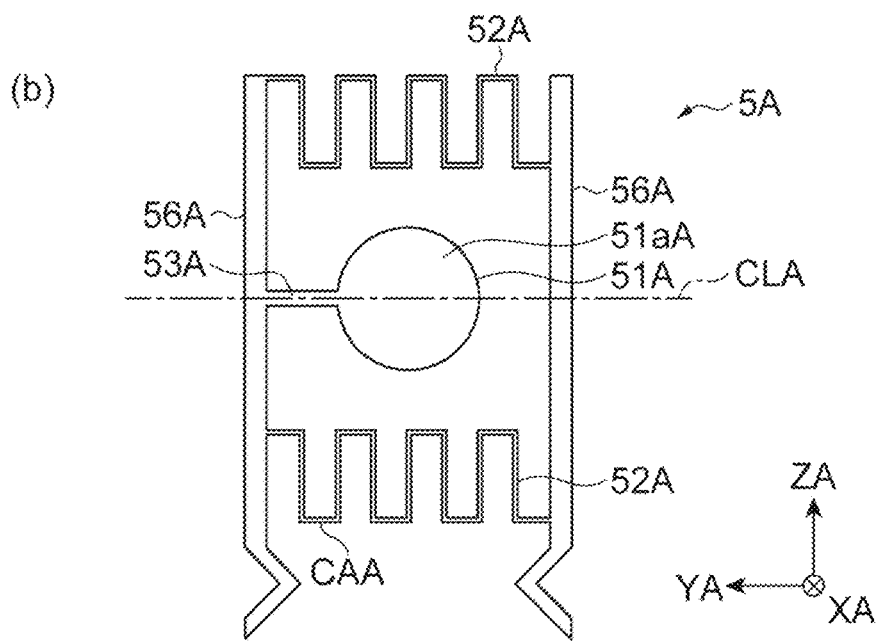
Figure 19:
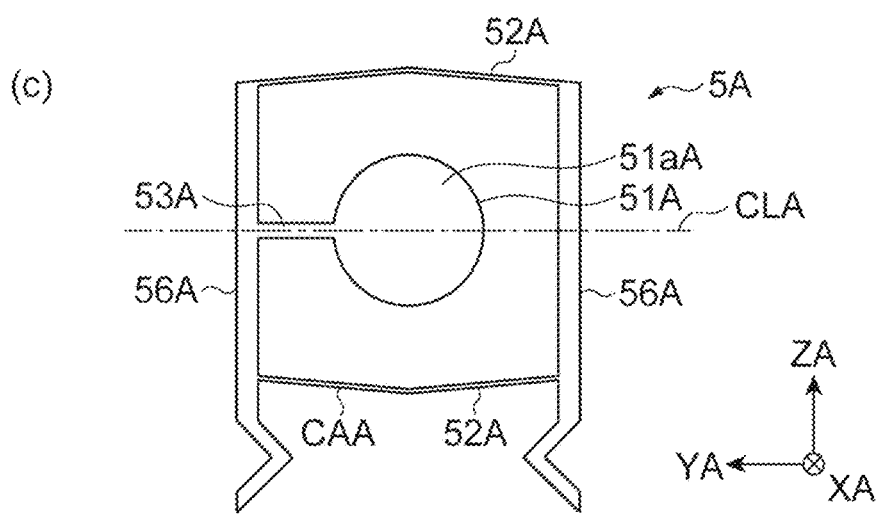

In addition, in the example illustrated in FIG. 19(b) as well, the movable mirror 5A has a pair of elastic portions 52A. Here, the elastic portions 52A are disposed on both sides of the mirror portion 51A such that the mirror portion 51A is sandwiched therebetween in the ZA-axis direction. Each of the elastic portions 52A is formed to have a waved plate shape. That is, when viewed in the XA-axis direction, the elastic portions 52A have a waved shape (here, a rectangular waved shape). The elastic portions 52A are respectively connected to the support portions 56A at both end portions thereof. Accordingly, here, the annular region CAA having a substantially rectangular shape is formed by the elastic portions 52A and the support portions 56A. In addition, here, the connecting portion 53A connects the support portions 56A and the mirror portion 51A to each other. In this manner, the mirror portion 51A may be connected to the support portions 56A.

In addition, in the example illustrated in FIG. 19(c) as well, the movable mirror 5A has a pair of elastic portions 52A. In this case as well, the elastic portions 52A are disposed on both sides of the mirror portion 51A such that the mirror portion 51A is sandwiched therebetween in the ZA-axis direction. Each of the elastic portions 52A is formed to have a V-plate shape. That is, when viewed in the XA-axis direction, the elastic portions 52A have a V-shape. The elastic portions 52A are respectively connected to the support portions 56A at both end portions thereof. Accordingly, here, the annular region CAA having a substantially rectangular shape is formed by the elastic portions 52A and the support portions 56A. In this case as well, the connecting portion 53A connects the support portions 56A and the mirror portion 51A to each other.

Figure 20:
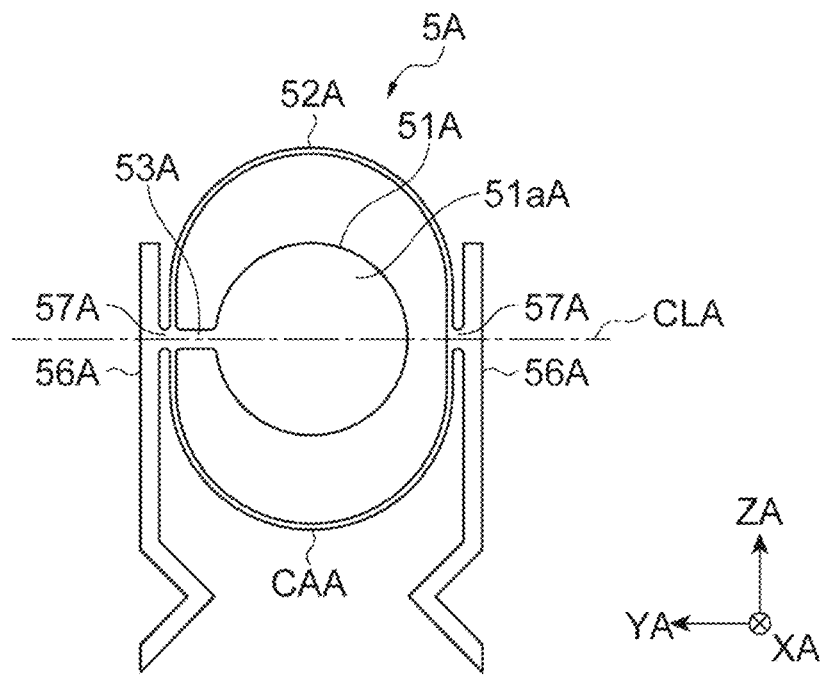
FIG. 20 is a front view illustrating another modification example of the movable mirror.
Figure 20:
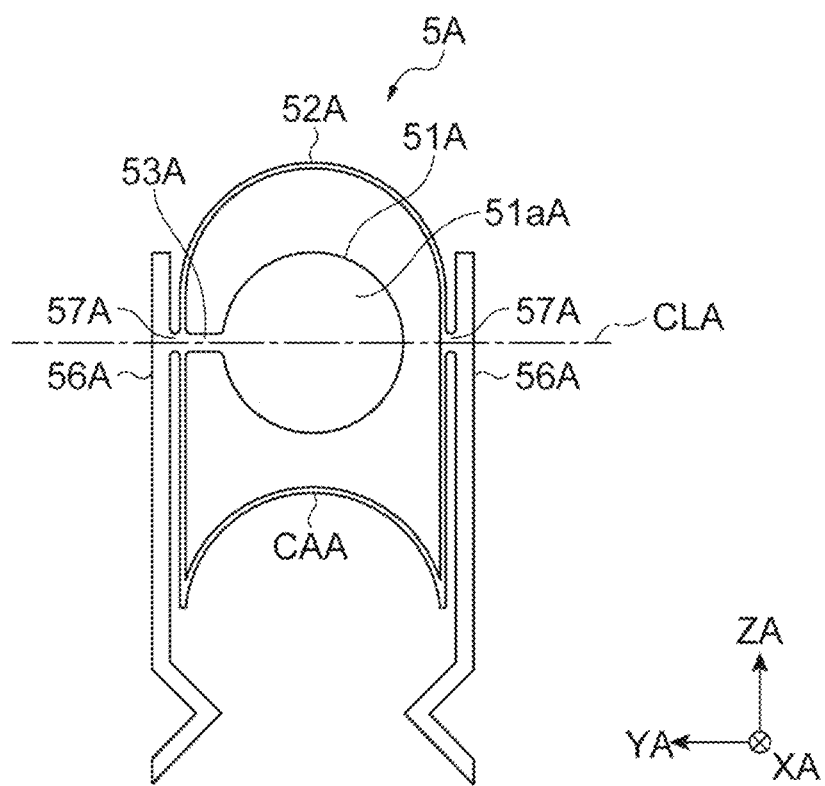

In addition, in the example illustrated in FIG. 20(a), when viewed in the XA-axis direction, the elastic portions 52A may be formed to have an annular shape by a pair of semicircular portions which is disposed in directions opposite to each other, and a pair of linear portions which connects the semicircular portions to each other. Alternatively, as illustrated in FIG. 20(b), when viewed in the XA-axis direction, the elastic portions 52A may be formed to have an annular shape by a pair of semicircular portions which is disposed in the same direction as each other, and a pair of linear portions which connects the semicircular portions to each other.

Figure 21:
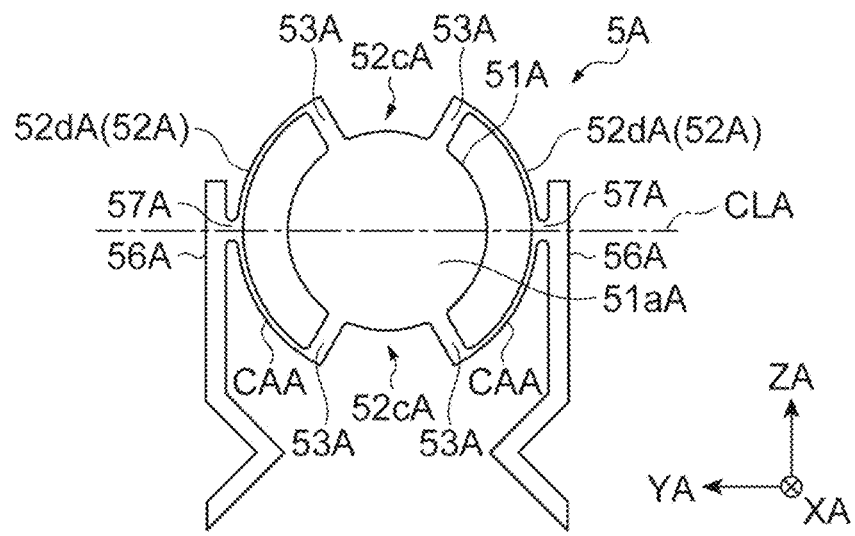
FIG. 21 is a front view illustrating another modification example of the movable mirror.
Figure 21:
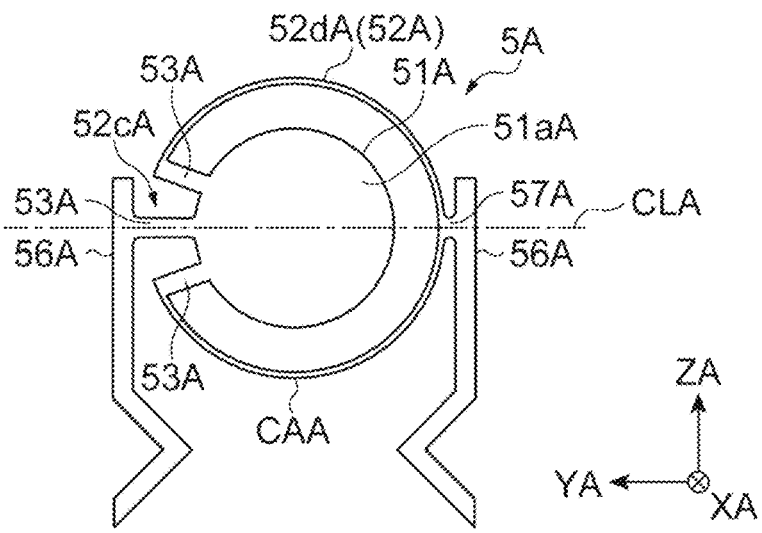
Figure 21:
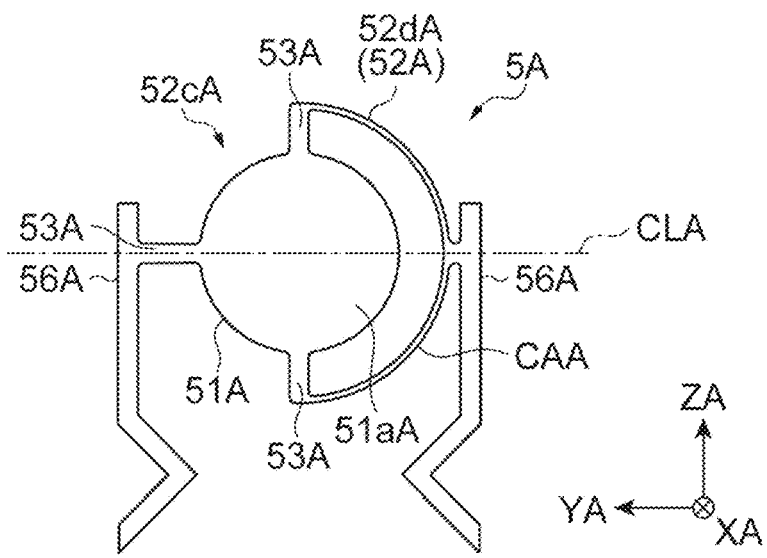

In addition, as illustrated in FIG. 21, when viewed in the XA-axis direction, the elastic portions 52A may be formed to have a shape in which a portion of the circle is cut out. In the example illustrated in FIG. 21(a), the elastic portions 52A have a shape in which a pair of cut-out portions 52cA is provided on both sides of the center line CLA with respect to the circle. That is, here, the elastic portions 52A are constituted of a pair of circular arc parts 52dA which is separated from each other across the cut-out portions 52cA. The connecting portions 53A connect the elastic portions 52A and the mirror portion 51A to each other at end portions of each of the circular arc parts 52dA. Accordingly, here, one annular region CAA is formed by one circular arc part 52dA, the pair of connecting portions 53A which is connected to the one circular arc part 52dA, and the mirror portion 51A.

In the example illustrated in FIGS. 21(b) and 21(c), the elastic portion 52A is constituted as a single circular arc part 52dA by a single cut-out portion 52cA. The connecting portions 53A connect the elastic portion 52A and the mirror portion 51A to each other at end portions of the elastic portion 52A. Accordingly, here, the annular region CAA is formed by the elastic portion 52A, the pair of connecting portions 53A, and the mirror portion 51A. Here, the connecting portions 53A connect the support portions 56A and the mirror portion 51A to each other via the cut-out portions 52cA. That is, the mirror portion 51A may be directly connected to the support portions 56A.

Figure 22:
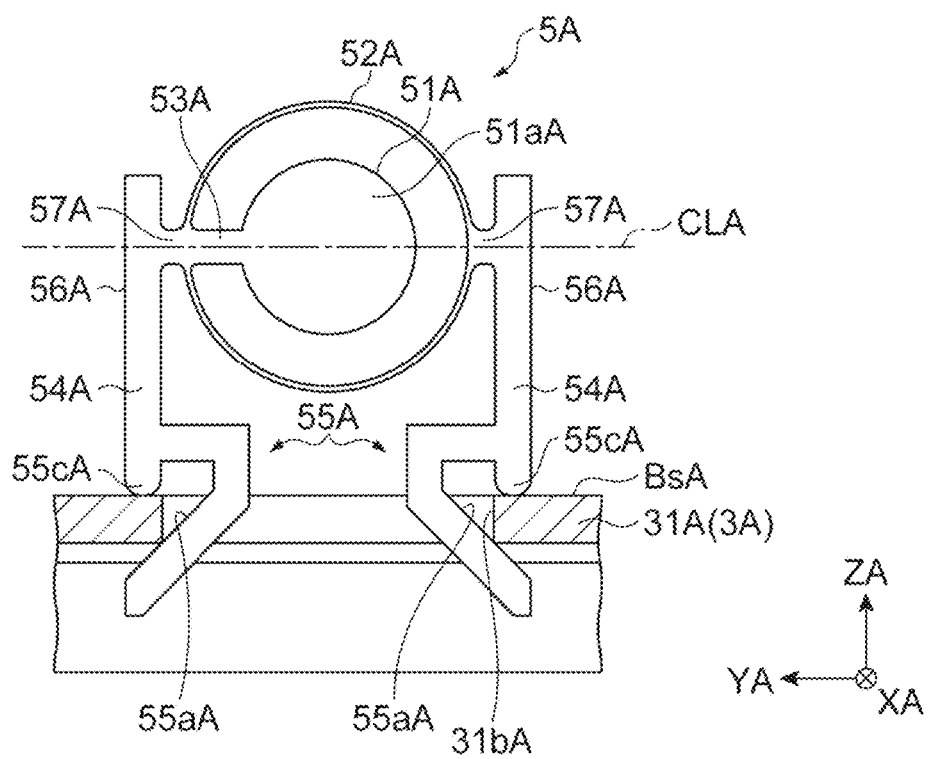
FIG. 22 is a front view illustrating another modification example of the movable mirror.
Figure 22:
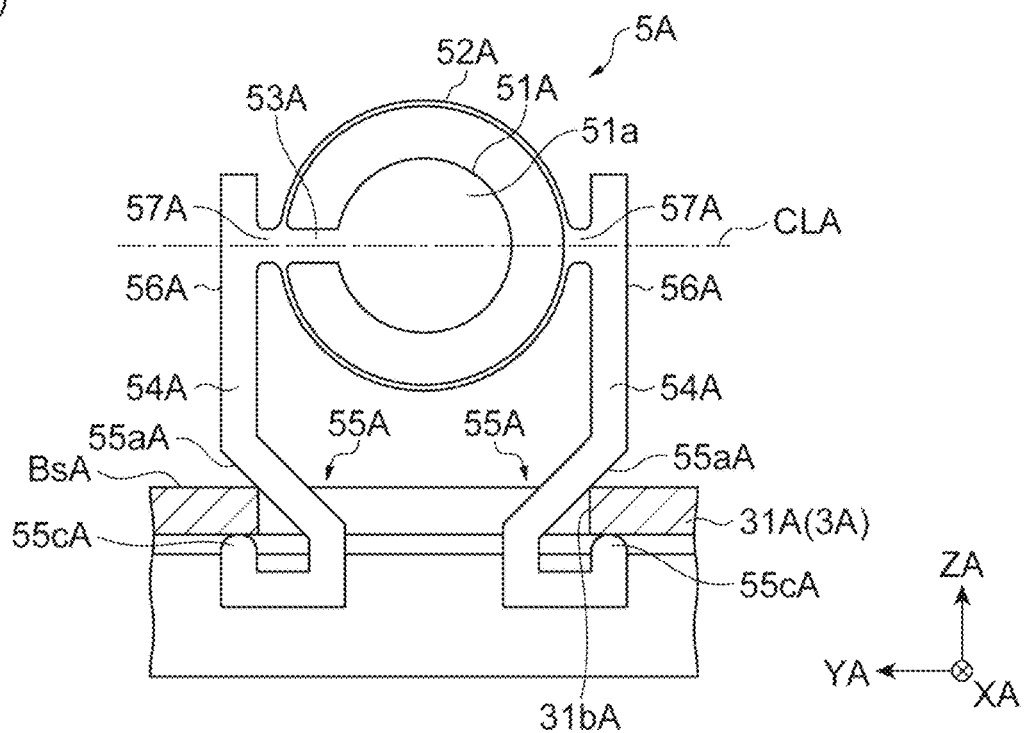

In the example illustrated in FIG. 22(a), compared to the form illustrated in FIG. 2, the shapes of the interlock portions 55A are changed. Here, the interlock portions 55A extend from the leg portion 54A in a direction (negative ZA-axis direction) opposite to the connecting portions 57A and are terminated. That is, the interlock portion 55A includes an end portion 55cA. In addition, the interlock portion 55A includes a protrusion portion 55dA which protrudes to the other interlock portion 55A side from a position on the connecting portion 57A side of the end portion 55cA. The protrusion portion 55dA includes the inclined surface 55bA. The end portion 55cA and the inclined surface 55bA face each other in the ZA-axis direction.

The end portions 55cA come into contact with circumferential edge portions of the opening 31bA on the main surface BsA. Meanwhile, the inclined surfaces 55bA come into contact with the edge portions of the opening 31bA on a side opposite to the main surface BsA. Accordingly, the interlock portions 55A are interlocked with the mounting region 31A such that the mounting region 31A is sandwiched therebetween in the ZA-axis direction. That is, in this case as well, the support portion 56A includes the interlock portion 55A which is bent to come into contact with the pair of edge portions of the opening 31bA in a direction intersecting the main surface BsA. As a result, detachment of the movable mirror 5A from the base BA in the ZA-axis direction is curbed.

In the example illustrated in FIG. 22(b), the interlock portion 55A has the inclined surface 55aA, is bent to be folded back to the connecting portion 57A side on the distal end side of the inclined surface 55aA, and is terminated. That is, the interlock portion 55A includes the end portion 55cA. The end portion 55cA and the inclined surface 55aA face each other in the ZA-axis direction.

The end portions 55cA come into contact with circumferential edge portion of the opening 31bA on a surface on a side opposite to the main surface BsA. Meanwhile, the inclined surfaces 55aA come into contact with the edge portions of the opening 31bA on the main surface BsA side. Accordingly, the interlock portions 55A are interlocked with the mounting region 31A such that the mounting region 31A is sandwiched therebetween in the ZA-axis direction. That is, in this case as well, the support portion 56A includes the interlock portion 55A which is bent to come into contact with the pair of edge portions of the opening 31bA in a direction intersecting the main surface BsA. As a result, detachment of the movable mirror 5A from the base BA in the ZA-axis direction is curbed.

Subsequently, modification examples of the movable mirror 5AA illustrated in FIG. 15 will be described. The movable mirror 5AA illustrated in FIG. 23(a) further includes a pair of handle portions 59A. In addition, here, the elastic portion 52A is constituted of the semicircular leaf spring 52aA and the leaf spring 52bA. The leaf springs 52aA and 52bA are disposed in directions opposite to each other and are connected to each other through the support portion 56AA (interlock portion 55A). Accordingly, here, the annular region CAA having a substantially elliptical shape is formed by the elastic portions 52A and the support portions 56AA.

The handle portions 59A are disposed on the inner side of the annular region CAA. The handle portion 59A exhibits a U-shape, and both ends thereof are connected to the support portion 56AA. The pair of support portions 56AA and the pair of handle portions 59A are arranged in a row along the center line CLA. The connecting portion 53A is connected to one handle portion 59A. Therefore, the connecting portion 53A connects the support portion 56AA and the mirror portion 51A to each other with the handle portion 59A interposed therebetween. In this movable mirror 5AA, for example, when a force is applied to the handle portions 59A such that the handle portions 59A approach each other in a state where the pair of handle portions 59A is held, the elastic portions 52A can be elastically deformed to be compressed in the YA-axis direction.

Figure 23:
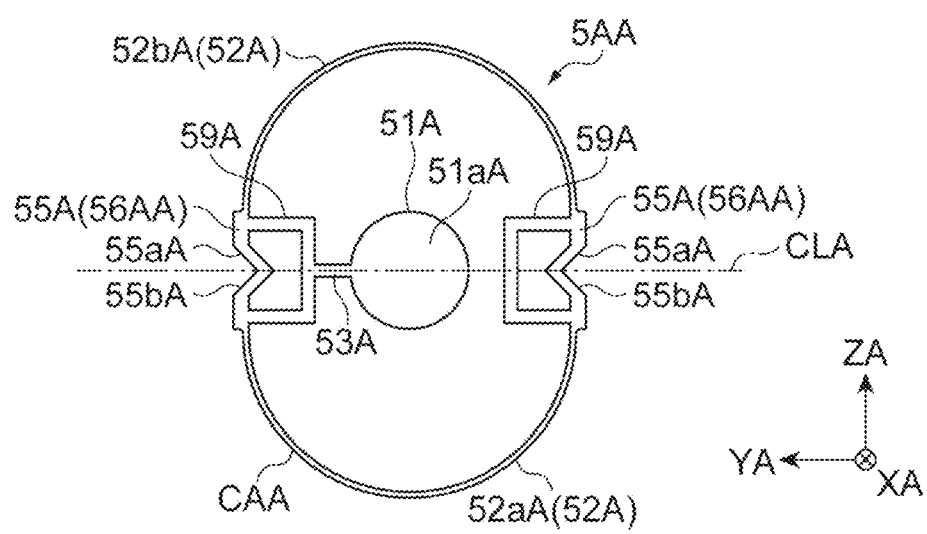
FIG. 23 is a front view illustrating another modification example of the movable mirror.
Figure 23:
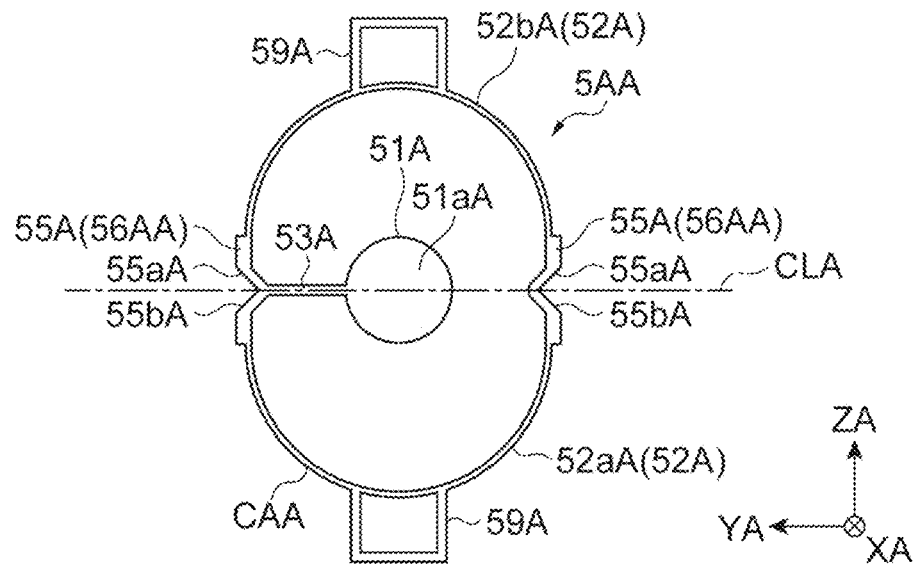
Figure 23:
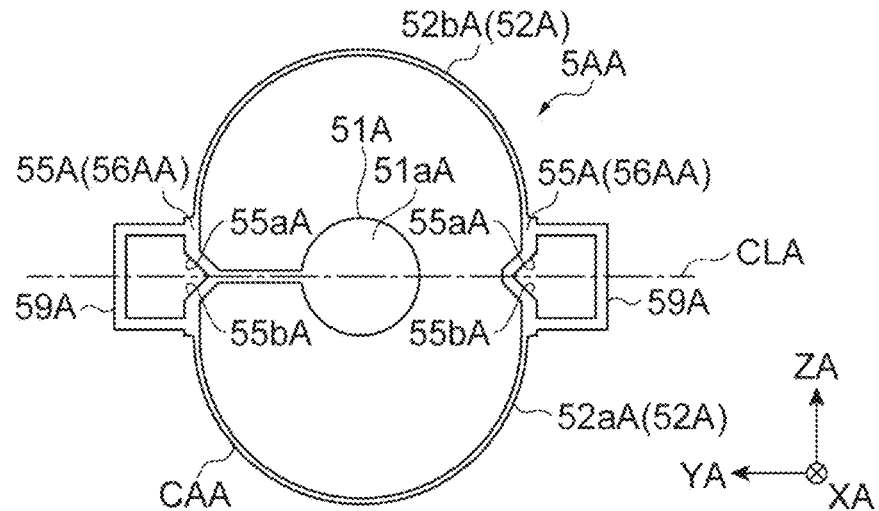

As illustrated in FIG. 23(b), the handle portion 59A may be provided in the elastic portion 52A. Here, the handle portion 59A protrudes outward from the annular region CAA. The handle portions 59A of the pair are distributed and disposed on both sides of the center line CLA. Particularly, here, the handle portions 59A of the pair are disposed at symmetrical positions with respect to the center line CLA. In this movable mirror 5AA, for example, when a force is applied to the handle portions 59A such that the handle portions 59A are separated from each other in a state where the pair of handle portions 59A is held, the elastic portions 52A can be elastically deformed to be compressed in the YA-axis direction.

As illustrated in FIG. 23(c), when the pair of support portions 56AA and the pair of handle portions 59A are disposed in a row along the center line CLA, the handle portions 59A may be connected to the support portions 56AA such that they protrude outward from the annular region CAA.

Figure 24:
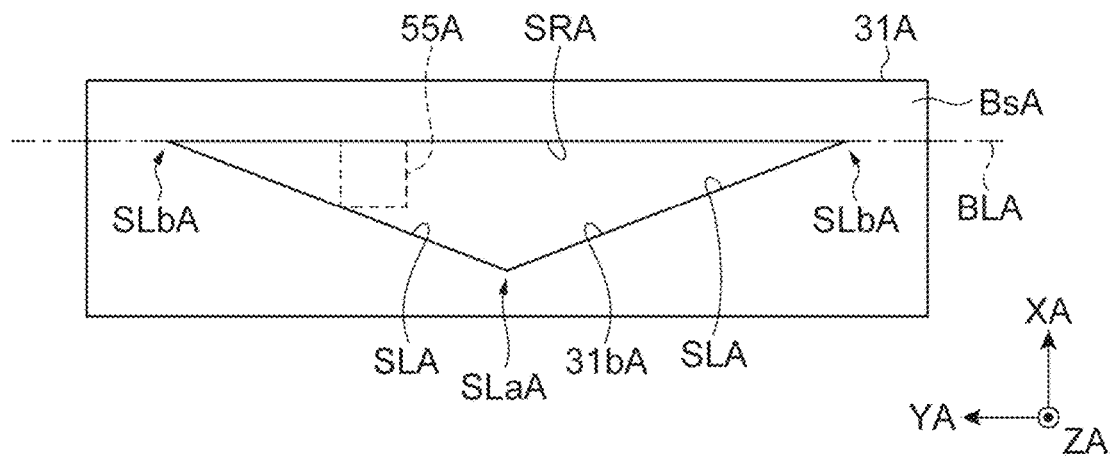
FIG. 24 is a plan view illustrating a modification example of an opening.
Figure 24:
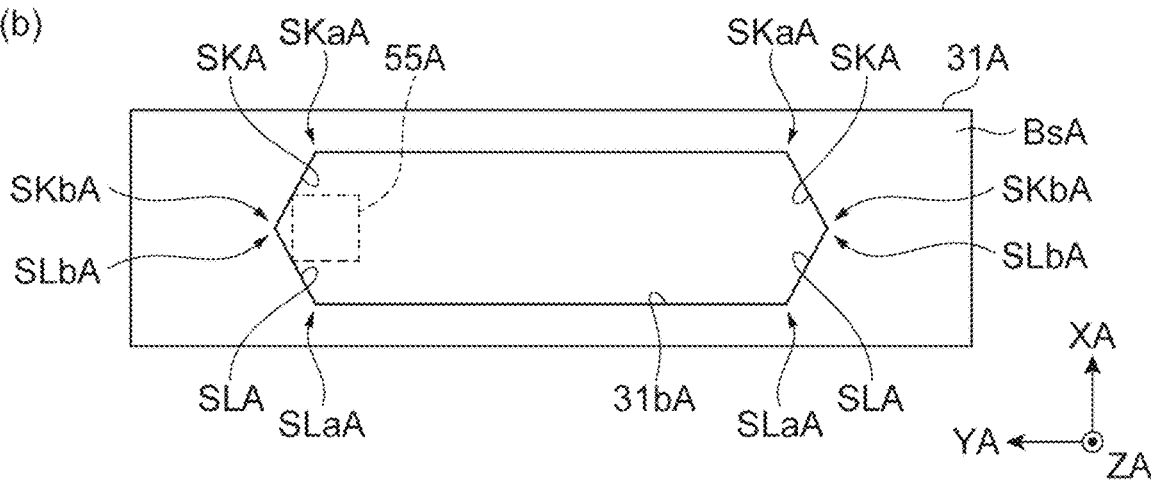
Figure 24:
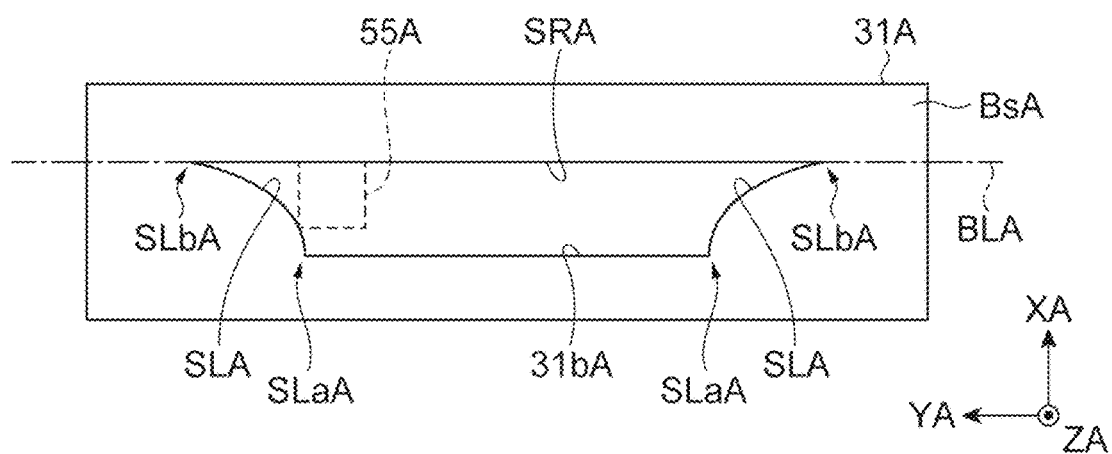

Subsequently, modification examples of the opening 31bA illustrated in FIG. 4 will be described. As illustrated in FIG. 24(a), the shape of the opening 31bA when viewed in the ZA-axis direction may be a triangular shape. In this case, the inner surface of the opening 31bA is constituted of the pair of inclined surfaces SLA and the reference surface SRA. Here, one ends SLaA of the inclined surfaces SLA are connected to each other. In this case as well, when the interlock portion 55A comes into internal contact with a corner portion defined by the inclined surface SLA and the reference surface SRA, the movable mirror 5A can be positionally aligned in both the XA-axis direction and the YA-axis direction.

In the example illustrated in FIG. 24(b), the shape of the opening 31bA when viewed in the ZA-axis direction is a hexagonal shape. In this case, the inner surface of the opening 31bA includes a pair of inclined surfaces SLA and a pair of inclined surfaces SKA which are inclined to sides opposite to the inclined surfaces SLA. The inclined surfaces SKA of the pair are inclined such that the distance therebetween increases from one end SkaA toward the other end SKbA. Here, the other end SLbA of the inclined surface SLA and the other end SKbA of the inclined surface SKA are connected to each other and form one corner portion. In this case as well, when the interlock portion 55A comes into internal contact with a corner portion defined by the inclined surface SLA and the inclined surface SKA, the movable mirror 5A can be positionally aligned in both the XA-axis direction and the YA-axis direction. Here, when viewed in the ZA-axis direction, one interlock portion 55A comes into contact with the inner surface of the opening 31bA at two points.

As illustrated in FIG. 24(c), the inclined surfaces SLA may be a curved surface. In this case, the inclined surfaces SLA of the pair are inclined and curved such that the distance therebetween increases from one end SLaA toward the other end SLbA. Here, when viewed in the ZA-axis direction, the inclined surface SLA is curved such that the inclination of a tangential line of the inclined surface SLA with respect to the XA-axis gradually increases from the one end SLaA toward the other end SLbA. The inclined surface SLA is curved to be projected inward toward the opening 31bA. Even in this case as well, when the interlock portion 55A comes into internal contact with a corner portion defined by the inclined surface SLA and the reference surface SRA, the movable mirror 5A can be positionally aligned in both the XA-axis direction and the YA-axis direction.

Figure 25:
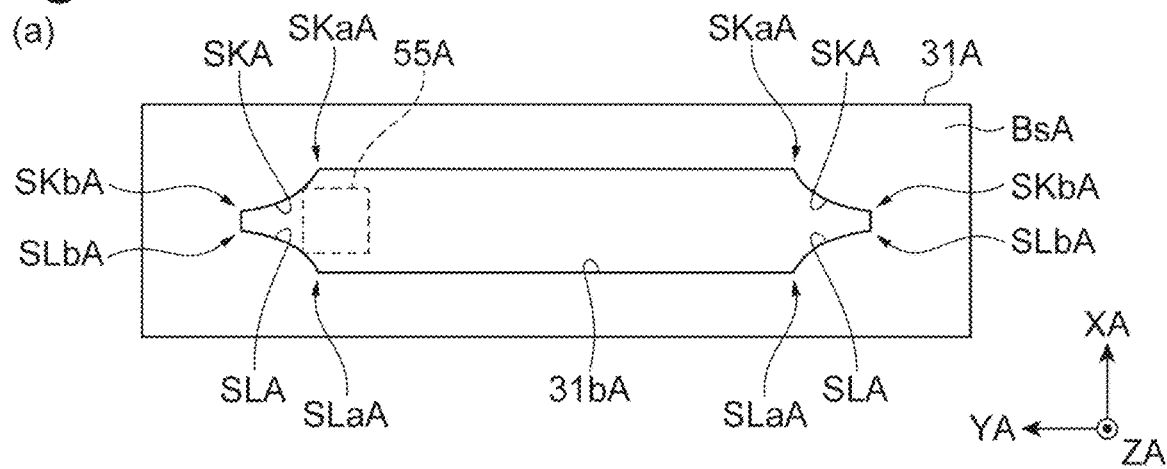
FIG. 25 is a plan view illustrating another modification example of the opening.
Figure 25:
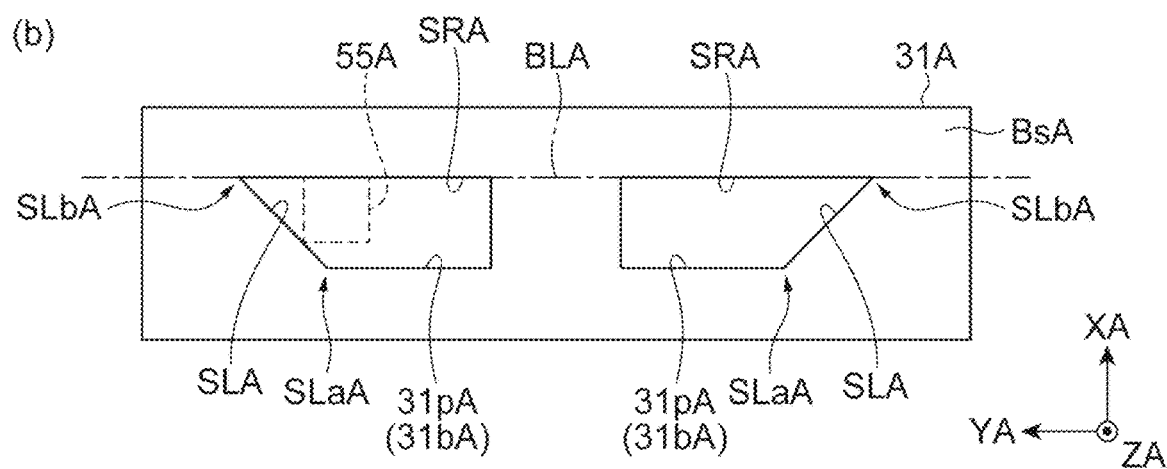
Figure 25:
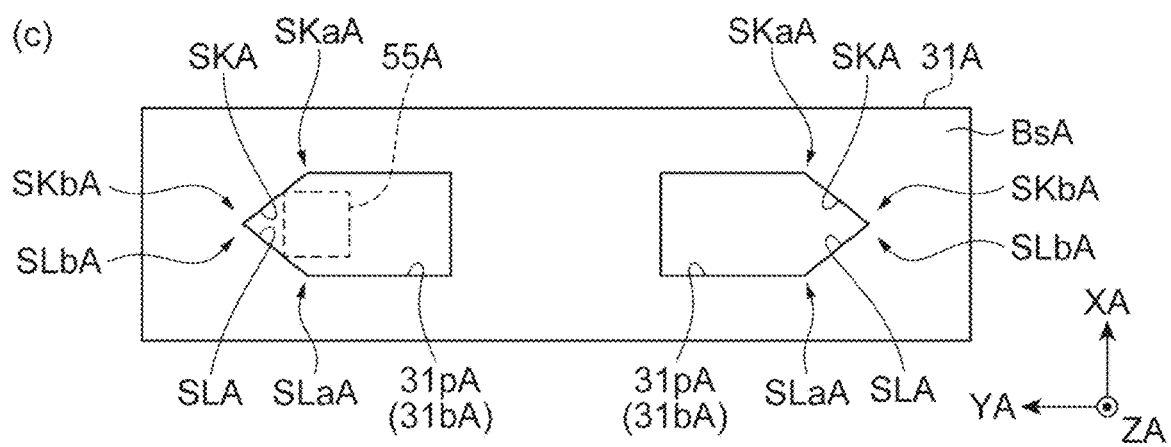

In the example illustrated in FIG. 25(a), both the inclined surface SLA and the inclined surface SKA have a curved surface to be projected inward to the opening 31bA. In addition, the other end SLbA of the inclined surface SLA and the other end SKbA of the inclined surface SKA are connected to each other via a connection surface which extends in the XA-axis direction. In this case as well, when the interlock portion 55A comes into internal contact with a corner portion defined by the inclined surface SLA and the inclined surface SKA, the movable mirror 5A can be positionally aligned in both the XA-axis direction and the YA-axis direction.

In the example illustrated in FIG. 25(b), the opening 31bA is divided into two parts 31pA when viewed in the ZA-axis direction. Each of the two parts 31pA has the inclined surface SLA and the reference surface SRA. That is, here, the reference surface SRA is also divided into two parts. However, when viewed in the ZA-axis direction, the reference surface SRA in its entirety extends along the reference line BLA connecting the other end SLbA of the inclined surface SLA of one part 31pA and the other end SLbA of the inclined surface SLA of the other part 31pA to each other. In this case, one interlock portion 55A is inserted into the one part 31pA of the opening 31bA. Then, when the interlock portion 55A comes into internal contact with a corner portion defined by the inclined surface SLA and the reference surface SRA, the movable mirror 5A can be positionally aligned in both the XA-axis direction and the YA-axis direction.

In the example illustrated in FIG. 25(c) as well, the opening 31bA is divided into two parts 31pA when viewed in the ZA-axis direction. Each of the two parts 31pA has the inclined surface SLA and the inclined surface SKA. In this case as well, when the interlock portion 55A comes into internal contact with a corner portion defined by the inclined surface SLA and the inclined surface SKA, the movable mirror 5A can be positionally aligned in both the XA-axis direction and the YA-axis direction.

Figure 26:
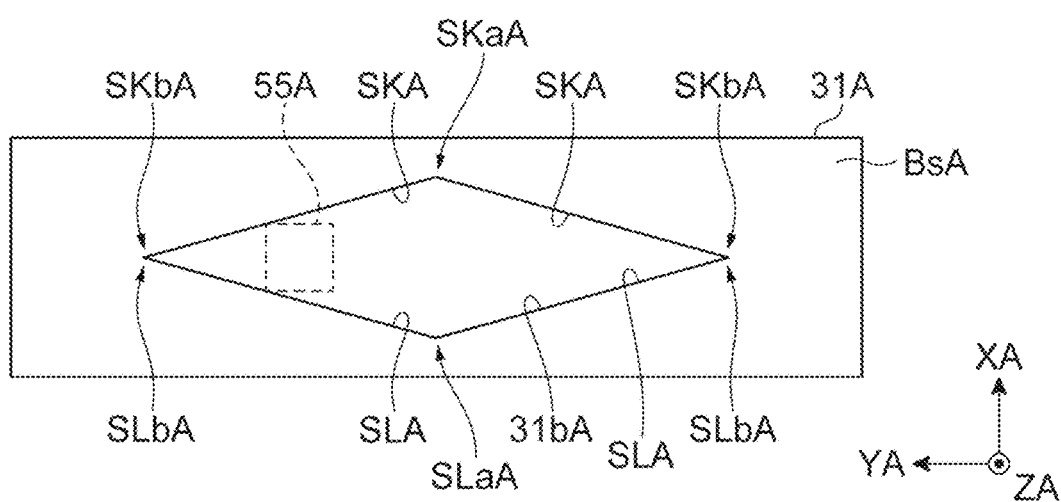
FIG. 26 is a plan view illustrating another modification example of the opening.
Figure 26:
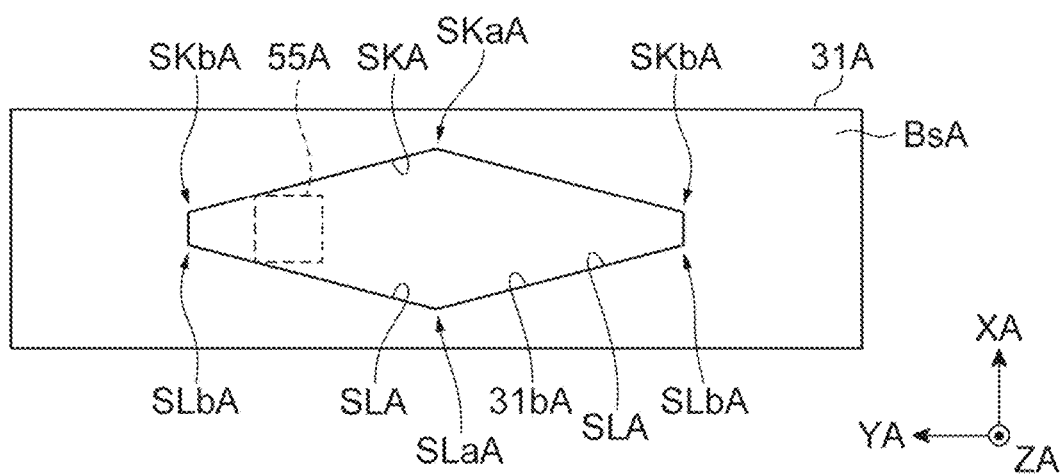

In the example illustrated in FIG. 26(a), the shape of the opening 31bA when viewed in the ZA-axis direction is a rhombic shape. Here, the inner surface of the opening 31bA is constituted of the inclined surfaces SLA and the inclined surfaces SKA. That is, here, in addition to that the inclined surfaces SLA and the inclined surfaces SKA are connected to each other, one ends SLaA of the inclined surfaces SLA are connected to each other, and one ends SkaA of the inclined surfaces SKA are connected to each other. In this case as well, when the interlock portion 55A comes into internal contact with a corner portion defined by the inclined surface SLA and the inclined surface SKA, the movable mirror 5A can be positionally aligned in both the XA-axis direction and the YA-axis direction.

Moreover, in the example illustrated in FIG. 26(b), the other end SLbA of the inclined surface SLA and the other end SKbA of the inclined surface SKA are connected to each other via a connection surface which extends in the XA-axis direction. In addition, one ends SLaA of the inclined surfaces SLA are connected to each other, and one ends SkaA of the inclined surfaces SKA are connected to each other. In this case as well, when the interlock portion 55A comes into internal contact with a corner portion defined by the inclined surface SLA and the inclined surface SKA, the movable mirror 5A can be positionally aligned in both the XA-axis direction and the YA-axis direction.

Here, in the foregoing description, a case where the interlock portion 55A is inserted into the opening 31bA after the gap between the support portions 56A is decreased in accordance with the elastic portions 52A which are elastically deformed to be compressed in the facing direction of the support portions 56A has been described as an example. However, it is also possible to employ a modification example in which the interlock portion 55A is inserted into the opening 31bA after the gap between the support portions 56A is increased.

Figure 27:
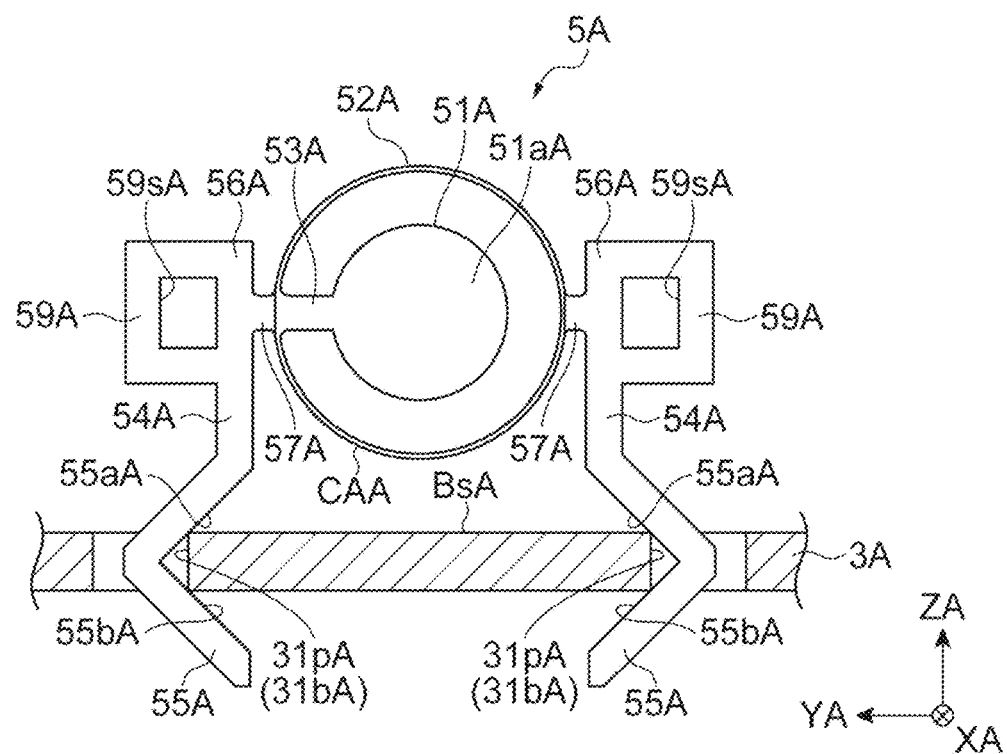
FIG. 27 is a cross-sectional view illustrating another modification example of the movable mirror.
Figure 27:
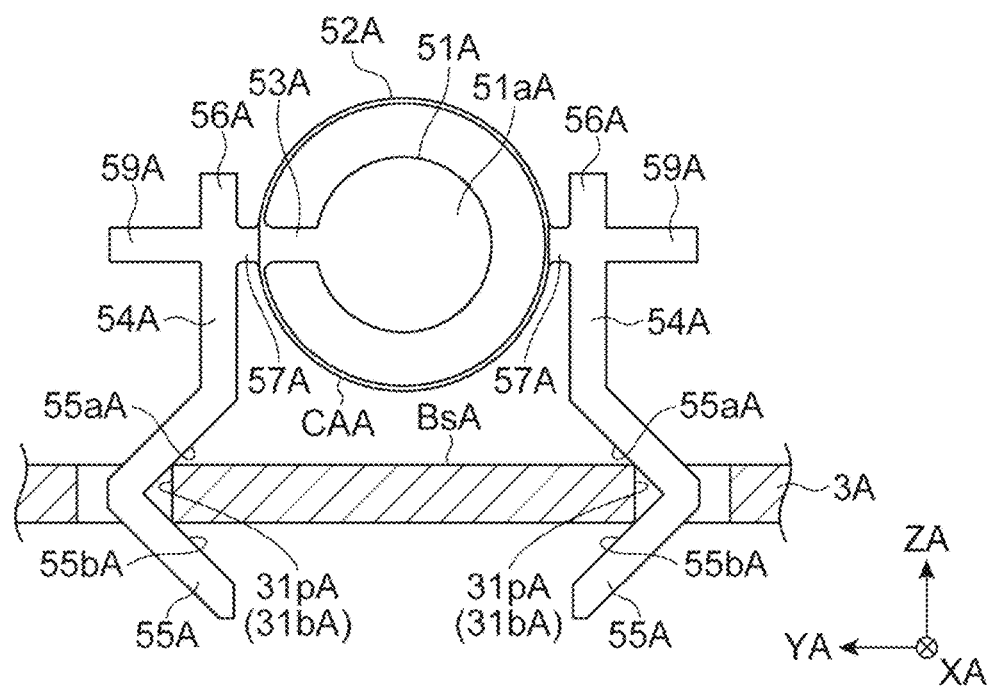
Figure 28:
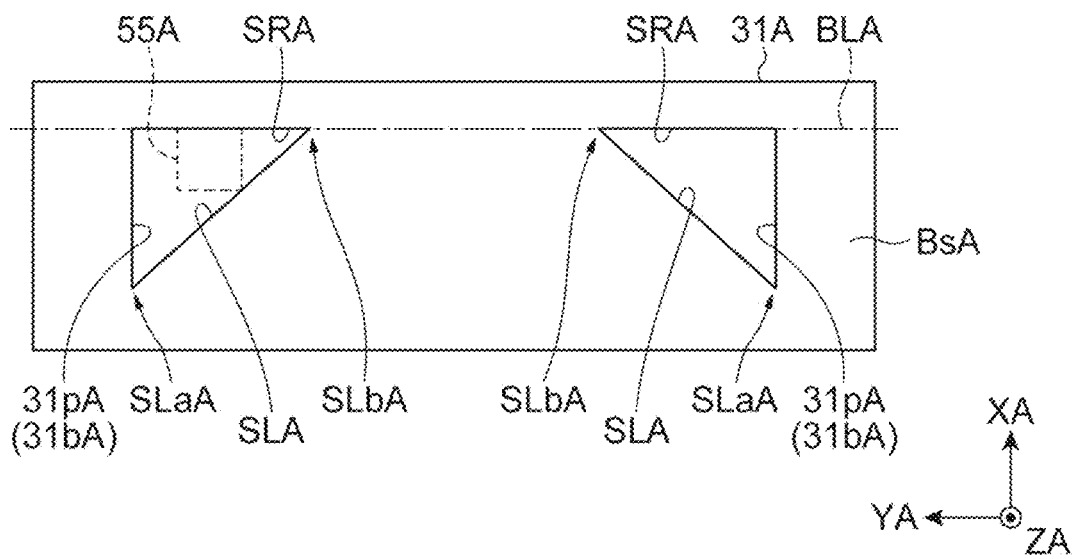
FIG. 28 is a plan view illustrating another modification example of the opening.
Figure 28:
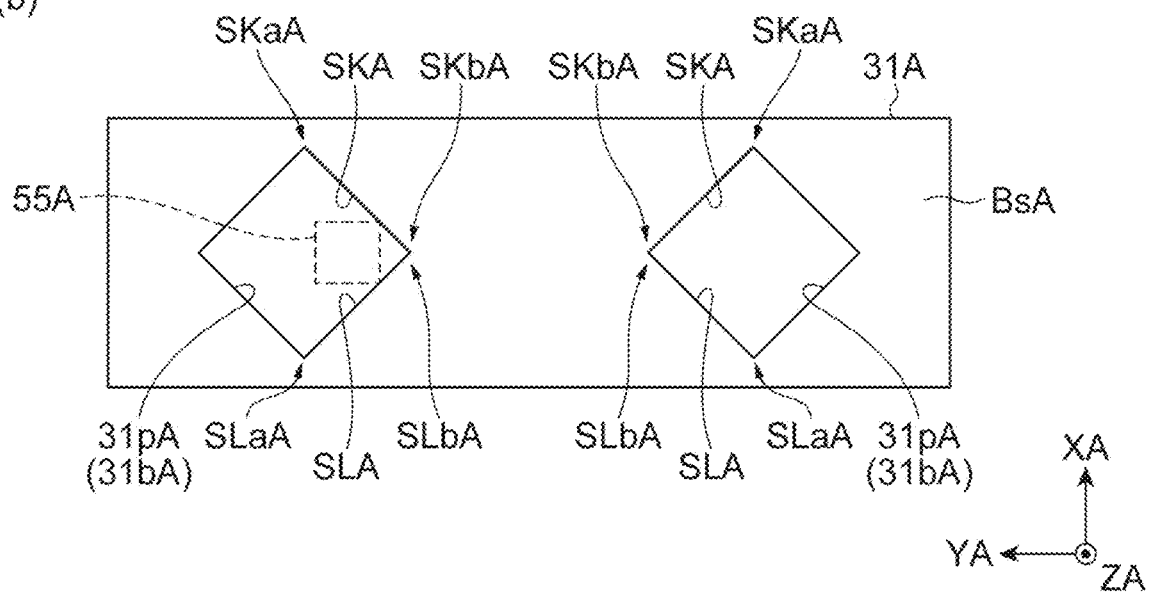

That is, the movable mirror 5A and the opening 31bA can be deformed as illustrated in FIGS. 27 and 28. In the example of FIG. 27, the support portion 56A includes the leg portion 54A and the interlock portion 55A. However, the bending direction of the interlock portion 55A differs from that of the example in FIG. 2. The interlock portions 55A are bent to be projected to opposite sides in the facing direction between the support portions 56A of the pair. Then, the interlock portions 55A include the inclined surfaces 55aA and the inclined surfaces 55bA as surfaces (inner surfaces) facing each other between the support portions 56A of the pair.

The inclined surfaces 55aA are inclined away from each other in a direction (negative ZA-axis direction) away from the connecting portions 57A. In addition, the inclined surfaces 55bA are inclined toward each other in the negative ZA-axis direction. The absolute value for the inclination angle thereof with respect to the ZA-axis is similar to that of the foregoing example. Here, a handle portion 59A is provided for each of the support portions 56A. The handle portions 59A are disposed such that the mirror portion 51A and the elastic portion 52A are sandwiched therebetween in the YA-axis direction. The handle portions 59A and the connecting portions 57A are arranged in a row along the center line CLA.

In the example of FIG. 27(a), the handle portion 59A is formed to have a U-shape, and a hole portion 59sA is formed between the handle portion 59A and the support portion 56A. Therefore, for example, when arms are inserted into the hole portions 59sA, a force can be applied to the handle portion 59A such that the gap between the support portions 56A is increased. In addition, in the example of FIG. 27(b), the handle portions 59A are linearly formed. Therefore, when the handle portions 59A are grabbed, a force can be applied to the handle portions 59A such that the gap between the support portions 56A is increased. In these cases, the elastic portion 52A is elastically deformed to be stretched in the YA-axis direction.

Correspondingly, the opening 31bA can be deformed as illustrated in FIG. 28. In the example of FIG. 28(a), the opening 31bA is divided into two triangular parts 31pA. In the movable mirror 5A illustrated in FIG. 27, when an elastic deformation of the elastic portion 52A is partially released in a state where the interlock portions 55A are inserted into the opening 31bA, the interlock portions 55A are displaced toward each other. In order to perform self-alignment utilizing this displacement, the inclined surface SLA is formed in each of the parts 31pA of the opening 31bA as a surface of the mounting region 31A on the center side in the YA-axis direction.

The inclined surface SLA includes one end SLaA and the other end SLbA. The one end SLaA and the other end SLbA are both end portions of the inclined surface SLA when viewed in the ZA-axis direction. The inclined surfaces SLA of the pair are inclined such that the distance therebetween is decreased from the one end SLaA toward the other end SLbA (for example, with respect to the XA-axis). When viewed in the ZA-axis direction, the reference surface SRA of each of the parts 31pA extends along the reference line BLA connecting the other end SLbA of one inclined surface SLA and the other end SLbA of the other inclined surface SLA to each other.

Therefore, when the pair of interlock portions 55A is disposed inside the opening 31bA, the interlock portions 55A slide on the inclined surfaces SLA toward the reference surface SRA due to a component of a reaction force from the inclined surfaces SLA in the XA-axis direction and abut the reference surface SRA while being in contact with the inclined surfaces SLA. Accordingly, the interlock portions 55A come into internal contact with the corner portions defined by the inclined surfaces SLA and the reference surface SRA and are positionally aligned (self-aligned due to an elastic force) in both the XA-axis direction and the YA-axis direction.

In the example of FIG. 28(b), the opening 31bA is divided into two rhombic parts 31pA. The inclined surface SLA and the inclined surface SKA are formed in each of the parts 31pA of the opening 31bA as a pair of surfaces of the mounting region 31A on the center side in the YA-axis direction. When focusing on one part 31pA, the inclined surface SLA and the inclined surface SLA are inclined to sides opposite to each other. The inclined surfaces SKA are inclined such that the distance therebetween is decreased from one ends SkaA toward the other ends SKbA. Here, the other end SLbA of the inclined surface SLA and the other end SKbA of the inclined surface SKA are connected to each other and form one corner portion. In this case as well, when the interlock portion 55A comes into internal contact with a corner portion defined by the inclined surface SLA and the inclined surface SKA, it is positionally aligned (self-aligned due to an elastic force) in both the XA-axis direction and the YA-axis direction.

Hereinabove, various modification examples of the movable mirrors 5A and 5AA and the opening 31bA have been described. However, the modification examples of the movable mirrors 5A and 5AA and the opening 31bA are not limited to those described above. For example, the movable mirrors 5A and 5AA and the opening 31bA can be constituted as another modification example by replacing arbitrary parts in the foregoing modification examples with each other. The same applies to the fixed mirror 6A and the opening 37aA as well.

Moreover, in the foregoing embodiment, a movable mirror and a fixed mirror have been described as examples of optical elements to be mounted on the base BA. In this example, the optical surface is a mirror surface. However, the optical element which becomes a mounting target is not limited to a mirror. For example, an arbitrary element such as a grating or an optical filter can be adopted.

In addition, the shapes of the mirror portions 51A and 61A and the mirror surfaces 51aA and 61aA are not limited to a circular shape and may be a rectangular shape or other shapes. The following are appendixes of the foregoing first embodiment.

APPENDIX 1

A light module including:
an optical element; and
a base on which the optical element is mounted, in which
the optical element has an optical portion which has an optical surface; an elastic portion which is provided around the optical portion such that an annular region is formed; and a pair of support portions which is provided such that the optical portion is sandwiched in a first direction along the optical surface and in which an elastic force is applied and a distance therebetween is able to be changed in accordance with elastic deformation of the elastic portion,
the base has a main surface, and a mounting region in which an opening communicating with the main surface is provided,
the support portions are inserted into the opening in a state where an elastic force of the elastic portion is applied, and
the optical element is supported in the mounting region by a reaction force of the elastic force applied from an inner surface of the opening to the support portions in a state where the optical surface intersects the main surface.

APPENDIX 2

The light module according to appendix 1, in which
the base has a support layer and a device layer which is provided on the support layer and includes the main surface and the mounting region,
the opening penetrates the device layer in a direction intersecting the main surface, and
the support portion includes an interlock portion which is bent to come into contact with a pair of edge portions of the opening in a direction intersecting the main surface.

APPENDIX 3

The light module according to appendix 1 or 2, in which
the inner surface of the opening includes a pair of inclined surfaces which is inclined such that a distance therebetween increases from one end toward the other end when viewed in a direction intersecting the main surface, and a reference surface which extends along a reference line connecting the other end of one inclined surface and the other end of the other inclined surface to each other.

APPENDIX 4

The light module according to any one of appendixes 1 to 3, in which
the optical element has a first connecting portion which connects the optical portion and the elastic portion to each other.

APPENDIX 5

The light module according to any one of appendixes 1 to 4, in which
the elastic portion forms the annular region by forming in an annular shape such that the optical portion is surrounded when viewed in a second direction intersecting the optical surface.

APPENDIX 6

The light module according to any one of appendixes 1 to 5, in which
the support portion includes a second connecting portion which is connected to the elastic portion, and a leg portion which extends over the optical surface from the second connecting portion along a third direction along the optical surface and intersecting the first direction and is inserted into the opening.

APPENDIX 7

The light module according to appendix 2, further including:
a fixed mirror which is mounted in the support layer, the device layer, or an intermediate layer; and
a beam splitter which is mounted in the support layer, the device layer, or the intermediate layer, in which
the optical element is a movable mirror which includes the optical surface serving as a mirror surface,
the device layer has a driving region which is connected to the mounting region, and
the movable mirror, the fixed mirror, and the beam splitter are disposed such that an interference optical system is constituted.

APPENDIX 8

The light module according to appendix 7, in which
the base has the intermediate layer which is provided between the support layer and the device layer,
the support layer is a first silicon layer of an SOI substrate,
the device layer is a second silicon layer of the SOI substrate, and
the intermediate layer is an insulating layer of the SOI substrate.

APPENDIX 9

The light module according to appendix 7 or 8, further including:
a light incident unit which is disposed such that measurement light is incident on the interference optical system from outside; and
a light emission unit which is disposed such that the measurement light is emitted from the interference optical system to the outside.

Second Embodiment

Light modules in which an interference optical system is formed on a silicon-on-insulator (SOI) substrate by a micro electro mechanical systems (MEMS) technology are known (for example, refer to Japanese Unexamined Patent Publication No. 2012-524295). Such light modules have attracted attention because they can provide users with a Fourier transform infrared spectroscopic analyzer (FTIR) in which highly accurate optical disposition is realized.

Specification of United States Patent Application, Publication No. 2002/0186477 discloses a process of manufacturing an optical system. In this process, first, a template substrate and an optical bench are prepared. An alignment slot is formed in the template substrate through etching. A bond pad is disposed on a main surface of the optical bench. Subsequently, the template substrate is attached to the main surface of the optical bench such that the alignment slot is disposed on the bond pad. Subsequently, an optical element is inserted into the alignment slot while being positionally aligned along a side wall of the alignment slot and is positioned on the bond pad. Then, the optical element is bonded to the optical bench due to a reflow of the bond pad.

The foregoing light modules have the following problem in respect that the size of a movable mirror depends on a degree of completion of deep cutting with respect to an SOI substrate, for example. That is, since the degree of completion of deep cutting with respect to an SOI substrate is approximately 500 μm at the maximum, there is a limitation in increasing the size of a movable mirror for the sake of improvement of sensitivity of an FTIR. Here, a technology of mounting a separately formed movable mirror in a device layer (for example, a layer of an SOI substrate in which a driving region is formed) may be taken into consideration.

In contrast, in a case where the process disclosed in Patent Literature 2 is used when the MEMS device disclosed in Japanese Unexamined Patent Publication No. 2012-524295 is prepared, an optical element such as a movable mirror is bonded due to a reflow of a bond pad to be mounted in a movable mounting region which is connected to an actuator. In this case, there is concern that if a using amount, a forming region, and the like of a bond pad are not sufficiently controlled, bonding of the bond pad may affect driving of the mounting region. Therefore, there are cases where the process disclosed in Japanese Unexamined Patent Publication No. 2012-524295 may not be able to be applied, depending on the characteristics of a mounting region of an optical element.

An object of another aspect of the present disclosure is to provide a light module, in which an optical element can be reliably mounted regardless of characteristics of a mounting region, and a method for mounting the same.

According to another aspect of the present disclosure, there is provided a light module including an optical element, and a base on which the optical element is mounted. The optical element has an optical portion which has an optical surface, an elastic portion which is able to be elastically deformed, a pair of support portions which is provided to face each other and in which an elastic force is applied and a distance therebetween is able to be changed in accordance with elastic deformation of the elastic portion, and a handle which is used for causing the elastic portion to be elastically deformed such that the distance between the support portions of the pair is changed. The base has a main surface, and a mounting region in which an opening communicating with the main surface is provided. The pair of support portions is inserted into the opening in a state where an elastic force of the elastic portion is applied. The optical element is supported in the mounting region by a reaction force of the elastic force applied from an inner surface of the opening. The handle is positioned on one side in a direction intersecting the main surface with respect to the optical portion and the pair of support portions in a state where the optical element is mounted in the mounting region.

In this light module, the optical element has the elastic portion, and the pair of support portions in which the distance therebetween is able to be changed in accordance with elastic deformation of the elastic portion. Meanwhile, the opening communicating with the main surface is formed in the mounting region of the base on which the optical element is mounted. Therefore, as an example, when the support portions are inserted into the opening in a state where the elastic portion is elastically deformed such that the distance between the support portions is decreased, and when an elastic deformation of the elastic portion is partially released, the distance between the support portions increases inside the opening, so that the support portions can be brought into contact with the inner surface of the opening. Accordingly, the optical element is supported due to a reaction force applied from the inner surface of the opening to the support portions. In this manner, in this light module, the optical element is mounted on the base utilizing an elastic force. Therefore, it is possible to reduce the using amount of a bonding agent or to eliminate the need for a bonding agent, so that it is possible to reliably mount the optical element without taking an influence of a bonding agent or the like into consideration, that is, regardless of characteristics of the mounting region.

Moreover, in this light module, the optical element has the handle which is used for causing the elastic portion to be elastically deformed such that the distance between the support portions of the pair is changed. This handle is positioned on one side in a direction intersecting the main surface with respect to the optical portion and the pair of support portions in a state where the optical element is mounted in the mounting region. Therefore, when the pair of support portions is inserted into the opening in a state where the distance between the support portions of the pair is changed by causing the elastic portion to be elastically deformed using the handle, the optical portion is unlikely to hinder working. Therefore, the optical element can be easily mounted on the base. Thus, according to this light module, it is possible to facilitate a step of mounting the light module.

In the light module according to another aspect of the present disclosure, the handle may be used for shortening the distance between the pair of support portions, or may be used for increasing the distance between the pair of support portions. Accordingly, it is possible to favorably realize a configuration for easy mounting of the optical element.

In the light module according to another aspect of the present disclosure, the handle may have a pair of displacement portions for changing the distance between the pair of support portions by being displaced in a direction away from each other, or may have a pair of displacement portions for changing the distance between the pair of support portions by being displaced in a direction toward each other. Accordingly, it is possible to more easily mount the optical element on the base.

In the light module according to another aspect of the present disclosure, the pair of displacement portions may be disposed to be inclined such that a distance therebetween increases toward one side in a direction intersecting the main surface when viewed in a direction perpendicular to both a direction intersecting the main surface and a direction in which the pair of displacement portions faces each other. Accordingly, for example, when a bonder head which has entered a space between the pair of displacement portions from one side in a direction intersecting the main surface is pressed to the pair of displacement portions and is caused to slide on the pair of displacement portions toward the other side in the direction, the pair of displacement portions can be displaced in a direction away from each other. Therefore, it is possible to further facilitate the step of mounting the light module.

In the light module according to another aspect of the present disclosure, the handle may be positioned on the one side in a direction intersecting the main surface with respect to the elastic portion in a state where the optical element is mounted in the mounting region. Accordingly, when the pair of support portions is inserted into the opening in a state where the distance between the pair of support portions is changed by causing the elastic portion to be elastically deformed using the handle, the elastic portion is unlikely to hinder working. Therefore, it is possible to even more easily mount the optical element with respect to the base.

In the light module according to another aspect of the present disclosure, the base may have a support layer and a device layer which is provided on the support layer and includes the main surface and the mounting region. The opening may penetrate the device layer in a direction intersecting the main surface. The support portion may include an interlock portion which is bent to come into contact with a pair of edge portions of the opening in a direction intersecting the main surface. In this case, the interlock portion is interlocked with the mounting region at a position where the interlock portion comes into contact with the pair of edge portions of the opening. Therefore, it is possible to more reliably mount the optical element on the base and to positionally align the optical element in a direction intersecting the main surface of the base.

The light module according to another aspect of the present disclosure may further include a fixed mirror which is mounted in at least one of the support layer, the device layer, and an intermediate layer which is provided between the support layer and the device layer; and a beam splitter which is mounted in at least one of the support layer, the device layer, and the intermediate layer. The optical element may be a movable mirror which includes the optical surface serving as a mirror surface. The device layer may have a driving region which is connected to the mounting region. The movable mirror, the fixed mirror, and the beam splitter may be disposed such that an interference optical system is constituted. In this case, it is possible to obtain an FTIR having improved sensitivity. In addition, here, the mounting region, in which the movable mirror is mounted, is characterized by being connected to the driving region and being driven. Therefore, since the mounting region is likely to be adversely affected by a bonding agent or the like, the foregoing configuration becomes more effective.

In the light module according to another aspect of the present disclosure, the base may have the intermediate layer which is provided between the support layer and the device layer. The support layer may be a first silicon layer of an SOI substrate. The device layer may be a second silicon layer of the SOI substrate. The intermediate layer may be an insulating layer of the SOI substrate. In this case, it is possible to favorably realize a configuration for reliable mounting of the movable mirror with respect to the device layer using the SOI substrate.

The light module according to another aspect of the present disclosure may further include a light incident unit which is disposed such that measurement light is incident on the interference optical system from outside, and a light emission unit which is disposed such that the measurement light is emitted from the interference optical system to the outside. In this case, it is possible to obtain an FTIR including a light incident unit and a light emission unit.

A method for mounting the light module according to another aspect of the present disclosure includes a first step of inserting the pair of support portions into the opening in a state where the distance between the pair of support portions is changed by applying a force to the handle, and a second step of bringing the pair of support portions into contact with the inner surface of the opening and fixing the optical element to the base by releasing the force being applied to the handle.

In this method for mounting a light module, the optical element is mounted on the base utilizing an elastic force of the elastic portion. Accordingly, it is possible to reduce the using amount of a bonding agent or to eliminate the need for a bonding agent, so that it is possible to reliably mount the optical element without taking an influence of a bonding agent or the like into consideration, that is, regardless of characteristics of the mounting region. In addition, the pair of support portions is inserted into the opening in a state where the distance between the pair of support portions is changed by applying a force to the handle. At this time, since the handle is provided to be positioned on one side in a direction intersecting the main surface with respect to the optical portion and the pair of support portions in a state where the optical element is mounted in the mounting region, the optical portion is unlikely to hinder working. Therefore, the pair of support portions can be easily inserted into the opening in a state where the distance between the pair of support portions is changed. Thus, according to this method for mounting a light module, it is possible to facilitate the step of mounting a light module.

According to another aspect of the present disclosure, it is possible to provide a light module in which an optical element can be reliably mounted regardless of characteristics of a mounting region.

Hereinafter, an embodiment of another aspect of the present disclosure will be described in detail with reference to the drawings. The same reference signs are applied to parts which are the same or corresponding in each of the drawings, and duplicated parts will be omitted.

[Configuration of Light Module]

Figure 29:
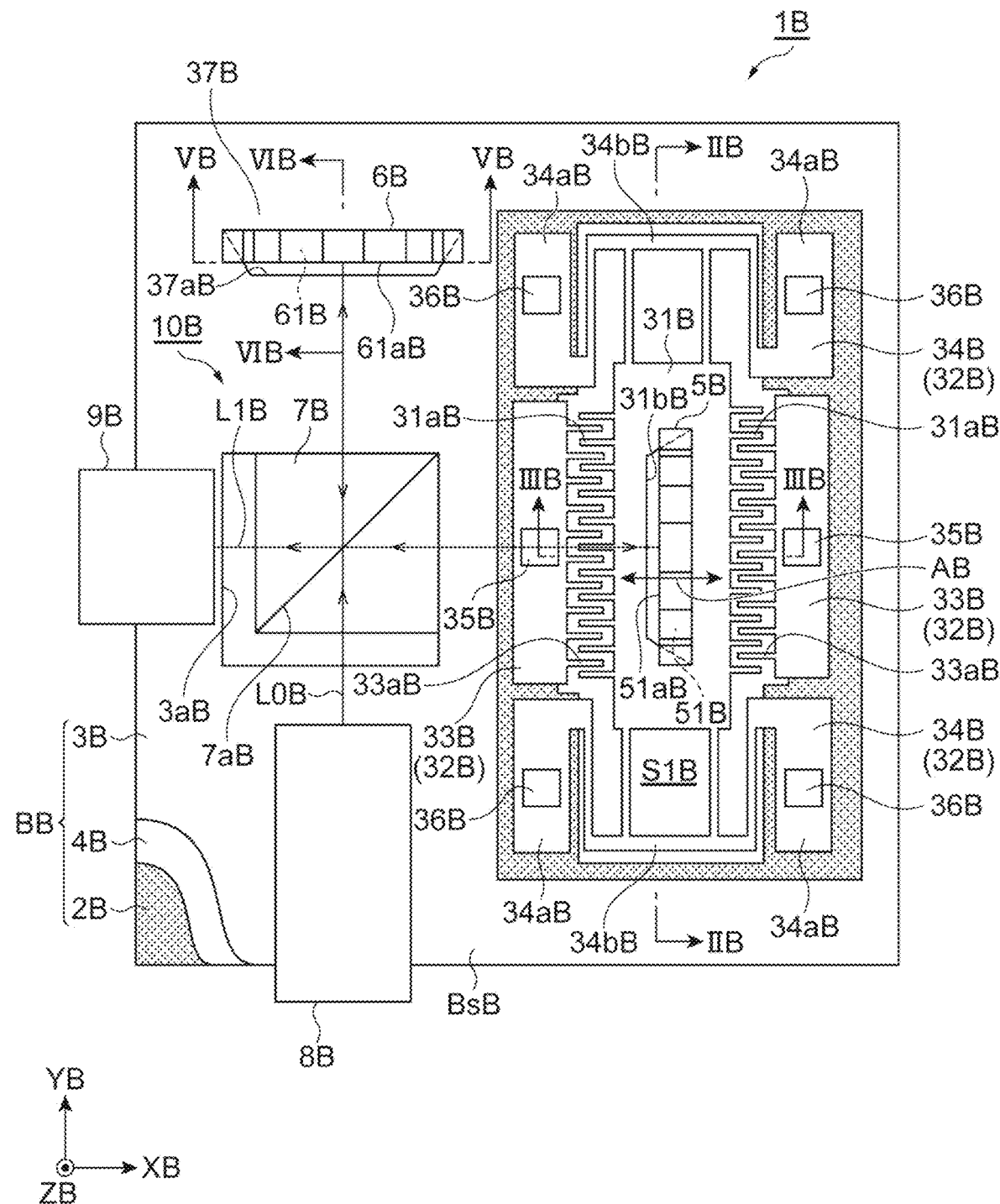
FIG. 29 is a plan view of a light module of another embodiment.

As illustrated in FIG. 29, a light module 1B includes a base BB. The base BB includes a main surface BsB. The base BB includes a support layer 2B, a device layer 3B which is provided on the support layer 2B, and an intermediate layer 4B which is provided between the support layer 2B and the device layer 3B. Here, the main surface BsB is a surface of the device layer 3B on a side opposite to the support layer 2B. The support layer 2B, the device layer 3B, and the intermediate layer 4B are constituted of an SOI substrate. Specifically, the support layer 2B is a first silicon layer of the SOI substrate. The device layer 3B is a second silicon layer of the SOI substrate. The intermediate layer 4B is an insulating layer of the SOI substrate. The support layer 2B, the device layer 3B, and the intermediate layer 4B exhibit a rectangular shape of which one side is approximately 10 mm, for example, when viewed in a ZB-axis direction (direction parallel to a ZB-axis) that is a laminating direction thereof. The thickness of each of the support layer 2B and the device layer 3B is approximately several hundreds of μm, for example. The thickness of the intermediate layer 4B is approximately several μm, for example. FIG. 29 illustrates the device layer 3B and the intermediate layer 4B in a state where one corner portion of the device layer 3B and one corner portion of the intermediate layer 4B are cut out.

The device layer 3B has a mounting region 31B and a driving region 32B which is connected to the mounting region 31B. The driving region 32B includes a pair of actuator regions 33B and a pair of elastic support regions 34B. The mounting region 31B and the driving region 32B (that is, the mounting region 31B, the pair of actuator regions 33B, and the pair of elastic support regions 34B) are integrally formed in a portion of the device layer 3B by a MEMS technology (patterning and etching).

The actuator regions 33B of the pair are disposed on both sides of the mounting region 31B in an XB-axis direction (direction parallel to an XB-axis orthogonal to the ZB-axis). That is, the mounting region 31B is sandwiched between the actuator regions 33B of the pair in the XB-axis direction. Each of the actuator regions 33B is fixed to the support layer 2B with the intermediate layer 4B. A first comb-teeth portion 33aB is provided on a side surface of each of the actuator regions 33B on the mounting region 31B side. Each of the first comb-teeth portions 33aB is in a state of being floated with respect to the support layer 2B by removing the intermediate layer 4B immediately below thereof. A first electrode 35B is provided in each of the actuator regions 33B.

The elastic support regions 34B of the pair are disposed on both sides of the mounting region 31B in a YB-axis direction (direction parallel to a YB-axis orthogonal to the ZB-axis and the XB-axis). That is, the mounting region 31B is sandwiched between the elastic support regions 34B of the pair in the YB-axis direction. Both end portions 34aB of each of the elastic support regions 34B are fixed to the support layer 2B with the intermediate layer 4B interposed therebetween. An elastic deformation portion 34bB (part between both the end portions 34aB) of each of the elastic support regions 34B has a structure in which a plurality of leaf springs are connected. The elastic deformation portion 34bB of each of the elastic support regions 34B is in a state of being floated with respect to the support layer 2B by removing the intermediate layer 4B immediately below thereof. A second electrode 36B is provided in each of both the end portions 34aB in each of the elastic support regions 34B.

The elastic deformation portion 34bB of each of the elastic support regions 34B is connected to the mounting region 31B. The mounting region 31B is in a state of being floated with respect to the support layer 2B removing the intermediate layer 4B immediately below thereof. That is, the mounting region 31B is supported by the pair of elastic support regions 34B. Second comb-teeth portions 31aB are provided on side surfaces of the mounting region 31B on the actuator region 33B side. Each of the second comb-teeth portions 31aB is in a state of being floated with respect to the support layer 2B by removing the intermediate layer 4B immediately below thereof. In the first comb-teeth portions 33aR and the second comb-teeth portions 31aB facing each other, each comb tooth of the first comb-teeth portions 33aB is positioned between comb teeth of the second comb-teeth portions 31aB The elastic support regions 34B of the pair sandwich the mounting region 31B from both sides when viewed in a direction AB parallel to the XB-axis. When the mounting region 31B moves along the direction AB, the pair of elastic support regions 34B causes an elastic force to act on the mounting region 31B such that the mounting region 31B returns to the initial position. Therefore, when a voltage is applied to a part between the first electrode 35B and the second electrode 36B such that an electrostatic attraction acts between the first comb-teeth portions 33aB and the second comb-teeth portions 31aB facing each other, the mounting region 31B moves along the direction AB to a position where the electrostatic attraction and the elastic force of the pair of elastic support regions 34B is balanced. In this manner, the driving region 32B functions as an electrostatic actuator.

The light module 1B further includes a movable mirror 5B, a fixed mirror 6B, a beam splitter 7B, a light incident unit 8B, and a light emission unit 9B. The movable mirror 5B, the fixed mirror 6B, and the beam splitter 7B are disposed on the device layer 3B such that an interference optical system 10B (Michelson interference optical system) is constituted.

The movable mirror 5B is mounted in the mounting region 31B of the device layer 3B on one side of the beam splitter 7B in the XB-axis direction. A mirror surface 51aB of a mirror portion 51B included in the movable mirror 5B is positioned on a side opposite to the support layer 2B with respect to the device layer 3B. For example, the mirror surface 51aB is a surface perpendicular to the XB-axis direction (that is, a surface perpendicular to the direction AB) and is directed to the beam splitter 7B side.

The fixed mirror 6B is mounted in a mounting region 37B of the device layer 3B on one side of the beam splitter 7B in the YB-axis direction. A mirror surface 61aB of a mirror portion 61B included in the fixed mirror 6B is positioned on a side opposite to the support layer 2B with respect to the device layer 3B. For example, the mirror surface 61aB is a surface perpendicular to the YB-axis direction and is directed to the beam splitter 7B side.

The light incident unit 8B is mounted in the device layer 3B on the other side of the beam splitter 7B in the YB-axis direction. For example, the light incident unit 8B is constituted of optical fibers, a collimating lens, and the like. The light incident unit 8B is disposed such that measurement light is incident on the interference optical system 10B from outside.

The light emission unit 9B is mounted in the device layer 3B on the other side of the beam splitter 7B in the XB-axis direction. For example, the light emission unit 9B is constituted of optical fibers, a collimating lens, and the like. The light emission unit 9B is disposed such that measurement light (interference light) is emitted from the interference optical system 10B to the outside.

The beam splitter 7B is a cube-type beam splitter having an optical functional surface 7aB. The optical functional surface 7aB is positioned on a side opposite to the support layer 2B with respect to the device layer 3B. The beam splitter 7B is positionally aligned when one corner portion of the beam splitter 7B on a bottom surface side is brought into contact with one corner of a rectangular opening 3aB formed in the device layer 3B. The beam splitter 7B is mounted in the support layer 2B by being fixed to the support layer 2B through bonding or the like in a positionally aligned state.

In the light module 1B having a configuration described above, when measurement light L0B is incident on the interference optical system 10B from outside via the light incident unit 8B, a portion of the measurement light L0B is reflected by the optical functional surface 7aB of the beam splitter 7B and travels toward the movable mirror 5B, and the remaining portion of the measurement light L0B is transmitted through the optical functional surface 7aB of the beam splitter 7B and travels toward the fixed mirror 6B. A portion of the measurement light L0B is reflected by the mirror surface 51aB of the movable mirror 5B, travels toward the beam splitter 7B along the same optical path, and is transmitted through the optical functional surface 7aB of the beam splitter 7B. The remaining portion of the measurement light L0B is reflected by the mirror surface 61aB of the fixed mirror 6B, travels toward the beam splitter 7B along the same optical path, and is reflected by the optical functional surface 7aB of the beam splitter 7B. A portion of the measurement light L0B which has been transmitted through the optical functional surface 7aB of the beam splitter 7B, and the remaining portion of the measurement light L0B which has been reflected by the optical functional surface 7aB of the beam splitter 7B become measurement light L1B (interference light). The measurement light L1B is emitted from the interference optical system 10B to the outside via the light emission unit 9B. According to the light module 1B, since the movable mirror 5B can reciprocate in the direction AB at a high speed, it is possible to provide a small-sized FTIR having high accuracy.

[Movable Mirror and Surrounding Structure Thereof]

Figure 30:
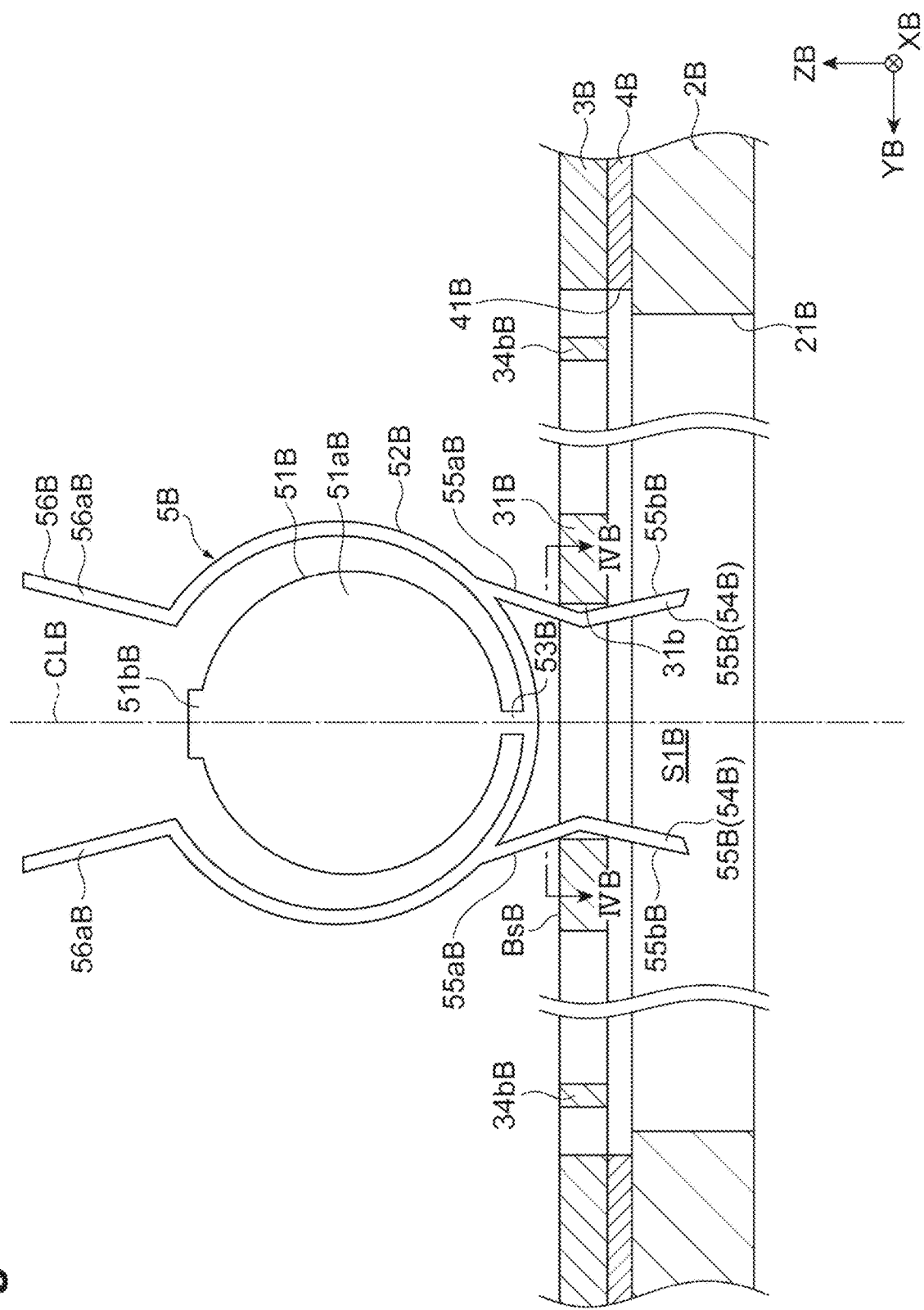
FIG. 30 is a cross-sectional view taken along line IIB-IIB illustrated in FIG. 29.
Figure 31:
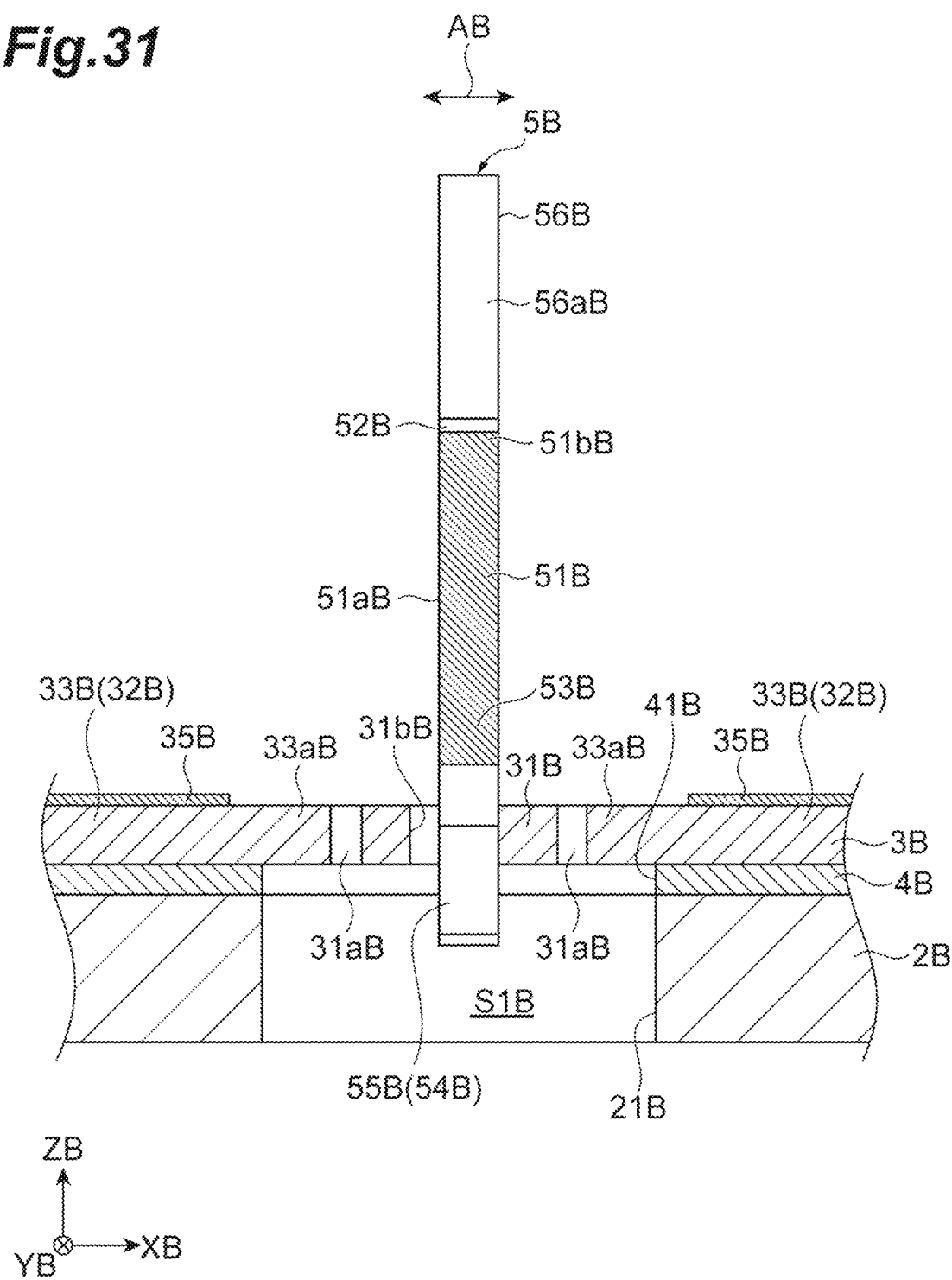
FIG. 31 is a cross-sectional view taken along line IIIB-IIIB illustrated in FIG. 29.
Figure 32:
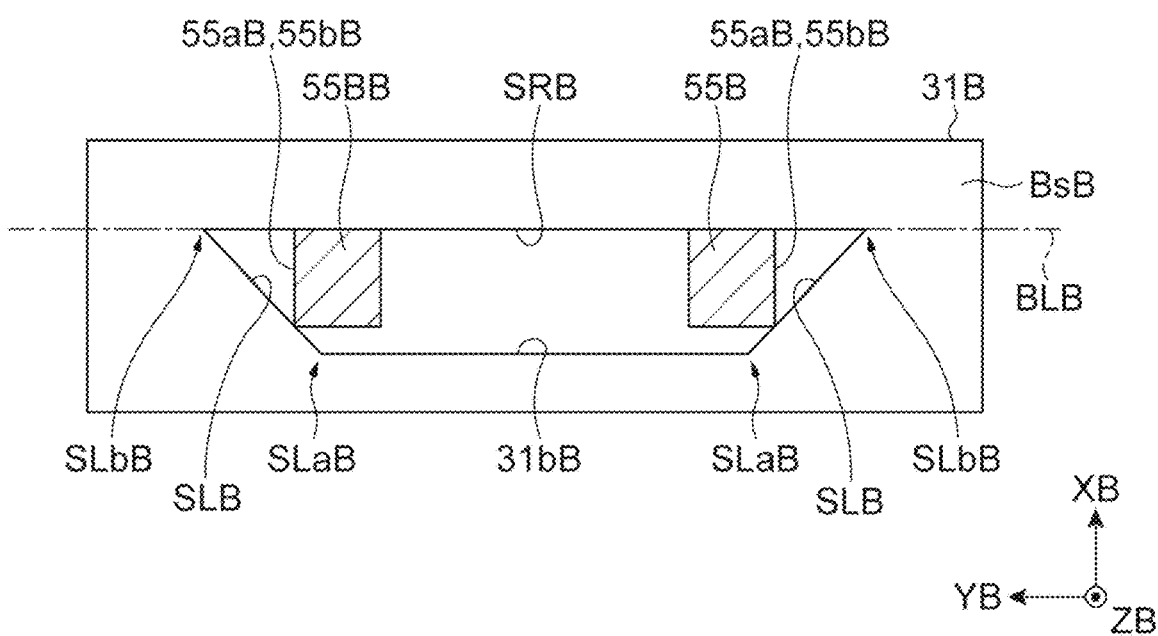
FIG. 32 is a cross-sectional view taken along line IVB-IVB illustrated in FIG. 30.

As illustrated in FIGS. 30, 31, and 32, the movable mirror (optical element) 5B has the mirror portion (optical portion) 51B which has the mirror surface (optical surface) 51aB, an elastic portion 52B which is able to be elastically deformed, a connecting portion 53B which connects the mirror portion 51B and the elastic portion 52B to each other, a pair of support portions 54B, and a handle 56B. The movable mirror 5B is mounted in the mounting region 31B of the base BB in a state where the mirror surface 51aB is positioned on a plane intersecting (for example, orthogonal to) the main surface BsB and the mirror surface 51aB is positioned on the main surface BsB side of the base BB.

The mirror portion 51B is formed to have a plate shape (for example, a disk shape) having the mirror surface 51aB as a main surface. In the mirror portion 51B, a flat portion 51bB having a flat surface on a side in the positive ZB-axis direction is provided in an edge portion on one side (side in the positive ZB-axis direction) in a direction (ZB-axis direction) intersecting the main surface BsB.

When viewed in a direction (XB-axis direction) intersecting the mirror surface 51aB, the elastic portion 52B is formed to be separated from the mirror portion 51B and to surround the mirror portion 51B. Here, the elastic portion 52B has an annular shape realized by removing a portion on a side in the positive ZB-axis direction from a circular shape. The connecting portion 53B extends along a center line CLB and connects the edge portion of the mirror portion 51B on a side in the negative ZB-axis direction and the elastic portion 52B to each other. The center line CLB is an imaginary straight line passing through the center of the mirror surface 51aB when viewed in the XB-axis direction and extending in the ZB-axis direction.

The pair of support portions 54B has a rod shape with a rectangular cross section and are provided to face each other in a direction (YB-axis direction) along the mirror surface 51aB and the main surface BsB. The pair of support portions 54B is connected to the elastic portion 52B respectively on one side and the other side in the YB-axis direction with respect to the center line CLB. The pair of support portions 54B is positioned on a side in the negative ZB-axis direction with respect to the mirror portion 51B.

Each of the support portions 54B includes an interlock portion 55B. A pair of interlock portions 55B is formed to be bent inward (toward each other) in a V-shape, for example, when viewed in the XB-axis direction. In this example, the support portion 54B in its entirety serves as the interlock portion 55B. Each of the interlock portions 55B includes an inclined surface 55aB and an inclined surface 55bB. The inclined surface 55aR and the inclined surface 55bB are surfaces (outer surfaces) of the pair of interlock portions 55B on sides opposite to surfaces facing each other. The inclined surfaces 55aB are inclined toward each other in the negative ZB-axis direction between the interlock portions 55B of the pair. The inclined surfaces 55bB are inclined away from each other in the negative ZB-axis direction.

The handle 56B has a pair of displacement portions 56aB which is respectively connected to both ends of the elastic portion 52B. The pair of displacement portions 56aB has a rod shape with a rectangular cross section and are provided to face each other in the YB-axis direction. Each of the displacement portions 56aB extends in the positive ZB-axis direction from the end portion of the elastic portion 52B. The displacement portions 56aB of the pair are disposed to be inclined such that the distance therebetween increases in the positive ZB-axis direction when viewed in the XB-axis direction (direction perpendicular to the ZB-axis direction intersecting the main surface BsB and the YB-axis direction in which the pair of displacement portions 56aB faces each other). The pair of displacement portions 56aB is positioned on a side in the positive ZB-axis direction with respect to the mirror portion 51B, the elastic portion 52B, and the pair of support portions 54B in a state where the movable mirror 5B is mounted in the mounting region 31B.

The pair of support portions 54B is connected to the elastic portion 52B, and the elastic portion 52B is connected to the pair of displacement portions 56aB. That is, the pair of displacement portions 56aB is connected to the pair of support portions 54B via the elastic portion 52B, respectively. Therefore, for example, when a force is applied to the displacement portions 56aB of the pair such that they are displaced in a direction away from each other, the elastic portion 52B can be elastically deformed to be stretched in the YB-axis direction, and the distance between the support portions 54B of the pair can be shortened. That is, the distance between the support portions 54B of the pair in the YB-axis direction can be changed in accordance with elastic deformation of the elastic portion 52B. In addition, an elastic force of the elastic portion 52B can be applied to the pair of support portions 54B.

Here, an opening 31bB is formed in the mounting region 31B of the base BB. Here, the opening 31bB extends in the ZB-axis direction and penetrates the device layer 3B. Therefore, the opening 31bB communicates with (reaches) the main surface BsB and a surface of the device layer 3B on a side opposite to the main surface BsB. The opening 31bB exhibits a pillar shape in which a shape when viewed in the ZB-axis direction is a trapezoidal shape (refer to FIG. 32). The opening 31bB will be described below in detail.

The pair of support portions 54B is inserted into the opening 31bB in a state where an elastic force of the elastic portion 52B is applied. In other words, each of the support portions 54B (that is, the movable mirror 5B) penetrates the mounting region 31B via the opening 31bB. More specifically, a portion of the interlock portion 55B of each of the support portions 54B is positioned inside the opening 31bB. In this state, each of the interlock portions 55B comes into contact with a pair of edge portions (an edge portion on the main surface BsB side and an edge portion on a side opposite to the main surface BsB) of the opening 31bB in the ZB-axis direction.

Here, the inclined surfaces 55aB come into contact with the edge portions of the opening 31bB on the main surface BsB side, and the inclined surfaces 55bB come into contact with the edge portions of the opening 31bB on a side opposite to the main surface BsB. Accordingly, the pair of interlock portions 55B is interlocked with the mounting region 31B such that the mounting region 31B is sandwiched therebetween in the ZB-axis direction. As a result, detachment of the movable mirror 5B from the base BB in the ZB-axis direction is curbed.

Here, an opening 41B is formed in the intermediate layer 4B. The opening 41B is open on both sides of the intermediate layer 4B in the ZB-axis direction. An opening 21B is formed in the support layer 2B. The opening 21B is open on both sides of the support layer 2B in the ZB-axis direction. In the light module 1B, a continuous space S1B is constituted of a region inside the opening 41B of the intermediate layer 4B and a region inside the opening 21B of the support layer 2B. That is, the space S1B includes a region inside the opening 41B of the inter mediate layer 4B and a region inside the opening 21B of the support layer 2B.

The space S1B is formed between the support layer 2B and the device layer 3B and corresponds to at least the mounting region 31B and the driving region 32B. Specifically, a region inside the opening 41B of the intermediate layer 4B and a region inside the opening 21B of the support layer 2B include a range in which the mounting region 31B moves when viewed in the ZB-axis direction. A region inside the opening 41B of the intermediate layer 4B forms a clearance for causing a part (that is, a part to be in a floated state with respect to the support layer 2B, for example, the mounting region 31B in its entirety, the elastic deformation portion 34$b$B of each of the elastic support regions 34B, the first comb-teeth portions 33$a$B, and the second comb-teeth portions 31$a$B) of the mounting region 31B and the driving region 32B, which needs to be separated from the support layer 2B, to be separated from the support layer 2B.

A portion of each of the interlock portions 55B included in the movable mirror 5B is positioned in the space S1B. Specifically, a portion of each of the interlock portions 55B is positioned in a region inside the opening 21B of the support layer 2B through a region inside the opening 41B of the intermediate layer 4B. A portion of each of the interlock portions 55B protrudes into the space S1B from a surface of the device layer 3B on the intermediate layer 4B side by approximately 100 μm, for example. As described above, since a region inside the opening 41B of the intermediate layer 4B and a region inside the opening 21B of the support layer 2B include the range in which the mounting region 31B moves when viewed in the ZB-axis direction, a portion of each of the interlock portions 55B of the movable mirror 5B positioned in the space S1B does not come into contact with the intermediate layer 4B and the support layer 2B when the mounting region 31B reciprocates in the direction AB.

Here, as illustrated in FIG. 32, an inner surface of the opening 31$b$B includes a pair of inclined surfaces SLB and a reference surface SRB. The inclined surface SLB includes one end SLaB and the other end SLbB. The one end SLaB and the other end SLbB are both end portions of the inclined surface SLB when viewed in the ZB-axis direction. The inclined surfaces SLB of the pair are inclined such that the distance therebetween increases from the one end SLaB toward the other end SLbB (for example, with respect to the XB-axis). When viewed in the ZB-axis direction, the reference surface SRB extends along a reference line BLB connecting the other end SLbB of one inclined surface SLB and the other end SLbB of the other inclined surface SLB to each other. Here, the reference surface SRB connects the other ends SLbB to each other. As described above, the shape of the opening 31$b$B when viewed in the ZB-axis direction is a trapezoidal shape. Therefore, here, the inclined surfaces SLB correspond to legs of the trapezoidal shape, and the reference surface SRB corresponds to a bottom base of the trapezoidal shape.

Here, the opening 31$b$B is a single space. The minimum value for the size (that is, the gap between the one ends SLaB of the inclined surfaces SLB) of the opening 31$b$B in the YB-axis direction is a value allowing the pair of interlock portions 55B to be collectively disposed inside the opening 31$b$B when the elastic portion 52B is elastically deformed to be compressed in the YB-axis direction. Meanwhile, the maximum value for the size (that is, the gap between the other ends SLbB of the inclined surfaces SLB) of the opening 31$b$B in the YB-axis direction is a value allowing only a portion of elastic deformation of the elastic portion 52B to be released (that is, the elastic portion 52B does not reach the natural length) when the pair of interlock portions 55B is disposed in the opening 31$b$B.

Therefore, when the pair of interlock portions 55B is disposed inside the opening 31$b$B, the interlock portions 55B press the inner surface of the opening 31$b$B due to an elastic force of the elastic portion 52B, and a reaction force from the inner surface of the opening 31$b$B is applied to the interlock portions 55B (support portions 54B). Accordingly, the movable mirror 5B is supported in the mounting region 31B by a reaction force of an elastic force applied from the inner surface of the opening 31$b$B to each of the support portions 54B.

Particularly, each of the interlock portions 55B is brought into contact with the inclined surface SLB of the opening 31$b$B. Therefore, each of the interlock portions 55B slides on the inclined surface SLB toward the reference surface SRB due to a component of a reaction force from the inclined surface SLB in the XB-axis direction and abuts the reference surface SRB while being in contact with the inclined surface SLB. Accordingly, each of the interlock portions 55B comes into internal contact with a corner portion defined by the inclined surface SLB and the reference surface SRB and is positionally aligned (self-aligned due to an elastic force) in both the XB-axis direction and the YB-axis direction.

Meanwhile, as illustrated in FIG. 30, when viewed in the XB-axis direction, a reaction force of an elastic force is also applied to each of the interlock portions 55B from the inner surface of the opening 31$b$B at the edge portion of the opening 31$b$B. When the movable mirror 5B is mounted, there are cases where a reaction force is applied to either the inclined surface 55$a$B or the inclined surface 55$b$B of each of the interlock portions 55B. In these cases, either the inclined surface 55$a$B or the inclined surface 55$b$B slides on the edge portion due to a component of a reaction force along the inclined surface 55$a$B or the inclined surface 55$b$B and moves in the ZB-axis direction to reach a position (that is, a position where the mounting region 31B is sandwiched therebetween in the ZB-axis direction) where both the inclined surface 55$a$B and the inclined surface 55$b$B come into contact with the edge portion. Accordingly, each of the interlock portions 55B is interlocked at the position, and the movable mirror 5B is positionally aligned (self-aligned due to an elastic force) in the ZB-axis direction. That is, the movable mirror 5B is self-aligned in a three-dimensional manner utilizing an elastic force of the elastic portion 52B.

The movable mirror 5B described above is integrally formed by a MEMS technology (patterning and etching), for example. Therefore, the thickness (size in a direction intersecting the mirror surface 51$a$B) of the movable mirror 5B is uniform in each portion. For example, the thickness thereof is approximately 320 μm. In addition, the diameter of the mirror surface 51$a$B is approximately 1 mm, for example. Moreover, the gap between a surface (inner surface) of the elastic portion 52B on the mirror portion 51B side and a surface (outer surface) of the mirror portion 51B on the elastic portion 52B side is approximately 200 μm, for example. The thickness of the elastic portion 52B (thickness of the leaf spring) is within a range of approximately 10 μm to 20 μm, for example.

[Fixed Mirror and Surrounding Structure Thereof]

Figure 33:
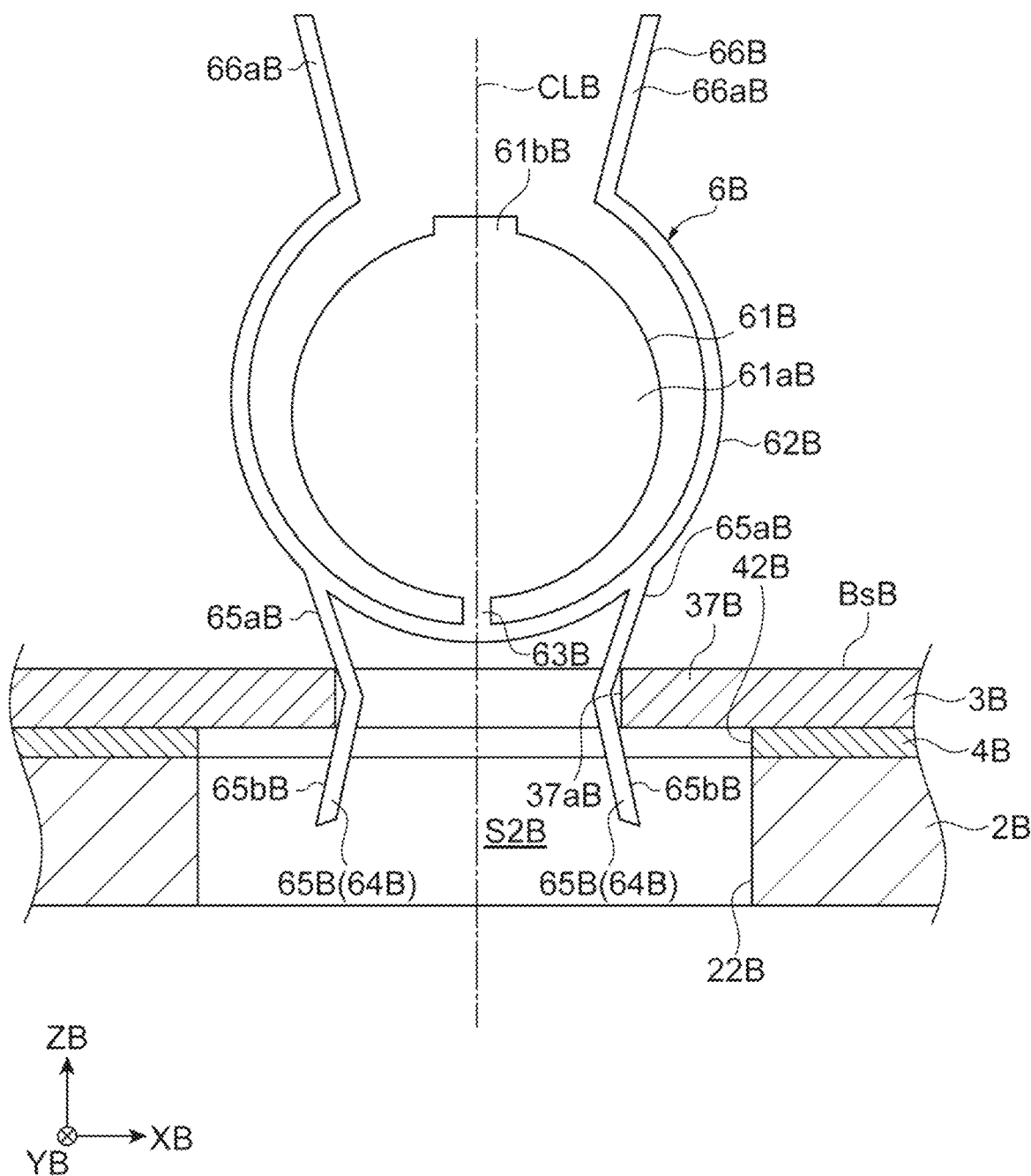
FIG. 33 is a cross-sectional view taken along line VB-VB illustrated in FIG. 29.
Figure 34:
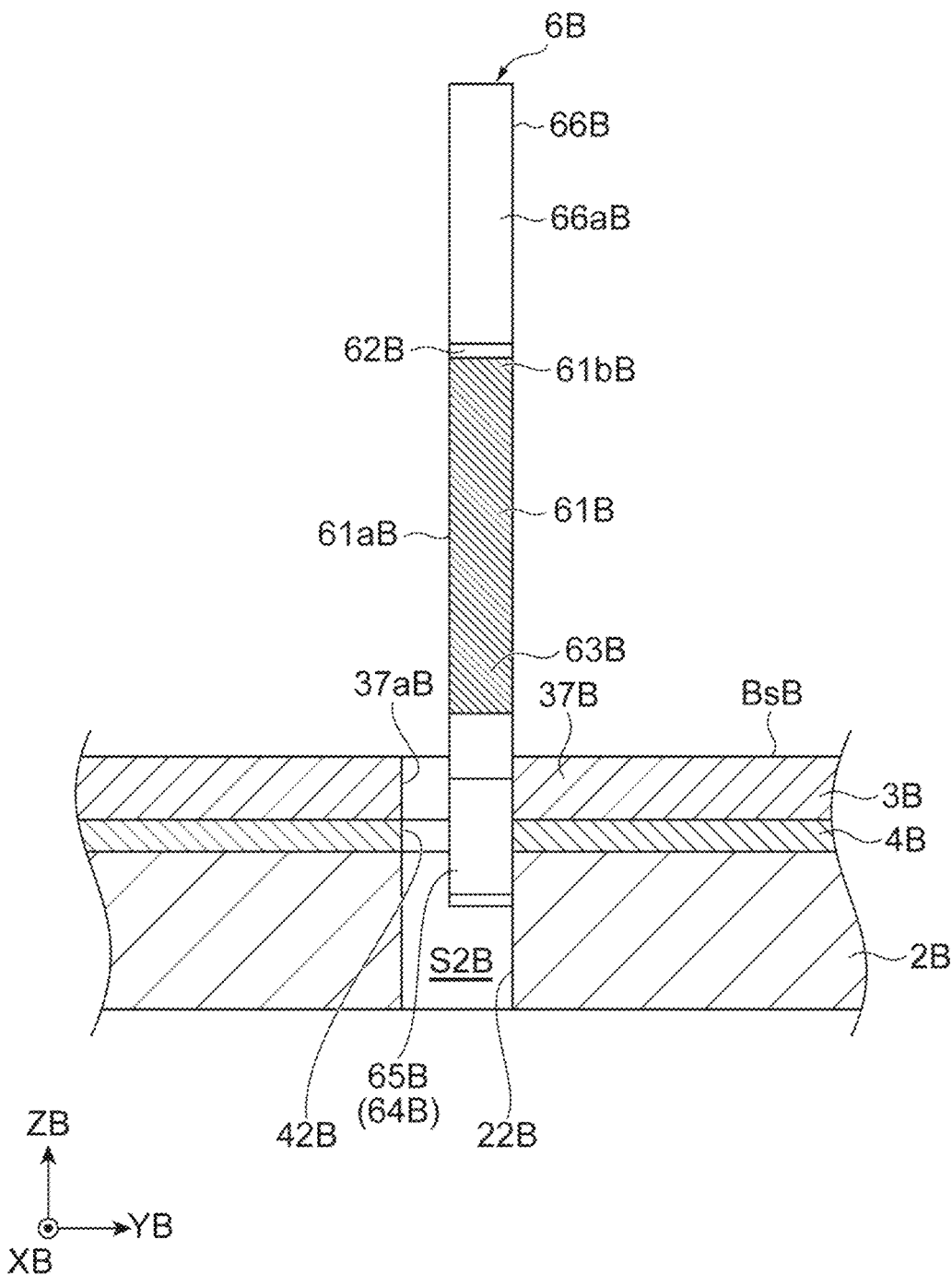
FIG. 34 is a cross-sectional view taken along line VIB-VIB illustrated in FIG. 29.

The fixed mirror 6B and the surrounding structure thereof are similar to the foregoing movable mirror 5B and the surrounding structure thereof, except that the mounting region is not movable. That is, as illustrated in FIGS. 33 and 34, the fixed mirror (optical element) 6B has the mirror portion (optical portion) 61B which has the mirror surface (optical surface) 61aB, an elastic portion 62B which is able to be elastically deformed, a connecting portion 63B which connects the mirror portion 61B and the elastic portion 62B to each other, a pair of support portions 64B, and a handle 66B. The fixed mirror 6B is mounted on the base BB in a state where the mirror surface 61aB is positioned on a plane intersecting (for example, orthogonal to) the main surface BsB and the mirror surface 61aB is positioned on the main surface BsB side of the base BB.

The mirror portion 61B is formed to have a plate shape (for example, a disk shape) having the mirror surface 61aB as a main surface. In the mirror portion 61B, a flat portion 61bB having a flat surface on a side in the positive ZB-axis direction is provided in an edge portion on one side (side in the positive ZB-axis direction) in a direction (ZB-axis direction) intersecting the main surface BsB.

When viewed in a direction (YB-axis direction) intersecting the mirror surface 61aB, the elastic portion 62B is formed to be separated from the mirror portion 61B and to surround the mirror portion 61B. Here, the elastic portion 62B has an annular shape realized by removing a portion on a side in the positive ZB-axis direction from a circular shape. The connecting portion 63B connects the edge portion of the mirror portion 61B on a side in the negative ZB-axis direction and the elastic portion 62B to each other along the center line CLB. The center line CLB is an imaginary straight line passing through the center of the mirror surface 61aB when viewed in the YB-axis direction and extending in the ZB-axis direction.

The pair of support portions 64B has a rod shape with a rectangular cross section and are provided to face each other in a direction (XB-axis direction) along the mirror surface 61aB and the main surface BsB. The pair of support portions 64B is connected to the elastic portion 62B respectively on one side and the other side in the XB-axis direction with respect to the center line CLB. The pair of support portions 64B is positioned on a side in the negative ZB-axis direction with respect to the mirror portion 61B.

Each of the support portions 64B includes an interlock portion 65B. A pair of interlock portions 65B is formed to be bent inward (toward each other) in a V-shape, for example, when viewed in the YB-axis direction. Each of the interlock portions 65B includes an inclined surface 65aB and an inclined surface 65bB. The inclined surface 65aB and the inclined surface 65bB are surfaces (outer surfaces) of the pair of interlock portions 65B on sides opposite to surfaces facing each other. The inclined surfaces 65aB are inclined toward each other in the negative ZB-axis direction between the interlock portions 65B of the pair. The inclined surfaces 65bB are inclined away from each other in the negative ZB-axis direction.

The handle 66B has a pair of displacement portions 66aB which is respectively connected to both ends of the elastic portion 62B. The pair of displacement portions 66aB has a rod shape with a rectangular cross section and is provided to face each other in the XB-axis direction. Each of the displacement portions 66aR extends in the positive ZB-axis direction from the end portion of the elastic portion 62B. The displacement portions 66aB of the pair are disposed to be inclined such that the distance therebetween increases in the positive ZB-axis direction when viewed in the YB-axis direction (direction perpendicular to the ZB-axis direction intersecting the main surface BsB and the XB-axis direction in which the displacement portions 66aB of the pair face each other). The pair of displacement portions 66aB is positioned on a side in the positive ZB-axis direction with respect to the mirror portion 61B, the elastic portion 62B, and the pair of support portions 64B in a state where the movable mirror 5B is mounted in the mounting region 37B.

The pair of support portions 64B is connected to the elastic portion 62B, and the elastic portion 62B is connected to the pair of displacement portions 66aB. That is, the pair of displacement portions 66aB is connected to the pair of support portions 64B via the elastic portion 62B, respectively. Therefore, for example, when a force is applied to the displacement portions 66aB of the pair such that they are displaced in a direction away from each other, the elastic portion 62B can be elastically deformed to be compressed in the XB-axis direction, and the distance between the support portions 64B of the pair can be shortened. That is, the distance between the support portions 64B of the pair in the XB-axis direction can be changed in accordance with elastic deformation of the elastic portion 62B. In addition, an elastic force of the elastic portion 62B can be applied to the support portions 64B.

Here, an opening 37aB is formed in the mounting region 37B. Here, the opening 37aB penetrates the device layer 3B in the ZB-axis direction. Therefore, the opening 37aB communicates with (reaches) the main surface BsB and a surface of the device layer 3B on a side opposite to the main surface BsB. The opening 37aB exhibits a pillar shape in which a shape when viewed in the ZB-axis direction is a trapezoidal shape, similar to the opening 31bB of the mounting region 31B.

The pair of support portions 64B is inserted into the opening 37aB in a state where an elastic force of the elastic portion 62B is applied. In other words, the support portions 64B (that is, the fixed mirror 6B) penetrate the mounting region 37B via the opening 37aB. More specifically, a portion of the interlock portion 65B of the support portion 64B is positioned inside the opening 37aB. In this state, the interlock portion 65B comes into contact with a pair of edge portions (an edge portion on the main surface BsB side and an edge portion on a side opposite to the main surface BsB) of the opening 37aB in the ZB-axis direction. Here, the inclined surfaces 65aB come into contact with the edge portions of the opening 37aB on the main surface BsB side, and the inclined surfaces 65bB come into contact with the edge portions of the opening 37aB on a side opposite to the main surface BsB. Accordingly, the interlock portions 65B are interlocked with the mounting region 37B such that the mounting region 37B is sandwiched therebetween in the ZB-axis direction. As a result, detachment of the fixed mirror 6B from the base BB in the ZB-axis direction is curbed.

Here, an opening 42B is formed in the intermediate layer 4B. The opening 42B includes the opening 37aB of the mounting region 37B when viewed in the ZB-axis direction and is open on both sides of the intermediate layer 4B in the ZB-axis direction. An opening 22B is formed in the support layer 2B. The opening 22B includes the opening 37aB of the mounting region 37B when viewed in the ZB-axis direction and is open on both sides of the support layer 2B in the ZB-axis direction. In the light module 1B, a continuous space S2B is constituted of a region inside the opening 42B of the intermediate layer 4B and a region inside the opening 22B of the support layer 2B. That is, the space S2B includes a region inside the opening 42B of the intermediate layer 4B and a region inside the opening 22B of the support layer 2B.

A portion of each of the interlock portions 65B included in the fixed mirror 6B is positioned in the space S2B. Specifically, a portion of each of the interlock portions 65B is positioned in a region inside the opening 22B of the support layer 2B through a region inside the opening 42B of the intermediate layer 4B. A portion of each of the interlock portions 65B protrudes into the space S2B from a surface of the device layer 3B on the intermediate layer 4B side by approximately 100 μm, for example.

Here, an inner surface of the opening 37aB has a configuration similar to the inner surface of the opening 31bB in the mounting region 31B. Therefore, when the pair of interlock portions 65B is disposed inside the opening 37aB, the interlock portions 65B press the inner surface of the opening 37aB due to an elastic force of the elastic portion 62B, and a reaction force from the inner surface of the opening 37aB is applied to the interlock portions 65B (support portions 64B). Accordingly, the fixed mirror 6B is supported in the base BB by a reaction force of an elastic force applied from the inner surface of the opening 37aB to the support portions 64B. Particularly, similar to the case of the movable mirror 5B, the fixed mirror 6B is also self-aligned in a three-dimensional manner utilizing the inner surface of the opening 37aB and an elastic force.

Similar to the movable mirror 5B, the fixed mirror 6B described above is also integrally formed by a MEMS technology (patterning and etching), for example. The size of each portion of the fixed mirror 6B is similar to the size of each portion of the movable mirror 5B described above, for example.

[Step of Manufacturing Movable Mirror and Step of Mounting Movable Mirror]

Figure 35:
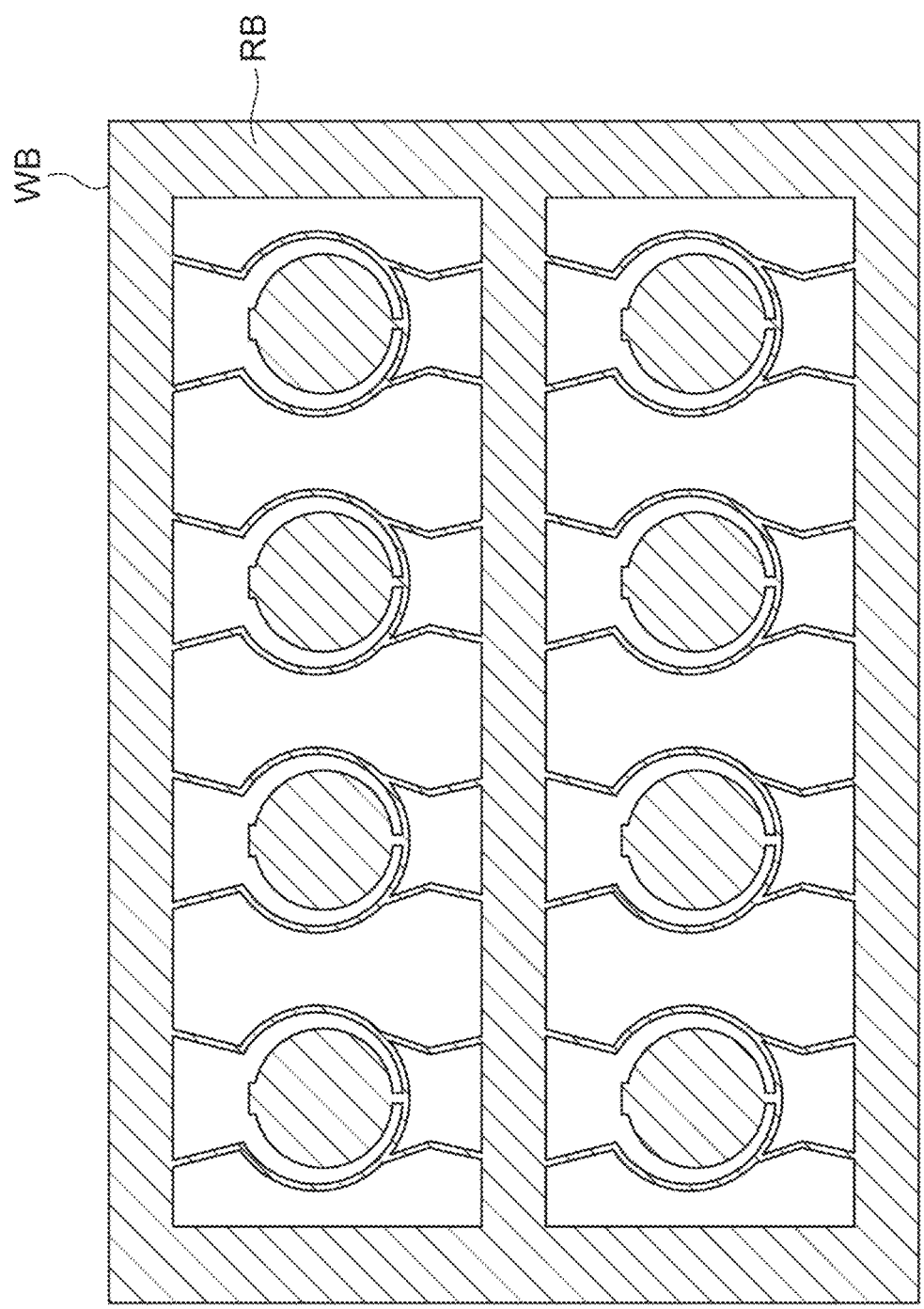
FIG. 35 is a plan view illustrating a step of manufacturing movable mirrors.
Figure 36:
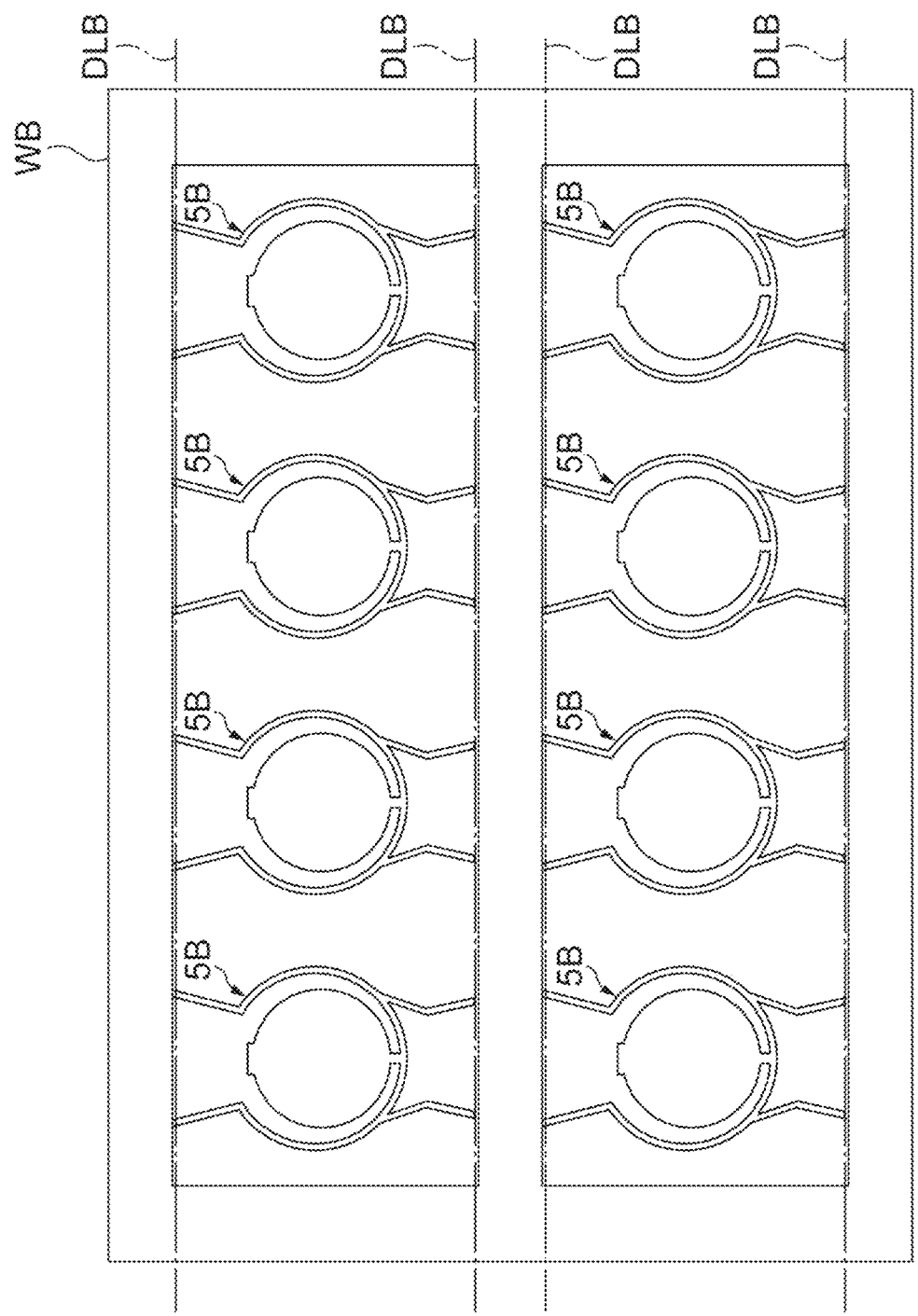
FIG. 36 is a plan view illustrating the step of manufacturing movable mirrors.

First, as illustrated in FIG. 35, a wafer WB made of silicon is prepared, and a resist layer RB is formed on a surface of the wafer WB. The resist layer RB is patterned through etching and has a pattern corresponding to a plurality of movable mirrors 5B. Subsequently, as illustrated in FIG. 36, etching is performed while the resist layer RB serves as a mask. Thereafter, the resist layer RB is removed, thereby forming a plurality of movable mirrors 5B arranged in two rows. Subsequently, the wafer WB is cut along dicing lines DLB, and individualized movable mirrors 5B are obtained. The movable mirror 5B is manufactured through the steps described above.

Figure 37:
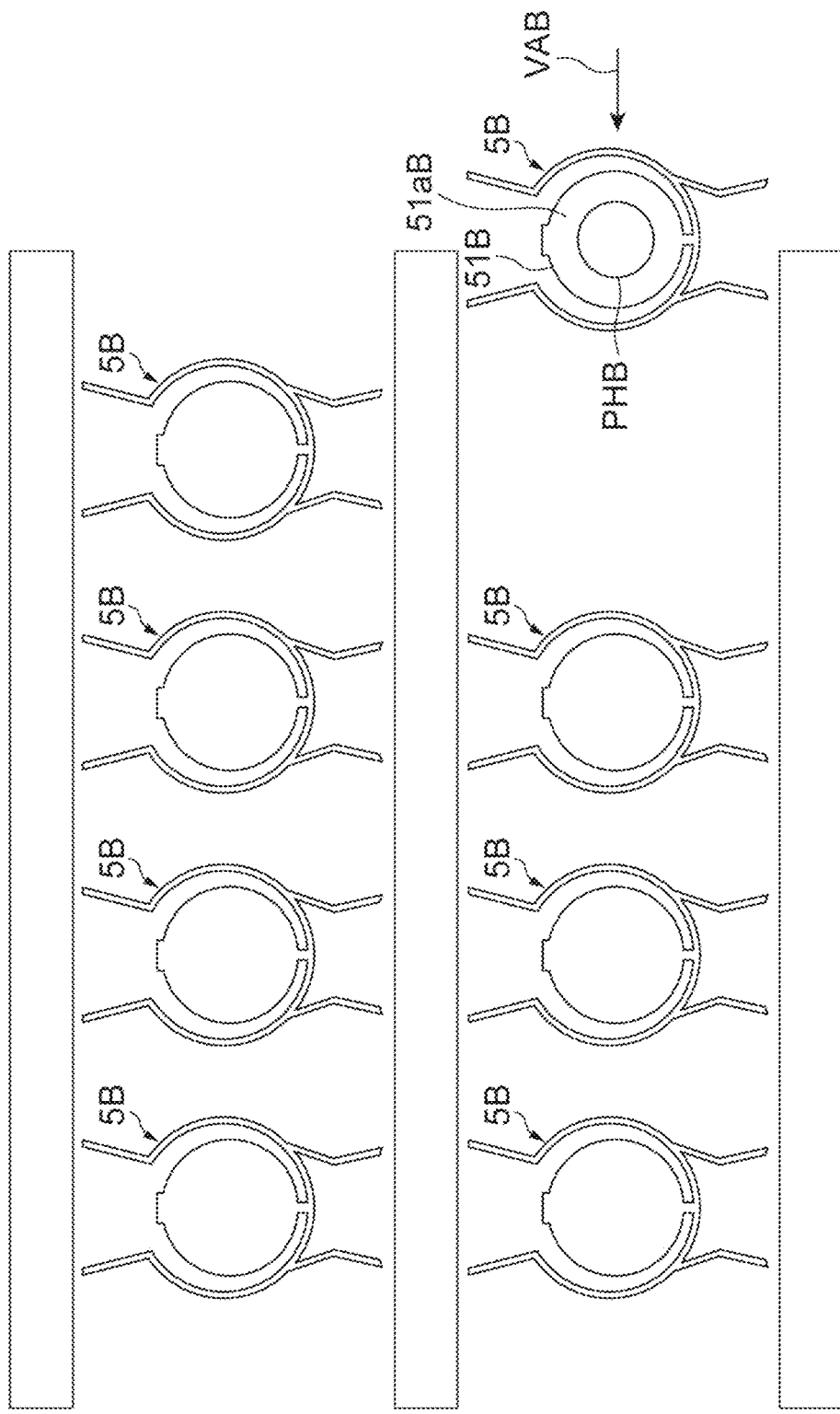
FIG. 37 is a plan view illustrating a step of mounting a movable mirror.
Figure 38:
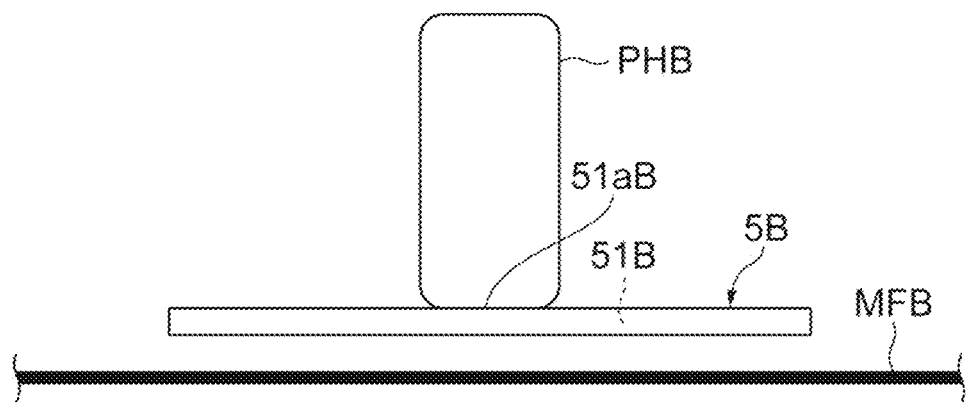
FIG. 38 is a side view when viewed from an arrow VAB side illustrated in FIG. 37.

Subsequently, as illustrated in FIGS. 37 and 38, one movable mirror 5B is picked up by a pick-up head PHB and is conveyed to a working position for a next step. For example, the pick-up head PHB is configured to be able to perform vacuum adsorption and holds the movable mirror 5B by adsorbing the mirror portion 51B of the movable mirror 5B placed on a placement surface MFB. For example, an operation of the pick-up head PHB is controlled by a control device (not illustrated).

Figure 39:
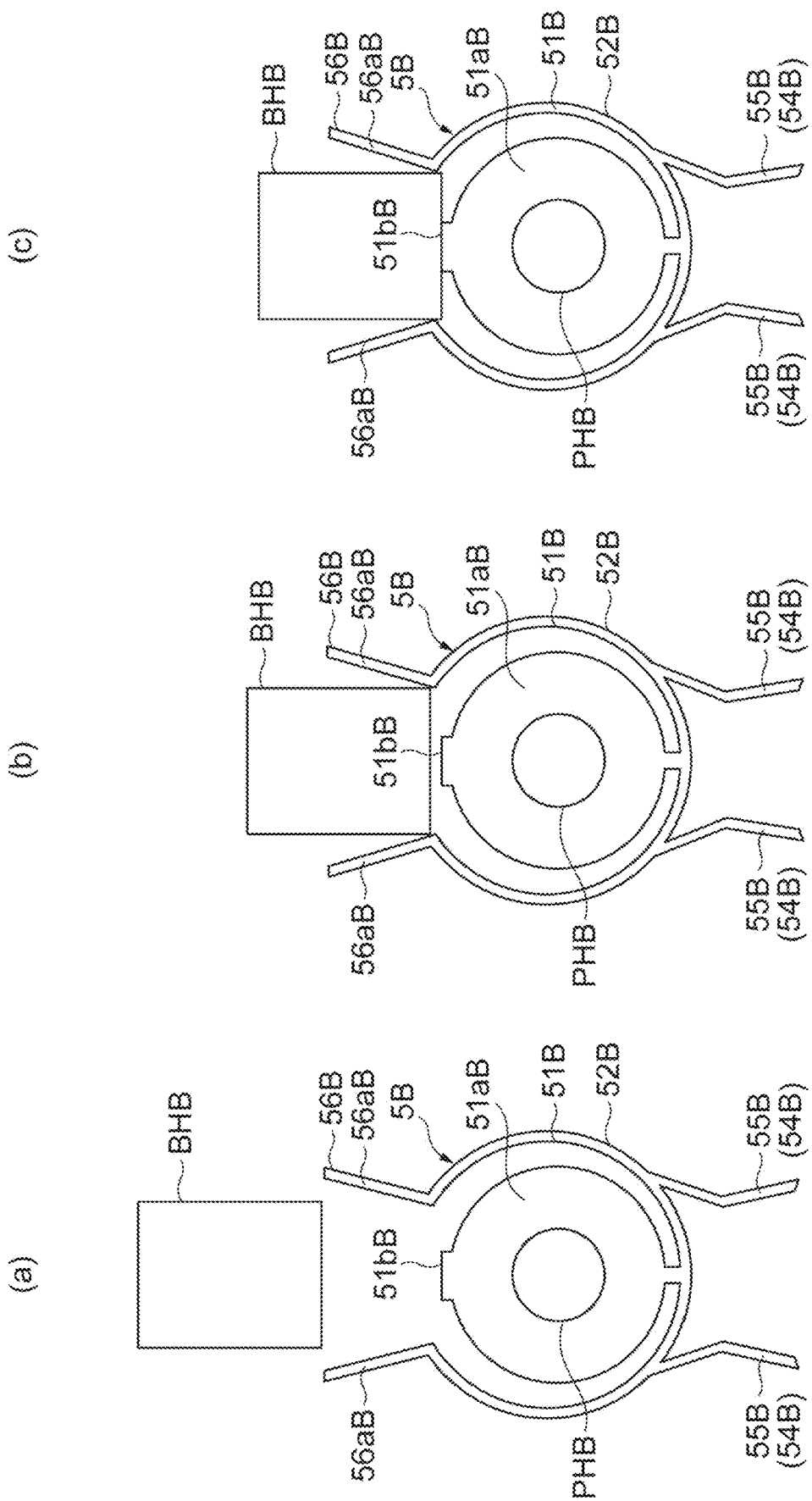
FIGS. 39(a) to 39(c) are plan views illustrating the step of mounting a movable mirror.

Subsequently, as illustrated in FIGS. 39(a) to 39(c), a bonder head BHB enters a space between the displacement portions 56aB of the pair from a side opposite to the mirror portion 51B, is pressed to the pair of displacement portions 56aB, and slides on the pair of displacement portions 56aB toward the mirror portion 51B side. Accordingly, a force is applied to the pair of displacement portions 56aB, and the pair of displacement portions 56aB is displaced in a direction away from each other. Accordingly, the elastic portion 52B is elastically deformed to be stretched in a direction in which the pair of displacement portions 56aB faces each other, and the distance between the support portions 54B of the pair is decreased. A part of the bonder head BHB which enters a space between the displacement portions 56aB of the pair is wider than the distance between the displacement portions 56aB of the pair before being displaced in a direction away from each other. For example, an operation of the bonder head BHB is controlled by the foregoing control device.

As illustrated in FIG. 39(c), the bonder head BHB slides on the pair of displacement portions 56aB to a position where it comes into contact with the flat portion 51bB provided in the mirror portion 51B. For example, the bonder head BHB is configured to be able to perform vacuum adsorption and holds the movable mirror 5B in a state where a force is applied to the pair of displacement portions 56aB by adsorbing the flat portion 51bB. After the bonder head BHB has started adsorption of the flat portion 51bB, the pick-up head PUB releases the held movable mirror 5B.

Figure 40:
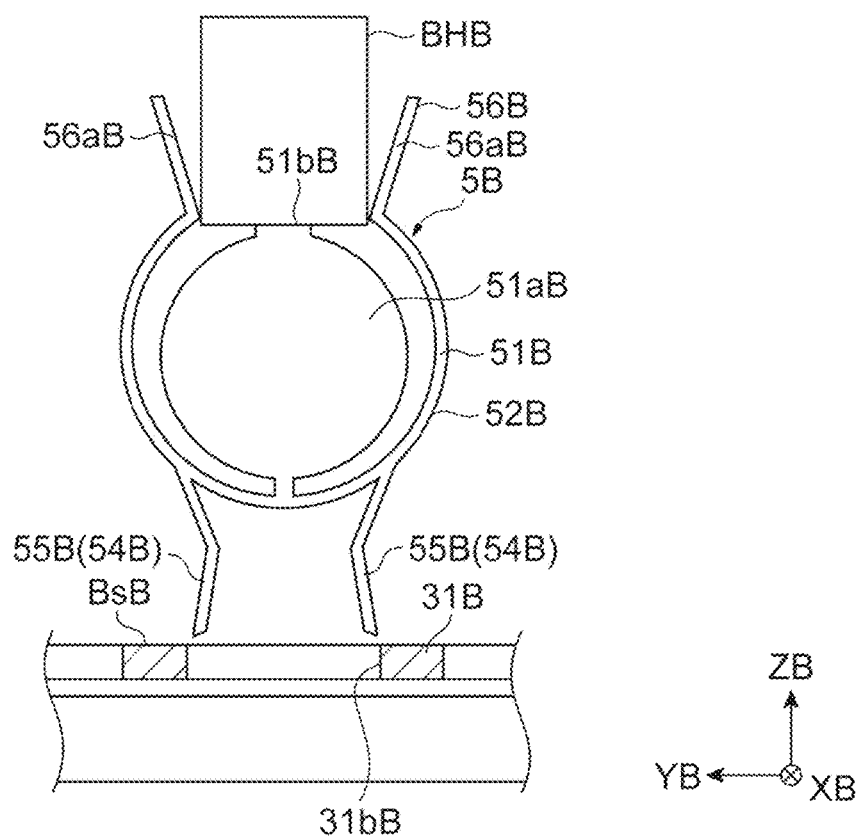
FIGS. 40(a) and 40(b) are plan views illustrating the step of mounting a movable mirror.
Figure 40:
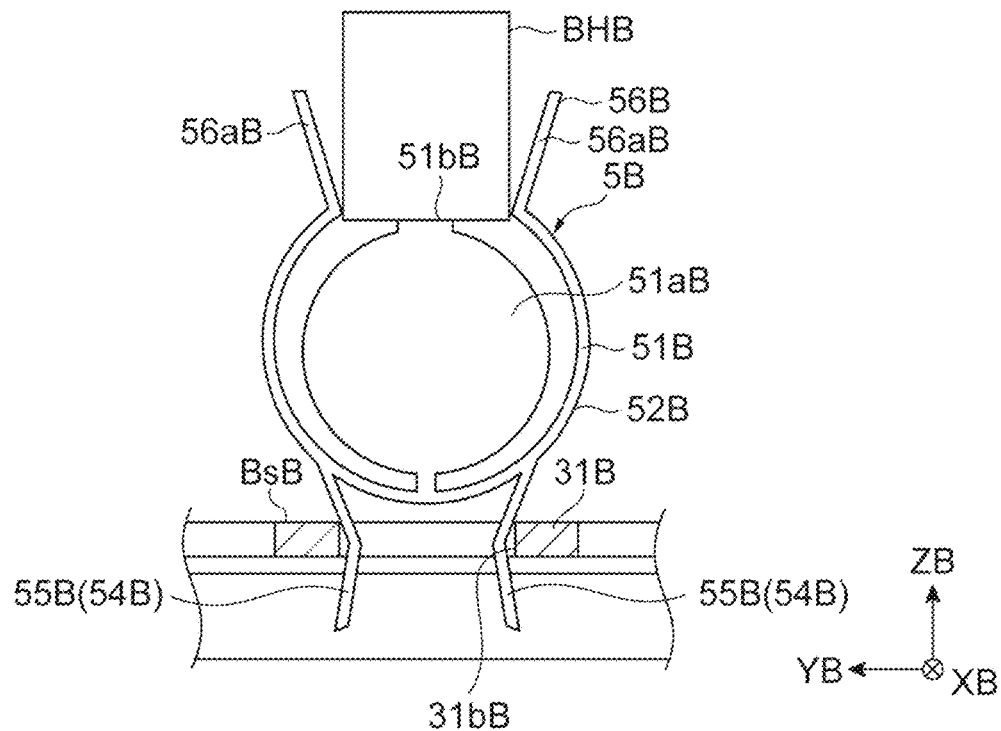

Subsequently, as illustrated in FIGS. 40(a) and 40(b), in a state where the distance between the support portions 54B of the pair is decreased by applying a force to the pair of displacement portions 56aB, the pair of support portions 54B is inserted into the opening 31bB of the base BB (first step). In the first step, the movable mirror 5B is conveyed to the position of the opening 31bB by moving the bonder head BHB and is inserted into the opening 31bB from the main surface BsB side.

Subsequently, the pair of support portions 54B is brought into contact with the inner surface of the opening 31bB and the movable mirror 5B is fixed to the base BB by releasing a force being applied to the pair of displacement portions 56aB (second step). In the second step, first, the bonder head BHB is reversely thrust such that the bonder head BHB is separated from the flat portion 51bB. Subsequently, the bonder head BHB is moved to a side away from the main surface BsB (side in the positive ZB-axis direction) and is pulled out from between the displacement portions 56aB of the pair. Accordingly, a force being applied to the pair of displacement portions 56aB is released, and the displacement portions 56aB of the pair are displaced in a direction toward each other. Accordingly, an elastic deformation of the elastic portion 52B is partially released, and the distance between the support portions 54B of the pair is increased. Accordingly, self-alignment is performed in a three-dimensional manner utilizing an elastic force of the elastic portion 52B, and the movable mirror 5B is positionally aligned in the XB-axis direction, the YB-axis direction, and the ZB-axis direction (refer to FIG. 30). The movable mirror 5B is mounted on the base BB through the steps described above.

[Operations and Effects]

In the light module 1B, the movable mirror 5B has the elastic portion 52B, and the support portions 54B of the pair in which the distance therebetween is able to be changed in accordance with elastic deformation of the elastic portion 52B. Meanwhile, the opening 31bB communicating with the main surface BsB is formed in the mounting region 31B of the base BB on which the movable mirror 5B is mounted. Therefore, as an example, when the support portions 54B are inserted into the opening 31bB in a state where the elastic portion 52B is elastically deformed such that the distance between the support portion 54B is decreased, and when an elastic deformation of the elastic portion 52B is partially released, the distance between the support portions 54B increases inside the opening 31bB, so that the support portions 54B can be brought into contact with the inner surface of the opening 31bB.

Accordingly, the movable mirror 5B is supported due to a reaction force applied from the inner surface of the opening 31bB to the support portions 54B. In this manner, in the light module 1B, the movable mirror 5B is mounted on the base BB using an elastic force. Therefore, it is possible to reduce the using amount of a bonding agent or to eliminate the need for a bonding agent, so that it is possible to reliably mount the movable mirror 5B without taking an influence of a bonding agent or the like into consideration, that is, regardless of characteristics of the mounting region 31B. Here, operations and effects are described with the movable mirror 5B as an example. However, the fixed mirror 6B also exhibits similar operations and effects.

Moreover, in the light module 1B, the movable mirror 5B has the handle 56B which is used for causing the elastic portion 52B to be elastically deformed such that the distance between the support portions 54B of the pair is changed. This handle 56B is positioned on a side in the positive ZB-axis direction with respect to the mirror portion 51B and the pair of support portions 54B in a state where the movable mirror 5B is mounted in the mounting region 31B. Therefore, when the pair of support portions 54B is inserted into the opening 31bB in a state where the distance between the support portions 54B of the pair is changed by causing the elastic portion 52B to be elastically deformed using the handle 56B, the mirror portion 51B is unlikely to hinder working. Therefore, the movable mirror 5B can be easily mounted on the base BB. Thus, according to this light module 1B, it is possible to facilitate the step of mounting the light module 1B.

In addition, in the light module 1B, the handle 56B is used for shortening the distance between the support portions 54B of the pair. Accordingly, it is possible to favorably realize a configuration for easy mounting of the movable mirror 5B. In addition, in the light module 1B, the handle 56B has the pair of displacement portions 56aB for changing the distance between the support portions 54B of the pair by being displaced in a direction away from each other. Accordingly, it is possible to more easily mount the movable mirror 5B on the base BB.

In addition, in the light module 1B, the pair of displacement portions 56aB is disposed to be inclined such that the distance therebetween increases toward a side in the positive ZB-axis direction when viewed in the XB-axis direction. Accordingly, for example, when the bonder head BHB which has entered a space between the displacement portions 56aB of the pair from a side in the positive ZB-axis direction is pressed to the pair of displacement portions 56aB and is caused to slide on the pair of displacement portions 56aB toward a side in the negative ZB-axis direction, the displacement portions 56aB of the pair can be displaced in a direction away from each other. Therefore, it is possible to further facilitate the step of mounting the light module 1B.

In addition, in the light module 1B, the handle 56B is positioned on a side in the positive ZB-axis direction with respect to the elastic portion 52B in a state where the movable mirror 5B is mounted in the mounting region 31B. Accordingly, when the pair of support portions 54B is inserted into the opening 31bB in a state where the distance between the support portions 54B of the pair is changed by causing the elastic portion 52B to be elastically dawned using the handle 56B, the elastic portion 52B is unlikely to hinder working. Therefore, it is possible to even more easily mount the movable mirror 5B with respect to the base BB.

In addition, in the light module 1B, the base BB has the support layer 2B and the device layer 3B which is provided on the support layer 2B and includes the main surface BsB and the mounting region 31B. In addition, the opening 31bB penetrates the device layer 3B in the ZB-axis direction. Then, the support portion 54B includes the interlock portion 55B which is bent to come into contact with the pair of edge portions of the opening 31bB in the ZB-axis direction. Therefore, the interlock portion 55B is interlocked with the mounting region 31B at a position where the interlock portion 55B comes into contact with the pair of edge portions of the opening 31bB. Therefore, it is possible to more reliably mount the movable mirror 5B on the base BB and to positionally align the movable mirror 5B in the ZB-axis direction.

In addition, in the light module 1B, the movable mirror 5B, the fixed mirror 6B, and the beam splitter 7B are disposed such that the interference optical system 10B is constituted. Accordingly, it is possible to obtain an FTIR having improved sensitivity.

In addition, in the light module 1B, the support layer 2B is the first silicon layer of the SOI substrate, the device layer 3B is the second silicon layer of the SOI substrate, and the intermediate layer 4B is the insulating layer of the SOI substrate. Accordingly, it is possible to favorably realize a configuration for reliable mounting of the movable mirror 5B with respect to the device layer 3B using the SOI substrate.

In addition, in the light module 1B, the light incident unit 8B is disposed such that measurement light is incident on the interference optical system 10B from outside, and the light emission unit 9B is disposed such that the measurement light is emitted from the interference optical system 10B to the outside. Accordingly, it is possible to obtain an FTIR including the light incident unit 8B and the light emission unit 9B.

In addition, in the method for mounting the light module 1B described above, the movable mirror 5B is mounted on the base BB using an elastic force of the elastic portion 52B. Accordingly, it is possible to reduce the using amount of a bonding agent or to eliminate the need for a bonding agent, so that it is possible to reliably mount the movable mirror 5B without taking an influence of a bonding agent or the like into consideration, that is, regardless of characteristics of the mounting region 31B. In addition, the pair of support portions 54B is inserted into the opening 31bB in a state where the distance between the support portions 54B of the pair is changed by applying a force to the handle 56B. At this time, since the handle 56B is provided to be positioned on a side in the positive ZB-axis direction with respect to the mirror portion 51B and the pair of support portions 54B in a state where the movable mirror 5B is mounted in the mounting region 31B, the mirror portion 51B is unlikely to hinder working. Therefore, the pair of support portions 54B can be easily inserted into the opening 31bB in a state where the distance between the support portions 54B of the pair is changed. Thus, according to the method for mounting the light module 1B, the step of mounting the light module 1B is facilitated. Moreover, as described above, since mounting can be performed by automatic machines (the pick-up head PHB and the bonder head BHB), the mounting step can be automated.

Modification Examples

Hereinabove, an embodiment of another aspect of the present disclosure has been described. However, another aspect of the present disclosure is not limited to the foregoing embodiment. For example, the material and the shape of each configuration are not limited to the materials and the shapes described above, and various materials and shapes can be employed.

Figure 41:
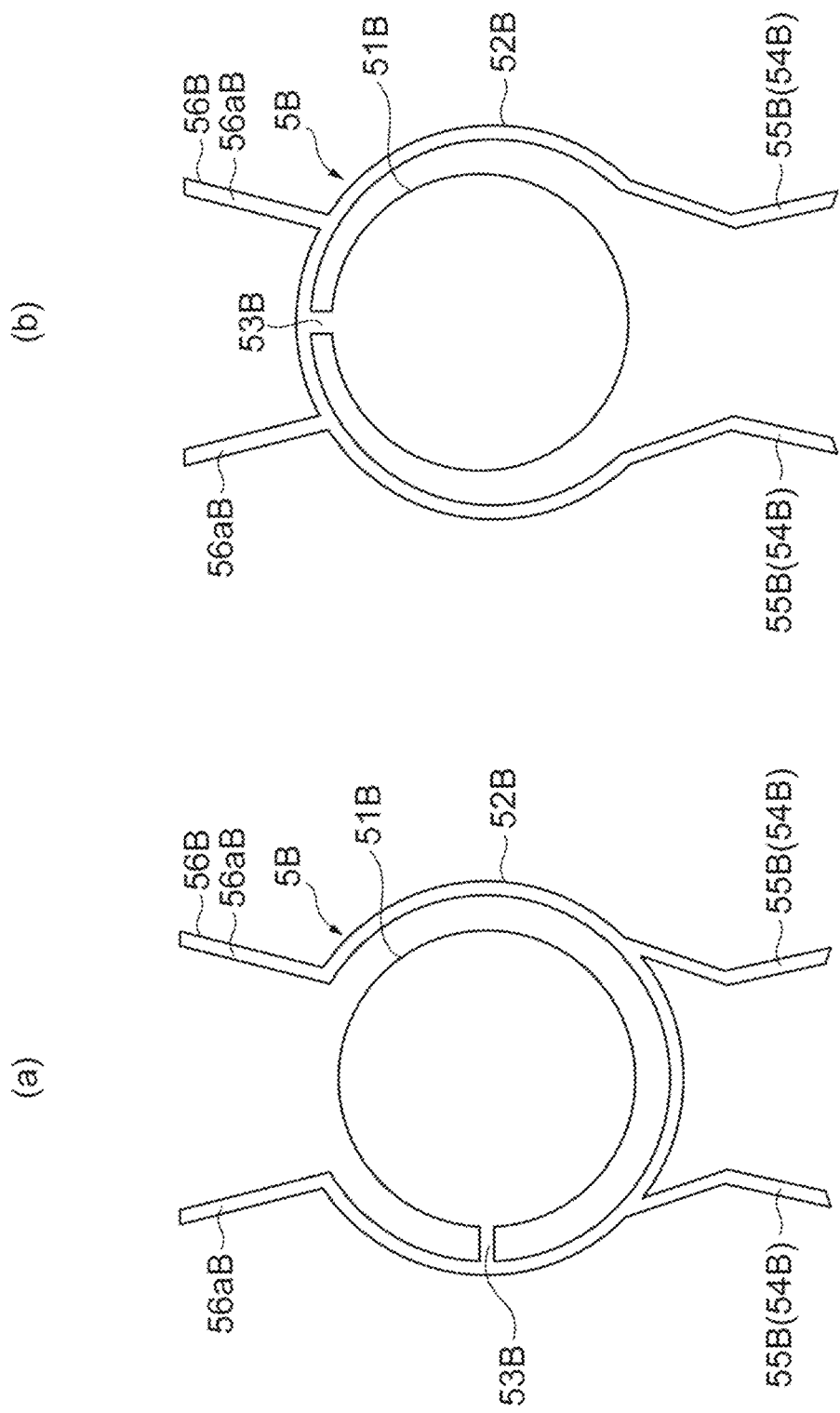
FIGS. 41(a) and 41(b) are front views illustrating a modification example of the movable mirror.

In addition, as illustrated in FIG. 41(a), the connecting portion 53B may extend in a direction (YB-axis direction) in which the displacement portions 56aB of the pair face each other and may connect the edge portion of the mirror portion 51B on one side in the YB-axis direction and the elastic portion 52B to each other. In addition, as illustrated in FIG. 41(b), the elastic portion 52B may have an annular shape realized by removing a portion on a side in the negative ZB-axis direction from a circular shape. In this example, the connecting portion 53B connects the edge portion on a side of the mirror portion 51B in the positive ZB-axis direction and the elastic portion 52B to each other. The pair of support portions 54B is respectively connected to both ends of the elastic portion 52B. Each of the displacement portions 56aB extends in the positive ZB-axis direction from an intermediate portion of the elastic portion 52B. Even in such a modification example, similar to the foregoing embodiment, it is possible to reliably mount the movable mirror 5B regardless of characteristics of the mounting region 31B and to facilitate the step of mounting the light module 1B.

Figure 42:
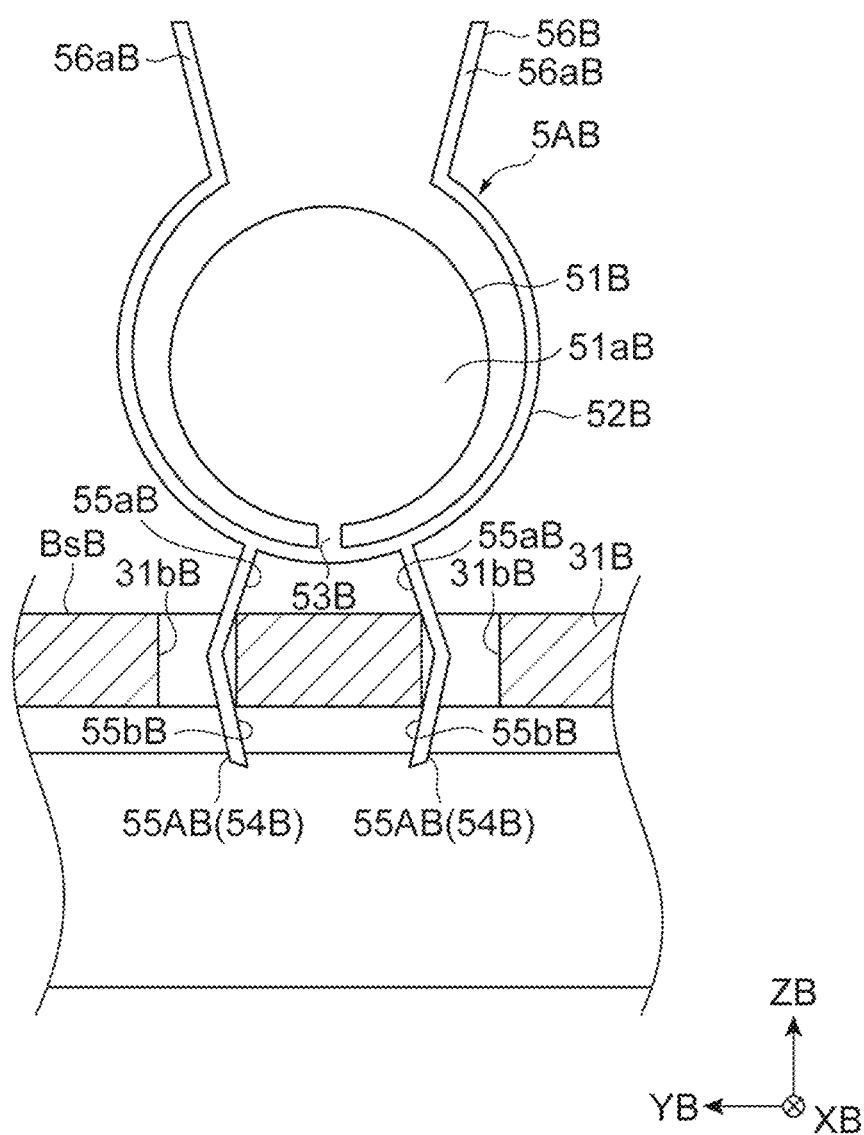
FIG. 42 is a front view illustrating another modification example of the movable mirror.

In addition, in the foregoing embodiment, in a state where the movable mirror 5B is mounted on the base BB, a reaction force from the inner surface of the opening 31bB is applied inward (toward each other) to the pair of support portions 54B. However, as in a movable mirror 5AB illustrated in FIG. 42, a reaction force from the inner surface of the opening 31bB may be applied outward (away from each other) to the pair of support portions 54B. In this example, a pair of openings 31bB is formed in the mounting region 31B of the base BB. A pair of interlock portions 55AB is formed to be bent outward (away from each other) in a V-shape when viewed in the XB-axis direction. The inclined surfaces 55aR are inclined away from each other in the negative ZB-axis direction between the interlock portions 55AB of the pair. The inclined surfaces 55bB are inclined toward each other in the negative ZB-axis direction. The interlock portions 55AB of the pair are respectively inserted into the pair of openings 31bB.

When the movable mirror 5AB is mounted, the pair of displacement portions 56aB is displaced in a direction toward each other by applying a force to the pair of displacement portions 56aB. Accordingly, the elastic portion 52B is elastically deformed to be decreased in size in the YB-axis direction, and the distance between the support portions 54B of the pair is increased. Subsequently, in a state where the distance between the support portions 54B of the pair is increased, the support portions 54B of the pair are respectively inserted into the pair of openings 31bB. Subsequently, each of the support portions 54B is brought into contact with the inner surface of each of the openings 31bB and the movable mirror 5AB is fixed to the base BB by releasing a force being applied to the pair of displacement portions 56aB. Even in such a modification example, similar to the foregoing embodiment, it is possible to reliably mount the movable mirror 5B regardless of characteristics of the mounting region 31B and to facilitate the step of mounting the light module 1B.

Figure 43:
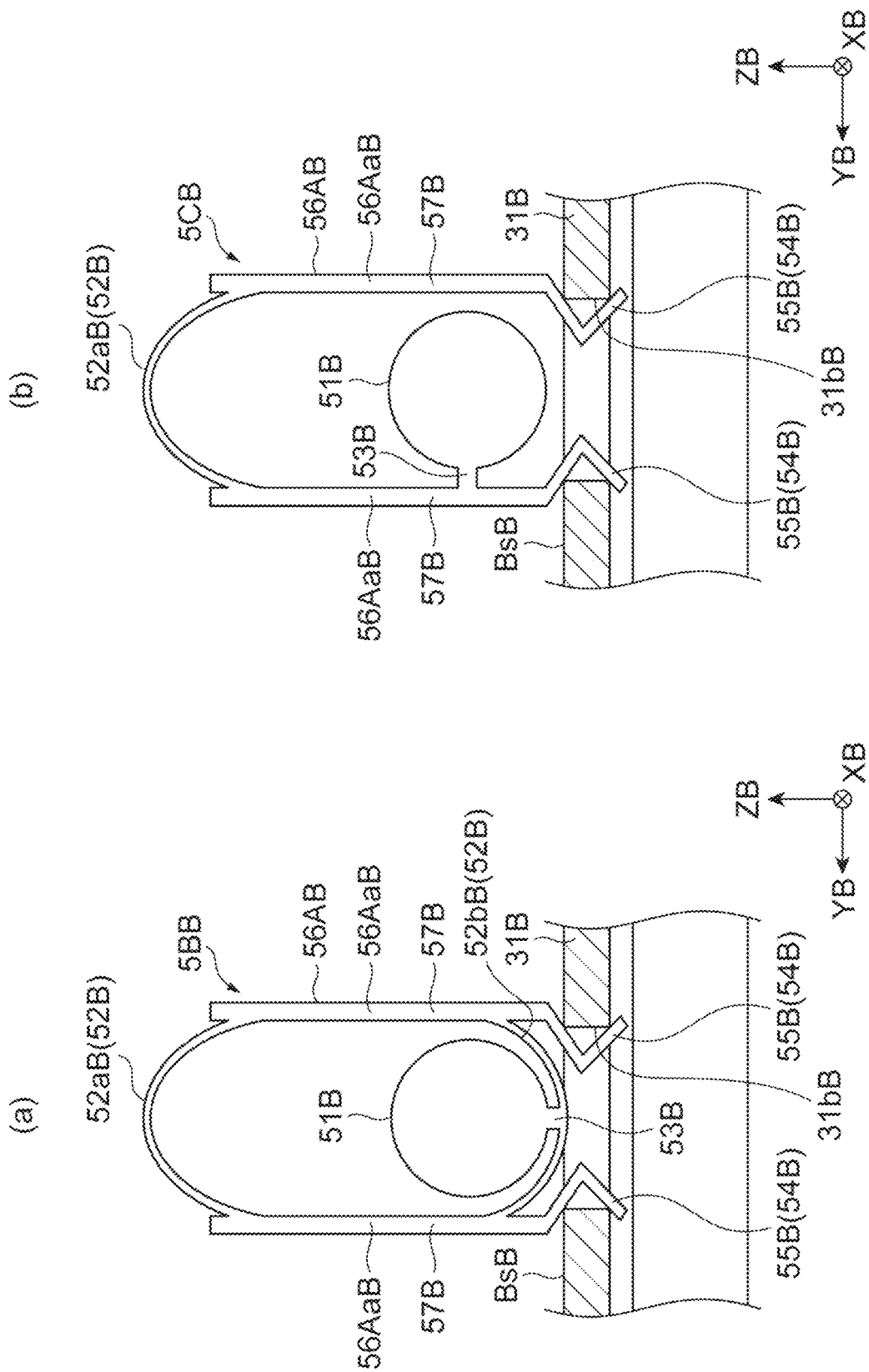
FIGS. 43(a) and 43(b) are front views illustrating another modification example of the movable mirror.

In addition, in the foregoing embodiment, the distance between the support portions 54B of the pair is decreased due to the pair of displacement portions 56aB displaced in a direction away from each other. However, as in a movable mirror 5BB illustrated in FIG. 43(a) and a movable mirror 5CB illustrated in FIG. 43(b), the distance between the support portions 54B of the pair may be decreased due to a pair of displacement portions 56AaB of handles 56AB displaced in a direction toward each other. In the movable mirror 5BB, each of the support portions 54B further includes a leg portion 57B extending in the ZB-axis direction. The leg portions 57B of the pair are provided such that the mirror portion 51B is sandwiched therebetween in the YB-axis direction and is connected to the displacement portions 56AaB and the interlock portions 55B. Each of the displacement portions 56AaB extends in the ZB-axis direction to be positioned along the same straight line as the leg portion 57B. The elastic portion 52B includes a pair of elastic portions 52aB and 52bB. For example, each of the elastic portions 52aB and 52bB has a semicircular shape. The elastic portion 52aB connects the pair of displacement portions 56AaB to each other, and the elastic portion 52bB connects the pair of leg portions 57B to each other. The elastic portion 52aB is positioned on a side in the positive ZB-axis direction with respect to the pair of displacement portions 56AaB. In the movable mirror 5CB, the elastic portion 52B includes only the elastic portion 52aB and does not include the elastic portion 52bB. The connecting portion 53B extends in the YB-axis direction and connects the edge portion of the mirror portion 51B on one side in the YB-axis direction and the leg portion 57B to each other. Even in these modification examples, similar to the foregoing embodiment, it is possible to reliably mount the movable mirror 5B regardless of characteristics of the mounting region 31B and to facilitate the step of mounting the light module 1B.

Figure 44:
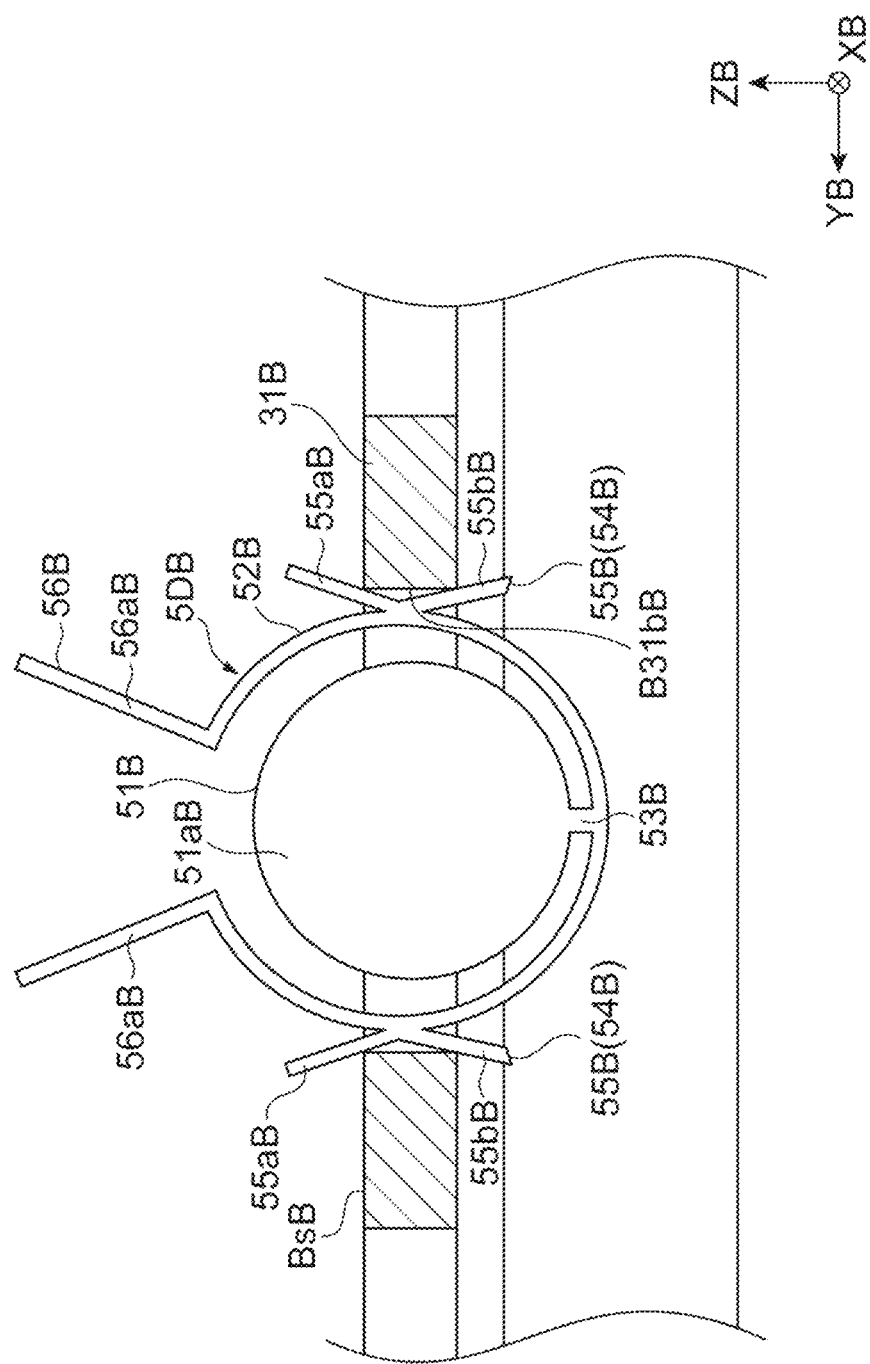
FIG. 44 is a front view illustrating another modification example of the movable mirror.

In addition, as in a movable mirror 5DB illustrated in FIG. 44, a portion of the mirror surface 51aB may be disposed inside the base BB. In this example, the mirror surface 51aB intersects the mounting region 31B, and the movable mirror 5AB in its entirety penetrates the mounting region 31B via the opening 31bB. In addition, the support portions 54B of the pair are provided such that the mirror portion 51B and the elastic portion 52B are sandwiched therebetween in the YB-axis direction, and each thereof is connected to the elastic portion 52B in a bent portion of the interlock portion 55B. In a part of the mounting region 31B defining the opening 31bB, a part facing the mirror surface 51aB is cut out to allow the measurement light L0B to pass therethrough. In this example as well, similar to the movable mirrors 5BB and 5CB, the distance between the support portions 54B of the pair is decreased due to the pair of displacement portions 56aB displaced in a direction toward each other. Even in such a modification example, similar to the foregoing embodiment, it is possible to reliably mount the movable mirror 5B regardless of characteristics of the mounting region 31B and to facilitate the step of mounting the light module 1B.

Figure 45:
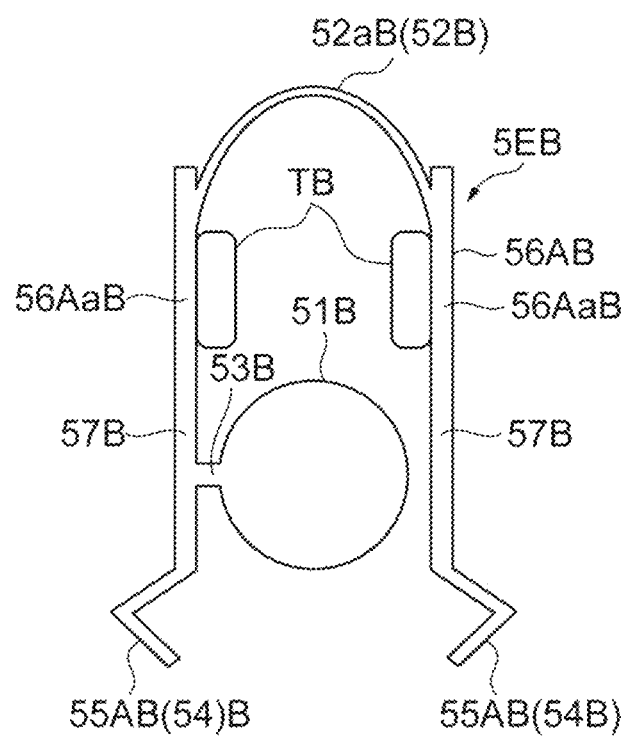
FIG. 45 is a front view illustrating another modification example of the movable mirror.

In addition, a movable mirror 5EB may be constituted as illustrated in FIG. 45. In the movable mirror 5EB, the distance between the support portions 54B of the pair is increased due to the pair of displacement portions 56AaB of the handles 56AB displaced in a direction away from each other. The opening 31bB has a configuration similar to the case in FIG. 42. In a state where the movable mirror 5EB is mounted on the base BB, a reaction force from the inner surface of the opening 31bB is applied outward (away from each other) to the pair of support portions 54B. For example, when the movable mirror 5EB is mounted, the displacement portions 56AaB of the pair are displaced in a direction away from each other using tweezers TB (pair of distal end portions of tweezers TB), so that the pair of interlock portions 55B is respectively inserted into the pair of openings 31bB in a state where the distance between the support portions 54B of the pair is increased. Even in such a modification example, similar to the foregoing embodiment, it is possible to reliably mount the movable mirror 5B regardless of characteristics of the mounting region 31B and to facilitate the step of mounting the light module 1B.

In addition, in the foregoing embodiment, the displacement portions 56aB of the pair are disposed to be inclined such that the distance therebetween increases to a side in the positive ZB-axis direction when viewed in the XB-axis direction. However, for example, the displacement portions 56aB of the pair may extend in the ZB-axis direction in a manner parallel to each other. In this case, for example, a pair of inclined surfaces which is inclined such that the distance therebetween increases while being away from the distal end portion may be provided in the distal end portion of the bonder head BHB. Moreover, the distance between the inclined surfaces in the distal end portions may be shorter than the distance between the displacement portions 56aB of the pair. Accordingly, the displacement portions 56aB of the pair can be displaced in a direction away from each other by causing the bonder head BHB to enter a space between the displacement portions 56aR of the pair from the distal end portion side, to be pressed to the pair of displacement portions 56aB, and to slide on the pair of displacement portions 56aB toward the mirror portion 51B side.

In addition, in the foregoing embodiment, the fixed mirror 6B is mounted in the device layer 3B. However, the fixed mirror 6B may be mounted in the support layer 2B. In addition, in the foregoing embodiment, the beam splitter 7B is mounted in the support layer 2B. However, the beam splitter 7B may be mounted in the device layer 3B. In addition, the beam splitter 7B is not limited to a cube-type beam splitter and may be a plate-type beam splitter.

In addition, the light module 1B may include a light emitting element for generating measurement light to be incident on the light incident unit 8B, in addition to the light incident unit 8B. Alternatively, the light module 1B may include a light emitting element for generating measurement light to be incident on the interference optical system 10B, in place of the light incident unit 8B. In addition, the light module 1B may include a light receiving element for detecting measurement light (interference light) emitted from the light emission unit 9B, in addition to the light emission unit 9B. Alternatively, the light module 1B may include a light receiving element for detecting measurement light (interference light) emitted from the interference optical system 10B, in place of the light emission unit 9B.

In addition, a first penetration electrode which is electrically connected to each of the actuator regions 33B and a second penetration electrode which is electrically connected to each of both the end portions 34aB of each of the elastic support regions 34B may be provided in the support layer 2B and the intermediate layer 4B (in only the support layer 2B when the intermediate layer 4B is not present), and a voltage may be applied to a part between the first penetration electrode and the second penetration electrode. In addition, the actuator for moving the mounting region 31B is not limited to an electrostatic actuator, and a piezoelectric actuator, an electromagnetic actuator, or the like may be adopted, for example. In addition, the light module 1B is not limited to a module for constituting an FTIR and may be a module for constituting other optical systems.

Moreover, in the foregoing embodiment, a movable mirror and a fixed mirror have been described as examples of optical elements to be mounted on the base BB. In this example, the optical surface is a mirror surface. However, the optical element which becomes a mounting target is not limited to a mirror. For example, an arbitrary element such as a grating, an optical filter, or the like can be adopted. The following are appendixes of the foregoing second embodiment.

APPENDIX 10

A light module including:

an optical element; and a base on which the optical element is mounted, in which the optical element has an optical portion which has an optical surface, an elastic portion which is able to be elastically deformed, a pair of support portions which is provided to face each other and in which an elastic force is applied and a distance therebetween is able to be changed in accordance with elastic deformation of the elastic portion, and a handle which is used for causing the elastic portion to be elastically deformed such that the distance between the pair of support portions is changed, the base has a main surface, and a mounting region in which an opening communicating with the main surface is provided, the pair of support portions is inserted into the opening in a state where an elastic force of the elastic portion is applied, the optical element is supported in the mounting region by a reaction force of the elastic force applied from an inner surface of the opening, and the handle is positioned on one side in a direction intersecting the main surface with respect to the optical portion and the pair of support portions in a state where the optical element is mounted in the mounting region.

APPENDIX 11

The light module according to appendix 10, in which the handle is used for shortening the distance between the pair of support portions.

APPENDIX 12

The light module according to appendix 10, in which the handle is used for increasing the distance between the pair of support portions.

APPENDIX 13

The light module according to any one of appendixes 10 to 12, in which the handle has a pair of displacement portions for changing the distance between the pair of support portions by being displaced in a direction away from each other.

APPENDIX 14

The light module according to any one of appendixes 10 to 12, in which the handle has a pair of displacement portions for changing the distance between the pair of support portions by being displaced in a direction toward each other.

APPENDIX 15

The light module according to appendix 13, in which
the pair of displacement portions is disposed to be inclined such that a distance therebetween increases toward one side in a direction intersecting the main surface when viewed in a direction perpendicular to both a direction intersecting the main surface and a direction in which the pair of displacement portions faces each other.

APPENDIX 16

The light module according to any one of appendixes 10 to 15, in which
the handle is positioned on the one side in a direction intersecting the main surface with respect to the elastic portion in a state where the optical element is mounted in the mounting region.

APPENDIX 17

The light module according to any one of appendixes 10 to 16, in which
the base has a support layer and a device layer which is provided on the support layer and includes the main surface and the mounting region,
the opening penetrates the device layer in a direction intersecting the main surface, and
the support portion includes an interlock portion which is bent to come into contact with a pair of edge portions of the opening in a direction intersecting the main surface.

APPENDIX 18

The light module according to appendix 17, further including:
a fixed mirror which is mounted in at least one of the support layer, the device layer, and an intermediate layer which is provided between the support layer and the device layer; and
a beam splitter which is mounted in at least one of the support layer, the device layer, and the intermediate layer, in which
the optical element is a movable mirror which includes the optical surface serving as a mirror surface,
the device layer has a driving region which is connected to the mounting region, and
the movable mirror, the fixed mirror, and the beam splitter are disposed such that an interference optical system is constituted.

APPENDIX 19

The light module according to appendix 18, in which
the base has the intermediate layer which is provided between the support layer and the device layer,
the support layer is a first silicon layer of an SOI substrate,
the device layer is a second silicon layer of the SOI substrate,
the intermediate layer is an insulating layer of the SOI substrate.

APPENDIX 20

The light module according to appendix 18 or 19, further including:
a light incident unit which is disposed such that measurement light is incident on the interference optical system from outside; and
a light emission unit which is disposed such that the measurement light is emitted from the interference optical system to the outside.

APPENDIX 21

A method for mounting the light module according to any one of appendixes 10 to 20, the method including:
a first step of inserting the pair of support portions into the opening in a state where the distance between the pair of support portions is changed by applying a force to the handle; and
a second step of bringing the pair of support portions into contact with the inner surface of the opening and fixing the optical element to the base by releasing the force being applied to the handle.

Third Embodiment

Light modules in which an interference optical system is formed on a silicon-on-insulator (SOI) substrate by a micro electro mechanical systems (MEMS) technology are known (for example, refer to Japanese Unexamined Patent Publication No. 2012-524295). Such light modules have attracted attention because they can provide users with a Fourier transform infrared spectroscopic analyzer (FTIR) in which highly accurate optical disposition is realized.

Specification of United States Patent Application, Publication No. 2002/0186477 discloses a process of manufacturing an optical system. In this process, first, a template substrate and an optical bench are prepared. An alignment slot is formed in the template substrate through etching. A bond pad is disposed on a main surface of the optical bench. Subsequently, the template substrate is attached to the main surface of the optical bench such that the alignment slot is disposed on the bond pad. Subsequently, an optical element is inserted into the alignment slot while being positionally aligned along a side wall of the alignment slot and is positioned on the bond pad. Then, the optical element is bonded to the optical bench due to a reflow of the bond pad.

The foregoing light modules have the following problem in respect that the size of a movable mirror depends on a degree of completion of deep cutting with respect to an SOI substrate, for example. That is, since the degree of completion of deep cutting with respect to an SOI substrate is approximately 500 μm at the maximum, there is a limitation in increasing the size of a movable mirror for the sake of improvement of sensitivity of an FTIR. Here, a technology of mounting a separately formed movable mirror in a device layer (for example, a layer of an SOI substrate in which a driving region is formed) may be taken into consideration.

In contrast, in a case where the process disclosed in the specification of United States Patent Application, Publication No. 2002/0186477 is used when the MEMS device disclosed in Japanese Unexamined Patent Publication No. 2012-524295 is prepared, an optical element such as a movable mirror is bonded due to a reflow of a bond pad to be mounted in a movable mounting region which is connected to an actuator. In this case, there is concern that if a using amount, a forming region, and the like of a bond pad are not sufficiently controlled, bonding of the bond pad may adversely affect driving of the mounting region. Therefore, there are cases where the process disclosed in Japanese Unexamined Patent Publication No. 2012-524295 may not be able to be applied, depending on the characteristics of a mounting region of an optical element.

An object of still another aspect of the present disclosure is to provide a light module in which an optical element can be stably mounted regardless of characteristics of a mounting region.

According to still another aspect of the present disclosure, there is provided a light module including an optical element, and a base on which the optical element is mounted. The optical element has an optical portion which has an optical surface, an elastic portion which includes one end portion and the other end portion and is provided around the optical portion, a pair of support portions which respectively extends from the one end portion and the other end portion to the base side beyond the optical portion, and a connecting portion which connects one support portion and the optical portion to each other. The base has a main surface, and a mounting region in which an opening communicating with the main surface is provided. The support portions, in which an elastic force is applied and a distance therebetween is able to be changed in accordance with elastic deformation of the elastic portion, are inserted into the opening in a state where the elastic force is applied. The optical element is supported in the mounting region by a reaction force of the elastic force applied from an inner surface of the opening to the support portions in a state where the optical surface intersects the main surface. The connecting portion is provided on the base side of a center of the optical surface.

In this light module, the optical element has the elastic portion, and the pair of support portions in which the distance therebetween is able to be changed in accordance with elastic deformation of the elastic portion. Meanwhile, the opening communicating with the main surface is formed in the mounting region of the base on which the optical element is mounted. Therefore, as an example, when the support portions are inserted into the opening in a state where the elastic portion is elastically deformed such that the distance between the support portions is decreased, and when an elastic deformation of the elastic portion is partially released, the distance between the support portions increases inside the opening, so that the support portions can be brought into contact with the inner surface of the opening. Accordingly, the optical element is supported due to a reaction force applied from the inner surface of the opening to the support portions. In this manner, in this light module, the optical element is mounted on the base utilizing an elastic force. Therefore, it is possible to mount the optical element without taking an adverse influence of a bonding agent or the like into consideration, that is, regardless of characteristics of the mounting region.

Here, in this optical element, the connecting portion which connects the optical portion and the support portion to each other is provided on the base side of the center of the optical surface. Therefore, for example, compared to a case where the connecting portion is provided on a side opposite to the base of the center of the optical surface, the centroid of the optical element in its entirety becomes closer to the base. Therefore, the stability is improved.

In addition, for a similar reason, the elastic portion can be provided around the optical portion in a region in its entirety on a side opposite to the base of the center of the optical surface. Therefore, the elastic portion can be relatively lengthened, and the spring constant is easily adjusted. As a result, it is possible to curb damage to the elastic portion accompanying elastic deformation and to realize stable mounting by curbing an increase in spring constant. In this manner, according to this light module, it is possible to stably mount the optical element regardless of characteristics of the mounting region.

According to this optical element, as described above, the elastic portion can be provided around the optical portion in a region in its entirety on a side opposite to the base of the center of the optical surface. Therefore, even when the elastic portion is provided close to the optical portion, the length of the elastic portion can be sufficiently ensured. That is, according to this optical element, it is possible to ensure the length of the elastic portion and to realize a compact optical element.

In the light module according to still another aspect of the present disclosure, the elastic portion may include a circular arc part which is formed such that the optical portion is partially surrounded when viewed in a direction intersecting the optical surface. The one end portion and the other end portion may be provided at distal ends of the circular arc part. In this manner, since the elastic portion has the circular arc part, both a compact size and the length of the elastic portion can be reliably ensured.

In the light module according to still another aspect of the present disclosure, the support portion may include an interlock portion which extends to the base side over a connecting position of the connecting portion with respect to the optical portion and is inserted into the opening. A thickness of the interlock portion may be larger than a thickness of the elastic portion when viewed in a direction intersecting the optical surface. In this case, the optical element can be more stably supported in the base via the interlock portion.

In the light module according to still another aspect of the present disclosure, a thickness of the support portion may be larger than the thickness of the elastic portion when viewed in a direction intersecting the optical surface. In this case, a force for causing the elastic portion to be elastically deformed can be stably applied to the elastic portion via the support portions.

In the light module according to still another aspect of the present disclosure, a thickness of the connecting portion may be larger than the thickness of the elastic portion when viewed in a direction intersecting the optical surface. In this case, the support portions and the optical portion can be reliably connected to each other.

In the light module according to still another aspect of the present disclosure, the inner surface of the opening may include a pair of inclined surfaces which is inclined such that a distance therebetween increases from one end toward the other end when viewed in a direction intersecting the main surface, and a reference surface which extends along a reference line connecting the other end of one inclined surface and the other end of the other inclined surface to each other. In this case, when the support portions are inserted into the opening and an elastic deformation of the elastic portion is partially released, the support portions can slide on the inclined surfaces and can abut the reference surface due to an elastic force. Therefore, it is possible to positionally align the optical element in a direction along the main surface.

The light module according to still another aspect of the present disclosure may further include a fixed mirror and a beam splitter which are mounted on the base. The optical element may be a movable mirror which includes the optical surface serving as a mirror surface. The base may have a driving region which is connected to the mounting region. The movable mirror, the fixed mirror, and the beam splitter may be disposed such that an interference optical system is constituted. In this case, it is possible to obtain an FTIR having improved sensitivity. In addition, here, the mounting region, in which the movable mirror is mounted, is characterized by being connected to the driving region and being driven. Therefore, since the mounting region is likely to be adversely affected by a bonding agent or the like, the foregoing configuration becomes more effective.

In the light module according to still another aspect of the present disclosure, the base may have a support layer, a device layer which is provided on the support layer, and an intermediate layer which is provided between the support layer and the device layer. The support layer may be a first silicon layer of an SOI substrate. The device layer may be a second silicon layer of the SOI substrate. The intermediate layer may be an insulating layer of the SOI substrate. In this case, it is possible to favorably realize a configuration for reliable mounting of the movable mirror with respect to the device layer using the SOI substrate.

The light module according to still another aspect of the present disclosure may further include a light incident unit which is disposed such that measurement light is incident on the interference optical system from outside, and a light emission unit which is disposed such that the measurement light is emitted from the interference optical system to the outside. In this case, it is possible to obtain an FTIR including a light incident unit and a light emission unit.

According to still another aspect of the present disclosure, it is possible to provide a light module in which an optical element can be stably mounted regardless of characteristics of a mounting region.

Hereinafter, an embodiment of still another aspect of the present disclosure will be described in detail with reference to the drawings. The same reference signs are applied to parts which are the same or corresponding in each of the drawings, and duplicated parts will be omitted.

[Configuration of Light Module]

Figure 46:
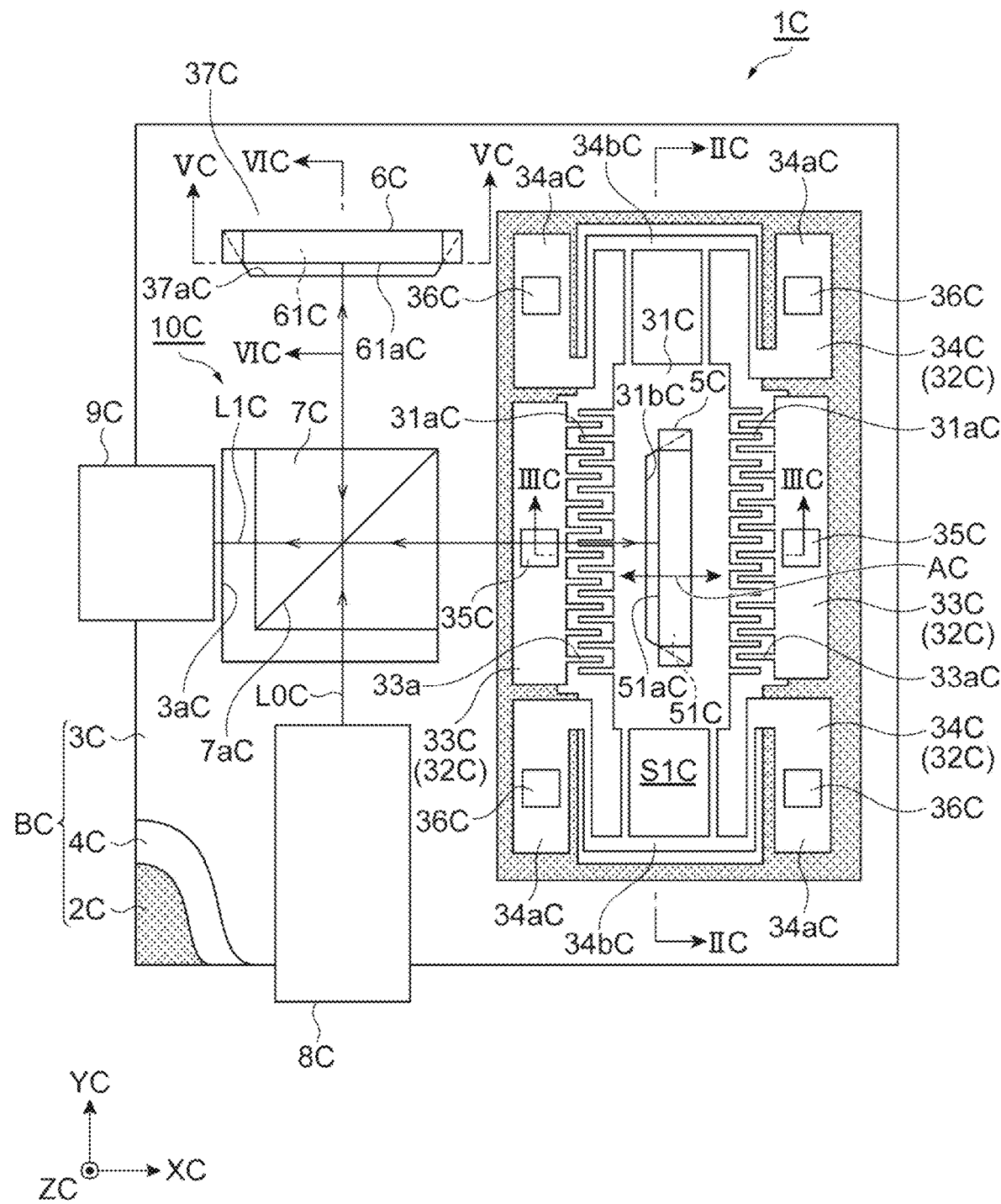
FIG. 46 is a plan view of a light module of still another embodiment.

As illustrated in FIG. 46, a light module 1C includes a base BC. The base BC includes a main surface BsC. The base BC includes a support layer 2C, a device layer 3C which is provided on the support layer 2C, and an intermediate layer 4C which is provided between the support layer 2C and the device layer 3C. Here, the main surface BsC is a surface of the device layer 3C on a side opposite to the support layer 2C. The support layer 2C, the device layer 3C, and the intermediate layer 4C are constituted of an SOI substrate. Specifically, the support layer 2C is a first silicon layer of the SOI substrate. The device layer 3C is a second silicon layer of the SOI substrate. The intermediate layer 4C is an insulating layer of the SOI substrate. The support layer 2C, the device layer 3C, and the intermediate layer 4C exhibit a rectangular shape of which one side is approximately 10 mm, for example, when viewed in a ZC-axis direction (direction parallel to a ZC-axis) that is a laminating direction thereof. The thickness of each of the support layer 2C and the device layer 3C is approximately several hundreds of for example. The thickness of the intermediate layer 4C is approximately several μm, for example. FIG. 46 illustrates the device layer 3C and the intermediate layer 4C in a state where one corner portion of the device layer 3C and one corner portion of the intermediate layer 4C are cut out.

The device layer 3C has a mounting region 31C and a driving region 32C which is connected to the mounting region 31C. The driving region 32C includes a pair of actuator regions 33C and a pair of elastic support regions 34C. The mounting region 31C and the driving region 32C (that is, the mounting region 31C, the pair of actuator regions 33C, and the pair of elastic support regions 34C) are integrally formed in a portion of the device layer 3C by a MEMS technology (patterning and etching).

The actuator regions 33C of the pair are disposed on both sides of the mounting region 31C in an XC-axis direction (direction parallel to an XC-axis orthogonal the ZC-axis). That is, the mounting region 31C is sandwiched between the actuator regions 33C of the pair in the XC-axis direction. Each of the actuator regions 33C is fixed to the support layer 2C with the intermediate layer 4C interposed therebetween. A first comb-teeth portion 33aC is provided on a side surface of each of the actuator regions 33C on the mounting region 31C side. Each of the first comb-teeth portions 33aC is in a state of being floated with respect to the support layer 2C by removing the intermediate layer 4C immediately below thereof. A first electrode 35C is provided in each of the actuator regions 33C.

The elastic support regions 34C of the pair are disposed on both sides of the mounting region 31C in a YC-axis direction (direction parallel to a YC-axis orthogonal to the ZC-axis and the XC-axis). That is, the mounting region 31C is sandwiched between the elastic support regions 34C of the pair in the YC-axis direction. Both end portions 34aC of each of the elastic support regions 34C are fixed to the support layer 2C with the intermediate layer 4C interposed therebetween. An elastic deformation portion 34bC (part between both the end portions 34aC) of each of the elastic support regions 34C has a structure in which a plurality of leaf springs are connected. The elastic deformation portion 34bC of each of the elastic support regions 34C is in a state of being floated with respect to the support layer 2C by removing the intermediate layer 4C immediately below thereof. A second electrode 36C is provided in each of both the end portions 34aC in each of the elastic support regions 34C.

The elastic deformation portion 34bC of each of the elastic support regions 34C is connected to the mounting region 31C. The mounting region 31C is in a state of being floated with respect to the support layer 2C by removing the intermediate layer 4C immediately below thereof. That is, the mounting region 31C is supported by the pair of elastic support regions 34C. Second comb-teeth portions 31aC are provided on side surfaces of the mounting region 31C on the actuator region 33C side. Each of the second comb-teeth portions 31aC is in a state of being floated with respect to the support layer 2C by removing the intermediate layer 4C immediately below thereof. In the first comb-teeth portions 33aC and the second comb-teeth portions 31aC facing each other, each comb tooth of the first comb-teeth portions 33aC is positioned between comb teeth of the second comb-teeth portions 31aC.

The elastic support regions 34C of the pair sandwiches the mounting region 31C from both sides when viewed in a direction AC parallel to the XC-axis. When the mounting region 31C moves in the direction AC, the pair of elastic support regions 34C causes an elastic force to act on the mounting region 31C such that the mounting region 31C returns to the initial position. Therefore, when a voltage is applied to a part between the first electrode 35C and the second electrode 36C such that an electrostatic attraction acts between the first comb-teeth portions 33aC and the second comb-teeth portions 31aC facing each other, the mounting region 31C moves in the direction AC to a position where the electrostatic attraction and the elastic force of elastic support regions 34C is balanced. In this manner, the driving region 32C functions as an electrostatic actuator.

The light module 1C further includes a movable mirror 5C, a fixed mirror 6C, a beam splitter 7C, a light incident unit 8C, and a light emission unit 9C. The movable mirror 5C, the fixed mirror 6C, and the beam splitter 7C are disposed on the device layer 3C such that an interference optical system 10C (Michelson interference optical system) is constituted.

The movable mirror 5C is mounted in the mounting region 31C of the device layer 3C on one side of the beam splitter 7C in the XC-axis direction. A mirror surface 51aC of a mirror portion 51C included in the movable mirror 5C is positioned on a side opposite to the support layer 2C with respect to the device layer 3C. For example, the mirror surface 51aC is a surface perpendicular to the XC-axis direction (that is, a surface perpendicular to the direction AC) and is directed to the beam splitter 7C side.

The fixed mirror 6C is mounted in a mounting region 37C of the device layer 3C on one side of the beam splitter 7C in the YC-axis direction. A mirror surface 61aC of a mirror portion 61C included in the fixed mirror 6C is positioned on a side opposite to the support layer 2C with respect to the device layer 3C. For example, the mirror surface 61aC is a surface perpendicular to the YC-axis direction and is directed to the beam splitter 7C side.

The light incident unit 8C is mounted in the device layer 3C on the other side of the beam splitter 7C in the YC-axis direction. For example, the light incident unit 8C is constituted of optical fibers, a collimating lens, and the like. The light incident unit 8C is disposed such that measurement light is incident on the interference optical system 10C from outside.

The light emission unit 9C is mounted in the device layer 3C on the other side of the beam splitter 7C in the XC-axis direction. For example, the light emission unit 9C is constituted of optical fibers, a collimating lens, and the like. The light emission unit 9C is disposed such that measurement light (interference light) is emitted from the interference optical system 10C to the outside.

The beam splitter 7C is a cube-type beam splitter having an optical functional surface 7aC. The optical functional surface 7aC is positioned on a side opposite to the support layer 2C with respect to the device layer 3C. The beam splitter 7C is positionally aligned when one corner portion of the beam splitter 7C on a bottom surface side is brought into contact with one corner of a rectangular opening 3aC formed in the device layer 3C. The beam splitter 7C is mounted in the support layer 2C by being fixed to the support layer 2C through bonding or the like in a positionally aligned state.

In the light module 1C having a configuration described above, when measurement light L0C is incident on the interference optical system 10C from outside via the light incident unit 8C, a portion of the measurement light L0C is reflected by the optical functional surface 7aC of the beam splitter 7C and travels toward the movable mirror 5C, and the remaining portion of the measurement light L0C is transmitted through the optical functional surface 7aC of the beam splitter 7C and travels toward the fixed mirror 6C. A portion of the measurement light L0C is reflected by the mirror surface 51aC of the movable mirror 5C, travels toward the beam splitter 7C along the same optical path, and is transmitted through the optical functional surface 7aC of the beam splitter 7C. The remaining portion of the measurement light L0C is reflected by the mirror surface 61aC of the fixed mirror 6C, travels toward the beam splitter 7C along the same optical path, and is reflected by the optical functional surface 7aC of the beam splitter 7C. A portion of the measurement light L0C which has been transmitted through the optical functional surface 7aC of the beam splitter 7C, and the remaining portion of the measurement light L0C which has been reflected by the optical functional surface 7aC of the beam splitter 7C become measurement light L1C (interference light). The measurement light L1C is emitted from the interference optical system 10C to the outside via the light emission unit 9C. According to the light module 1C, since the movable mirror 5C can reciprocate in the direction AC at a high speed, it is possible to provide a small-sized FTIR having high accuracy.

[Movable Mirror and Surrounding Structure Thereof]

Figure 47:
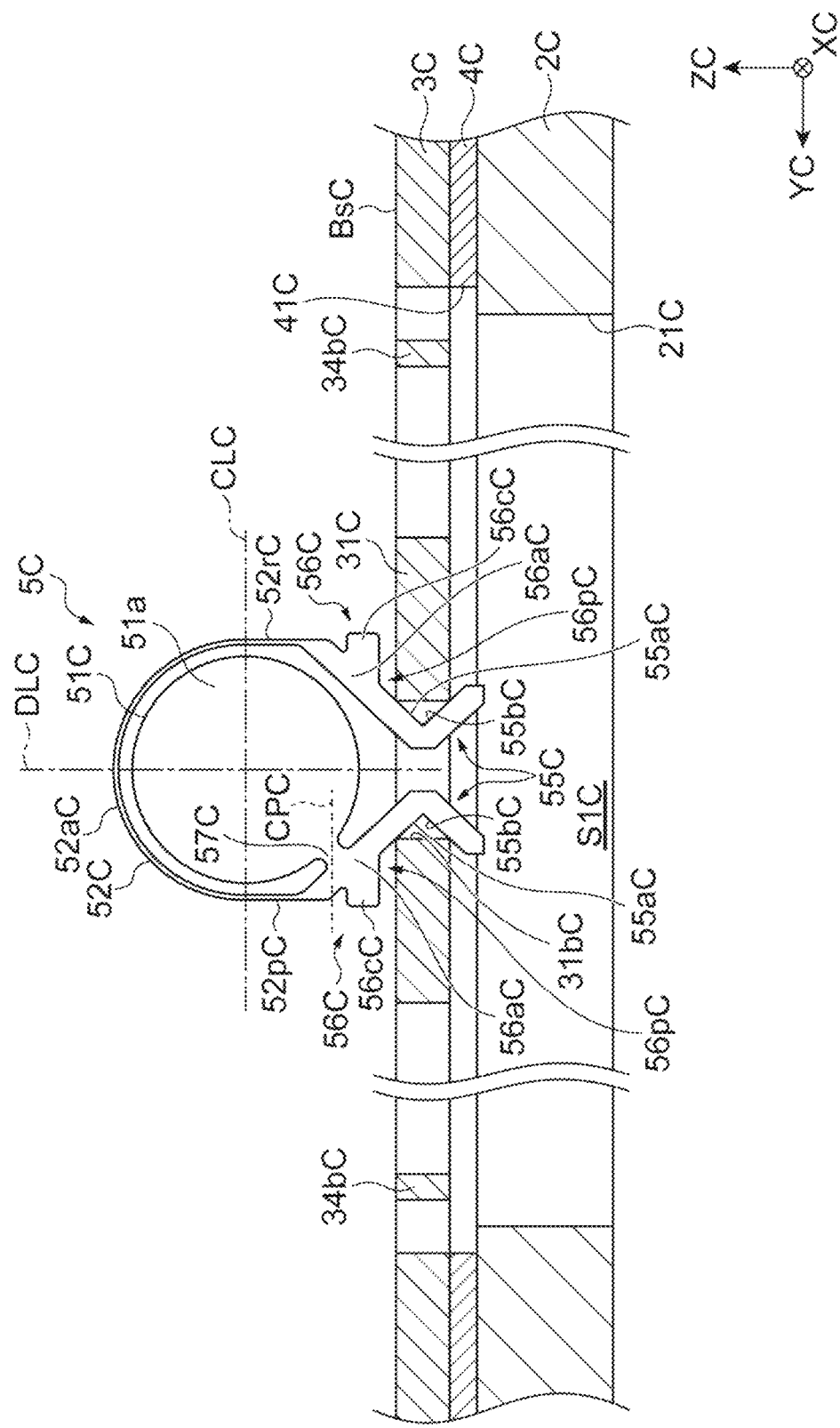
FIG. 47 is a cross-sectional view taken along line IIC-IIC illustrated in FIG. 46.
Figure 48:
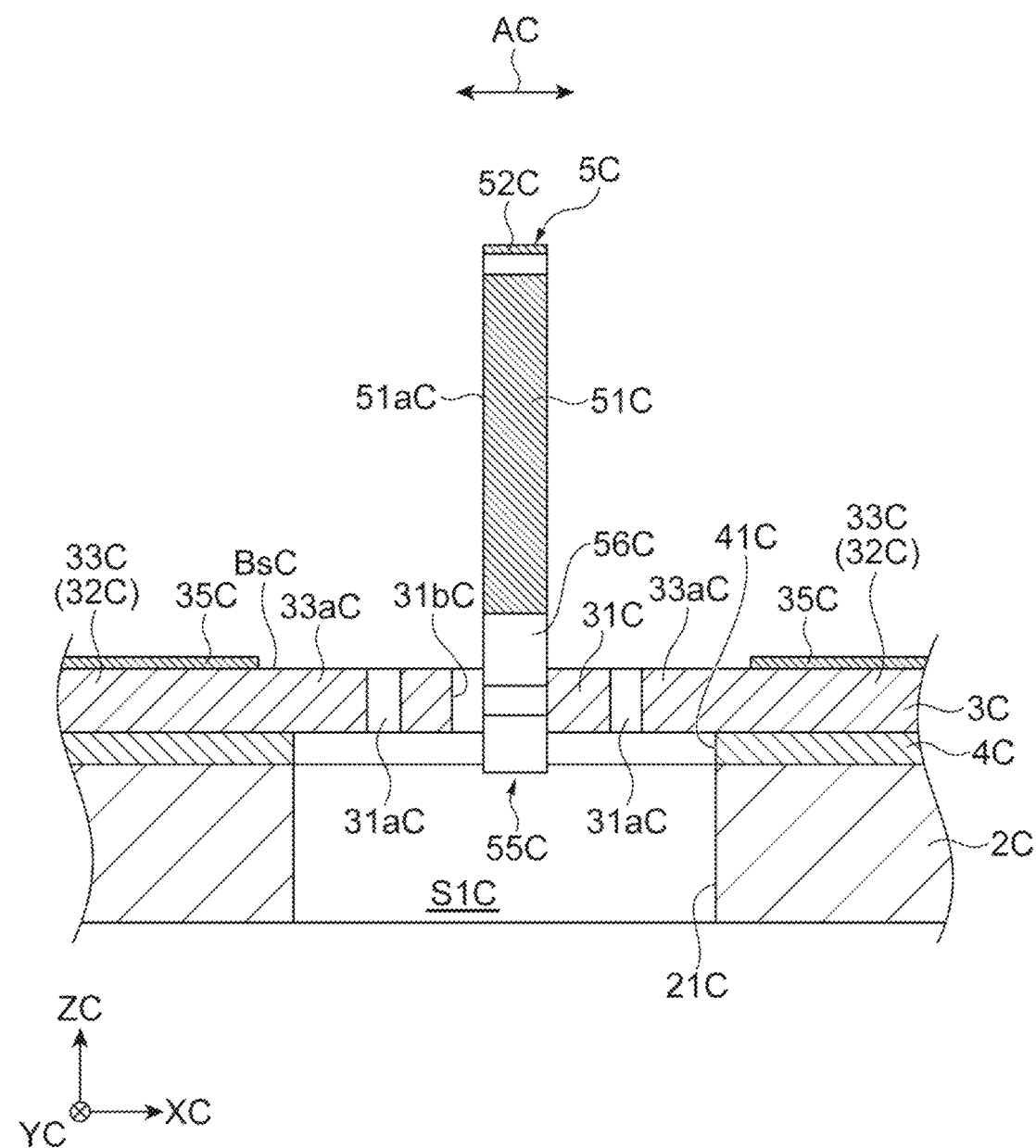
FIG. 48 is a cross-sectional view taken along line IIIC-IIIC illustrated in FIG. 46.
Figure 49:
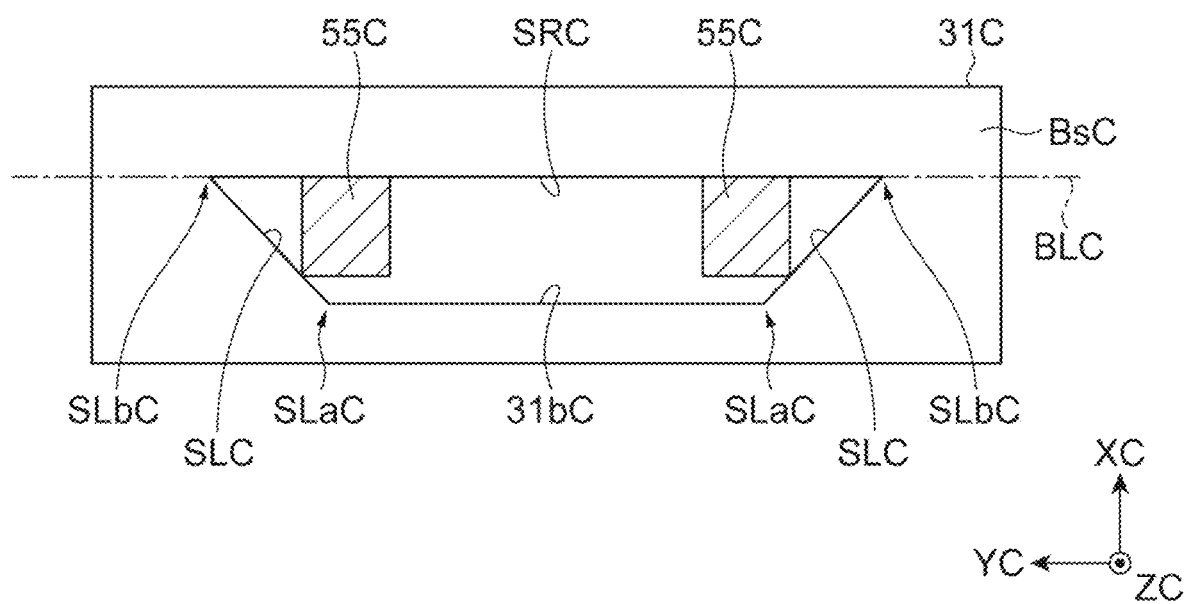
FIG. 49 a partially plan view including a mounting region illustrated in FIG. 46.

As illustrated in FIGS. 47, 48, and 49, the movable mirror (optical element) 5C has the mirror portion (optical portion) 51C which has the mirror surface (optical surface) 51aC, an elastic portion 52C, a pair of support portions 56C, and a single connecting portion 57C which connects one support portion 56C and the mirror portion 51C to each other. The mirror portion 51C is formed to have a disk shape. The mirror surface 51aC is a circular plate surface of the mirror portion 51C. The movable mirror 5C is mounted on the base BC in a state where the mirror surface 51aC intersects (for example, is orthogonal to) the main surface BsC.

The elastic portion 52C is provided around the mirror portion 51C. Here, the elastic portion 52C is provided around the mirror portion 51C such that the mirror portion 51C in its entirety is surrounded on a side of the base BC opposite to the main surface BsC of the center of the mirror portion 51C in the ZC-axis direction. The elastic portion 52C is separated from the mirror portion 51C. The elastic portion 52C includes a circular arc part 52aC which is formed to have a circular arc shape such that the mirror portion 51C is partially surrounded when viewed in a direction (XC-axis direction) intersecting the mirror surface 51aC. The elastic portion 52C in its entirety is constituted as a leaf spring including this circular arc part 52aC. Here, the circular arc part 52aC is disposed on a side opposite to the main surface BsC of the base BC of a center line CLC passing through the center of the mirror portion 51C in the ZC-axis direction. The center line CLC is an imaginary straight line extending in a direction (YC-axis direction) along the mirror surface 51aC and the main surface BsC.

The elastic portion 52C includes one end portion 52pC and the other end portion 52rC which are provided at both ends of the circular arc part 52aC. The one end portion 52pC and the other end portion 52rC may have a curved shape which continues from the circular arc part 52aC or may have a linear shape. For example, the one end portion 52pC and the other end portion 52rC overlap the center line CLC. Here, the elastic portion 52C is symmetrically constituted with respect to another center line DLC passing through the center of the mirror portion 51C in the YC-axis direction. The center line DLC is an imaginary line intersecting (orthogonal to) the center line CLC and extending in the ZC-axis direction.

The support portions 56C have a rod shape with a rectangular cross section, as an example, and are provided such that at least a portion of the mirror portion 51C (portion of the base BC on the main surface BsC side) is sandwiched therebetween in the YC-axis direction. The support portions 56C are respectively connected (formed with no disconnection) to the one end portion 52pC and the other end portion 52rC of the elastic portion 52C. The support portions 56C extend to the base BC side beyond the mirror portion 51C from the one end portion 52pC and the other end portion 52rC, respectively. More specifically, the support portions 56C include inclined portions 56aC which are inclined such that the distance therebetween decreases from the one end portion 52pC and the other end portion 52rC toward the base BC. In addition, the support portions 56C include interlock portions 55C which extend from end portions of the inclined portions 56aC on a side opposite to the one end portion 52pC and the other end portion 52rC.

The support portions 56C include projection portions 56cC which protrude from the inclined portions 56aC in directions opposite to each other between the support portions 56C of the pair. In the support portion 56C, a corner portion 56pC is formed by the inclined portion 56aC, the interlock portion 55C, and the projection portion 56cC. The corner portions 56pC face sides opposite to each other between the support portions 56C of the pair.

In regard to the support portions 56C, when a force is applied to the support portions 56C such that the support portions 56C are sandwiched from both sides in the YC-axis direction, the elastic portion 52C can be elastically deformed to be compressed in the YC-axis direction. That is, the distance between the support portions 56C in the YC-axis direction can be changed in accordance with elastic deformation of the elastic portion 52C. In addition, an elastic force of the elastic portion 52C can be applied to the support portions 56C. When a force for causing the elastic portion 52C to be deformed is applied to the support portions 56C, the projection portions 56cC can be utilized (that is, a force can be input from through the projection portions 56cC), for example.

The connecting portion 57C is provided in one of the pair of support portions 56C and connects the support portion 56C and the mirror portion 51C to each other. Here, the connecting portion 57C is connected to the inclined portion 56aC of the support portion 56C. In addition, the connecting portion 57C is connected to the mirror portion 51C at a position on a side opposite to the base BC of the position connected to the inclined portion 56aC. Therefore, the connecting portion 57C is inclined (is obliquely provided) to be closer to the base BC from one support portion 56C in which the connecting portion 57C is not provided toward the other support portion 56C. In addition, the connecting portion 57C is provided on the base BC side of the center of the mirror surface 51aC. Therefore, the pair of support portions 56C extends to the base BC side over a connecting position CPC of the connecting portion 57C with respect to the mirror portion 51C. The interlock portions 55C are inserted into an opening 31bC, which will be described below.

The interlock portion 55C in its entirety is bent in a V-shape. The interlock portion 55C includes an inclined surface 55aC and an inclined surface 55bC. The inclined surface 55aC and the inclined surface 55bC are surfaces (outer surfaces) of a pair of interlock portions 55C on sides opposite to surfaces facing each other. The inclined surfaces 55aC are inclined toward each other in a direction (negative ZC-axis direction) away from the connecting portion 57C between the interlock portions 55C of the pair. The inclined surfaces 55bC are inclined away from each other in the negative ZC-axis direction. When viewed in the XC-axis direction, the absolute value for an inclination angle of the inclined surface 55aC with respect to the ZC-axis is smaller than 90°. Similarly, the absolute value for an inclination angle of the inclined surface 55bC is smaller than 90°. Here, as an example, the absolute values for the inclination angles thereof are equal to each other.

Here, the opening 31bC is formed in the mounting region 31C. Here, the opening 31bC extends in the ZC-axis direction and penetrates the device layer 3C. Therefore, the opening 31bC communicates with (reaches) the main surface BsC and a surface of the device layer 3C on a side opposite to the main surface BsC. The opening 31bC exhibits a pillar shape in which a shape when viewed in the ZC-axis direction is a trapezoidal shape (refer to FIG. 49). The opening 31bC will be described below in detail.

The support portions 56C are inserted into this opening 31bC in a state where an elastic force of the elastic portion 52C is applied. In other words, the support portions 56C (that is, the movable mirror 5C) penetrates the mounting region 31C via the opening 31bC. More specifically, a portion of the interlock portion 55C of the support portion 56C is positioned inside the opening 31bC. In this state, the interlock portions 55C come into contact with a pair of edge portions (an edge portion on the main surface BsC side and an edge portion on a side opposite to the main surface BsC) of the opening 31bC in the ZC-axis direction.

Here, the inclined surfaces 55aC come into contact with the edge portions of the opening 31bC on the main surface BsC side, and the inclined surfaces 55bC come into contact with the edge portions of the opening 31bC on a side opposite to the main surface BsC. Accordingly, the interlock portions 55C are interlocked with the mounting region 31C such that the mounting region 31C is sandwiched therebetween in the ZC-axis direction. As a result, detachment of the movable mirror 5C from the base BC in the ZC-axis direction is curbed.

Here, an opening 41C is formed in the intermediate layer 4C. The opening 41C is open on both sides of the intermediate layer 4C in the ZC-axis direction. An opening 21C is formed in the support layer 2C. The opening 21C is open on both sides of the support layer 2C in the ZC-axis direction. In the light module 1C, a continuous space S1C is constituted of a region inside the opening 41C of the intermediate layer 4C and a region inside the opening 21C of the support layer 2C. That is, the space S1C includes a region inside the opening 41C of the intermediate layer 4C and a region inside the opening 21C of the support layer 2C.

The space S1C is formed between the support layer 2C and the device layer 3C and corresponds to at least the mounting region 31C and the driving region 32C. Specifically, a region inside the opening 41C of the intermediate layer 4C and a region inside the opening 21C of the support layer 2C include a range in which the mounting region 31C moves when viewed in the ZC-axis direction. A region inside the opening 41C of the intermediate layer 4C forms a clearance for causing a part (that is, a part to be in a floated state with respect to the support layer 2C, for example, the mounting region 31C in its entirety, the elastic deformation portion 34bC of each of the elastic support regions 34C, the first comb-teeth portions 33aC, and the second comb-teeth portions 31aC) of the mounting region 31C and the driving region 32C, which needs to be separated from the support layer 2C, to be separated from the support layer 2C.

Here, as illustrated in FIG. 49, an inner surface of the opening 31bC includes a pair of inclined surfaces SLC and a reference surface SRC. The inclined surface SLC includes one end SLaC and the other end SLbC. The one end SLaC and the other end SLbC are both end portions of the inclined surface SLC when viewed in the ZC-axis direction. The inclined surfaces SLC of the pair are inclined such that the distance therebetween increases from the one end SLaC toward the other end SLbC (for example, with respect to the XC-axis). When viewed in the ZC-axis direction, the reference surface SRC extends along a reference line BLC connecting the other end SLbC of one inclined surface SLC and the other end SLbC of the other inclined surface SLC to each other. Here, the reference surface SRC simply connects the other ends SLbC to each other. As described above, the shape of the opening 31bC when viewed in the ZC-axis direction is a trapezoidal shape. Therefore, here, the inclined surfaces SLC correspond to legs of the trapezoidal shape, and the reference surface SRC corresponds to a bottom base of the trapezoidal shape.

Here, the opening 31bC is a single space. The minimum value for the size (that is, the gap between the one ends SLaC of the inclined surfaces SLC) of the opening 31bC in the YC-axis direction is a value allowing the pair of interlock portions 55C to be collectively disposed inside the opening 31bC when the elastic portion 52C is elastically deformed to be compressed in the YC-axis direction. Meanwhile, the maximum value for the size (that is, the gap between the other ends SLbC of the inclined surfaces SLC) of the opening 31bC in the YC-axis direction is a value allowing only a portion of elastic deformation of the elastic portion 52C to be released (that is, the elastic portion 52C does not reach the natural length) when the pair of interlock portions 55C is disposed in the opening 31bC.

Therefore, when the pair of interlock portions 55C is disposed inside the opening 31bC, the interlock portions 55C press the inner surface of the opening 31bC due to an elastic force of the elastic portion 52C, and a reaction force from the inner surface of the opening 31bC is applied to the interlock portions 55C (support portions 56C). Accordingly, in a state where the mirror surface 51aC intersects (for example, is orthogonal to) the main surface BsC, the movable mirror 5C is supported in the mounting region 31C by a reaction force of an elastic force applied from the inner surface of the opening 31bC to the support portions 56C.

Particularly, the interlock portions 55C are brought into contact with the inclined surfaces SLC of the opening 31bC. Therefore, the interlock portions 55C slide on the inclined surfaces SLC toward the reference surface SRC due to a component of a reaction force from the inclined surfaces SLC in the XC-axis direction and abut the reference surface SRC while being in contact with the inclined surfaces SLC. Accordingly, the interlock portions 55C come into internal contact with the corner portions defined by the inclined surfaces SLC and the reference surface SRC and are positionally aligned (self-aligned due to an elastic force) in both the XC-axis direction and the YC-axis direction. Here, since the interlock portions 55C have a quadrangular cross-sectional shape, the inclined surfaces SLC come into point contact with the interlock portions 55C and the reference surface SRC comes into line contact with the interlock portions 55C when viewed in the ZC-axis direction. That is, here, the inner surface of the opening 31bC comes into contact with the pair of interlock portions 55C at two points and along two lines when viewed in the ZC-axis direction.

Meanwhile, as illustrated in FIG. 47, when viewed in the XC-axis direction, a reaction force of an elastic force is also applied to the interlock portions 55C from the inner surface of the opening 31bC at the edge portions of the opening 31bC. When the movable mirror 5C is mounted, there are cases where a reaction force is applied to either the inclined surfaces 55aC or the inclined surfaces 55bC of the interlock portions 55C. In these cases, either the inclined surfaces 55aC or the inclined surfaces 55bC slide on the edge portions due to a component of the reaction force along the inclined surfaces 55aC or the inclined surfaces 55bC and move in the ZC-axis direction to reach positions (that is, positions where the mounting region 31C is sandwiched therebetween in the ZC-axis direction) where both the inclined surfaces 55aC and the inclined surfaces 55bC come into contact with the edge portions. Accordingly, the interlock portions 55C are interlocked at the positions, and the movable mirror 5C is positionally aligned (self-aligned due to an elastic force) in the ZC-axis direction. That is, the movable mirror 5C is self-aligned in a three-dimensional manner utilizing an elastic force of the elastic portion 52C.

The movable mirror 5C described above is integrally formed by a MEMS technology (patterning and etching), for example. Therefore, the thickness (size in a direction intersecting the mirror surface 51aC) of the movable mirror 5C is uniform in each portion. For example, the thickness thereof is approximately 320 μm. In addition, the diameter of the mirror surface 51aC is approximately 1 mm, for example. Moreover, the gap between a surface (inner surface) of the elastic portion 52C on the mirror portion 51C side and a surface (outer surface) of the mirror portion 51C on the elastic portion 52C side is approximately 200 μm, for example. The thickness of the elastic portion 52C (thickness of the leaf spring) is within a range of approximately 10 μm to 20 μm, for example.

When viewed in a direction (XC-axis direction) intersecting the mirror surface 51aC, the thickness of the interlock portion 55C is larger than the thickness (plate thickness) of the elastic portion 52C. In addition, when viewed in the XC-axis direction, the thickness of the support portion 56C in its entirety is larger than the thickness of the elastic portion 52C. Moreover, when viewed in the XC-axis direction, the thickness of the connecting portion 57C is larger than the thickness of the elastic portion 52C. That is, here, the elastic portion 52C is the slenderest (thinnest) among the elastic portion 52C, the support portions 56C, and the connecting portion 57C. Therefore, for example, when the elastic portion 52C is elastically deformed due to a force input from the support portions 56C, the support portions 56C and the connecting portion 57C are not substantially deformed. However, the support portions 56C and the connecting portion 57C may be slightly deformed. In other words, there are cases where the support portions 56C and the connecting portion 57C are deformed within a range in which the deformation amounts of the support portions 56C and the connecting portion 57C are smaller than the deformation amount of the elastic portion 52C (there are cases where the deformation amounts of the support portions 56C and the connecting portion 57C are zero).

[Fixed Mirror and Surrounding Structure Thereof]

Figure 50:
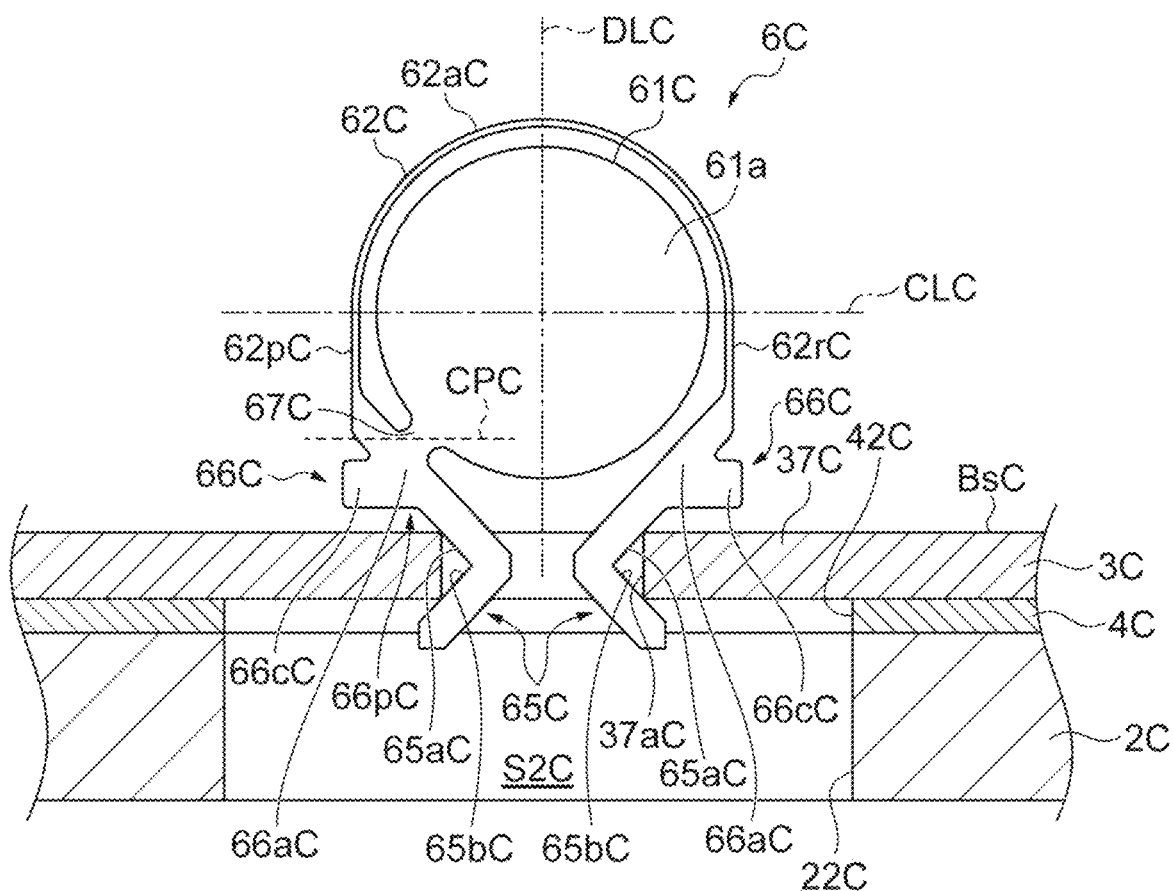
FIG. 50 is a cross-sectional view taken along line VC-VC illustrated in FIG. 46.
Figure 51:
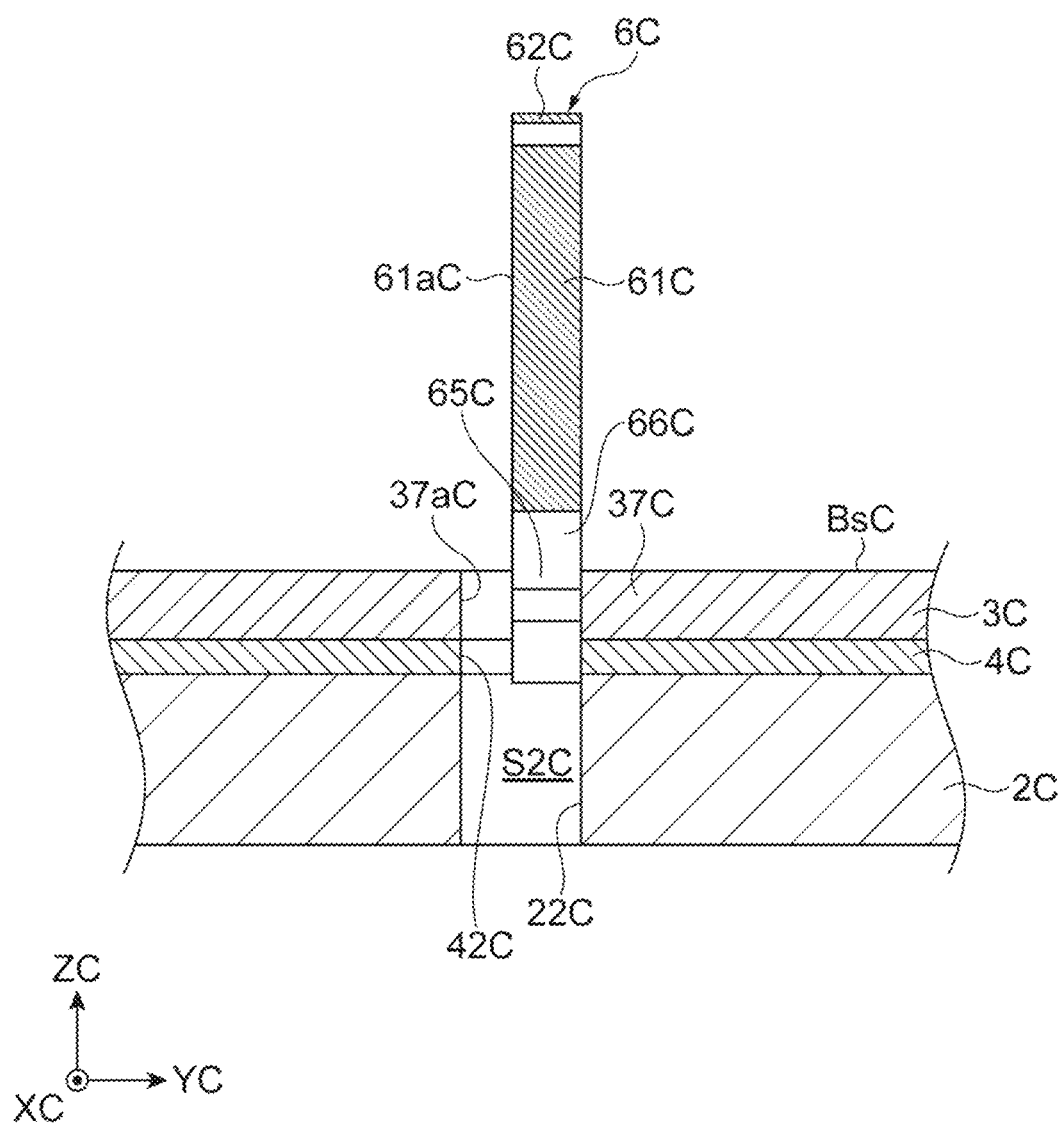
FIG. 51 is a cross-sectional view taken along line VIC-VIC illustrated in FIG. 46.

The fixed mirror 6C and the surrounding structure thereof are similar to the foregoing movable mirror 5C and the surrounding structure thereof, except that the mounting region is not movable. That is, as illustrated in FIGS. 50 and 51, the fixed mirror (optical element) 6C has the mirror portion (optical portion) 61C which has the mirror surface (optical surface) 61aC, an elastic portion 62C, a pair of support portions 66C, and a single connecting portion 67C which connects one support portion 66C and the mirror portion 61C to each other. The mirror portion 61C is formed to have a disk shape. The mirror surface 61aC is a circular plate surface of the mirror portion 61C. The fixed mirror 6C is mounted on the base BC in a state where the mirror surface 61aC intersects (for example, is orthogonal to) the main surface BsC.

The elastic portion 62C is provided around the mirror portion 61C. Here, the elastic portion 62C is provided around the mirror portion 61C such that the entirety on a side of the base BC opposite to the main surface BsC of the center of the mirror portion 61C in the ZC-axis direction is surrounded. The elastic portion 62C includes a circular arc part 62aC which is formed to have a circular arc shape being separated from the mirror portion 61C and partially surrounding the mirror portion 61C when viewed in a direction (XC-axis direction) intersecting the mirror surface 61aC. The elastic portion 62C in its entirety is constituted as a leaf spring including this circular arc part 62aC. Here, the circular arc part 62aC is disposed on a side opposite to the main surface BsC of the base BC of the center line CLC passing through the center of the mirror portion 61C in the ZC-axis direction. The center line CLC is an imaginary straight line extending in a direction (XC-axis direction) along the mirror surface 61aC and the main surface BsC.

The elastic portion 62C includes one end portion 62pC and the other end portion 62rC which are provided at both ends of the circular arc part 62aC. The one end portion 62pC and the other end portion 62rC may be continuously curved in a circular arc shape from the circular arc part 62aC or may have a linear shape. For example, the one end portion 62pC and the other end portion 62rC are positioned along the center line CLC. Here, the elastic portion 62C is symmetrically constituted with respect to another center line DLC passing through the center of the mirror portion 61C in the ZC-axis direction. The center line DLC is an imaginary line intersecting (orthogonal to) the center line CLC and extending in the ZC-axis direction.

The support portions 66C have a rod shape with a rectangular cross section and are provided such that at least a portion of the mirror portion 61C (portion of the base BC on the main surface BsC side) is sandwiched therebetween in the XC-axis direction. The support portions 66C are respectively connected (formed with no disconnection) to the one end portion 62pC and the other end portion 62rC of the elastic portion 62C. The support portions 66C extend to the base BC side beyond the mirror portion 61C from the one end portion 62pC and the other end portion 62rC. More specifically, the support portions 66C include inclined portions 66aC which are inclined such that the distance therebetween decreases from the one end portion 62pC and the other end portion 62rC toward the base BC. In addition, the support portions 66C include interlock portions 65C which extend from end portions of the inclined portions 66aC on a side opposite to the one end portion 62pC and the other end portion 62rC.

Moreover, the support portions 66C include projection portions 66cC which protrude from the inclined portions 66aC in directions opposite to each other between the support portions 66C of the pair. In the support portion 66C, a corner portion 66pC is formed by the inclined portion 66aC, the interlock portion 65C, and the projection portion 66cC. The corner portions 66pC face sides opposite to each other between the support portions 66C of the pair.

In regard to the support portions 66C, when a force is applied to the support portions 66C such that the support portions 66C are sandwiched from both sides in the XC-axis direction, the elastic portion 62C can be elastically deformed to be compressed in the XC-axis direction. That is, the distance between the support portions 66C in the XC-axis direction can be changed in accordance with elastic deformation of the elastic portion 62C. In addition, an elastic force of the elastic portion 62C can be applied to the support portions 66C. When a force for causing the elastic portion 62C to be deformed is applied to the support portions 66C, the projection portions 66cC can be utilized (that is, a force can be input through the projection portions 66cC), for example.

The connecting portion 67C is provided in one of the pair of support portions 66C and connects the support portion 66C and the mirror portion 61C to each other. Here, the connecting portion 67C is connected to the inclined portion 66aC of the support portion 66C. In addition, the connecting portion 67C is connected to the mirror portion 61C at a position on a side opposite to the base BC of the position connected to the inclined portion 66aC. Therefore, the connecting portion 67C is inclined to be closer to the base BC from one support portion 66C in which the connecting portion 67C is not provided toward the other support portion 66C. In addition, the connecting portion 67C is provided on the base BC side of the center of the mirror surface 61aC. Therefore, the pair of support portions 66C extends to the base BC side over the connecting position CPC of the connecting portion 67C with respect to the mirror portion 61C and is inserted into an opening 37aC, which will be described below.

The interlock portion 65C in its entirety is bent. The interlock portion 65C includes an inclined surface 65aC and an inclined surface 65bC. The inclined surface 65aC and the inclined surface 65bC are surfaces (outer surfaces) of a pair of interlock portions 65C on sides opposite to surfaces facing each other. The inclined surfaces 65aC are inclined toward each other in a direction (negative ZC-axis direction) away from the connecting portion 67C between the interlock portions 65C of the pair. The inclined surfaces 65bC are inclined away from each other in the negative ZC-axis direction. When viewed in the YC-axis direction, the inclination angles of the inclined surfaces 65aC and 65bC with respect to the ZC-axis are similar to those of the inclined surfaces 55aC and 55bC in the movable mirror 5C.

Here, an opening 42C is formed in the intermediate layer 4C. The opening 42C includes the opening 37aC of the mounting region 37C when viewed in the ZC-axis direction and is open on both sides of the intermediate layer 4C in the ZC-axis direction. An opening 22C is formed in the support layer 2C. The opening 22C includes the opening 37aC of the mounting region 37C when viewed in the ZC-axis direction and is open on both sides of the support layer 2C in the ZC-axis direction. In the light module 1C, a continuous space S2C is constituted of a region inside the opening 42C of the intermediate layer 4C and a region inside the opening 22C of the support layer 2C. That is, the space S2C includes a region inside the opening 42C of the intermediate layer 4C and a region inside the opening 22C of the support layer 2C.

Here, an inner surface of the opening 37aC has a configuration similar to the inner surface of the opening 31bC in the mounting region 31C. Therefore, when the pair of interlock portions 65C is disposed inside the opening 37aC, the interlock portions 65C press the inner surface of the opening 37aC due to an elastic force of the elastic portion 62C, and a reaction force from the inner surface of the opening 37aC is applied to the interlock portions 65C (support portions 66C). Accordingly, in a state where the mirror surface 61aC intersects (for example, is orthogonal to) the main surface BsC, the fixed mirror 6C is supported in the base BC by a reaction force of an elastic force applied from the inner surface of the opening 37aC to the support portions 66C. Particularly, similar to the case of the movable mirror 5C, the fixed mirror 6C is also self-aligned utilizing the inner surface or the edge portions of the opening 37aC and an elastic force.

Similar to the movable mirror 5C, the fixed mirror 6C described above is also integrally formed by a MEMS technology (patterning and etching), for example. The size of each portion of the fixed mirror 6C is similar to the size of each portion of the movable mirror 5C described above, for example.

That is, when viewed in a direction (YC-axis direction) intersecting the mirror surface 61aC, the thickness of the interlock portion 65C is larger than the thickness (plate thickness) of the elastic portion 62C. In addition, when viewed in the YC-axis direction, the thickness of the support portion 66C in its entirety is larger than the thickness of the elastic portion 62C. Moreover, when viewed in the YC-axis direction, the thickness of the connecting portion 67C is larger than the thickness of the elastic portion 62C. That is, here, the elastic portion 62C is the slenderest (thinnest) among the elastic portion 62C, the support portion 66C, and the connecting portion 67C. Therefore, for example, when the elastic portion 62C is elastically deformed due to a force input from the support portions 66C, the support portions 66C and the connecting portion 67C are not substantially deformed. However, the support portions 66C and the connecting portion 67C may be slightly deformed. In other words, there are cases where the support portions 66C and the connecting portion 67C are deformed within a range in which the deformation amounts of the support portions 66C and the connecting portion 67C are smaller than the deformation amount of the elastic portion 62C (there are cases where the deformation amounts of the support portions 66C and the connecting portion 67C are zero).

[Operations and Effects]

In the light module 1C, the movable mirror 5C has the elastic portion 52C, and the support portions 56C of the pair in which the distance therebetween is able to be changed in accordance with elastic deformation of the elastic portion 52C. Meanwhile, the opening 31bC communicating with the main surface BsC is formed in the mounting region 31C of the base BC on which the movable mirror 5C is mounted. Therefore, as an example, when the support portions 56C are inserted into the opening 31bC in a state where the elastic portion 52C is elastically deformed such that the distance between the support portions 56C is decreased, and when an elastic deformation of the elastic portion 52C is partially released, the distance between the support portions 56C increases inside the opening 31bC, so that the support portions 56C can be brought into contact with the inner surface of the opening 31bC.

Accordingly, the movable mirror 5C is supported due to a reaction force applied from the inner surface of the opening 31bC to the support portions 56C. In this manner, in this light module 1C, the movable mirror 5C is mounted on the base BC utilizing an elastic force. Therefore, it is possible to reliably mount the optical element without taking an adverse influence of a bonding agent or the like into consideration, that is, regardless of characteristics of the mounting region 31C. Here, operations and effects are described with the movable mirror 5C as an example. However, the fixed mirror 6C also exhibits similar operations and effects (the same applies hereinafter).

Here, in this movable mirror 5C, the connecting portion 57C which connects the mirror portion 51C and the support portion 56C to each other is provided on the base BC side of the center of the mirror surface 51aC. Therefore, for example, compared to a case where the connecting portion 57C is provided on a side opposite to the base BC of the center of the mirror surface 51aC, the centroid of the movable mirror 5C in its entirety becomes closer to the base BC. Therefore, the stability is improved.

In addition, for a similar reason, the elastic portion 52C can be provided around the mirror portion 51C in a region in its entirety on a side opposite to the base BC of the center of the mirror surface 51aC. Moreover, there is no need for the region to have a member (for example, a connecting portion) for affecting elastic deformation of the elastic portion 52C. Therefore, the elastic portion 52C can have a relatively long part which can be freely and elastically deformed, and the spring constant is easily adjusted. As a result, it is possible to curb damage to the elastic portion accompanying elastic deformation and to realize stable mounting by curbing an increase in spring constant.

Meanwhile, for example, if the elastic portion 52C and the mirror portion 51C are connected to each other by providing a connecting portion near the center (position along the center line DLC on a side opposite to the base BC) of the circular arc part 52aC, the part of the elastic portion 52C which can be freely and elastically deformed is divided by the connecting portion. As a result, it is difficult to achieve the foregoing effects. As described above, according to this light module 1C, it is possible to stably mount the movable mirror 5C regardless of characteristics of the mounting region 31C.

According to the movable mirror 5C, as described above, the elastic portion 52C can be provided around the mirror portion 51C in a region in its entirety on a side opposite to the base BC of the center of the mirror surface 51aC. Therefore, even when the elastic portion 52C is provided close to the mirror portion 51C, the length of the elastic portion 52C can be sufficiently ensured. That is, according to this movable mirror 5C, it is possible to ensure the length of the elastic portion 52C and to realize a compact movable mirror 5C.

In addition, in the light module 1C, the elastic portion 52C includes the circular arc part 52aC which is formed such that the mirror portion 51C is partially surrounded when viewed in a direction intersecting the mirror surface 51aC. The one end portion 52pC and the other end portion 52rC are provided at the distal ends of the circular arc part 52aC. In this manner, since the elastic portion 52C has the circular arc part 52aC, both a compact size and the length of the elastic portion 52C can be reliably ensured.

In addition, in the light module 1C, the support portion 56C includes the interlock portion 55C which extends to the base BC side over the connecting position CPC of the connecting portion 57C with respect to the mirror portion 51C and is inserted into the opening 31bC. Then, the thickness of the interlock portion 55C is larger than the thickness of the elastic portion 52C when viewed in a direction intersecting the mirror surface 51aC. Therefore, the movable mirror 5C can be more stably supported in the base BC via the interlock portions 55C.

In addition, in the light module 1C, the thickness of the support portion 56C is larger than the thickness of the elastic portion 52C when viewed in a direction intersecting the mirror surface 51aC. Therefore, a force for causing the elastic portion 52C to be elastically deformed can be stably applied to the elastic portion 52C via the support portions 56C.

In addition, in the light module 1C, the thickness of the connecting portion 57C may be larger than the thickness of the elastic portion 52C when viewed in a direction intersecting the mirror surface 51aC. In this case, the support portions 56C and the mirror portion 51C can be reliably connected to each other.

In addition, in the light module 1C, the inner surface of the opening 31bC includes the inclined surfaces SLC of the pair which are inclined such that the distance therebetween increases from the one end SLaC toward the other end SLbC when viewed in the ZC-axis direction, and the reference surface SRC which extends along the reference line BLC connecting the other end SLbC of one inclined surface SLC and the other end SLbC of the other inclined surface SLC to each other. Therefore, when the support portions 56C are inserted into the opening 31bC and an elastic deformation of the elastic portion 52C is partially released, the support portions 56C can slide on the inclined surfaces SLC and can abut the reference surface SRC due to an elastic force. Therefore, it is possible to positionally align the movable mirror 5C in a direction along the main surface BsC.

In addition, the light module 1C further includes the fixed mirror 6C and the beam splitter 7C which are mounted on the base BC. The base BC has the driving region 32C which is connected to the mounting region 31C. The movable mirror 5C, the fixed mirror 6C, and the beam splitter 7C are disposed such that the interference optical system 10C is constituted. Therefore, it is possible to obtain an FTIR having improved sensitivity. In addition, here, the mounting region 31C, in which the movable mirror 5C is mounted, is characterized by being connected to the driving region 32C and being driven. Therefore, since the mounting region 31C is likely to be adversely affected by a bonding agent or the like, the foregoing configuration becomes more effective.

In addition, in the light module 1C, the base BC has the support layer 2C, a device layer 3C which is provided on the support layer 2C, and the intermediate layer 4C which is provided between the support layer 2C and the device layer 3C. Then, the support layer 2C is the first silicon layer of the SOI substrate, the device layer 3C is the second silicon layer of the SOI substrate, and the intermediate layer 4C is the insulating layer of the SOI substrate. Therefore, it is possible to favorably realize a configuration for reliable mounting of the movable mirror 5C with respect to the device layer 3C using the SOI substrate.

In addition, in the light module 1C, the mirror surface 51aC of the movable mirror 5C is positioned on a side opposite to the support layer 2C with respect to the device layer 3C. Accordingly, it is possible to simplify the configuration of the light module 1C.

In addition, in the light module 1C, the light incident unit 8C is disposed such that measurement light is incident on the interference optical system 10C from outside, and the light emission unit 9C is disposed such that the measurement light is emitted from the interference optical system 10C to the outside. Accordingly, it is possible to obtain an FTIR including the light incident unit 8C and the light emission unit 9C.

Modification Examples

Hereinabove, an embodiment of still another aspect of the present disclosure has been described. However, still another aspect of the present disclosure is not limited to the foregoing embodiment. For example, the material and the shape of each configuration are not limited to the materials and the shapes described above, and various materials and shapes can be employed.

Figure 52:
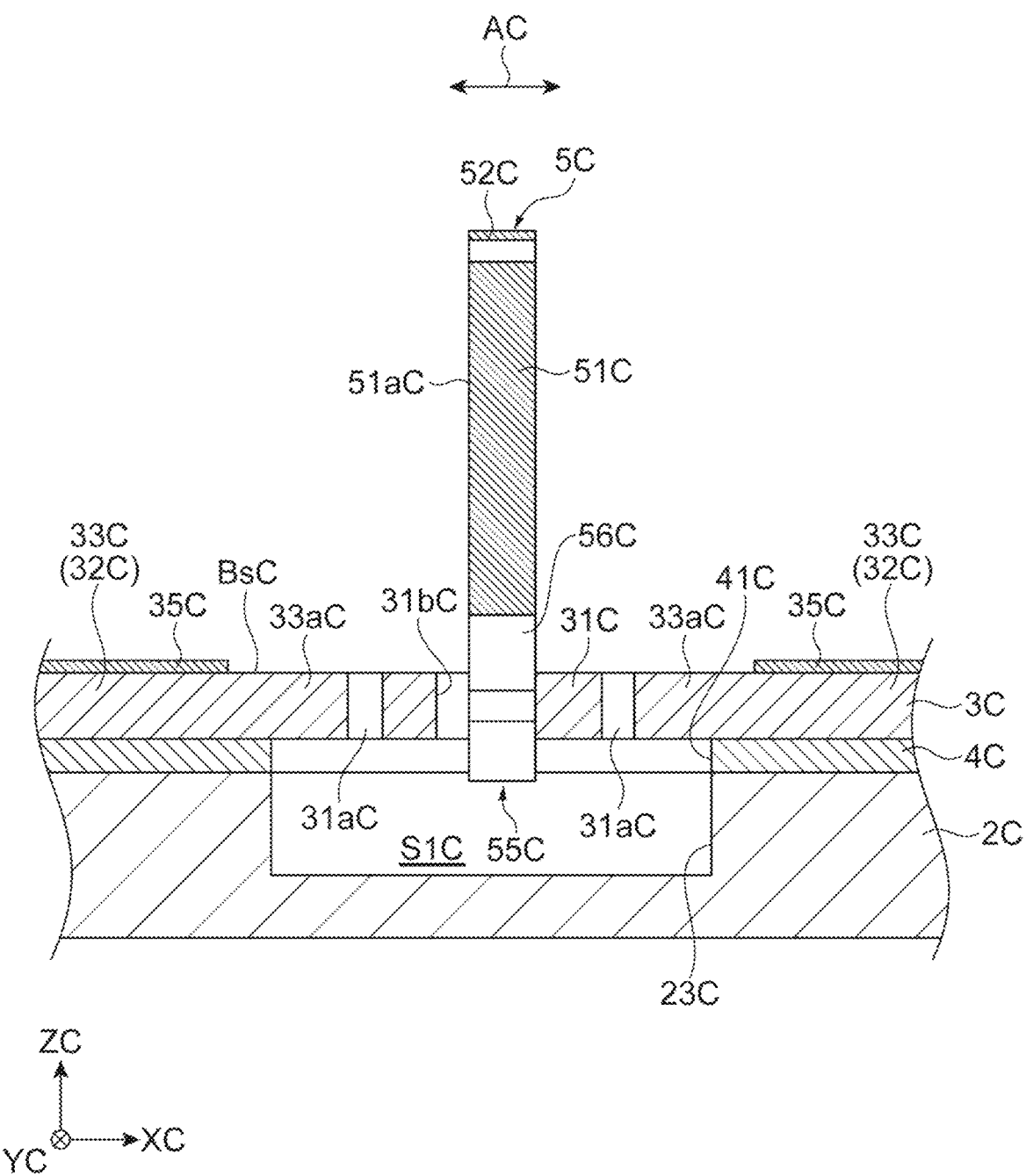
FIG. 52 is a cross-sectional view of another modification example of the surrounding structure of the movable mirror.
Figure 53:
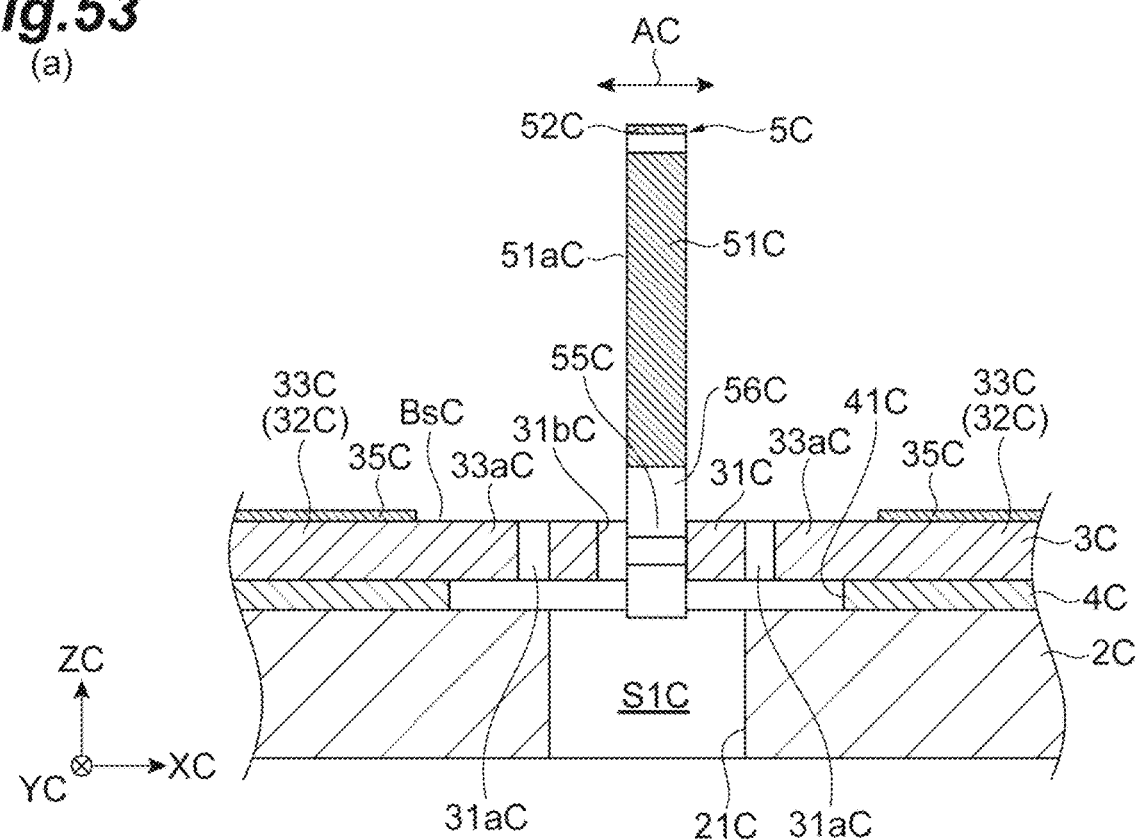
FIG. 53 is a cross-sectional view of another modification example of the surrounding structure of the movable mirror.
Figure 53:
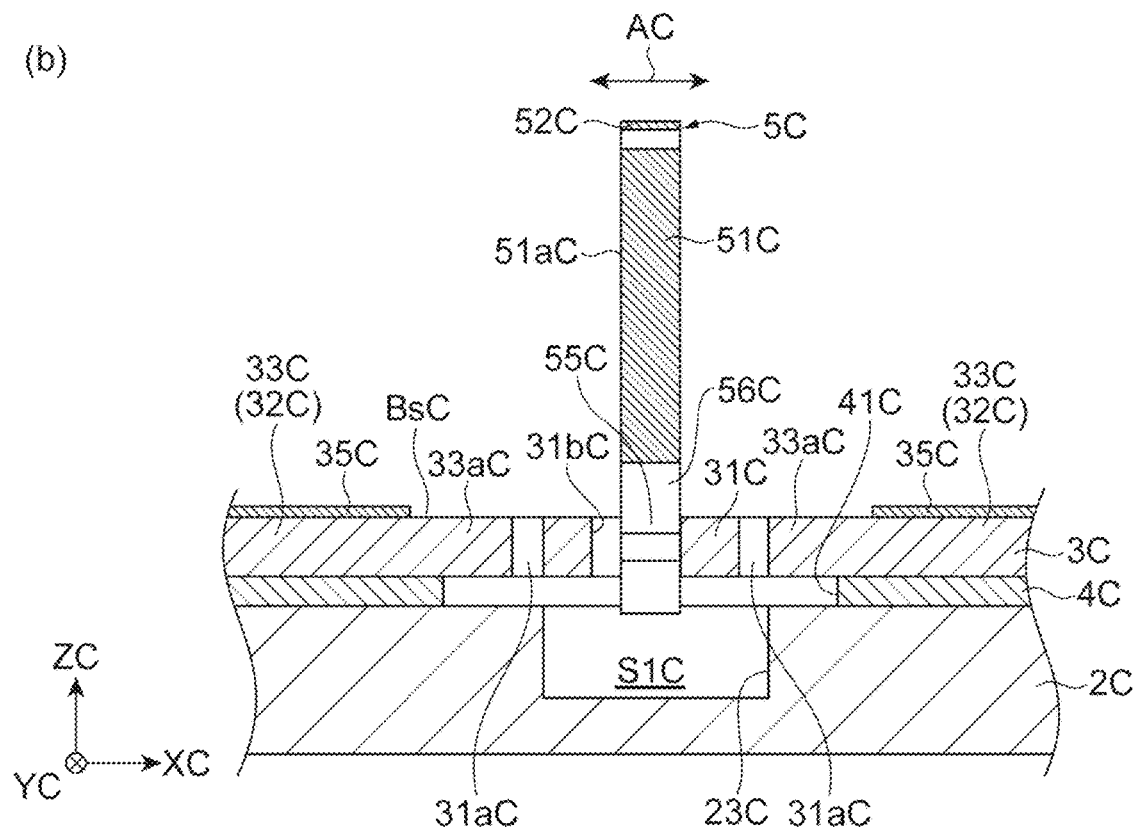
Figure 54:
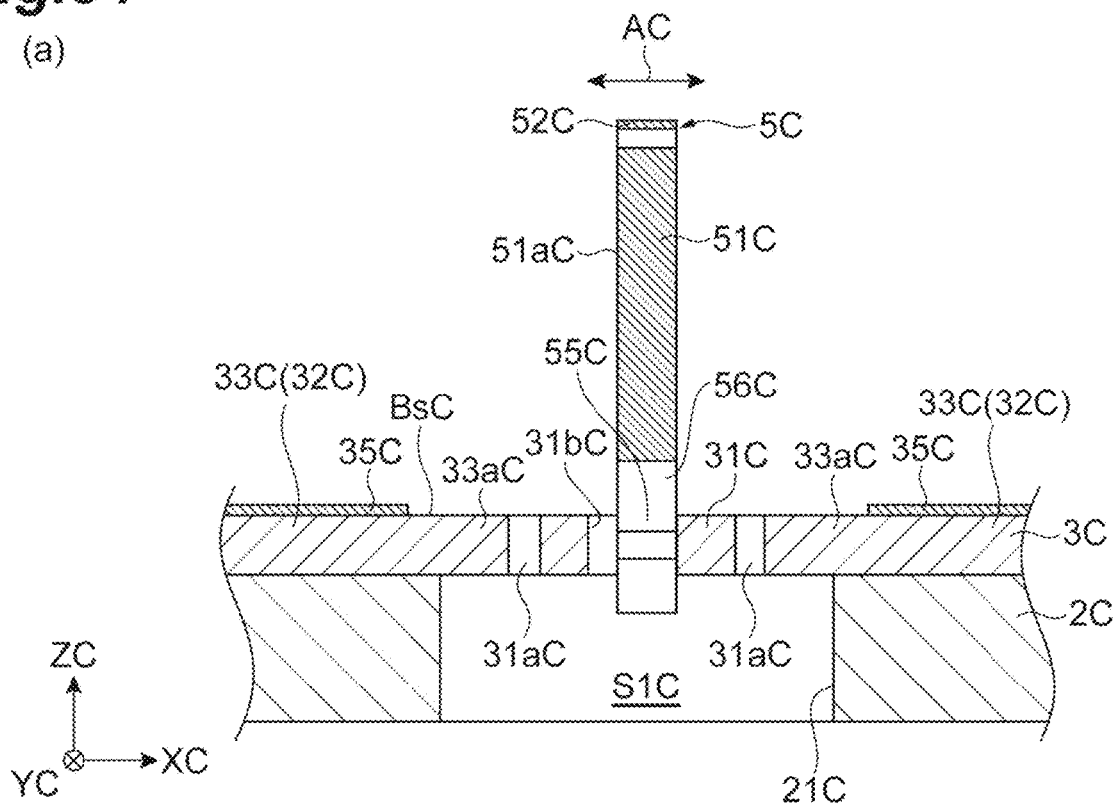
FIG. 54 is a cross-sectional view of another modification example of the surrounding structure of the movable mirror.
Figure 54:
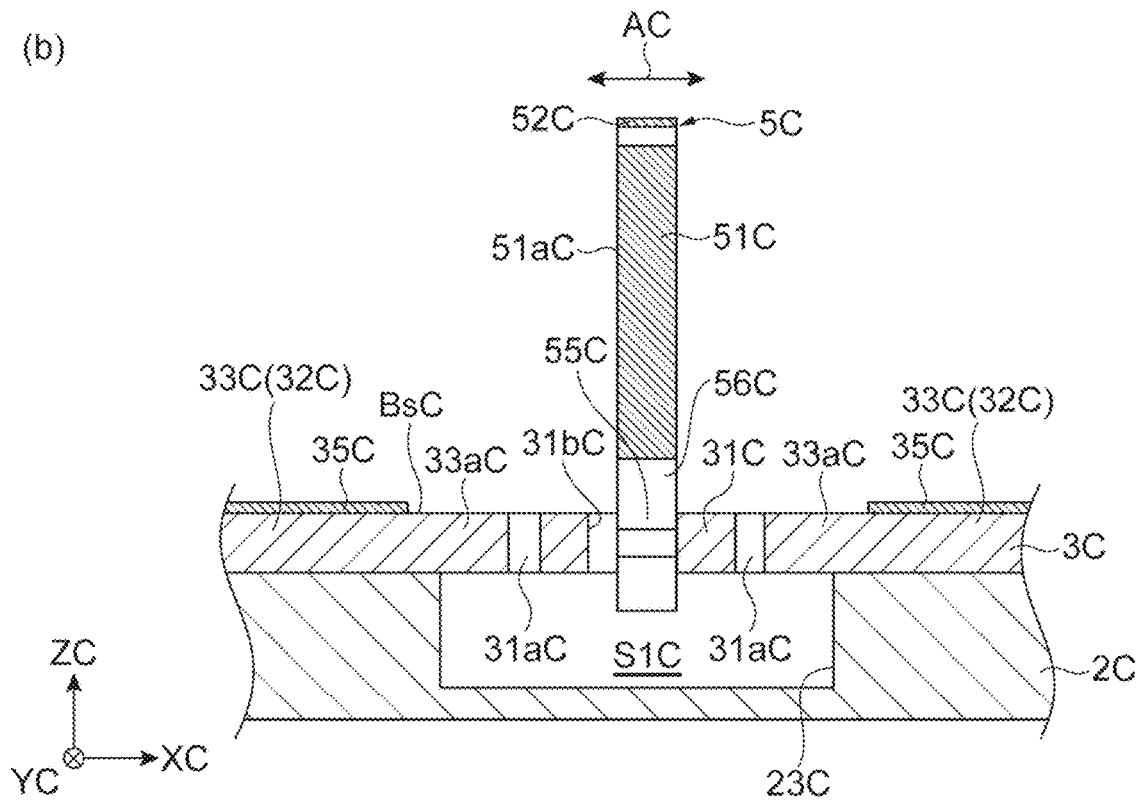
Figure 55:
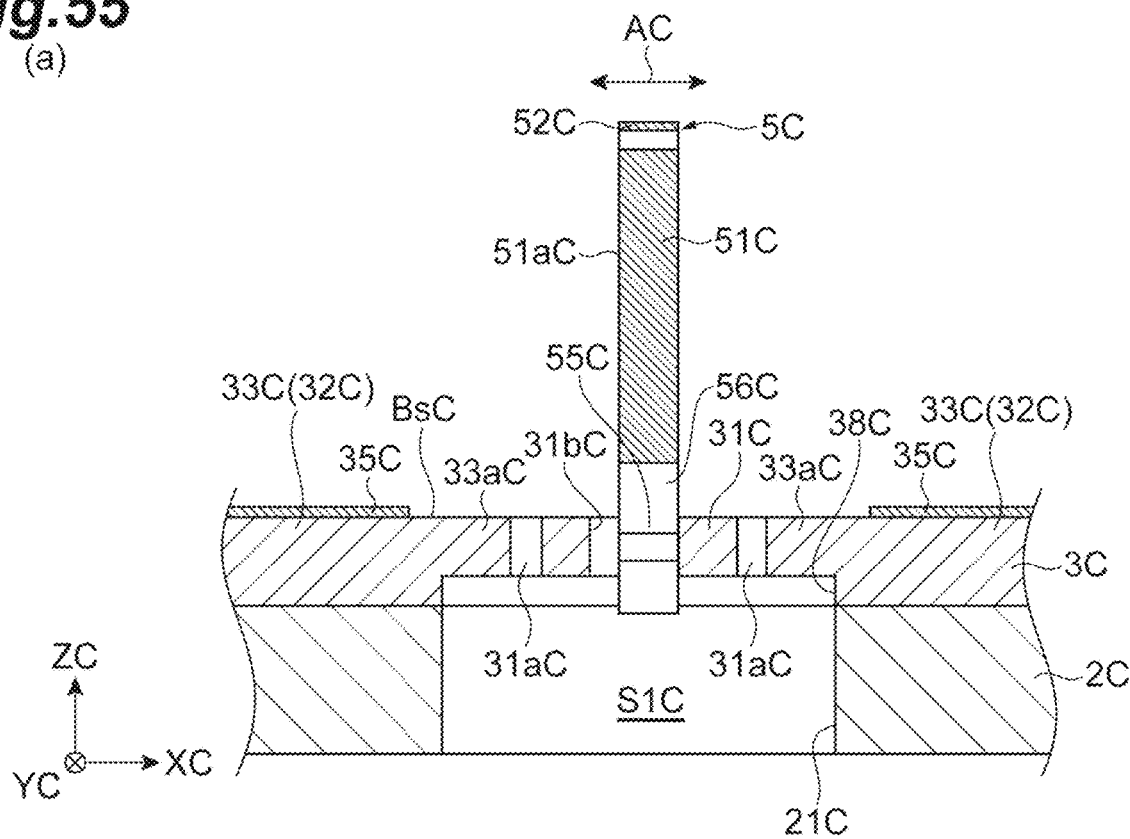
FIG. 55 is a cross-sectional view of another modification example of the surrounding structure of the movable mirror.
Figure 55:
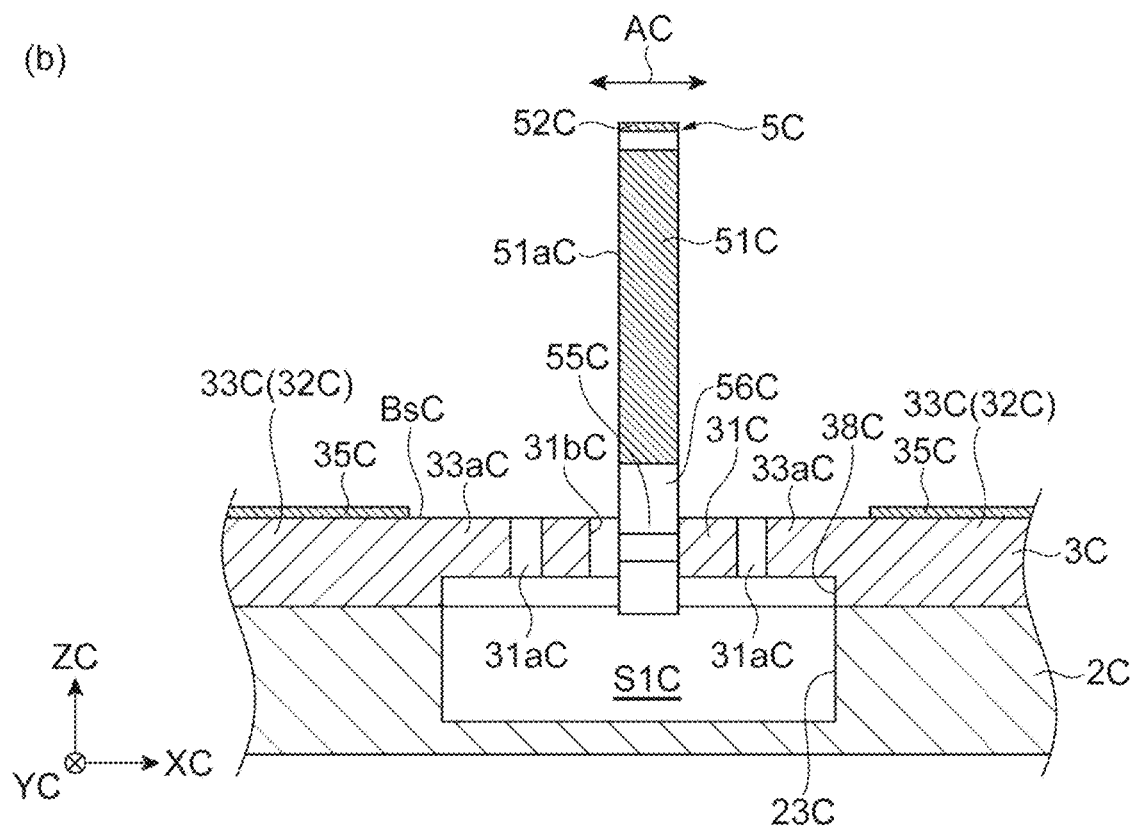
Figure 56:
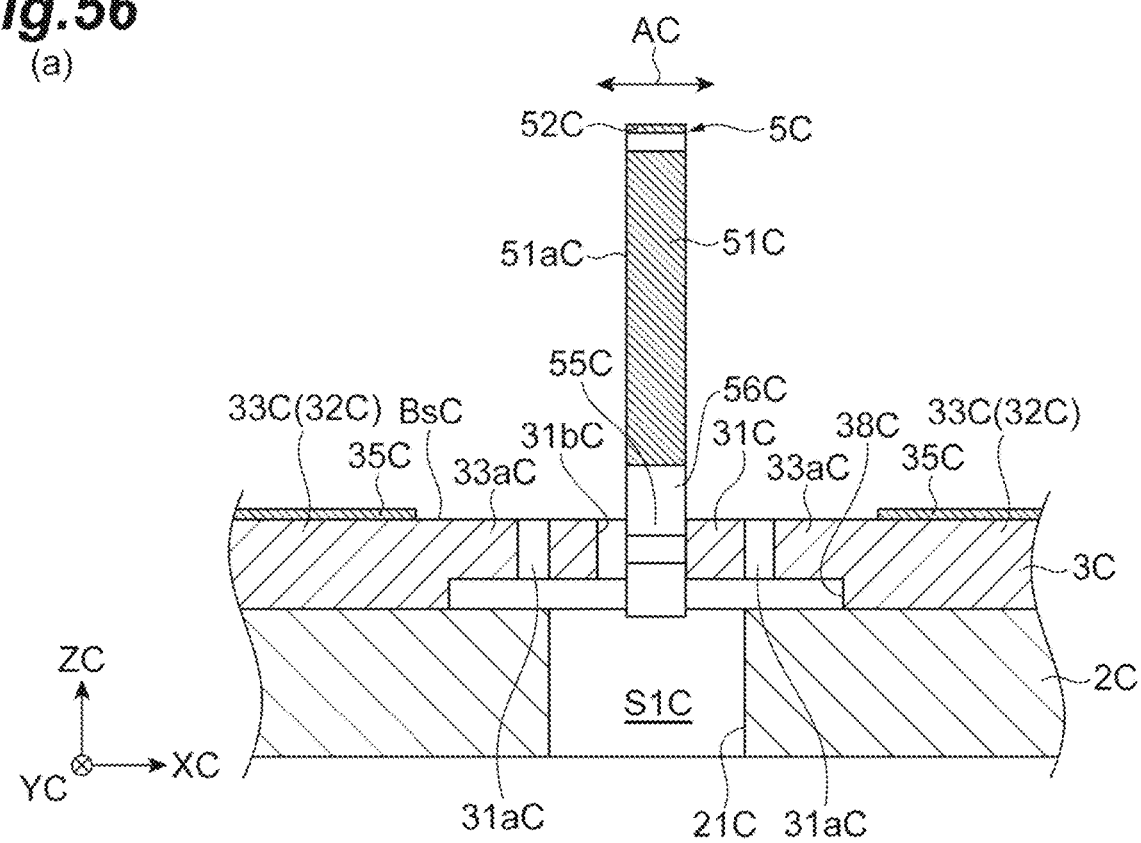
FIG. 56 is a cross-sectional view of another modification example of the surrounding structure of the movable mirror.
Figure 56:
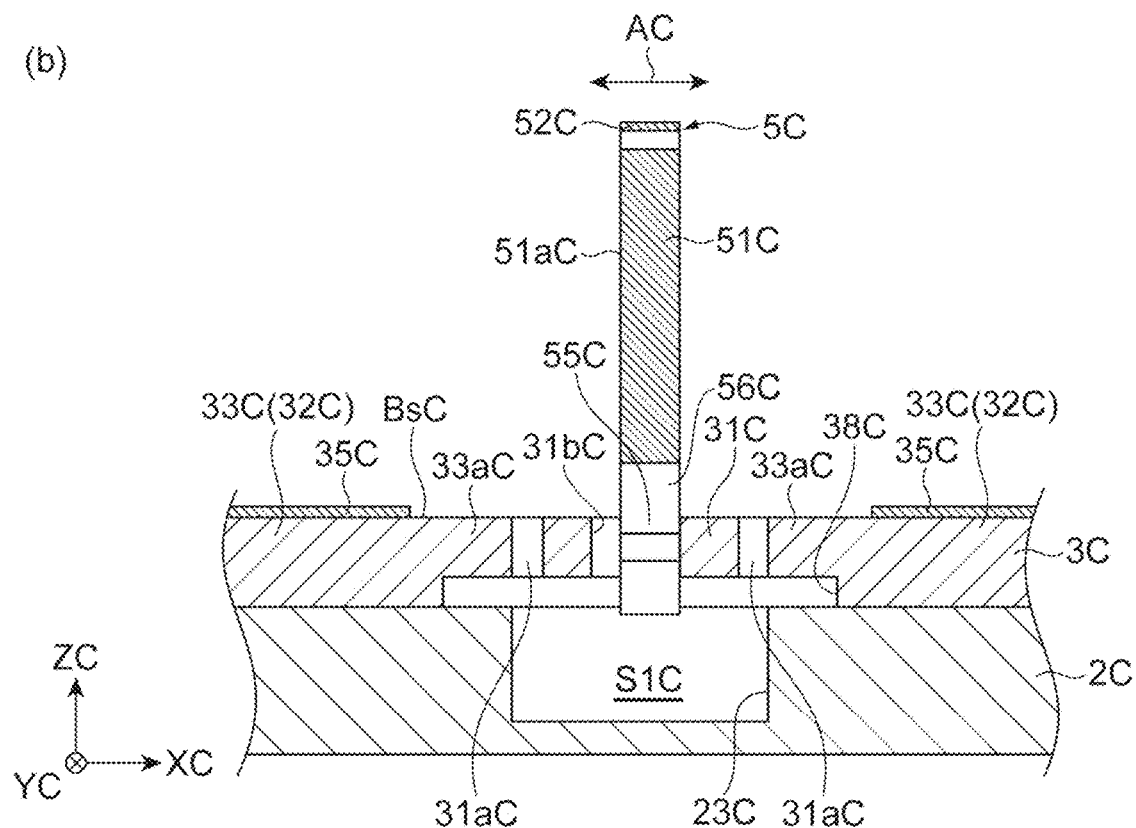

In addition, as long as the space S1C is formed between the support layer 2C and the device layer 3C and corresponds to at least the mounting region 31C and the driving region 32C, various forms can be employed as illustrated in FIGS. 52 and 53.

In the configuration illustrated in FIG. 52, in place of the opening 21C, a recess portion 23C open on the device layer 3C side is formed in the support layer 2C, and the space S1C is constituted of a region inside the opening 41C of the intermediate layer 4C and a region inside the recess portion 23C of the support layer 2C. In this case, a region inside the recess portion 23C of the support layer 2C includes the range in which the mounting region 31C moves when viewed in the ZC-axis direction. A portion of each of the interlock portions 55C of the movable mirror 5C is positioned in a region inside the recess portion 23C through a region inside the opening 41C of the intermediate layer 4C. With this configuration as well, it is possible to favorably realize a configuration for reliable mounting of the movable mirror 5C with respect to the device layer 3C.

In the configuration illustrated in FIG. 53(a), a region inside the opening 21C of the support layer 2C includes a range in which each of the interlock portions 55C of the movable mirror 5C moves when viewed in the ZC-axis direction. A portion of the interlock portion 55C is positioned in a region inside the opening 21C of the support layer 2C through a region inside the opening 41C of the intermediate layer 4C. In the configuration illustrated in FIG. 53(b), a region inside the recess portion 23C of the support layer 2C includes the range in which each of the interlock portions 55C of the movable mirror 5C moves when viewed in the ZC-axis direction. In these cases, a region inside the opening 41C of the intermediate layer 4C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of the interlock portion 55C is positioned in a region inside the recess portion 23C of the support layer 2C through a region inside the opening 41C of the intermediate layer 4C.

In addition, the support layer 2C and the device layer 3C may be joined to each other without having the intermediate layer 4C interposed therebetween. In this case, the support layer 2C is formed of silicon, borosilicate glass, quartz glass, or ceramic, for example, and the device layer 3C is formed of silicon, for example. The support layer 2C and the device layer 3C are joined to each other through room-temperature joining utilizing surface activation, low-temperature plasma joining, direct joining in which high-temperature processing is performed, insulating resin bonding, metal joining, or joining using glass frit, for example. In this case as well, as long as the space S1C is formed between the support layer 2C and the device layer 3C and corresponds to at least the mounting region 31C and the driving region 32C, various forms can be employed as illustrated in FIGS. 54, 55, 56, and 57. In any configuration, it is possible to favorably realize a configuration for reliable mounting of the movable mirror 5C with respect to the device layer 3C.

In the configuration illustrated in FIG. 54(a), the space S1C is constituted of a region inside the opening 21C of the support layer 2C. In this case, a region inside the opening 21C of the support layer 2C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of the interlock portion 55C is positioned in a region inside the opening 21C of the support layer 2C.

In the configuration illustrated in FIG. 54(b), the space S1C is constituted of a region inside the recess portion 23C of the support layer 2C. In this case, a region inside the recess portion 23C of the support layer 2C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of the interlock portion 55C is positioned in a region inside the recess portion 23C of the support layer 2C.

In the configuration illustrated in FIG. 55(a), a recess portion (first recess portion) 38C open on the support layer 2C side is formed in the device layer 3C, and the space S1C is constituted of a region inside the recess portion 38C of the device layer 3C and a region inside the opening 21C of the support layer 2C. In this case, a region inside the recess portion 38C of the device layer 3C and a region inside the opening 21C of the support layer 2C include the range in which the mounting region 31C moves when viewed in the ZC-axis direction. A region inside the recess portion 38C of the device layer 3C forms a clearance for causing a part of the mounting region 31C and the driving region 32C, which needs to be separated from the support layer 2C, to be separated from the support layer 2C. A portion of the interlock portion 55C is positioned in a region inside the opening 21C of the support layer 2C through a region inside the recess portion 38C of the device layer 3C.

In the configuration illustrated in FIG. 55(b), the recess portion 38C is formed in the device layer 3C, and the space S1C is constituted of a region inside the recess portion 38C of the device layer 3C and a region inside the recess portion (second recess portion) 23C of the support layer 2C. In this case, a region inside the recess portion 38C of the device layer 3C and a region inside the recess portion 23C of the support layer 2C include the range in which the mounting region 31C moves when viewed in the ZC-axis direction. A region inside the recess portion 38C of the device layer 3C forms a clearance for causing a part of the mounting region 31C and the driving region 32C, which needs to be separated from the support layer 2C, to be separated from the support layer 2C. A portion of each of the interlock portions 55C of the movable mirror 5C is positioned in a region inside the recess portion 23C of the support layer 2C through a region inside the recess portion 38C of the device layer 3C.

In the configuration illustrated in FIG. 56(a), the recess portion 38C is formed in the device layer 3C, and the space S1C is constituted of a region inside the recess portion 38C of the device layer 3C and a region inside the opening 21C of the support layer 2C. In this case, a region inside the recess portion 38C of the device layer 3C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A region inside the opening 21C of the support layer 2C includes the range in which each of the interlock portions 55C of the movable mirror 5C moves when viewed in the ZC-axis direction. A portion of each of the interlock portions 55C of the movable mirror 5C is positioned in a region inside the opening 21C of the support layer 2C through a region inside the recess portion 38C of the device layer 3C.

In the configuration illustrated in FIG. 56(b), the recess portion 38C is formed in the device layer 3C, and the space S1C is constituted of a region inside the recess portion 38C of the device layer 3C and a region inside the recess portion (second recess portion) 23C of the support layer 2C. In this case, a region inside the recess portion 38C of the device layer 3C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A region inside the recess portion 23C of the support layer 2C includes the range in which each of the interlock portions 55C of the movable mirror 5C moves when viewed in the ZC-axis direction. A portion of the interlock portion 55C is positioned in a region inside the recess portion 23C of the support layer 2C through a region inside the recess portion 38C of the device layer 3C.

Figure 57:
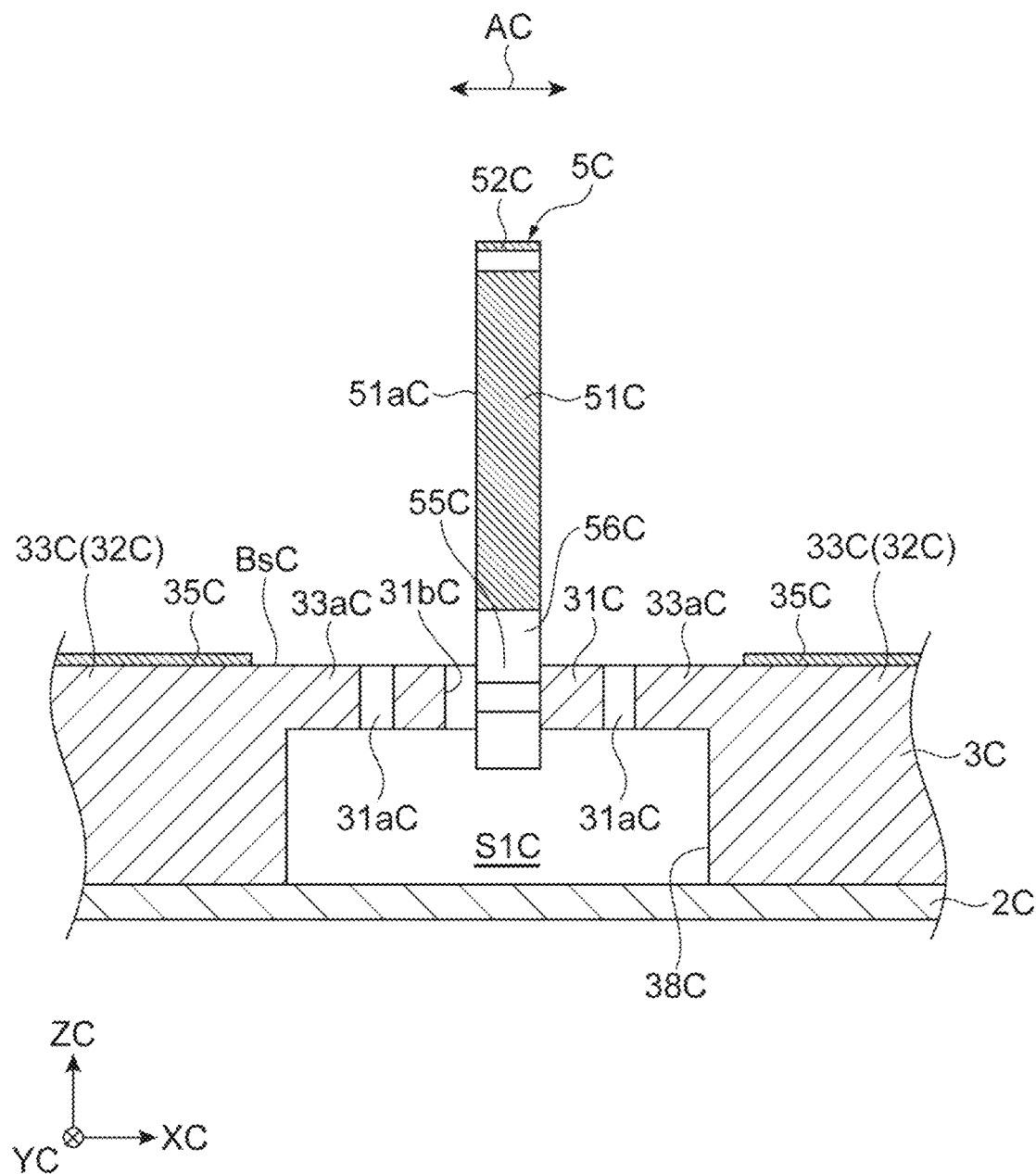
FIG. 57 is a cross-sectional view of another modification example of the surrounding structure of the movable mirror.

In the configuration illustrated in FIG. 57, the recess portion 38C is formed in the device layer 3C, and the space S1C is constituted of a region inside the recess portion 38C of the device layer 3C. In this case, a region inside the recess portion 38C of the device layer 3C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of the interlock portion 55C is positioned in a region inside the recess portion 38C of the device layer 3C.

Figure 58:
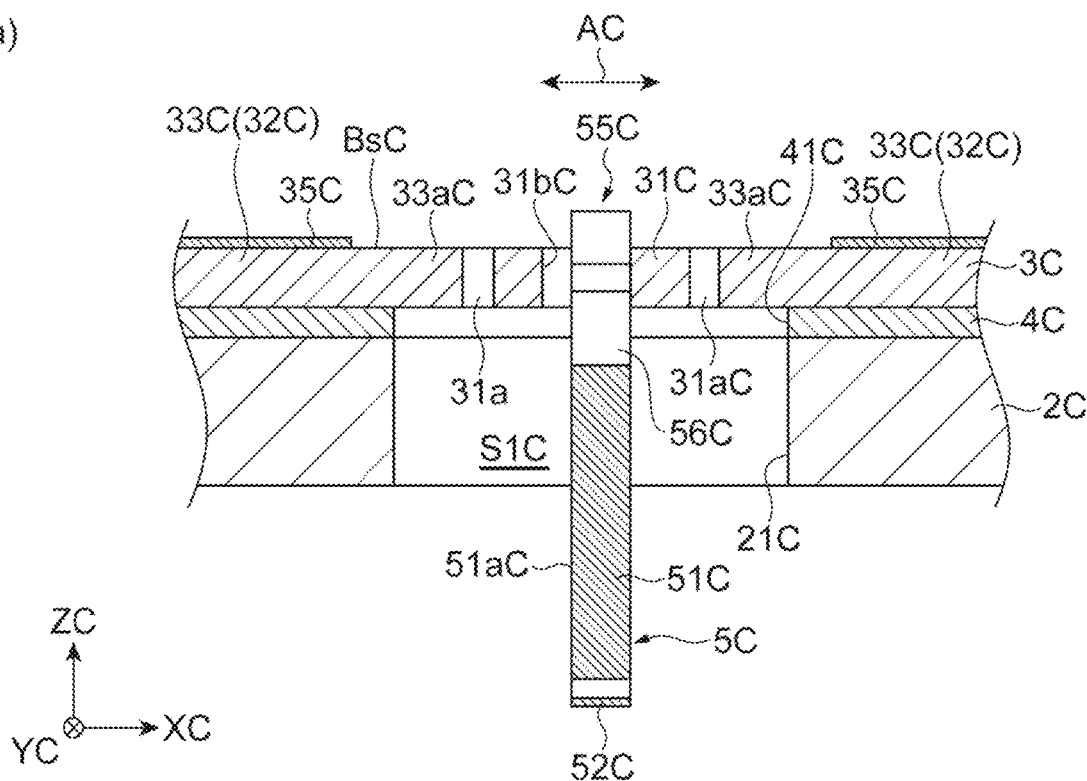
FIG. 58 is a cross-sectional view of another modification example of the surrounding structure of the movable mirror.
Figure 58:
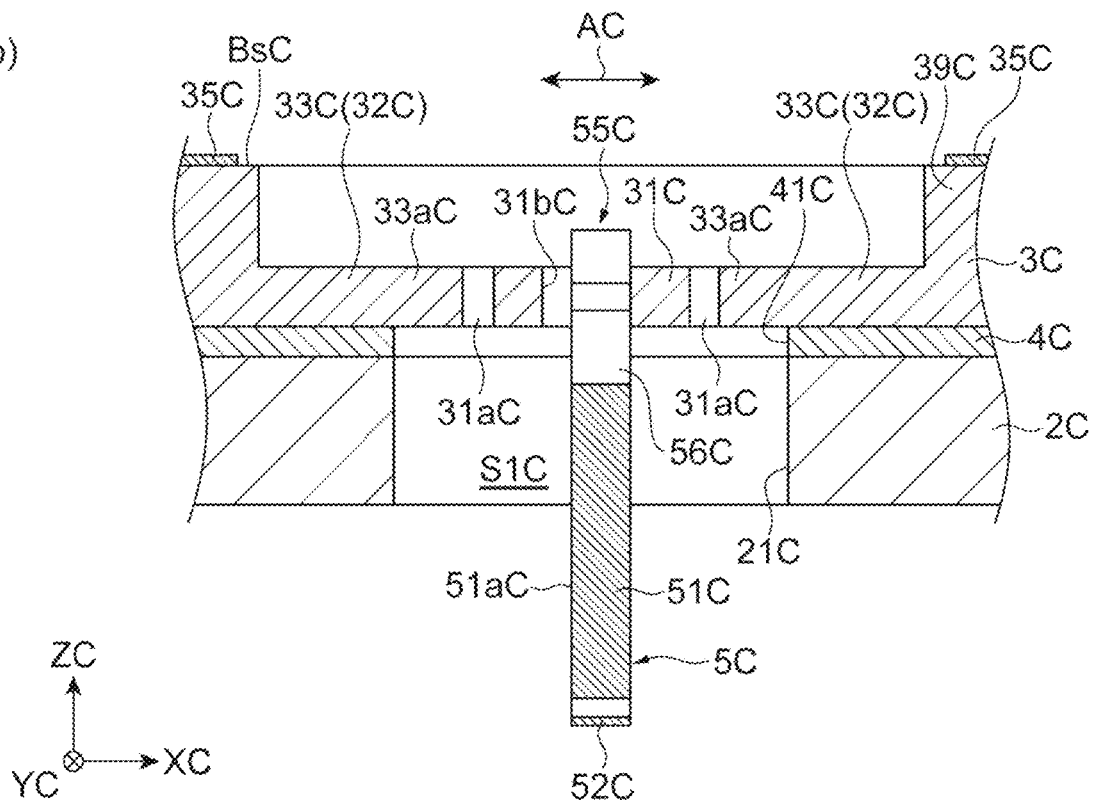

In addition, as illustrated in FIGS. 58(a) and 58(b), the mirror surface 51aC of the movable mirror 5C may be positioned on a side opposite to the device layer 3C with respect to the support layer 2C. Here, in a state where the mirror portion 51C of movable mirror 5C protrudes from the main surface of the support layer 2C on a side opposite to the device layer 3C, the interlock portion 55C extends such that it reaches the opening 31bC. In this case, the mirror surface 61aC of the fixed mirror 6C and the optical functional surface 7aC of the beam splitter 7C are also positioned on a side opposite to the device layer 3C with respect to the support layer 2C. In the configuration illustrated in FIG. 58(b), a spacer 39C protruding to a side opposite to the support layer 2C is integrally provided in the device layer 3C. The spacer 39C protrudes beyond a part of each of the interlock portions 55C of the movable mirror 5C protruding from the device layer 3C to a side opposite to the support layer 2C, thereby protecting the part. In addition, here, the opening 31bC communicates with the main surface BsC via a space defined by the spacer 39C. Alternatively, here, the opening 31bC communicates with another main surface which is a surface on a side opposite to the main surface BsC, via the space S1C.

In addition, in the foregoing embodiment, the fixed mirror 6C is mounted in the device layer 3C. However, the fixed mirror 6C may be mounted in the support layer 2C or the intermediate layer 4C. In addition, in the foregoing embodiment, the beam splitter 7C is mounted in the support layer 2C. However, the beam splitter 7C may be mounted in the device layer 3C or the intermediate layer 4C. In addition, the beam splitter 7C is not limited to a cube-type beam splitter and may be a plate-type beam splitter.

In addition, the light module 1C may include a light emitting element for generating measurement light to be incident on the light incident unit 8C, in addition to the light incident unit 8C. Alternatively, the light module 1C may include a light emitting element for generating measurement light to be incident on the interference optical system 10C, in place of the light incident unit 8C. In addition, the light module 1C may include a light receiving element for detecting measurement light (interference light) emitted from the light emission unit 9C, in addition to the light emission unit 9C. Alternatively, the light module 1C may include a light receiving element for detecting measurement light (interference light) emitted from the interference optical system 10C, in place of the light emission unit 9C.

In addition, a first penetration electrode which is electrically connected to each of the actuator regions 33C, and a second penetration electrode which is electrically connected to each of both the end portions 34aC of each of the elastic support regions 34C are provided in the support layer 2C and the intermediate layer 4C (in only the support layer 2C when the intermediate layer 4C is not present), and a voltage may be applied to a part between the first penetration electrode and the second penetration electrode. In addition, the actuator for moving the mounting region 31C is not limited to an electrostatic actuator, and a piezoelectric actuator or an electromagnetic actuator may be adopted, for example. In addition, the light module 1C is not limited to a module for constituting an FTIR and may be a module for constituting other optical systems.

Figure 59:
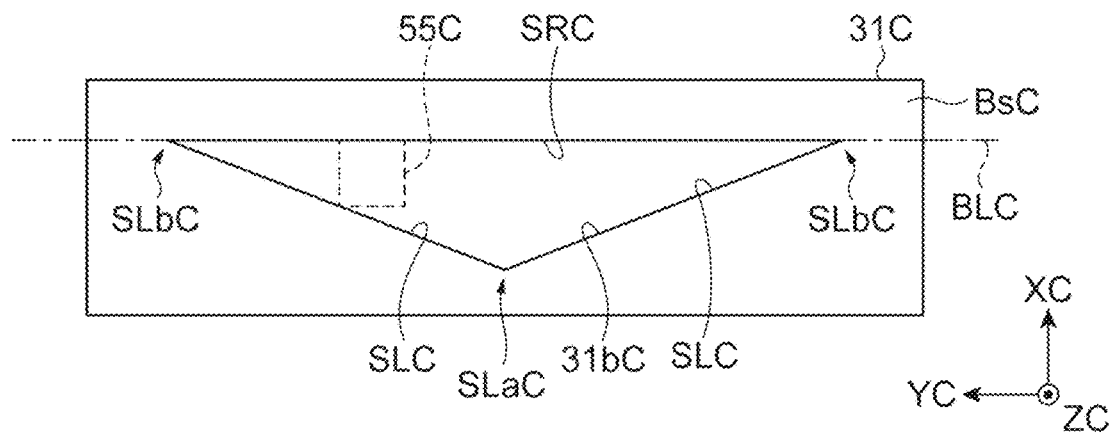
FIG. 59 is a plan view illustrating a modification example of the opening.
Figure 59:
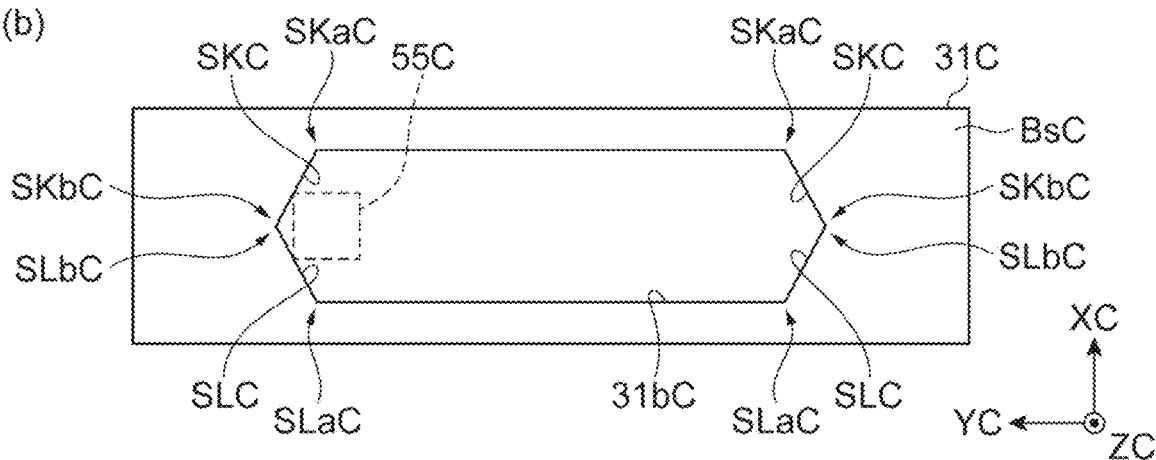
Figure 59:
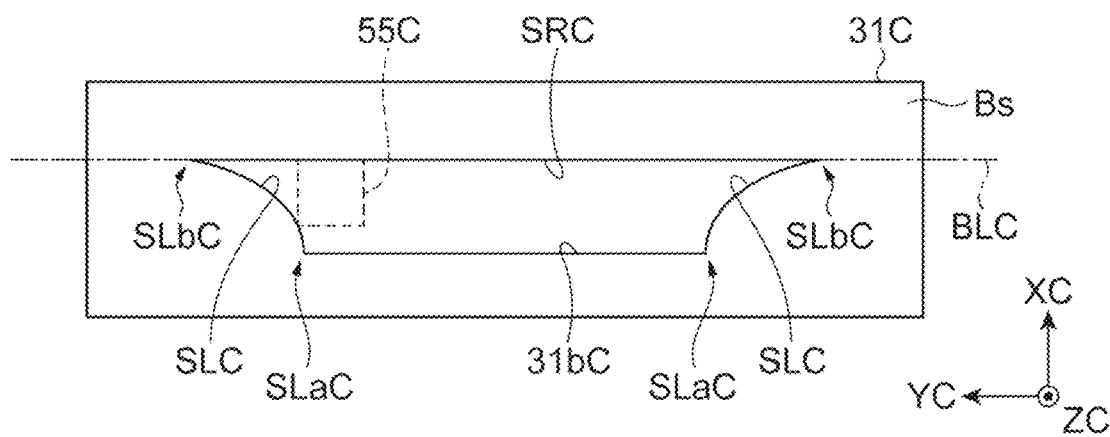

Subsequently, modification examples of the opening 31bC illustrated in FIG. 49 will be described. As illustrated in FIG. 59(a), the shape of the opening 31bC when viewed in the ZC-axis direction may be a triangular shape. In this case, the inner surface of the opening 31bC is constituted of inclined surfaces SLC and the reference surface SRC. Here, one ends SLaC of the inclined surfaces SLC are connected to each other. In this case as well, when the interlock portion 55C comes into internal contact with a corner portion defined by the inclined surface SLC and the reference surface SRC, the movable mirror 5C can be positionally aligned in both the XC-axis direction and the YC-axis direction.

In the example illustrated in FIG. 59(b), the shape of the opening 31bC when viewed in the ZC-axis direction is a hexagonal shape. In this case, the inner surface of the opening 31bC includes a pair of inclined surfaces SLC and a pair of inclined surfaces SKC which are inclined to sides opposite to the inclined surfaces SLC. The inclined surfaces SKC of the pair are inclined such that the distance therebetween increases from one end SKaC toward the other end SKbC. Here, the other end SLbC of the inclined surface SLC and the other end SKbC of the inclined surface SKC are connected to each other and form one corner portion. In this case as well, when the interlock portion 55C comes into internal contact with a corner portion defined by the inclined surface SLC and the inclined surface SKC, the movable mirror 5C can be positionally aligned in both the XC-axis direction and the YC-axis direction. Here, when viewed in the ZC-axis direction, one interlock portion 55C comes into contact with the inner surface of the opening 31bC at two points.

As illustrated in FIG. 59(c), the inclined surfaces SLC may be curved surfaces. In this case, the inclined surfaces SLC of the pair are inclined and curved such that the distance therebetween increases from one end SLaC toward the other end SLbC. Here, when viewed in the ZC-axis direction, the inclined surface SLC is curved such that the inclination of a tangential line of the inclined surface SLC with respect to the XC-axis gradually increases from the one end SLaC toward the other end SLbC. The inclined surface SLC is curved to be projected inward toward the opening 31bC. Even in this case as well, when the interlock portion 55C comes into internal contact with a corner portion defined by the inclined surface SLC and the reference surface SRC, the movable mirror 5C can be positionally aligned in both the XC-axis direction and the YC-axis direction.

Figure 60:
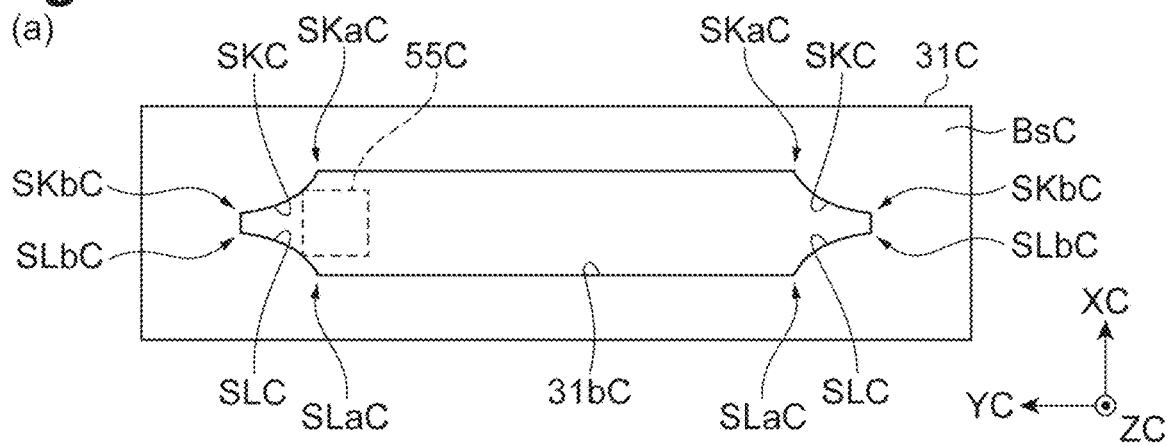
FIG. 60 is a plan view illustrating another modification example of the opening.
Figure 60:
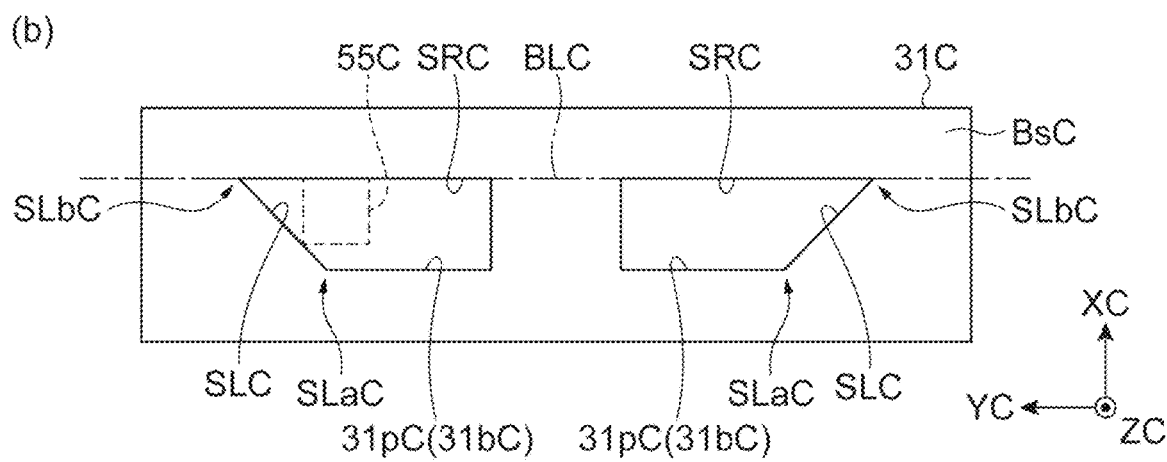
Figure 60:
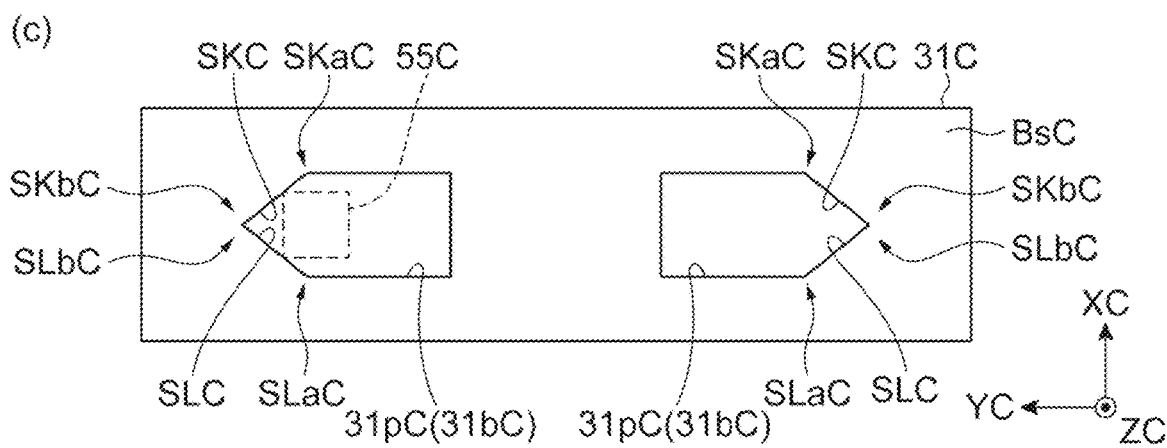

In the example illustrated in FIG. 60(a), both the inclined surface SLC and the inclined surface SKC have a curved surface to be projected inward to the opening 31bC. In addition, the other end SLbC of the inclined surface SLC and the other end SKbC of the inclined surface SKC are connected to each other via a connection surface which extends in the XC-axis direction. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

In the example illustrated in FIG. 60(b), the opening 31bC is divided into two parts 31pC when viewed in the ZC-axis direction. Each of the two parts 31pC has the inclined surface SLC and the reference surface SRC. That is, here, the reference surface SRC is also divided into two parts. However, when viewed in the ZC-axis direction, the reference surface SRC in its entirety extends along the reference line BLC connecting the other end SLbC of the inclined surface SLC of one part 31pC and the other end SLbC of the inclined surface SLC of the other part 31pC to each other. In this case, one interlock portion 55C is inserted into the one part 31pC of the opening 31bC. Then, when the interlock portion 55C comes into internal contact with a corner portion defined by the inclined surface SLC and the reference surface SRC, the movable mirror 5C can be positionally aligned in both the XC-axis direction and the YC-axis direction.

In the example illustrated in FIG. 60(c) as well, the opening 31bC is divided into two parts 31pC when viewed in the ZC-axis direction. Each of the two parts 31pC has the inclined surface SLC and the inclined surface SKC. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

Figure 61:
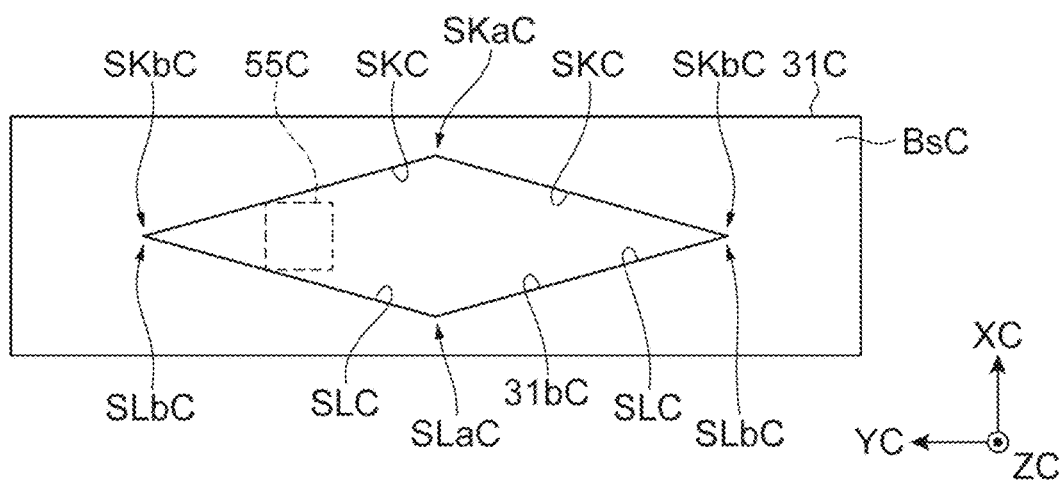
FIG. 61 is a plan view illustrating another modification example of the opening.
Figure 61:
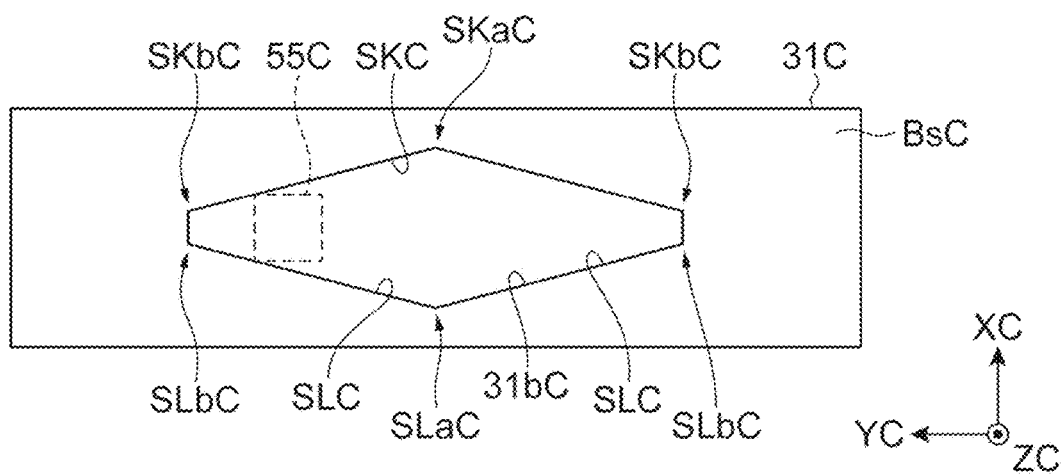

In the example illustrated in FIG. 61(a), the shape of the opening 31bC when viewed in the ZC-axis direction is a rhombic shape. Here, the inner surface of the opening 31bC is constituted of the inclined surfaces SLC and the inclined surfaces SKC. That is, here, in addition to that the inclined surfaces SLC and the inclined surfaces SKC are connected to each other, one ends SLaC of the inclined surfaces SLC are connected to each other, and one ends SKaC of the inclined surfaces SKC are connected to each other. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

Moreover, in the example illustrated in FIG. 61(b), the other end SLbC of the inclined surface SLC and the other end SKbC of the inclined surface SKC are connected to each other via a connection surface which extends in the XC-axis direction. In addition, one ends SLaC of the inclined surfaces SLC are connected to each other, and one ends SKaC of the inclined surfaces SKC are connected to each other. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

The shapes of the mirror portions 51C and 61C and the mirror surfaces 51aC and 61aC are not limited to a circular shape and may be a rectangular shape or other shapes.

Hereinabove, various modification examples of the movable mirror 5C and the opening 31bC have been described. However, the modification examples of the movable mirror 5C and the opening 31bC are not limited to those described above. For example, the movable mirror 5C and the opening 31bC can be constituted as another modification example by replacing arbitrary parts in the foregoing modification examples with each other. The same applies to the fixed mirror 6C and the opening 37aC.

Moreover, in the foregoing embodiment, a movable mirror and a fixed mirror have been described as examples of optical elements to be mounted on the base BC. In this example, the optical surface is a mirror surface. However, the optical element which becomes a mounting target is not limited to a mirror. For example, an arbitrary element such as a grating, an optical filter, or the like can be adopted.

Here, the centers of the mirror surfaces (optical surfaces) 51aC and 61aC described above are the centers of the mirror surfaces 51aC and 61aC in the ZC-axis direction (direction intersecting (orthogonal to) the main surface BsC). However, when the shapes of the mirror surfaces 51aC and 61aC are not shapes (for example, circular shapes, quadrangular shapes, or the like) of which the center cannot be uniquely determined, the centers of the mirror surfaces 51aC and 61aC can be interpreted by being substituted with the centroids of the mirror surfaces 51aC and 61aC in the ZC-axis direction. In this case, the centroid can be defined in accordance with the areas of the mirror surfaces 51aC and 61aC.

In addition, in the foregoing embodiment, for example, a case where the elastic portion 52C is elastically deformed such that the distance between the support portions 56C is decreased has been described as an example. In this case, the distance between the support portions 56C is increased by releasing a portion of elastic deformation of the elastic portion 52C inside the opening 31bC. Accordingly, self-alignment is performed by bringing the support portions 56C into contact with the inner surface of the opening 31bC. However, for example, the elastic portion 52C may be elastically deformed such that the gap between the support portions 56C is increased. In such a case, when an elastic deformation of the elastic portion 52C is partially released in a state where the interlock portions 55C are inserted into the opening 31bC, the interlock portions 55C are displaced toward each other. Accordingly, self-alignment is performed by bringing the support portions 56C into contact with the inner surface of the opening 31bC. The following are appendixes of the foregoing third embodiment.

APPENDIX 22

A light module including:
an optical element; and
a base on which the optical element is mounted, in which
the optical element has
an optical portion which has an optical surface,
an elastic portion which includes one end portion and the other end portion and is provided around the optical portion,
a pair of support portions which respectively extends from the one end portion and the other end portion to the base side beyond the optical portion, and
a connecting portion which connects one support portion and the optical portion to each other,
the base has a main surface, and a mounting region in which an opening communicating with the main surface is provided,
the support portions, in which an elastic force is applied and a distance therebetween is able to be changed in accordance with elastic deformation of the elastic portion, are inserted into the opening in a state where the elastic force is applied,
the optical element is supported in the mounting region by a reaction force of the elastic force applied from an inner surface of the opening to the support portions in a state where the optical surface intersects the main surface, and
the connecting portion is provided on the base side of a center of the optical surface.

APPENDIX 23

The light module according to appendix 22, in which
the elastic portion includes a circular arc part which is formed such that the optical portion is partially surrounded when viewed in a direction intersecting the optical surface, and
the one end portion and the other end portion are provided at distal ends of the circular arc part.

APPENDIX 24

The light module according to appendix 22 or 23, in which
the support portion includes an interlock portion which extends to the base side over a connecting position of the connecting portion with respect to the optical portion and is inserted into the opening, and
a thickness of the interlock portion is larger than a thickness of the elastic portion when viewed in a direction intersecting the optical surface.

APPENDIX 25

The light module according to any one of appendixes 22 to 24, in which
a thickness of the support portion is larger than the thickness of the elastic portion when viewed in a direction intersecting the optical surface.

APPENDIX 26

The light module according to any one of appendixes 22 to 25, in which
a thickness of the connecting portion is larger than the thickness of the elastic portion when viewed in a direction intersecting the optical surface.

APPENDIX 27

The light module according to any one of appendixes 22 to 26, in which
the inner surface of the opening includes a pair of inclined surfaces which is inclined such that a distance therebetween increases from one end toward the other end when viewed in a direction intersecting the main surface, and a reference surface which extends along a reference line connecting the other end of one inclined surface and the other end of the other inclined surface to each other.

APPENDIX 28

The light module according to any one of appendixes 22 to 27, further including:
a fixed mirror and a beam splitter which are mounted on the base, in which
the optical element is a movable mirror which includes the optical surface serving as a mirror surface,
the base has a driving region which is connected to the mounting region, and the movable mirror, the fixed mirror, and the beam splitter are disposed such that an interference optical system is constituted.

APPENDIX 29

The light module according to appendix 28, in which
the base has a support layer, a device layer which is provided on the support layer, and an intermediate layer which is provided between the support layer and the device layer,
the support layer is a first silicon layer of an SOI substrate,
the device layer is a second silicon layer of the SOI substrate, and
the intermediate layer is an insulating layer of the SOI substrate.

APPENDIX 30

The light module according to appendix 28 or 29, further including:
a light incident unit which is disposed such that measurement light is incident on the interference optical system from outside; and
a light emission unit which is disposed such that the measurement light is emitted from the interference optical system to the outside.

The light module according to the first embodiment, the light module according to the second embodiment, and the light module according to the third embodiment described above can be subjected to modification in which an arbitrary element thereof is added to and/or replaced with each other.

INDUSTRIAL APPLICABILITY

It is possible to provide a light module in which an optical element can be reliably mounted regardless of characteristics of a mounting region.

REFERENCE SIGNS LIST

1A Light module
2A Support layer
3A Device layer
4A Intermediate layer
5A, 5AA Movable mirror (optical element)
6A Fixed mirror (optical element)
7A Beam splitter
8A Light incident unit
9A Light emission unit
10A Interference optical system
31A, 37A Mounting region
31bA, 37aA Opening
32A Driving region
51A, 61A Mirror portion (optical portion)
51aA, 61aA Mirror surface (optical surface)
52A, 62A Elastic portion
53A, 63A Connecting portion (first connecting portion)
54A, 64A Leg portion
55A, 65A Interlock portion
55aA, 55bA, 65aA, 65bA Inclined surface
56A, 66A Support portion
57A, 67A Connecting portion (second connecting portion)
SLA Inclined surface
SLaA One end
SLbA The other end
SRA Reference surface
BLA Reference line
CAA Annular region
1B Light module
2B Support layer
3B Device layer
4B Intermediate layer
5B Movable mirror
7B Beam splitter
8B Light incident unit
9B Light emission unit
10B Interference optical system
31B Mounting region
31bB Opening
51B Mirror portion
51aB Mirror surface
52B Elastic portion
54B Support portion
55B Interlock portion
56B Handle
56B Handle
56aB Displacement portion
BB Base
1C Light module
2C Support layer
3C Device layer
4C Intermediate layer
5C Movable mirror (optical element)
6C Fixed mirror (optical element)
7C Beam splitter
8C Light incident unit
9C Light emission unit
10C Interference optical system
31C, 37C Mounting region
31bC, 37aC Opening
32C Driving region
51C, 61C Mirror portion (optical portion)
51aC, 61aC Mirror surface (optical surface)
52C, 62C Elastic portion
52aC, 62aC Circular arc part
52pC, 62pC One end portion
52rC, 62rC The other end portion
55C, 65C Interlock portion
56C, 66C Support portion
57C, 67C Connecting portion
SLC Inclined surface
SLaC One end
SLbC The other end
SRC Reference surface
BLC Reference line

The invention claimed is:
1. A light module comprising:
an optical element; and
a base on which the optical element is mounted,
wherein the optical element has
an optical portion which has an optical surface,
an elastic portion which is able to be elastically deformed, and
a pair of support portions which is provided to face each other and in which an elastic force is applied and a distance therebetween is able to be changed in accordance with elastic deformation of the elastic portion,
wherein the base has a main surface, and a mounting region in which an opening communicating with the main surface is provided, wherein the pair of support portions is inserted into the opening in a state where an elastic force of the elastic portion is applied, and wherein the optical element is supported in the mounting region by a reaction force of the elastic force applied from an inner surface of the opening.

2. The light module according to claim 1, wherein the elastic portion is provided around the optical portion such that an annular region is formed, and wherein the optical element is supported in the mounting region by a reaction force of the elastic force applied from the inner surface of the opening to the support portions in a state where the optical surface intersects the main surface.

3. The light module according to claim 1, wherein the optical element has a handle used for causing the elastic portion to be elastically deformed such that the distance between the pair of support portions is changed, and wherein the handle is positioned on one side in a direction intersecting the main surface with respect to the optical portion and the pair of support portions in a state where the optical element is mounted in the mounting region.

4. The light module according to claim 1, wherein the elastic portion includes one end portion and the other end portion and is provided around the optical portion, wherein the pair of support portions extends to the base side of the optical portion from each of the one end portion and the other end portion, wherein the optical element has a connecting portion connecting one support portion and the optical portion to each other and is supported in the mounting region by a reaction force of the elastic force applied from the inner surface of the opening to the support portions in a state where the optical surface intersects the main surface, and wherein the connecting portion is provided on the base side of a center of the optical surface.

\* \* \* \* \*